United States Patent [19]

Bradley et al.

[11] Patent Number: 4,672,360
[45] Date of Patent: Jun. 9, 1987

[54] APPARATUS AND METHOD FOR CONVERTING A NUMBER IN BINARY FORMAT TO A DECIMAL FORMAT

[75] Inventors: John J. Bradley, Framingham; Brian L. Stoffers, N. Billerica; Melinda A. Widen, Arlington, all of Mass.

[73] Assignee: Honeywell Information Systems Inc., Waltham, Mass.

[21] Appl. No.: 537,902

[22] Filed: Sep. 30, 1983

[51] Int. Cl.⁴ ............................................. H03M 7/02
[52] U.S. Cl. ............................. 340/347 DD; 364/715
[58] Field of Search ................. 340/347 DD; 364/715

[56] References Cited

U.S. PATENT DOCUMENTS

| | | | |
|---|---|---|---|
| 3,064,889 | 11/1962 | Hupp | 340/347 DD |
| 3,064,894 | 11/1962 | Campbell | 340/347 DD |
| 4,384,340 | 5/1983 | Tague et al. | 364/736 |
| 4,384,341 | 5/1983 | Tague et al. | 364/763 |
| 4,390,961 | 6/1983 | Negi et al. | 364/756 |
| 4,423,483 | 12/1983 | Tague et al. | 364/200 |
| 4,426,680 | 1/1984 | Tague et al. | 364/200 |
| 4,484,300 | 11/1984 | Negi et al. | 364/755 |

Primary Examiner—T. J. Sloyan
Attorney, Agent, or Firm—William A. Linnell; George Grayson; John S. Solakian

[57] ABSTRACT

A data processing system having a central processing unit (CPU) capable of performing binary and decimal arithmetic software instructions is disclosed. Also disclosed is a method and apparatus for speeding conversion of a number in binary format to decimal format by first stripping leading zeroes before the highest order non-zero bit of the binary number, and only allocating enough memory storage bits to hold the resultant decimal number. A multiplexer is used to apply a partial sum during conversion concurrently to both inputs of an adder for doubling.

4 Claims, 27 Drawing Figures

```
 0                       10 11           15
┌───────────────────────────┬─────────────┐
│ 0 0 0 0 0 0 0 0 0 1       │ X X X X X   │  WORD 1
│         OP   CODE         │             │
├───────────────────────────┼─────────────┤
│      LABLE  1   (LB1)     │ 0  0  0  0  │  WORD 2
├───────────────────────────┼─────────────┤
│      LABLE  2   (LB2)     │ 0  0  0  0  │  WORD 3
├───────────────────────────┼─────────────┤
│      LABLE  3   (LB3)     │ 0  0  0  0  │  WORD 4
└───────────────────────────┴─────────────┘
```

*FIG. 8C-2*

```
┌───────────────────────────────────────┐
│ 0 0 0 0 0 0 0 0 0 1   X X X X X       │  WORD 1
│        OP   CODE                      │
├───────────────────────────────────────┤
│      EITHER   LB1  OR   DD1           │  1 OR 2 WORDS
├───────────────────────────────────────┤
│      EITHER   LB2  OR   DD2           │  1 OR 2 WORDS
├───────────────────────────────────────┤
│      EITHER   LB3  OR   DD3           │  1 OR 2 WORDS
└───────────────────────────────────────┘
```

*FIG. 8C-3*

```
 0  1  2  3         7 8 9           15
┌──┬──┬──┬──────────┬─┬──────────────┐
│C1│C2│C3│    L     │T│     CAS      │  WORD 1
├──┴──┴──┴──────────┴─┴──────────────┤
│       DISPLACEMENT   OR   IMO      │  WORD 2
└────────────────────────────────────┘
```

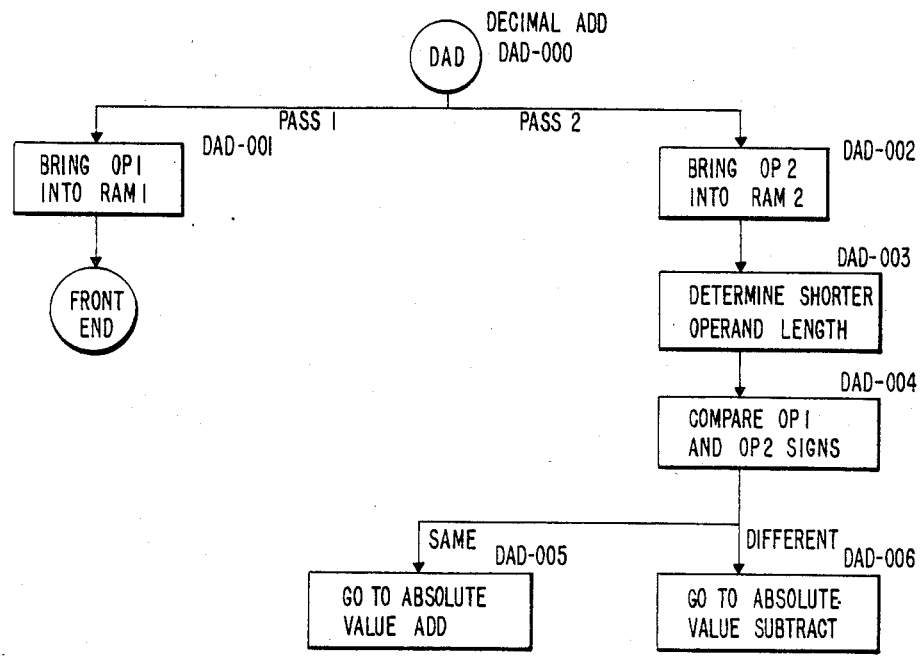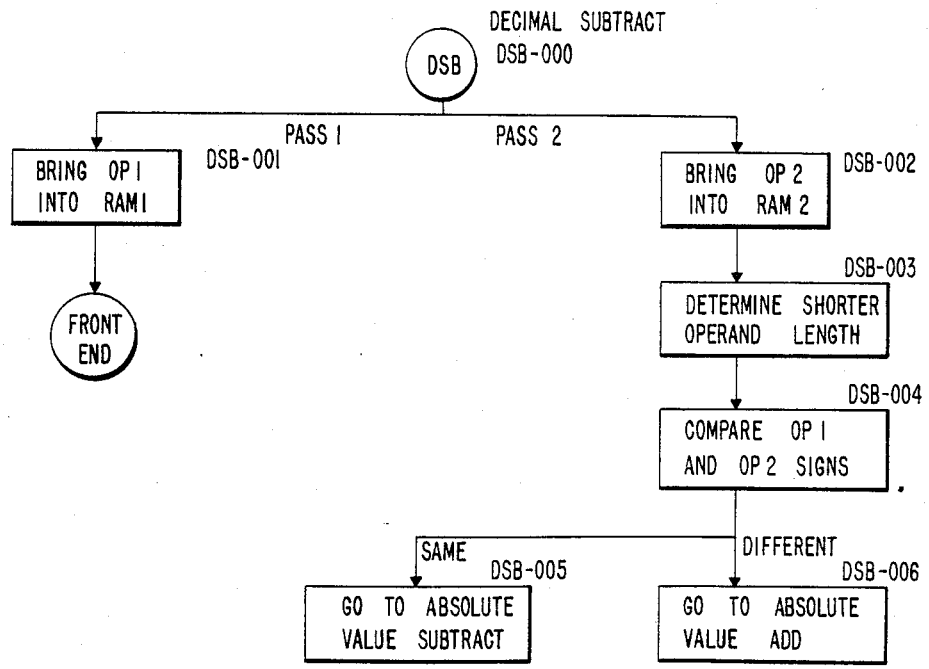
FIG. 11
SHEET 1 OF 4

APPARATUS AND METHOD FOR CONVERTING A NUMBER IN BINARY FORMAT TO A DECIMAL FORMAT

RELATED APPLICATIONS

The following patent applications, which are assigned to the same assignee as the instant application, have related subject matter and are incorporated herein by reference. Certain portions of the system and processes herein disclosed are not our invention, but are the invention of the below-named inventors as defined by the claims in the following patent application.

Ser. No.: 537,910
Filing Date: Sept. 30, 1983
Title: Apparatus For Performing Simplified Decimal Multiplication By Stripping Leading Zeroes
Inventors: John J. Bradley, Brian L. Stoffers, Theodore R. Staplin J., Melinda A. Widen Ser. No.: 537,928
Filing Date: Sept. 30, 1983
Title: A Nibble and Word Addressable Memory Arrangement
Inventors: Melinda A. Widen, John J. Bradley, George M. O'Har Ser. No.: 537,992
Filing Date: Sept. 30, 1983
Title: An Illegal Decimal Digit Detection Apparatus For Supporting Decimal Arithmetic Operations
Inventors: Thomas C. O'Brien, Melinda A. widen, Theodore R. Staplin, Jr., Ming T. Miu Ser. No.: 537,899
Filing Date: Sept. 30, 1983
Title: Decimal Arithmetic Logic Unit For Doubling Or Complementing Decimal Operands
Inventors: Theodore R. Staplin, Jr., John J. Bradley, Brian L. Stoffers Ser. No.: 537,751
Filing Date: Sept. 30, 1983
Title: An Equal Nine Apparatus For Supporting Absolute Value Subtracts On Decimal Operands of Unequal Length
Inventor: Brian L. Stoffers Ser. No.: 537,991
Filing Date: Sept. 30, 1983
Title: An Arithmetic Logic Unit With Outputs Indicating Invalid Computation Results Caused By Invalid Operands
Inventors: John J. Bradley, Thomas C. O'Brien, George M. O'Har, Ming T. Miu, Theodore R. Staplin, Jr., Brian L. Stoffers, Melinda A. Widen

BACKGROUND OF THE INVENTION

1. Field of the Invention

This invention relates to data processing systems and more specifically to a data processing system which provides for execution of decimal numeric software instructions.

2. Description of the Prior Art

There are primarily two different methods employed within modern data processing systems for representing numeric data.

It can be represented in a binary format in which each bit within a word is given a weight of 2 raised to a power such that the least significant bit, when a binary ONE, represents 2 to the zeroth power, the next more significant bit, when a binary ONE, represents 2 to the first power and so on. Negative numbers in a binary format may be indicated by a sign bit at either the beginning or end of the number or by performing a two's complement on the number.

The other method of representing numbers is to represent them in some type of decimal format. The decimal format commonly used is to have each decimal digit represented by four or more bits with the bits being binary encoded to represent the values of 0 to 9 decimal. Representing numbers in the decimal format has two disadvantages. First, as the number gets larger, more bits are required to represent a number in a decimal format than in a binary format. Second, performing decimal arithmetic operations is more complex and generally slower than binary operations because there are discontinuities at the boundaries between decimal digits which are not present between binary digits.

Numerous techniques for performing decimal arithmetic operations in data processing systems are known in the prior art. Some techniques are described in the book entitled, *Digital Computer Design Fundamentals*, by Y. Chu, published by McGraw-Hill Book Company Inc., 1962 which is incorporated herein by reference. These techniques generally require that individual decimal digits be manipulated one digit at a time at some point in performing a decimal arithmetic operation.

Therefore, in order to speed up decimal operations, what is needed are methods to efficiently manipulate individual decimal digits within a data processing system and methods which reduce the number of digits which must be manipulated during any arithmetic operation.

OBJECTS OF THE INVENTION

Accordingly, it is the primary object of this invention to reduce the amount of circuitry and processing time required to convert a number in binary format to decimal format.

This invention is pointed out with particularity in the appended claims. An understanding of the above and further objects and advantages of this invention can be obtained by referring to the following description taken in conjunction with the drawings.

SUMMARY OF THE INVENTIN

In accordance with the teaching of the present invention a method and apparatus are taught to speed conversion of a number in binary format to decimal format. First, to decrease the number of steps required in the conversion process all leading zeroes before the highest order non-zero bit of the binary number are removed. To speed conversion processing time, multiple steps in the process to add a partial sum to itself in an adder are minimized by using a multiplexer to apply the partial sum stored in a second memory to first and second inputs of an adder, rather than writing the same partial sum number to a first memory to be read out and applied to the first adder input while the partial sum is read out of the second memory and applied to the second adder input. In addition, the amount of circuitry and processing time required for conversion are further minimized by allocating only sufficient memory space to store the resultant decimal number from the conversion.

BRIEF DESCRIPTION OF THE DRAWINGS

The manner in which the method of the present invention is performed and the manner in which the apparatus of the present invention is constructed and its mode of operation can best be understood in light of the following detailed description together with the accompanying drawings in which like reference numbers identify like elements in the several figures and in which:

FIGS. 8C-1 through 8C-3 illustrate the format of commercial software numeric, alphanumeric and edit instructions with in-line data descriptors, remote data descriptors and a combination of in-line and remote data descriptors;

FIG. 9 illustrates the format of the data descriptors used by the commercial software instructions of the central processing unit/of FIG. 1;

FIG. 17 is a flow chart of the method used by the central processing unit of FIG. 1 to perform commercial software instructions which converts a number in a decimal format to a binary format.

DESCRIPTION OF THE PREFERRED EMBODIMENT

Figure 1:
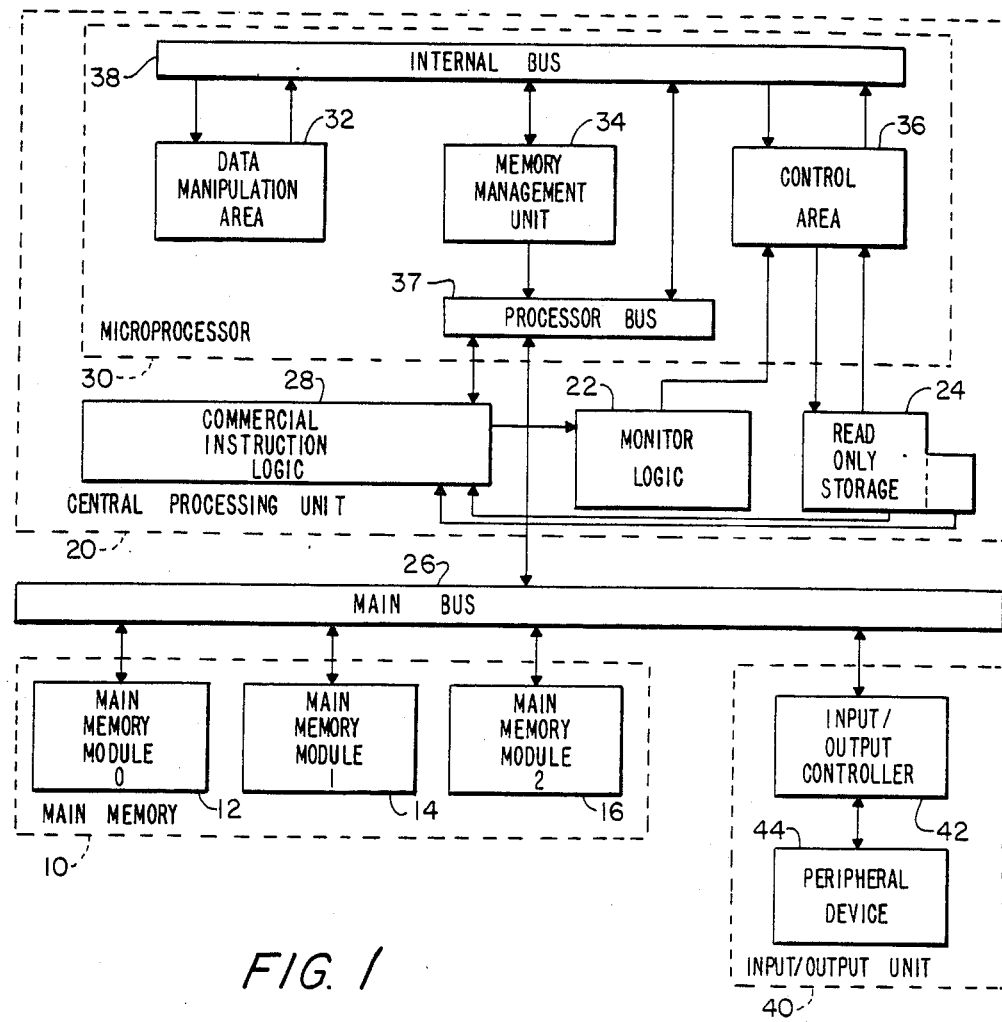
FIG. 1 is a general block diagram of a data processing system utilizing the present invention.

The implementation of the embodiment illustrated in the drawings is effected with a given arrangement of circuitry. However, it is understood that other logic arrangements may be employed in carrying out the invention to adapt the invention to various types of data processors. Accordingly, it is not intended to be limited to the specific schemes shown in the drawings.

DATA PROCESSING SYSTEM OVERVIEW

Referring now to the drawings, FIG. 1 illustrates the overall data processing system in which the present invention may be used. More particularly, FIG. 1 shows a main memory subsystem 10, a central processing unit (CPU) 20 and an input/output (I/O) unit 40. The main memory subsystem 10 consists of three metal oxide semiconductor modules 12, 14 and 16. The three modules are interfaced to the central processor unit 20 and the input/output unit 40 via main bus 26. The main bus 26 gives the capability of providing access to and control of all memory modules and input/output units.

The central processing unit 20 executes word oriented software instructions that operate on fixed and variable length fields. The basic unit of information in the central processor is a 16-bit word consisting of two 8-bit bytes (see FIG. 7A). A 16-bit word can also be broken into four 4-bit nibbles (see FIG. 7B). These words of information are used in groups of one, two or more for basic instructions (see FIG. 8A for an example of one of the instruction formats) or fixed or floating point binary operands (data). These words are also used in groups of one or more words for commercial instructions (see FIGS. 8C-1 to 8C-3). Bytes are also used in variable length fields as decimal or alphanumeric operands (data).

CPU 20 is comprised of microprocessor 30, monitor logic 22, Read Only Storage (ROS) 24 and commercial instruction logic 28. Microprocessor 30 is an NMOS, 16-bit chip capable of arithmetic, logic, and control operations, driven by a 48-bit external firmware microinstruction words which in the preferred embodiment are contained in ROS 24. The microprocessor 30 design permits the execution of the CPU 20 basic software instruction repertoire which operates on fixed and floating point binary data. Commercial instruction logic (CIL) 28 is used in conjunction with microprocessor 30 to permit the execution of the CPU 20 commercial software instruction repertoire which operates on decimal and alphanumeric data with the microprocessor 30 under the control of bits 0–47 of a 56-bit external firmware microinstruction word contained in ROS 24. As will be seen below, ROS 24 contains 2K (where 1K=1024) of 48-bit, microinstruction words which are used to execute the asic software instructions of CPU 20 and ROS 24 also contains 2K of 56-bit microinstruction words which are used to execute the commercial software instructions of CPU 20 with bits 0–47 controlling microprocessor 30 and bits 48–55 controlling CIL 28.

MICROPROCESSOR OVERVIEW

Microprocessor 30 is designed to directly control input/output (I/O) and memory operation for ease in integrated system designs. The microprocessor 30 design permits greater control and integration by use of a 48-bit external firmware microinstruction word that provides true horizontal microprogramming allowing up to 12 simultaneous micro-operations per 48-bit microinstruction word. The microprocessor 30 design also permits 8 external hardware interrupts which generate vectors to firmware microprogram routines as well as allowing 5 external software interrupts that are handled under firmware control. In addition microprocessor 30 provides for 10 external monitor bits originated in monitor logic 22 that are sensed and controlled by sophisticated test branch and major branch operations by logic within microprocessor control area 36 which allows for sophisticated branching operations to be performed within the firmware. Four of these ten external monitor bits are set by commercial instruction logic 28 to control test branch and major branch operations of microprocessor 30 when it and commercial instruction logic 28 are used together to execute a commercial software instruction of CPU 20.

Microprocessor 30 is comprised of 5 major internal hardware logic areas as shown in FIG. 1. The five major logic areas are the data manipulation area 32 which includes the arithmetic logic unit (ALU), the memory management unit (MMU 34), the control area 36, the processor bus 37, and internal bus 38.

The processor bus 37 consists of 20 address/data lines, one memory address violation line and three general purpose control lines. Processor bus 37 is connected to main bus 26 and is used to provide addresses to the main memory 10 and input/output unit 40 and to receive and send data to main memory 10 and input/output unit 40.

Internal bus 38 is the major path for communications of information between the other four areas of the microprocessor chip. Internal bus 38 is 20-bit wide. There are 12 sources of information to internal bus 38 under of the 11 micro-ops within the 48-bit microinstruction word. The ALU is the default so to internal bus 38 if none of the eleven defined micro-ops are used.

The data manipulation area 32 performs arithmetic and logic operations on data and does memory address generation. Data manipulation area 32 is described in greater detail in reference to FIG. 2 below.

The control area 36 of microprocessor 30 is logically divided into 3 areas: input latches for control, testable registers, and the next address generation. Control area 36 is described in greater detail in reference to FIG. 3 below.

The MMU 34 section of microprocessor 30 is comprised primarily of: a register file, a 12-bit address for base relocation, a 9-bit comparator for checking the size of a memory segment, several 2-bit ring comparators for evaluating access rights to a given segment, and storage flip-flops for indicating potential memory violations. During any CPU generated memory address cycle, the MMU 34 translates the software logical address containing a segment number, a block number and an offset value presented by internal bus 38 into a physical address which is placed on processor bus 37 which in turn is transmitted to main memory 10 via main bus 26.

As can be appreciated as the description so far, CPU 20 executes software programs, the instructions of which are fetched from main memory 10, and performs arithmetic and logical operations on data also contained in main memory 10. The software program executed by CPU 20 has the ability to manipulate general and base address registers that are software visible and the current software instruction is pointed to by a program counter. These general registers, base address registers and program counter, which are visible to the software being executed by CPU 20, are physically contained within the data manipulation area 32 of microprocessor 30.

Detailed operation of CPU 20 of FIG. 1 is controlled by microprocessor 30 under the control of firmware microinstructions stored in ROS 24. Each location in ROS 24 can be interpreted as controlling one microprocessor machine cycle. As each location of ROS 24 is read, the contents are decoded by control area 36 resulting in a specific operation within microprocessor 30. By grouping ROS locations, firmware microinstruction sequences are obtained that can perform a specific operation or software instruction associated with CPU 20. As each software instruction is initiated, certain bits within the operation code field of the software instruction are used to determine the starting address of the firmware microinstruction routine contained within ROS 24. The testing of certain flip-flops which are set or reset by software instruction decoding done by microprocessor 30 allow the microprocessor to branch to a more specific firmware microinstruction sequence within ROS 24 when necessary. When a commercial software instruction is encountered, microprocessor 30 branches to that portion of ROS 24 which contains 56-bit microinstruction words so that bits 0–47 are used to control the operation of microprocessor 30 and bits 48-55 are used to control the operation of commercial instruction logic 28. CIL 28 is described in greater detail with reference to FIG. 4 below.

Connected to main bus 26 is a input/output unit 40. The input/output controller 42 is that portion of the input/output unit 40 which completes a data path from a peripheral device 44 to main memory 10 via main bus 26. I/O controller 42 provides a path through which the peripheral commands are initiated, in addition to controlling resulting data transfers.

The microprocessor 30 interfaces with other CPU 20 logic by means of interface signals. In the preferred embodiment, the interface signals are divided into four groups according to pin assignment on microprocessor 30 and the phase relationship of the clock.

Figure 6:
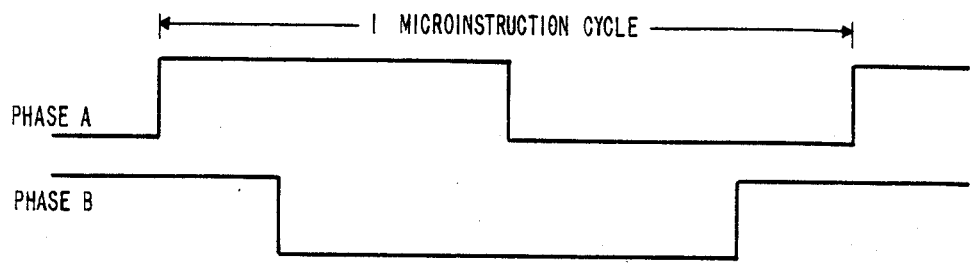
FIG. 6 illustrates the clock phase relationship of one microinstruction cycle of the microprocessor of FIG. 1.

The microprocessor clock is the primary element of the interface and it produces a Phase A and a Phase B signal as shown in FIG. 6.

The phase relationship between Phase A and Phase B determines the functions of the interface lines because there are 129 signals (excluding power, ground, and clock timing) shared among 57 input/output pins of microprocessor 30 of the preferred embodiment.

Phase A signal is used by the microprocessor 30 and the system to reverse the direction of the processor bus 37 drivers. When Phase A is high (a binary ONE), the 48 ROS data lines from read only storage 24 and the five option lines are inputs to the microprocessor 30. When Phase A is low (a binary ZERO), all other shared signals are either inputs or outputs to microprocessor 30.

Phase B signal is used to latch the signals that were gated with Phase A. When Phase B is going low, the ROS data and options are latched internal to the microprocessor 30. When Phase B is going high, all other shared signals are latched internal to the microprocessor 30.

There are four signal groups defined by the microprocessor 30 interface. Each group, except group 1, consists of signals that have common pin assignments and clock phase relationship shown in FIG. 6.

Group 1 consists of nine interface lines that have unshared signals. They are: three voltage, two ground, and four timing signals.

Group 2 consists of 23 interface lines which control 69 signals, five of which are unused. During Phase A high, the 23 lines represent 21 ROS input data bits and two input option bits. During Phase A low, the 23 lines are bidirectional representing inputs of 16 data bus bits, 3 control signals, and 4 unused signals; or outputs of 20 address/data bus bits and 3 control signals.

Group 3 consists of 19 interface lines which control 38 input signals. During Phase A low, the 19 lines represent 4 software interrupt signals, 8 hardware interrupt signals, and 7 monitor bits. During Phase A high, the 19 lines represent 14 ROS input data bits, 3 input option bits, and 2 unused signals.

Group 4 consists of 13 interface lines which control 26 signals. During Phase A low, the 13 lines represent 12 ROS output address bits and an error signal. During Phase A high, the 13 lines represent 13 ROS input data bits.

MICROPROCESSOR DATA MANIPULATION AREA

Figure 2:
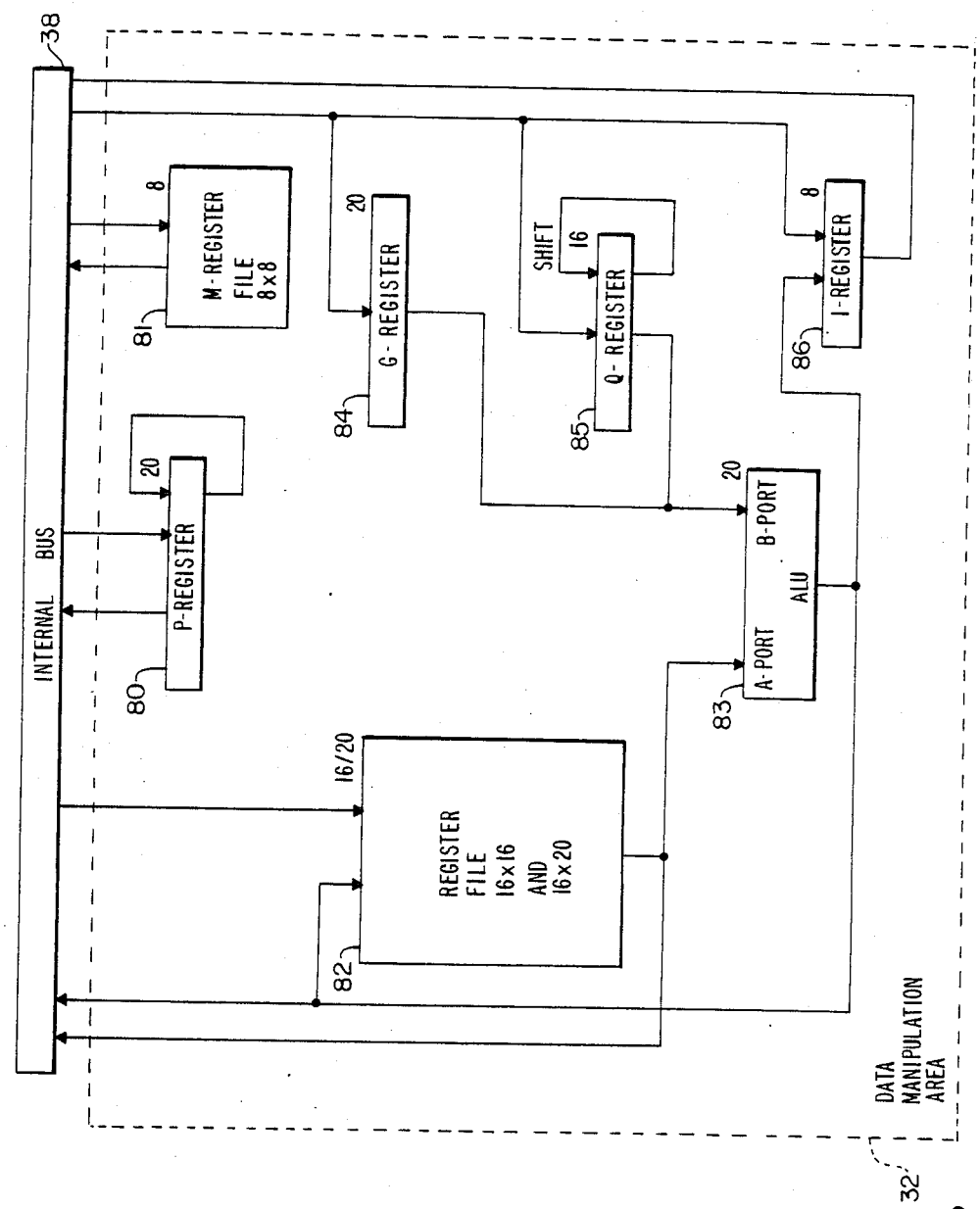
FIG. 2 is a block diagram of the data manipulation area of the microprocessor of FIG. 1.

Referring now to FIG. 2 which illustrates the data manipulation area 32 of FIG. 1 in greater detail. In FIG. 2, the number next to the upper right hand corner of the blocks represents the number of bits of information contained in the register represented by the block.

The data manipulation area, as shown in FIG. 2, performs arithmetic and logical operations on data and memory address generation. It is composed of the following eight elements: P-register 80, arithmetic logic unit (ALU) 83, G-register 84, a shifting mechanism (not shown in FIG. 2), Q-register 85, indicator register (I-register) 86, register file 82, and M-register file 81.

The P-register 80 is a 20-bit memory address register that contains either the program counter or a logical memory address. The P-register can be loaded from the internal bus 38, incremented or decremented, and the output transferred to the internal bus under firmware control by various microinstruction commands.

The G-register 84 is 20 bits wide and is used to hold addresses for ALU operations. It can be loaded from the internal bus 38 under firmware control by a microinstruction command and the output is sent to the B-port of ALU 83.

The Q-register 85 is a 16-bit register that provides operand shifts, and holds secondary operands for ALU 83. It can be loaded from the internal bus under firmware control by a microinstruction command and the output is sent to the B-port of the ALU 83. Q-register output can be sign extended to 20 bits for ALU operations. The load Q-register microinstruction command is used for loading from internal bus 38 when shifting microinstruction commands are not used.

The register 82 can be loaded from the ALU 83 output or the internal bus 38. When loaded from internal bus 38, data comes direct, or with byte 0 (the left most 8 bits) swapped with byte 1 (the right most 8 bits) of a 16 bit word, or with the right most 4 bits from internal bus 83 being loaded into the left most 4 bits of a 20 bit register in register file 82. Two write lines control the loading of registers in register file 82: one loading the right most bits 0 through 15 in 16-bit or 20-bit registers, the other loading the left bits 0D through 0A in 20-bit registers. The register file 82 output feeds the A-port of the ALU 83. The register address is taken from either the ROS data register 65 (RDDT) or the information in the F-register 51 (see FIG. 3).

Figure 5:
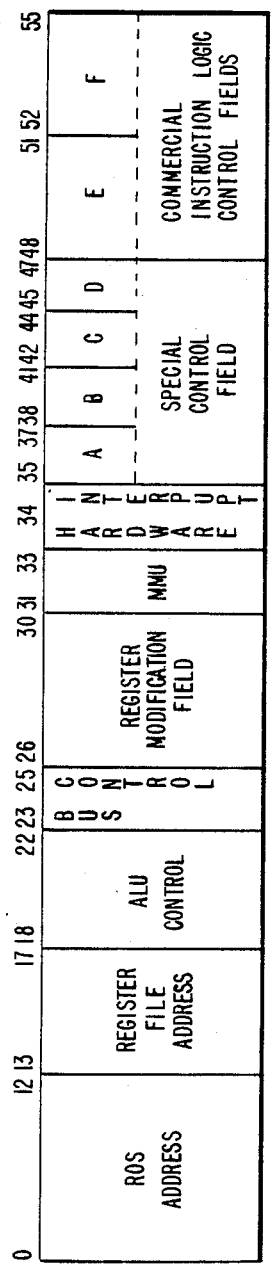
FIG. 5 illustrates the firmware microinstruction word fields of the microprocessor of FIG. 1 and the commercial instruction logic of FIG. 4.

During Phase A high time, the address for the selected register file is generated under control of the register file address field of the microinstruction (see FIG. 5). The selected register file is read out during Phase A high and its contents are latched in an output register (not shown in FIG. 2) during Phase A low. This output register is then available to two possible destinations, the A-port of ALU 83 (under control of the ALU control field of the microinstruction, RDDT bits 18 through 22) and the internal bus 38 (under control of special control field of the microinstruction, RDDT bits 35 through 41) (see FIG. 5).

The selected register file is written near the end of Phase A low time. The general command for writing the register file is supplied by RDDT bit 26 (register file load). This general command can be modified by certain special control field subcommands.

The register file description that follows is in terms of software visible registers of CPU 20.

There are seven 16-bit software addressable data registers, R1 through R7. They can be loaded from or stored into memory on either a word or byte basis. Each register can be used as operands in arithmetic, logical, and compare operations. R0 is a 16-bit register that is used to hold a copy of the executing software instruction. There are seven software-addressable base registers, B1 through B7. They are 20 bits wide and can be used to hold main memory addresses. B0 is a 20-bit working register used when CPU 20 is in a maintenance panel mode. Six 16-bit (DW1 through DW5) and five 20-bit (AW1 through AW5) work registers are available for temporary storage of information during firmware operations. The 16-bit registers are normally used to hold data and the 20-bit registers are normally used to hold memory addresses. AW1 is normally used as the "effective address" storage element for the currently executing software instruction. The T-register is the stack address register and is 20 bits wide. System keys and processor security keys are contained in the 16-bit S-register.

Field defines the CPU identification number to allow for multiprocessor systems. A 6-bit level field defines the interrupt priority on which the CPU is currently operating. Zero is the highest and 63 the lowest priority. The history register (H-register) is 20 bits wide. It contains the history of the program counter under firmware control. The remote descriptor base register (RDBR) is used by the commercial instruction logic 28. It is 20 bits wide. The I/O data register is a 16-bit data working register that can be used for temporary storage during I/O data transfer operations.

ALU 83 has full 16- or 20-bit capabilities. Overflow and carry functions are generated out of both the 16th and 20th bit positions. The 16-bit capability of the ALU is normally used when handling data, while the 20-bit capability is normally reserved for address modifications and transfers. The ALU 83 has two ports for operand inputs, the A-port and B-port. The A-port can accept either a 16-bit or 20-bit register file input. In the case where the register file selected is a 16-bit wide data register, the most significant bit is sign extended to 20 bits. The A-port can also select a value of zero as input as specified by the ALU control field of the microinstruction (RDDT bits 18 through 22) (see FIG. 5). The B-port can select as its inputs: 20 bits from the G-register, or 16, 8 or 7 bits right justified from the Q-register.

The most significant bit of the field selected from the Q-register port can also select a value of zero as its input.

The output of the ALU can be directed to either internal bus 38 or register file 82. When directed to the register file, its path can be direct (by special control field subcommands) or shifted left or right one bit position (also under control of special control field--all register file shift subcommands). The ALU output is directed to the internal bus 38 whenever there is no microcommand called to source the internal bus 38 (it is the default source for the internal bus 38).

The carry and overflow conditions for both 16- and 20-bit operations are stored in temporary flip-flops for testing using test branch microcommands during the following cycle.

The microprocessor 30 has the ability to perform various shift operations (i.e., open/closed, arithmetic/logical, left/right) on either 16-bit or 32-bit operands. Sixteen-bit data shifting can be accomplished in one of two ways. The first takes place from output of the ALU 83 into the register file 82 and the second takes place in the Q-register 85. These two operations can be concatenated to perform the 32-bit data shift operations.

Three shift microcommands are used to implement the software shift instructions of CPU 20. The shift microcommands are combined with the F-register 51 (see FIG. 3) decode (the F-register contains the software instruction word for this operation) to determine the shift type, direction, and necessary filler bits. The following Table 1 shows the decoded F-register bits and the corresponding shift type. In Table 1 the abbreviation "LE." means "less than or equal to" followed by the maximum number of bit positions that can be specified to be shifted. and the abbreviation "GE." means "greater than or equal to" followed by the maximum number of bit positions that can be specified to be shifted.

TABLE 1

F-Register Shift-Type Decoding

| F-Register Bits 8 Through 11 | Shift Type |
|---|---|
| 0 | Single open left shift |
| 1 | Single closed left shift |
| 2 | Single arithmetic left shift |
| 3 | Double closed left shift |
| 4 | Single open right shift |
| 5 | Single closed right shift |
| 6 | Single arithmetic right shift |
| 7 | Double closed right shift |
| 8 | Double open left shift (LE. 15) |
| 9 | Double open left shift (GE. 16) |
| A | Double arithmetic left shift (LE. 15) |
| B | Double arithmetic left shift (GE. 16) |
| C | Double open right shift (LE. 15) |
| D | Double open right shift (GE. 16) |
| E | Double arithmetic right shift (LE. 15) |
| F | Double arithmetic right shift (GE. 16) |

F-register bits 1 through 3 contain the R-register to be shifted, and F-register bits 12 through 15 or 11 through 15 contain the number of positions to be shifted. When F-register bit 8 equals a binary ZERO, the number of positions to be shifted is determined by F-register bits 12 through 15; and when F-register bit 8 equals a binary ONE, the number of positions to be shifted is contained in F-register bits 11 through 15. A special case exists when the count field contains a value of zero. In this case, the number of positions to be shifted is contained in register file location R1 (general purpose register).

When a double word is selected (i.e., F-register bits 8 through 11 equals a hexadecimal 3, 7, 8, 9, A, B, C, D, E, or F), then F-register bits 1 through 3 must equal a 3, 5, or 7. This is necessary because it requires a combination of an implied even-numbered register and an explicitly addressed odd-numbered register to perform a double-word shift operation. When register R3 is explicitly addressed, register R2 is the implied addressed register. The even-numbered register contains the most significant bits of the double word.

The I-register is eight bits wide, containing various single bit indicators in the following format:

Bit 0—Overflow indicator (OV): It is set when any of the data registers R1 through R7 overflow; e.g., when a 16-bit arithmetic result produced is larger than the capacity of the register (under op-code control, out of ALU).

Bit 1—Always a binary ZERO.

Bit 2—Carry indicator (C): This is set when the logical capacity of a register is exceeded. The carry indicator is generated from the ALU.

Bit 3—Bit test indicator (B): This bit gives the state of the last bit tested (primarily for bit test operations).

Bit 4—Input/output indicator (I): It indicates whether the last I/O command was accepted by the I/O controller.

Bit 5—Greater than (G) indicator.

Bit 6—Less than (L) indicator.

Bit 7—Unlike sign (U) indicator.

The G, L and U indicators are controlled by microcommands during the compare instructions and contain the result of the last compare operation executed. Typically, the comparison involves a register and a word from memory. The indicators show whether the register contents are greater than or less than the memory word.

The I-register can also be loaded from the right byte of internal bus 38, and its output goes to the right byte of internal bus with the left byte of the internal bus being set to binary ZERO bits.

The microprocessor 30 has a mode register (M-register) file 81 that has eight registers, each eight bits wide (8 by 8). This file 81 can be loaded from the internal bus 38 using a microcommand or sourced to the internal bus 38 using a second microcommand. When using either of these microcommands, the M-register address is supplied by the least significant three bits of the register file address register. When neither of these microcommands are called, the M-register address defaults to location 1 (M1 register).

M-register bits 1 through 7 of any M-register are testable, with the register file address field of the microinstruction (see FIG. 5) selecting the desired M-register, and the desired bit within the register being selected by a code of 1 through 7 in F-register bits (0 through 3). This causes the setting of a temporary flip-flop when a binary ONE is detected. Bit 0 of the selected M-register is sampled in each cycle by another temporary flip-flop. Testing of these temporary flip-flops is accomplished on the following cycle by using two subcommands.

The various mode registers (M0–M7) are settable by software instructions so that a software program can specify how certain conditions are to be handled when they arise during the program's execution. For example, setting bit 0 in M1 to a binary ONE indicates that all software branches and jumps are to cause a trap to an entry of a software routine that will trace the program's execution. Bits 1 to 7 in M1 are used to control the trapping if an overflow occurs in the corresponding data register R1 to R7 during arithmetic operations. Bit 0 of M3 controls the trapping of overflow when a commercial software instruction is executed and for bit 1 of M3 control trapping if truncation occurs during the execution of a commercial software instruction.

MICROPROCESSOR CONTROL AREA

Figure 3:
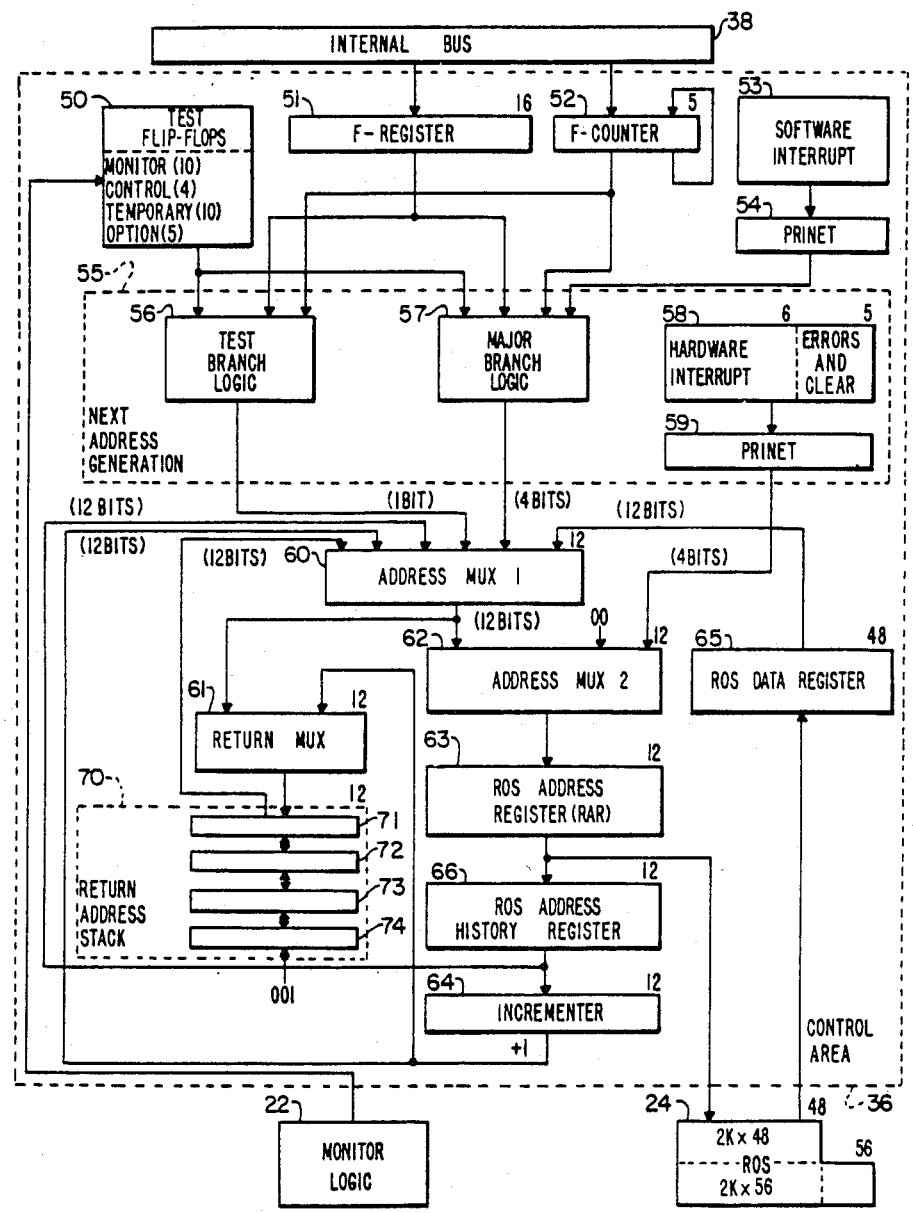
FIG. 3 is a block diagram of a portion of the control area of the microprocessor of FIG. 1.

Referring now to FIG. 3 which illustrates the control area 36 of FIG. 1 in greater detail. Control area 36 contains additional logic and circuitry, but for the purposes of the invention, the logic has been limited to that shown in FIG. 3 which is primarily concerned with addressing read only storage 24. In particular, control are 36 also includes the microinstruction decode logic (not shown in FIG. 3) which controls the enabling and gating of the logic elements and registers of microprocessor 30. FIG. 3 also illustrates internal bus 38, monitor logic 22 and read only storage (ROS) 24.

In FIG. 3, the number next to the upper right hand corner of the blocks represents the number of bits of information contained in the register represented by the block.

ROS 24 may be a read only memory (ROM) or a random access memory (RAM) or any other form of memory device capable of holding firmware microinstructions. The ROS 24 contains the firmware microinstructions (or control words) which are used by microprocessor 30 and eommercial instruction logic 28 to control the operation of central processing unit and more particularly to execute the software instructions of CPU 20. For each microprocessor machine cycle, a control word is fetched out of ROS 24.

ROS 24 is coupled to ROS data register 65 which receives bits 0-47 of the microinstruction word fetched from read only storage 24. Each microinstruction contains an address portion and a command portion. The address portion in the microinstruction word identifies the address of the next location to be read from read only storage 24 which will be the next microinstruction to be executed by microprocessor 30. The command portion of the microinstruction identifies the operations to be performed by the microprocessor 30 and commercial instruction logic 28 during the execution of the current microinstruction.

The address portion of the microinstruction word may be contained in a predetermined number of bits, for example, in the preferred embodiment it is contained in bits 0 through 12 of the microinstruction word (see FIG. 5). The command portion of the microinstruction may also be contained in a predetermined number of bits, for example, in the preferred embodiment it is contained in bits 13 through 47 which control the operation of microprocessor 30 and in bits 48 through 55 which, when present, along with bits 35 through 47 control the operation of commercial instruction logic 28 (see FIG. 5). The command portion may be further broken down into a number of fields which comprise subcommands of the microinstruction.

Before describing the microinstruction word in greater detail with respect to FIG. 5, the other elements of FIG. 3 will be described. Monitor logic 22 provides status information with respect to CPU 20 and is loaded into test flip-flops 50 such that the status may be tested by the firmware. In addition to holding ten bits of dynamic status information from monitor logic 22, test flip-flop 50 hold five bits which sample the status of various CPU options. The CPU option bits should be thought of as static in nature and indicate whether or not a specific hardware option is present or not within the data processing system. For example, one CPU option bit indicates whether or not the commercial instruction logic 28 is present in the system. In addition, test flip-flop 50 contains four control flip-flops (CF1-CF4) which are available to be set or reset or to have a bit transferred under control of the firmware. These four control flip-flops are testable by the firmware. There are also ten temporary flip-flops in flip-flops 50 which are loaded during each firmware cycle with dynamic information such as whether there has been a carry or overflow from bit 16 of the ALU or a carry or overflow from bit 20 of the ALU or whether certain bits on the internal bus 38 are equal to 0, etc. These ten temporary flip-flops are also testable by firmware.

The F-register 51 is a 16-bit instruction register that is loaded form internal bus 38. All bits of the F-register are testable by firmware. The low-order four bits of F-register 51 also constitute the low-order four bits of the five-bit counter F-counter 52. F-counter 52 is a five-bit counter that can be loaded form internal bus 38. F-counter 52 can be incremented or decremented. The four low-order bits of F-counter 52 are also decoded such that a 16-bit mask can be placed on internal bus 38 under firmware control.

There are five possible conditions that can cause a software interrupt. These conditions are latched in software interrupt register 53. Software interrupt prinet 54 prioritizes these conditions and generates a vectored address for input into major branch logic 57.

The next address generation section 55 of control area 36 contains the logic ecessary for sequencing the read only storage (ROS) 24. Test branch logic 56 is used to test 64 test conditions which can result in a 2-way branch address for ROS address register 63. These 64 test conditions are testable under firmware control and with the output of the test branch logic 56 being one bit of information into address multiplexer 1 60. Inputs to test branch logic 56 are provided by test flip-flops 50, F-register 51 and F-counter 52.

Major branch logic 57 provides 15 major test branch matrixes. The majority of the inputs to these matrixes are from F-register 51 (in various combinations). Other inputs are from the monitor and option bits of test flip-flops 50. The output of major branch logic 57 is four bits of address information which is provided to address multiplexer 1 60.

Register 58 provides the bits of information that correspond to the ten possible conditions that can cause a hardware interrupt. Hardware interrupt prinet 59 prioritizes these ten possible conditions and produces a four-bit output that is used by address multiplexer 2 62 to produce the 12-bit vectored hardware interrupt address when one of these ten possible conditions occur.

The output of address multiplexer 1 60 provides the 12-bit nominal next address which will be loaded into ROS address register 63 and used to fetch the next microinstruction from ROS 24. This 12-bit address is nominal in the sense that this nominal next address will be used as the next address only if a hardware interrupt does not occur. A hardware interrupt will not occur if no hardware interrupts are pending or if pending hardware interrupts are inhibited by the setting of the interrupt inhibit bit within the microinstruction word (see bit 34 in FIG. 5).

Address multiplexer 2 62 is used to select between the 12-bit nominal next address generated by multiplexer 1 60 and the vectored hardware interrupt address that is produced by combining the 4-bits from hardware interrupt prinet 59 with 8 leading 0 bits. The output of address multiplexer 2 62 is the 12-bit next address which is loaded into ROS address register (RAR) 63. The output of RAR 63 is used to provide the address of the next microinstruction to be fetched from ROS 24. The output of RAR 63 is also input to ROS address history register 66.

ROS address history register 66 is provided so that early in the execution of the current microinstruction contained in ROS data register 65, while the next microinstruction address is being developed and transferred to ROS address register 63, ROS address history register holds the address of the current microinstruction. This current microinstruction address is used in developing the next microinstruction address if the current microinstruction calls for its use. The current address from ROS address history register 66 is also used after being incremented by incrementer 64 as the return address from microsubroutines and hardware interrupt service routines.

Incrementer 64 increments by a predetermined number (e.g., by 1 in the preferred embodiment) the address contained in RAR address history register 66. Incrementer 64 is a 12-bit incrementer which will be used to source the return address stack 70 via return multiplexer 61 during a PUSH microcommand. The output of incrementar 64 is also used to provide the next ROS address value to RAR 63 for INC and INCK microcommands via address multiplexer 1 60 and address multiplexer 2 62. The INC microcommand specifies that the next ROS address is to be the current ROS address incremented by one and the INCK microcommand specifies that the next ROS address value is to be the current address value plus 1 and in addition a constant, as specified in other unused address field bits within the microinstruction, is to be placed on internal bus 38.

Return address stack 70 is a 4 by 12-bit last in first out (LIFO) array used for storing the return addresses of subroutines and hardware interrupts. Return address stack 70 is initialized to hexadecimal value of 001 during clear time and its bottom location is set to 001 (hexadecimal) during each POP (return) microcommand. A PUSH microcommand causes the top of return address stack 70 to be sourced by the output of incrementer 64. A hardware interrupt causes the top of stack 70 to be sourced by the output of address multiplexer 1 60, which is the nominal next address. Incrementer 64 transfers to return address stack 70 the incremented address history from ROS address history register 66 when one subfield of the next command portion of the ROS data register 65 specifies a PUSH microcommand. This PUSH microcommand enables the storing of the return address of the microprogram microinstruction that is being executed while branching to a microprogram subroutine.

In response to the PUSH microcommand, incrementer 64 provides that the incremented current ROS address from ROS address history register 66 to return address stack 70, which comprises a plurality of registers 71 through 74. Functionally, return address stack 70 is a push down storage device which comprises a plurality of work registers arrayed in a column. The only output from the stack is from top register 71 which is connected to address multiplexer 1 60. The only inputs return address stack 70 are from the top and bottom. When an address is pushed onto stack 70, it goes into register 71 after the other addresses already in the stack are pushed down the column one register. As an address is removed from the column (popped up), it is provided by top register 71 to address multiplexer 1 60 and each address stored in return address stack 70 moves up one hardware register in the column. During this pop operation, the bottom register 74, which is vacated, is loaded with the address 001 (hexadecimal). The stack can be visualized as a deck of cards, wherein access to the cards of the deck is only possible by adding or removing cards one at a time to or from the top of the deck and wherein a predetermined card (hexadecimal value 001) is added to the bottom of the deck as each card is removed from the top of the deck.

Return address stack 70 thus stores the incremented current address as is provided from ROS address history register 66 when the executing microprogram branches to a subroutine. In addition, return address stack 70 stores the nominal next address output by address multiplexer 1 60 whenever a hardware interrupt occurs which vectors the execution of the firmware to a predetermined location within ROS 24 as determined by the particular hardware interrupt that has occurred. These addresses stored in return address stack 70 point to the next step of the microprogram which would have been executed except for the occurrence of a branch to a microprogram subroutine or a branch to a microprogram interrupt handling routine. Since these addresses will be stored when a branch to a microprogram subroutine occurs, or when a hardware interrupt occurs, the addresses in return address stack 70 will, upon the execution of the last microinstruction in a subroutine or hardware interrupt handling routine return the microprogram to the proper sequence.

FIG. 5 illustrates the firmware microinstruction word fields of microprocessor 30 of the preferred embodiment. This microinstruction word is comprised of 56 bits (bits 0–55). Bits 0–47 which control microprocessor 30 will be discussed now with reference to FIG. 3 and bits 48–55 which control commercial instruction 28 will be discussed later with reference to FIG. 4. Bits 0 through 12 are used as the ROS address field, bits 13 through 17 are used to select registers in the register file, bits 18 through 22 are used to control the arithmetic and logic functions of the ALU and the inputs to its ports, bits 23 through 25 are used as bus control, bits 26 through 30 are used as a register modification field, bits 31 through 33 are used as memory management unit control, bit 34 is used to inhibit the occurrence of a hardwara interrupt and bits 35 through 47 are used as a special control field.

The special control field (RDDT bits 35 through 47) is used to modify as well as supplement certain of the other fields in the microinstruction firmware word. The special control field provides up to three simultaneous microcommands during a given microcycle. The special control field is divided into 4 subfields (A through D) as illustrated in FIG. 5. With the interpretation of some of the subfields dependent upon the contents of other subfields.

The 48 bits of the microinstructions are loaded into the ROS data register 65 at the beginning of the execution of the microinstruction. These 48 bits are referred to as signals RDDT00 through RDDT47.

The ROS address field contains 13 bits (RDDT00 through RDDT12) and is used to generate the address of the next firmware step in a given microprogram sequence. The method for generating this next address is defined by the first five bits of the ROS address field as shown below in Table 2.

TABLE 2

| ROS Address Field Microoperations | | | | | |
|---|---|---|---|---|---|
| RDDT Bits | | | | | |
| 0 | 1 | 2 | 3 | 4 | Operation |
| 1 | X | X | X | X | Jump |
| 0 | 1 | X | X | X | Test Branch |
| 0 | 0 | 1 | X | X | Major Branch |
| 0 | 0 | 0 | 1 | X | Increment With Constant |
| 0 | 0 | 0 | 0 | 1 | Increment Without Constant |
| 0 | 0 | 0 | 0 | 0 | Return (POP microcommand) |

A PUSH microcommand can be used in conjunction with any of the first five operations listed in Table 2. The PUSH microcommand, when used in combination with a jump or branch microcommand, allows the microprogrammer to store away into return address stack 70 a return address to which the microprogrammer will wish to return upon completion of the subroutine which was branched to. To facilitate the storing away of this return address by the person writing a microprogram, the PUSH microcommand pushes the contents of the ROS history address register 66 incremented by 1 by incrementer 64 onto the top of return address stack 70. The return (POP) microcommand is then used by the microprogrammer as the last firmware step of the called subroutine to return to the first location after the microinstruction which called the microprogram subroutine.

One exception to the next address generation being defined by the six operations described in Table 2 is that of a hardware interrupt. When a hardware interrupt is initiated, the next ROS address will be provided as a hardware vector and the ROS address generated by the ROS address field of the present firmware word will be placed on the top of the return address stack 70 by the output of address multiplexer 1 60 being selected as the output of return multiplexer 61 and pushed onto return address stack 70. If a PUSH microcommand (as specified by special control field C in bits RDDT42 through RDDT44 in conjunction with a special coding of subfields A and B) is used in conjunction with one of the first five operations shown in Table 2, then the microprogrammer must also inhibit hardware interrupts by specifying that RDDT bit 34 is a binary ONE in order to prevent a conflicting push operation being performed as the result of the occurrence of a hardware interrupt. Since a hardware interrupt can occur (normally by the occurrence of an external asynchronous event) at any time prior to the completion of a given firmware microprogram sequence, special consideration must be given to allow for the occurrence of a hardware interrupt.

The branching capabilities of the six operations defined in Table 2 are referred to as page branching and bank branching. A page is defined as 64 consecutive memory locations within ROS 24 and a bank is defined as 1024 memory locations within ROS 24 (16 Pages). The branch boundaries for the test branch operation is restricted to any location within a page. The branch boundaries for the major branch are restricted to any location within a bank. The remaining four operations of Table 2 are capable of branching or incrementing from one bank to another.

The jump operation is the only next address generation method of Table 2 that allows a branch to any of the possible 4096 locations of ROS 24. This is accomplished by providing, within the ROS address field, a 12-bit direct address of the next firmware microinstruction to be executed.

When RDDT bit 0 equals a binary ONE, RDDT bits 1 through 12 of the present ROS data word (firmware microinstruction) as contained in ROS data register 65 are delivered directly to ROS address register 63 via address multiplexer 1 60 and address multiplexer 2 62 as the next address in the firmware microprogram, assuming of course, no intervening hardware interrupt occurs. Should a hardware interrupt occur, this nominal next address would be pushed onto the top of return address stack 70 and the generated hardware interrupt vector address, as generated by concatenating eight high order binary ZERO bits with the four bit output of hardware interrupt prinet 59, as output by address multiplexer 2 62 will be loaded into ROS address register 63 as the next ROS address.

A PUSH microcommand (as defined by special control field C) can be used along with the jump operation. Hardware interrupt inhibit bit RDDT34 must be set to a binary ONE to inhibit hardware interrupts when the PUSH microcommand is used in conjunction with a jump operation. During a PUSH microcommand, the current ROS address held in ROS address history register 66 is incremented by 1 and pushed onto the top of return address stack 70 by return multiplexer 61 before the next address as specified in RDDT bits 1 through 12 is loaded into ROS address register 63.

The test branch operation of Table 2 is a two-way branch using the result of one of 64 test conditions specified as part of the ROS address field in bits 3 through 8. All test branches are restricted to branching within the current page, that is, the next ROS address generated as a result of the test will always be one of two locations (depending upon the results of the test: i.e., true or false) eight locations apart but within (64 locations) currently being address by ROS address register 63. That is, depending upon the results of the test branch, the next microinstruction will be fetched from the location determined by taking the six high-order bits from the current ROS address (from ROS address history register 66) concatenated with the six low-order bits which come from bits 2, 9, 10, 11 and 12 of the ROS address field which are used for bits positions 7, 8, 10, 11 and 12 respectively within the nominal next ROS address and with the result of the test (1 or 0 corresponding to true or false respectively) being used as bit position 9 within the nominal next ROS address.

This nominal next ROS address composed of the bits as described above, generated as the result of the test branch as specified in bits 0 through 13 in the current firmware microinstruction word, is the next ROS address assuming no intervening hardware interrupt occurs. Should a hardware interrupt occur, this address is placed on the top of return address stack 70 and the generated hardware interrupt vector address replaces it as the contents of the next ROS address in ROS address register 63.

The PUSH microcommand can also be used along with test branch operations. As indicated above, hardware interrupts must be inhibited (by setting RDDT bit 34 equal to a binary ONE) if the PUSH microcommand is used. If the PUSH microcommand is used in conjunction with a test branch operation, the current ROS address, which is the address of the test branch microinstruction (from ROS address history register 66) incremented by 1, will be placed on the top of return address stack 70 and the microprogram will branch to the nominal next address as determined by the output of test branch logic 56.

The major branch operation is a 16-way branch using the results of 15 test groups specified as part of the ROS address field in bits 5 through 8. All major branches are restricted to branching within the current bank (1024 locations). That is, the nominal next ROS address generated as a result of the major branch test will always be in one of 16 locations (depending on the output of the major branch matrix) 16 locations apart but within the bank (1024 locations) currently being addressed by ROS address history register 66. The nominal next ROS address is generated by taking bit 0 and 1 from the current ROS address and using them as bit 0 and 1 in the nominal next ROS address and taking bits 3, 4, 9, 10, 11 and 12 from the ROS address field and using them as bits 2, 3, 8, 9, 10 and 11 in the nominal next ROS address respectively. In addition, bits 4 through 7 in the nominal next ROS address are determined by the four-bit output by major branch logic 57.

The nominal next ROS address as described above is generated as the result of the major branch operation specified in bit 0 through 12 of the current firmware microinstruction word contained in ROS data register 65 is the next ROS address assuming that no intervening hardware interrupt occurs. Should a hardware interrupt occur, this newly generated nominal next ROS address will be placed on top of the return address stack 70 and the generated hardware interrupt vector address replaces it as the next ROS address in RAR 63.

As in the case of test branch operation, the PUSH microcommand can be used along with major branch operations. Again, as indicated above, hardware interrupts must be inhibited by setting bit RDDT34 to a binary ONE. If a PUSH microcommand is used in conjunction with a major branch operation, the current ROS address which is the address of the major branch microinstruction itself (from ROS address history register 66) plus 1 will be placed on top of the return address stack 70 and the microprogram will branch to the nominal next address as determined by the output of major branch logic 57.

The incrementing with a constant operation (INCK microcommand) as specified in ROS address field (bit 0 through 3 of the 13-bit field) of the current microinstruction causes the current value of the ROS address history register 66 incremented by 1 to be placed in the ROS address register for the next microcycle. In addition to this next address generation, the remaining 9 bits (RDOT bits 4 through 12) are used to generate an 8-bit constant plus a filler to the 20-bit wide internal bus 38 during the current microcycle.

The current ROS address contained in ROS address history register 66 is incremented by incrementer 64 and the result is returned to the ROS address register 63 via address multiplexer 1 60 and address multiplexer 2 62 when an increment with constant microcommand is specified in the ROS address field of a microinstruction. Should a hardware interrupt occur, this newly generated next address will be placed on the top of return address stack 70 via return multiplexer 61 and the hardware generated interrupt vector address will be placed in ROS address register 63 to be used as the next ROS address. The PUSH subcommand can be used along with the increment operations. As with all PUSH subcommands, the hardware interrupts must be inhibited by setting RDDT bit 34 to a binary ONE when using a PUSH subcommand in conjunction with an increment operation. If a PUSH microcommand is used in conjunction with an increment operation, the current ROS address incremented by one will be placed on the top of return address stack 70, in addition to becoming the next ROS address.

The increment operation (INC) subcommand as specified in the ROS address field of the microinstruction initiates the same operation as described above for the increment with constant (INCK microcommand) operation except that no constant is generated onto internal bus 38.

The return operation (POP microcommand) causes the contents of the top of return address stack 70 to be loaded into ROS address register 63 via address multiplexer 1 60 and address multiplexer 2 62 to be used as the ROS address for the next microcycle. In addition, a ROS address of 001 (hexadecimal) is loaded into the bottom of the stack into register 74 each time return address stack 70 is popped one location. This loading of the bottom of return address stack 70 with the ROS address of 1 is used to detect the case of overpopping of the stack. The overpopping of the stack will result in the microprocessor being vectored to microprogram error sequence which begins at ROS location 1. Because a return operation (POP microcommand) is fully specified by bit 0 through 4 of the ROS address field, bits 5 through 12 of the ROS address field are unused as part of the return operation.

When a return operation is specified in bit 0 through 4 of the ROS address field, ROS address register 63 receives the contents of the top of return address stack assuming no intervening hardware interrupt occurs. Should a hardware interrupt occur, the return (or pop) operation will effectively be bypassed or cancelled. This cancelling of the pop stack operation when a hardware interrupt occurs during a return operation is the logical equivalent of the popping the return address from the top of return address stack 70 and immediately, within the same microcycle, pushing it back onto the top of return address stack 70. It is this cancelling or bypassing of popping return address stack 70 when a hardware interrupt occurs during a return operation that allows the return address stack to be used to contain the return addresses for both microprogram subroutine calls and for hardware interrupts.

By having the push operation onto the stack associated with storing the return address for the hardware interrupt routine cancel the pop operation performed on the stack when returning from a microprogram subroutine or upon completion of a hardware interrupt service routine, the return address stack 70 does not have to be able to simultaneously move in opposite directions or to first pop up and then push down during one microcycle. This cancelling of the stack pop operation associated with a return operation by the occurrence of the push operation associated with the occurrence of a hardware interrupt does not adversely affect the flow of control within the microprogram because the hardware interrupt routine will perform a return operation as the last step in its microprogrammed interrupt service routine.

The PUSH microcommand which is coded in the special control field (RDDT bits 35 through 47) must not be used in the same microinstruction with a return operation which is coded within the ROS address field (RDDT bit 0 through 12) because the results within microprocessor 30 in the preferred embodiment are unspecified.

As described above, a hardware interrupt forces a branch to a fixed ROS address. This ROS address is determined by a priority network (prinet 59) which has various error signals and interrupt requests as inputs from register 58. Hardware interrupts cause the next firmware generated ROS address to be pushed onto the top of return address stack 70. If the next ROS address was to have been generated from the return address stack via a return microcommand, popping of the return address stack 70 is inhibited. Hardware interrupts must be inhibited whenever a PUSH micro-operation is performed in order to prevent the requirement to doubly push the stack, the first push being associated with the PUSH microcommand itself and the second push being associated with the saving of the return address for the hardware interrupt.

When the hardware interrupt inhibit field (RDDT bit 34) is a binary ONE, hardware interrupts are inhibited, non-error condition hardware interrupts (such as those associated with memory refresh and data request) are inhibited (prevented from intervening between the execution of the current microinstruction and the execution of the next microinstruction). Hardware error condition inputs to prinet 59 (such as system clear, an attempt to access a nonexistent resource, an access violation, or a memory parity error) are not under the control of RDDT bit 34 and can intervene between any two given microcycles. The fact that hardware interrupts associated with these error conditions can not be inhibited and therefore could occur during a microinstruction which contains a PUSH microcommand does not cause a problem, because the hardware interrupt service routines associated with these noninhibitable error conditions does not do a return operation at the end and therefore do not depend upon the contents of return address stack 70 to be valid. When RDDT bit 34 is a binary ZERO, all hardware interrupts are allowed.

COMMERCIAL INSTRUCTION LOGIC OVERVIEW

Figure 4:
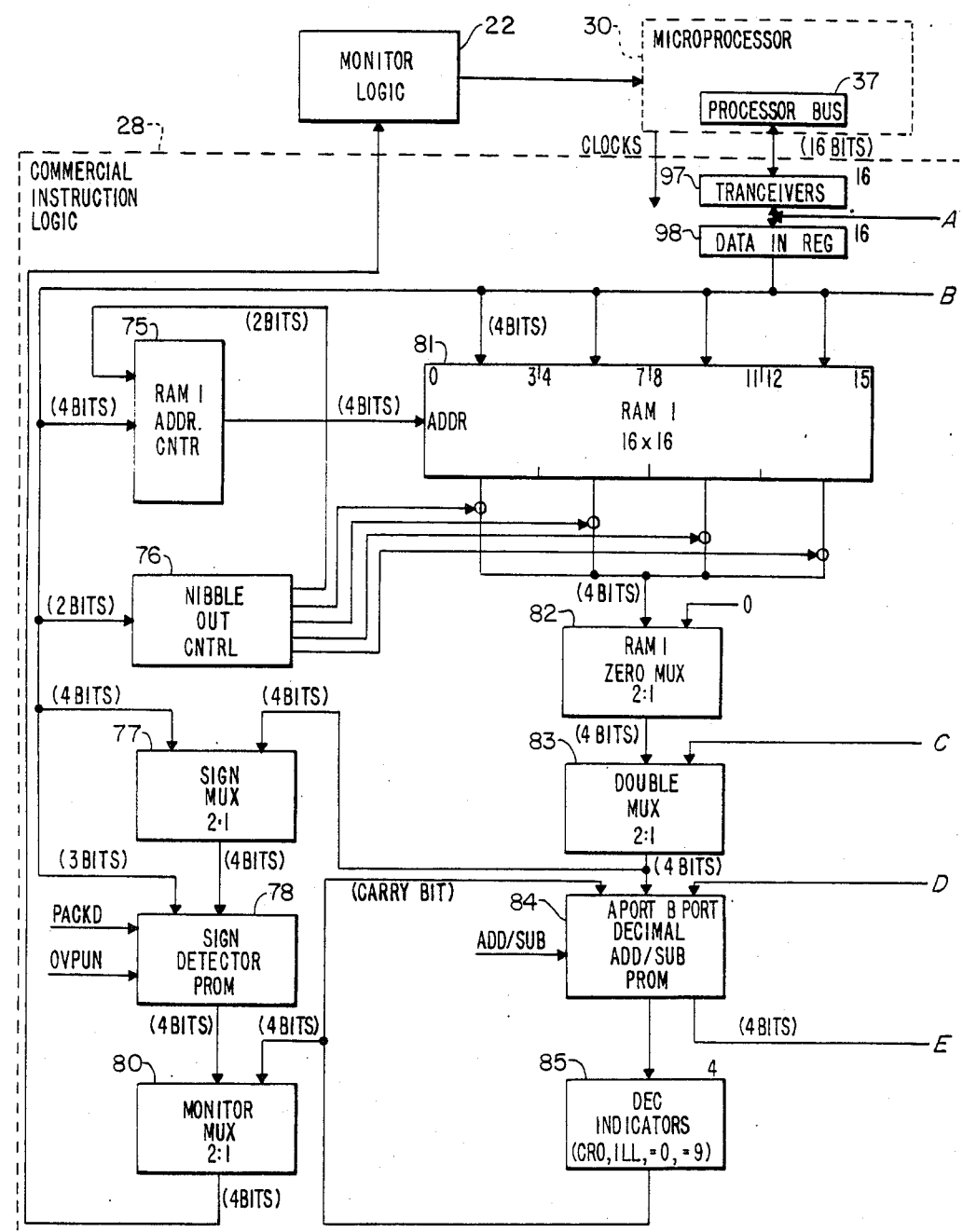
FIG. 4 is a block diagram of the commercial instruction logic of FIG. 1 which carries out the principles of the present invention.
Figure 4:
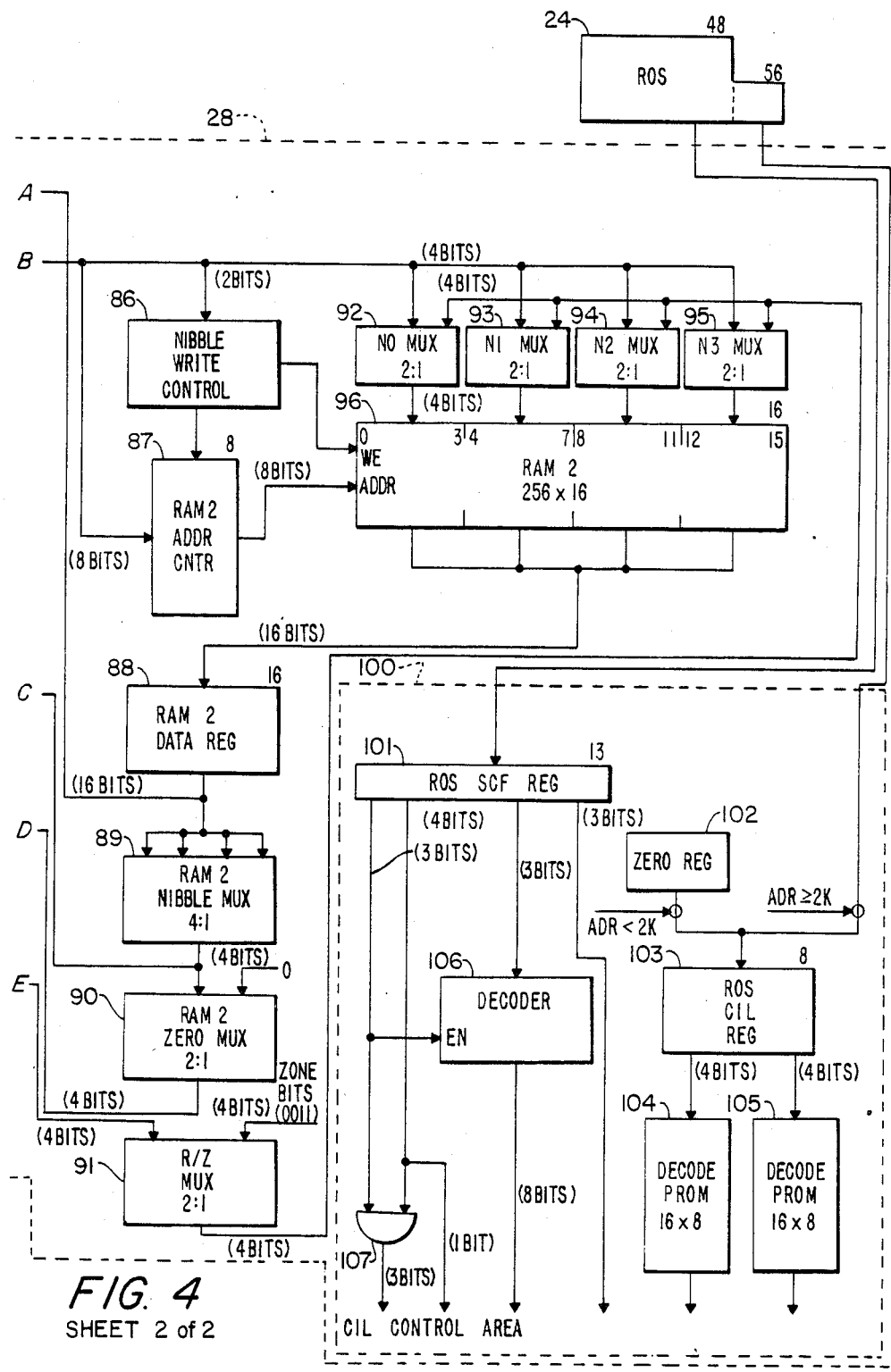

Referring now to FIG. 4 which illustrates the instruction logic 28, of FIG. 1 in greater detail. FIG. 4 also illustrates microprocessor 30, read-only storage 24 and monitor logic 22.

In FIG. 4, the number next to the upper right-hand corner of the blocks represents the number of bits of information contained in the register represented by the block and the numbers within parentheses next to signal lines represents the number of parallel signals transmitted over the signal path.

As indicated above, commercial instruction logic 28 is used in conjunction with microprocessor 30 to perform the commercial software instructions of CPU 20 which do decimal arithmetic operations on decimal data and editing operations on alphanumeric data strings. Commercial instruction logic 28 consists primarily of random access memory (RAM) 1 81, RAM 2 96 and decimal adder/subtractor PROM 84, all of which operate under the control of CIL control area 100. As will be described in greater detail below, CIL control area 100 is used to decode the bits within the firmware microinstruction word which control commercial instruction logic 28. In particular, CIL control area receives bits 35 through 47 of the microinstruction firmware word shown as the special control field in FIG. 5, which are also used to control the operation of microprocessor 30 and in addition it receives bits 48 through 55 which are dedicated to the control of commercial instruction logic 28. Decoding of these microinstruction bits associated with the commercial instruction logic is performed by CIL control area 100 which produces control signals which are distributed throughout commercial instruction logic 28 to control the enabling and disabling and the selection of the various registers, gates and multiplexers.

Data is transmitted between microprocessor 30 and commercial instruction logic 28 over a 16-bit wide data path which connects processor bus 37 of microprocessor 30 to transceivers 97. The output of transceivers 97 can be latched into data-in register 98 which is also 16 bits wide.

As can be seen in FIG. 4, transceivers 97 can not only load data-in register 98 from the output of processor bus 37, but can also be used to transfer the output of RAM 2 data register 88 from transceivers 97 to processor bus 37. This data path from the output of RAM 2 data register 88 which is 16 bits wide, besides being connected into transceivers 97 can also be used to load data-in register 98 and thereby provide the means for loading the output of RAM 2 96 into RAM 1 81 or back into RAM 2 96. When commercial instruction logic 28 is used to perform a commercial software instruction which requires two operands, operand 1 is usually stored in RAM 1 81 and operand 2 is stored in RAM 2 96 and the output of the operation is stored back into RAM 2 96.

As indicated, the arithmetic and logic unit functions of commercial instruction logic 28 are performed by decimal adder/subtractor PROM 84. PROM 84 generatas the result by using its four inputs (2 4-bit operands, 1 bit of carry-in and a 1-bit indicator indicating whether this is an add or subtract operation) to form a 10-bit address which is used to fetch an 8-bit data word which contains a 4-bit arithmetic result of the addition or subtraction and four indicators (one bit of carry-out, one bit to indicate whether one of the operands is an illegal value, a bit indicating whether the result is equal to zero, and a bit indicating whether the result is equal to nine). The coding of decimal adder/subtractor PROM 84 is shown in Table 3.

Table 3 shows the encoding of the 10-bit address. The most significant bit in the 10-bit address, which has a value of 512, is used as an indicator as to whether the operation being performed is an addition or subtraction. Thus, when address bit 512 is equal to a binary ZERO, a subtraction is to be performed, and when equal to a binary ONE, an addition is to be performed. The next address bit, having a value of 256, is used to indicate whether a carry in from the previous decimal digit is to be used in calculating the result and when a binary ZERO indicates that the previous digit did not generate a carry-out and when a binary ONE indicates that the previous digit did generate a carry-out. The next four address bits, bits having a value of 128, 64, 32 and 16, are used to represent the four bits of operand 2 at the B port of decimal ALU 84 and the last four bits having values of 8, 4, 2 and 1 are used to indicate the values of operand 1 at the A port of decimal ALU 84. The 8-bit data word retrieved form PROM 1 as addressed by the 10-bit address is coded with the result as indicated in Table 3. The four lower bits of the data word (bits 3 through 0) contain the 4-bit decimal result of the addition or subtraction. The other four bits of the data word contain the four indicators which are output by decimal adder/subtractor PROM 84.

The 4-bit indicators are encoded such that bit 7 of the data word (labeled "CRO" in Table 3), when a binary ZERO, indicates that there is no carry-out and, when a binary ONE, indicates that there was a carry-out. Bit 6 (labeled "ILL" in Table 3), when a binary ZERO, indicates that both operand 1 and operand 2 were legal decimal values and when a binary ONE, indicates that one or the other of operand 1 or operand 2 contained an illegal decimal value (i.e., a hexadecimal value of from A through F), bit 5 (labeled "E0" in Table 3) indicates when a binary ONE that the arithmetic result is equal to zero and when a binary ZERO that the arithmetic result is not equal to zero, and bit 4 (labeled "E9" in Table 3) when a binary ONE indicates that the arithmetic result equal nine and when a binary ZERO indicates that the arithmetic result does not equal nine. As can be seen in FIG. 4, the four indicator bits are held by decimal indicators 85 and are also an input into monitor multiplexer 80 and the carry-out bit is input into decimal adder/subtractor 84 as the carry-in bit. The 4-bit decimal arithmetic result is one input into result/zone multiplexer 91.

TABLE 3

Decimal Add/Subtract PROM Encoding

| 10 ADDRESS BITS | | | | 8 DATA BITS | | | | |
|---|---|---|---|---|---|---|---|---|
| | | | | 3 2 1 0 | 7 | 6 | 5 | 4 |
| 512 | 256 | 128 64 32 16 | 8 4 2 1 | DECIMAL | INDICATORS | | | |
| ADD | CRI | OP2 | OP1 | RESULT | CRO | ILL | E0 | E9 |
| 0 | 0 | 0 | 0 | 0 | 0 | 0 | 1 | 0 |
| 0 | 0 | 0 | 1 | 9 | 1 | 0 | 0 | 1 |
| 0 | 0 | 0 | 2-9 | 8-1 | 1 | 0 | 0 | 0 |
| 0 | 0 | 0 | A-F | A-F | 0 | 1 | 0 | 0 |
| 0 | 0 | 1 | 0 | 1 | 0 | 0 | 0 | 0 |
| 0 | 0 | 1 | 1 | 0 | 0 | 0 | 1 | 0 |
| 0 | 0 | 1 | 2 | 9 | 1 | 0 | 0 | 1 |
| 0 | 0 | 1 | 3-9 | 8-2 | 1 | 0 | 0 | 0 |
| 0 | 0 | 1 | A-F | A-F | 0 | 1 | 0 | 0 |
| 0 | 0 | 2 | 0-1 | 2-1 | 0 | 0 | 0 | 0 |
| 0 | 0 | 2 | 2 | 0 | 0 | 0 | 1 | 0 |
| 0 | 0 | 2 | 3 | 9 | 1 | 0 | 0 | 1 |
| 0 | 0 | 2 | 4-9 | 8-3 | 1 | 0 | 0 | 0 |
| 0 | 0 | 2 | A-F | A-F | 0 | 1 | 0 | 0 |
| 0 | 0 | 3 | 0-2 | 3-1 | 0 | 0 | 0 | 0 |
| 0 | 0 | 3 | 3 | 0 | 0 | 0 | 1 | 0 |
| 0 | 0 | 3 | 4 | 9 | 1 | 0 | 0 | 1 |
| 0 | 0 | 3 | 5-9 | 8-4 | 1 | 0 | 0 | 0 |
| 0 | 0 | 3 | A-F | A-F | 0 | 1 | 0 | 0 |
| 0 | 0 | 4 | 0-3 | 4-1 | 0 | 0 | 0 | 0 |
| 0 | 0 | 4 | 4 | 0 | 0 | 0 | 1 | 0 |
| 0 | 0 | 4 | 5 | 9 | 1 | 0 | 0 | 1 |
| 0 | 0 | 4 | 6-9 | 8-5 | 1 | 0 | 0 | 0 |
| 0 | 0 | 4 | A-F | A-F | 0 | 1 | 0 | 0 |
| 0 | 0 | 5 | 0-4 | 5-1 | 0 | 0 | 0 | 0 |
| 0 | 0 | 5 | 5 | 0 | 0 | 0 | 1 | 0 |
| 0 | 0 | 5 | 6 | 9 | 1 | 0 | 0 | 1 |
| 0 | 0 | 5 | 7-9 | 8-6 | 1 | 0 | 0 | 0 |
| 0 | 0 | 5 | A-F | A-F | 0 | 1 | 0 | 0 |
| 0 | 0 | 6 | 0-5 | 6-1 | 0 | 0 | 0 | 0 |
| 0 | 0 | 6 | 6 | 0 | 0 | 0 | 1 | 0 |
| 0 | 0 | 6 | 7 | 9 | 1 | 0 | 0 | 1 |
| 0 | 0 | 6 | 8-9 | 8-7 | 1 | 0 | 0 | 0 |
| 0 | 0 | 6 | A-F | A-F | 0 | 1 | 0 | 0 |
| 0 | 0 | 7 | 0-6 | 7-1 | 0 | 0 | 0 | 0 |
| 0 | 0 | 7 | 7 | 0 | 0 | 0 | 1 | 0 |
| 0 | 0 | 7 | 8 | 9 | 1 | 0 | 0 | 1 |
| 0 | 0 | 7 | 9 | 8 | 1 | 0 | 0 | 0 |
| 0 | 0 | 7 | A-F | A-F | 0 | 1 | 0 | 0 |
| 0 | 0 | 8 | 0-7 | 8-1 | 0 | 0 | 0 | 0 |
| 0 | 0 | 8 | 8 | 0 | 0 | 0 | 1 | 0 |
| 0 | 0 | 8 | 9 | 9 | 1 | 0 | 0 | 1 |
| 0 | 0 | 8 | A-F | A-F | 0 | 1 | 0 | 0 |
| 0 | 0 | 9 | 0 | 9 | 0 | 0 | 0 | 1 |
| 0 | 0 | 9 | 1-8 | 8-1 | 0 | 0 | 0 | 0 |
| 0 | 0 | 9 | 9 | 0 | 0 | 0 | 1 | 0 |
| 0 | 0 | 9 | A-F | A-F | 0 | 1 | 0 | 0 |
| 0 | 0 | A | 0-9 | A | 0 | 1 | 0 | 0 |
| 0 | 0 | A | A | A | 0 | 1 | 1 | 0 |
| 0 | 0 | A | B-F | A | 0 | 1 | 0 | 0 |
| 0 | 0 | B | 0-A | B | 0 | 1 | 0 | 0 |
| 0 | 0 | B | B | B | 0 | 1 | 1 | 0 |
| 0 | 0 | B | C-F | B | 0 | 1 | 0 | 0 |
| 0 | 0 | C | 0-B | C | 0 | 1 | 0 | 0 |
| 0 | 0 | C | C | C | 0 | 1 | 1 | 0 |
| 0 | 0 | C | D-F | C | 0 | 1 | 0 | 0 |
| 0 | 0 | D | 0-C | D | 0 | 1 | 0 | 0 |
| 0 | 0 | D | D | D | 0 | 1 | 1 | 0 |
| 0 | 0 | D | E-F | D | 0 | 1 | 0 | 0 |
| 0 | 0 | E | 0-D | E | 0 | 1 | 0 | 0 |
| 0 | 0 | E | E | E | 0 | 1 | 1 | 0 |

TABLE 3-continued

Decimal Add/Subtract PROM Encoding

| 10 ADDRESS BITS | | | | 8 DATA BITS | | | | |
|---|---|---|---|---|---|---|---|---|
| | | | | 3 2 1 0 | 7 | 6 | 5 | 4 |
| 512 | 256 | 128 64 32 16 | 8 4 2 1 | DECIMAL | INDICATORS | | | |
| ADD | CRI | OP2 | OP1 | RESULT | CRO | ILL | E0 | E9 |
| 0 | 0 | E | F | E | 0 | 1 | 0 | 0 |
| 0 | 0 | F | 0-E | F | 0 | 1 | 0 | 0 |
| 0 | 0 | F | F | F | 0 | 1 | 1 | 0 |
| 0 | 1 | 0 | 0 | 9 | 1 | 0 | 0 | 1 |
| 0 | 1 | 0 | 1-8 | 8-1 | 1 | 0 | 0 | 0 |
| 0 | 1 | 0 | 9 | 0 | 1 | 0 | 1 | 0 |
| 0 | 1 | 0 | A-F | A-F | 0 | 1 | 0 | 0 |
| 0 | 1 | 1 | 0 | 0 | 0 | 0 | 1 | 0 |
| 0 | 1 | 1 | 1 | 9 | 1 | 0 | 0 | 1 |
| 0 | 1 | 1 | 2-9 | 8-1 | 1 | 0 | 0 | 0 |
| 0 | 1 | 1 | A-F | A-F | 0 | 1 | 0 | 0 |
| 0 | 1 | 2 | 0 | 1 | 0 | 0 | 0 | 0 |
| 0 | 1 | 2 | 1 | 0 | 0 | 0 | 1 | 0 |
| 0 | 1 | 2 | 2 | 9 | 1 | 0 | 0 | 1 |
| 0 | 1 | 2 | 3-9 | 8-2 | 1 | 0 | 0 | 0 |
| 0 | 1 | 2 | A-F | A-F | 0 | 1 | 0 | 0 |
| 0 | 1 | 3 | 0-1 | 2-1 | 0 | 0 | 0 | 0 |
| 0 | 1 | 3 | 2 | 0 | 0 | 0 | 1 | 0 |
| 0 | 1 | 3 | 3 | 9 | 1 | 0 | 0 | 1 |
| 0 | 1 | 3 | 4-9 | 8-3 | 1 | 0 | 0 | 0 |
| 0 | 1 | 3 | A-F | A-F | 0 | 1 | 0 | 0 |
| 0 | 1 | 4 | 0-2 | 3-1 | 0 | 0 | 0 | 0 |
| 0 | 1 | 4 | 3 | 0 | 0 | 0 | 1 | 0 |
| 0 | 1 | 4 | 4 | 9 | 1 | 0 | 0 | 1 |
| 0 | 1 | 4 | 5-9 | 8-4 | 1 | 0 | 0 | 0 |
| 0 | 1 | 4 | A-F | A-F | 0 | 1 | 0 | 0 |
| 0 | 1 | 5 | 0-3 | 4-1 | 0 | 0 | 0 | 0 |
| 0 | 1 | 5 | 4 | 0 | 0 | 0 | 1 | 0 |
| 0 | 1 | 5 | 5 | 9 | 1 | 0 | 0 | 1 |
| 0 | 1 | 5 | 6-9 | 8-5 | 1 | 0 | 0 | 0 |
| 0 | 1 | 5 | A-F | A-F | 0 | 1 | 0 | 0 |
| 0 | 1 | 6 | 0-4 | 5-1 | 0 | 0 | 0 | 0 |
| 0 | 1 | 6 | 5 | 0 | 0 | 0 | 1 | 0 |
| 0 | 1 | 6 | 6 | 9 | 1 | 0 | 0 | 1 |
| 0 | 1 | 6 | 7-9 | 8-6 | 1 | 0 | 0 | 0 |
| 0 | 1 | 6 | A-F | A-F | 0 | 1 | 0 | 0 |
| 0 | 1 | 7 | 0-5 | 6-1 | 0 | 0 | 0 | 0 |
| 0 | 1 | 7 | 6 | 0 | 0 | 0 | 1 | 0 |
| 0 | 1 | 7 | 7 | 9 | 1 | 0 | 0 | 1 |
| 0 | 1 | 7 | 8-9 | 8-7 | 1 | 0 | 0 | 0 |
| 0 | 1 | 7 | A-F | A-F | 0 | 1 | 0 | 0 |
| 0 | 1 | 8 | 0-6 | 7-1 | 0 | 0 | 0 | 0 |
| 0 | 1 | 8 | 7 | 0 | 0 | 0 | 1 | 0 |
| 0 | 1 | 8 | 8 | 9 | 1 | 0 | 0 | 1 |
| 0 | 1 | 8 | 9 | 8 | 1 | 0 | 0 | 0 |
| 0 | 1 | 8 | A-F | A-F | 0 | 1 | 0 | 0 |
| 0 | 1 | 9 | 0-7 | 8-1 | 0 | 0 | 0 | 0 |
| 0 | 1 | 9 | 8 | 0 | 0 | 0 | 1 | 0 |
| 0 | 1 | 9 | 9 | 9 | 1 | 0 | 0 | 1 |
| 0 | 1 | 9 | A-F | A-F | 0 | 1 | 0 | 0 |
| 0 | 1 | A | 0-9 | A | 0 | 1 | 0 | 0 |
| 0 | 1 | A | A | A | 0 | 1 | 1 | 0 |
| 0 | 1 | A | B-F | A | 0 | 1 | 0 | 0 |
| 0 | 1 | B | 0-A | B | 0 | 1 | 0 | 0 |
| 0 | 1 | B | B | B | 0 | 1 | 1 | 0 |
| 0 | 1 | B | C-F | B | 0 | 1 | 0 | 0 |
| 0 | 1 | C | 0-B | C | 0 | 1 | 0 | 0 |
| 0 | 1 | C | C | C | 0 | 1 | 1 | 0 |
| 0 | 1 | C | D-F | C | 0 | 1 | 0 | 0 |
| 0 | 1 | D | 0-C | D | 0 | 1 | 0 | 0 |
| 0 | 1 | D | D | D | 0 | 1 | 1 | 0 |
| 0 | 1 | D | E-F | D | 0 | 1 | 0 | 0 |
| 0 | 1 | E | 0-D | E | 0 | 1 | 0 | 0 |
| 0 | 1 | E | E | E | 0 | 1 | 1 | 0 |
| 0 | 1 | E | F | E | 0 | 1 | 0 | 0 |
| 0 | 1 | F | 0-E | F | 0 | 1 | 0 | 0 |
| 0 | 1 | F | F | F | 0 | 1 | 1 | 0 |
| 1 | 0 | 0 | 0 | 0 | 0 | 0 | 1 | 0 |
| 1 | 0 | 0 | 1-9 | 1-9 | 0 | 0 | 0 | 0 |
| 1 | 0 | 0 | A-F | A-F | 0 | 1 | 0 | 0 |
| 1 | 0 | 1 | 0-8 | 1-9 | 0 | 0 | 0 | 0 |
| 1 | 0 | 1 | 9 | 0 | 1 | 0 | 1 | 0 |
| 1 | 0 | 1 | A-F | A-F | 0 | 1 | 0 | 0 |
| 1 | 0 | 2 | 0-7 | 2-9 | 0 | 0 | 0 | 0 |
| 1 | 0 | 2 | 8 | 0 | 1 | 0 | 1 | 0 |
| 1 | 0 | 2 | 9 | 1 | 1 | 0 | 0 | 0 |

TABLE 3-continued
Decimal Add/Subtract PROM Encoding

| 10 ADDRESS BITS | | | | 8 DATA BITS | | | | |
|---|---|---|---|---|---|---|---|---|
| 512 | 256 | 128 64 32 16 | 8 4 2 1 | 3 2 1 0 | 7 | 6 | 5 | 4 |
| ADD | CRI | OP2 | OP1 | DECIMAL RESULT | CRO | ILL | E0 | E9 |
| 1 | 0 | 2 | A-F | A-F | 0 | 1 | 0 | 0 |
| 1 | 0 | 3 | 0-6 | 3-9 | 0 | 0 | 0 | 0 |
| 1 | 0 | 3 | 7 | 0 | 1 | 0 | 1 | 0 |
| 1 | 0 | 3 | 8-9 | 1-2 | 1 | 0 | 0 | 0 |
| 1 | 0 | 3 | A-F | A-F | 0 | 1 | 0 | 0 |
| 1 | 0 | 4 | 0-5 | 4-9 | 0 | 0 | 0 | 0 |
| 1 | 0 | 4 | 6 | 0 | 1 | 0 | 1 | 0 |
| 1 | 0 | 4 | 7-9 | 1-3 | 1 | 0 | 0 | 0 |
| 1 | 0 | 4 | A-F | A-F | 0 | 1 | 0 | 0 |
| 1 | 0 | 5 | 0-4 | 5-9 | 0 | 0 | 0 | 0 |
| 1 | 0 | 5 | 5 | 0 | 1 | 0 | 1 | 0 |
| 1 | 0 | 5 | 6-9 | 1-4 | 1 | 0 | 0 | 0 |
| 1 | 0 | 5 | A-F | A-F | 0 | 1 | 0 | 0 |
| 1 | 0 | 6 | 0-3 | 6-9 | 0 | 0 | 0 | 0 |
| 1 | 0 | 6 | 4 | 0 | 1 | 0 | 1 | 0 |
| 1 | 0 | 6 | 5-9 | 1-5 | 1 | 0 | 0 | 0 |
| 1 | 0 | 6 | A-F | A-F | 0 | 1 | 0 | 0 |
| 1 | 0 | 7 | 0-2 | 7-9 | 0 | 0 | 0 | 0 |
| 1 | 0 | 7 | 3 | 0 | 1 | 0 | 1 | 0 |
| 1 | 0 | 7 | 4-9 | 1-6 | 1 | 0 | 0 | 0 |
| 1 | 0 | 7 | A-F | A-F | 0 | 1 | 0 | 0 |
| 1 | 0 | 8 | 0-1 | 8-9 | 0 | 0 | 0 | 0 |
| 1 | 0 | 8 | 2 | 0 | 1 | 0 | 1 | 0 |
| 1 | 0 | 8 | 3-9 | 1-7 | 1 | 0 | 0 | 0 |
| 1 | 0 | 8 | A-F | A-F | 0 | 1 | 0 | 0 |
| 1 | 0 | 9 | 0 | 9 | 0 | 0 | 0 | 0 |
| 1 | 0 | 9 | 1 | 0 | 1 | 0 | 1 | 0 |
| 1 | 0 | 9 | 2-9 | 1-8 | 1 | 0 | 0 | 0 |
| 1 | 0 | 9 | A-F | A-F | 0 | 1 | 0 | 0 |
| 1 | 0 | A | 0-9 | A | 0 | 1 | 0 | 0 |
| 1 | 0 | A | A | A | 0 | 1 | 1 | 0 |
| 1 | 0 | A | B-F | A | 0 | 1 | 0 | 0 |
| 1 | 0 | B | 0-A | B | 0 | 1 | 0 | 0 |
| 1 | 0 | B | B | B | 0 | 1 | 1 | 0 |
| 1 | 0 | B | C-F | B | 0 | 1 | 0 | 0 |
| 1 | 0 | C | 0-B | C | 0 | 1 | 0 | 0 |
| 1 | 0 | C | C | C | 0 | 1 | 1 | 0 |
| 1 | 0 | C | D-F | C | 0 | 1 | 0 | 0 |
| 1 | 0 | D | 0-C | D | 0 | 1 | 0 | 0 |
| 1 | 0 | D | D | D | 0 | 1 | 1 | 0 |
| 1 | 0 | D | E-F | D | 0 | 1 | 0 | 0 |
| 1 | 0 | E | 0-D | E | 0 | 1 | 0 | 0 |
| 1 | 0 | E | E | E | 0 | 1 | 1 | 0 |
| 1 | 0 | E | F | E | 0 | 1 | 0 | 0 |
| 1 | 0 | F | 0-E | F | 0 | 1 | 0 | 0 |
| 1 | 0 | F | F | F | 0 | 1 | 1 | 0 |
| 1 | 1 | 0 | 0-8 | 1-9 | 0 | 0 | 0 | 0 |
| 1 | 1 | 0 | 9 | 0 | 1 | 0 | 1 | 0 |
| 1 | 1 | 0 | A-F | A-F | 0 | 1 | 0 | 0 |
| 1 | 1 | 1 | 0-7 | 2-9 | 0 | 0 | 0 | 0 |
| 1 | 1 | 1 | 8 | 0 | 1 | 0 | 1 | 0 |
| 1 | 1 | 1 | 9 | 1 | 1 | 0 | 0 | 0 |
| 1 | 1 | 1 | A-F | A-F | 0 | 1 | 0 | 0 |
| 1 | 1 | 2 | 0-6 | 3-9 | 0 | 0 | 0 | 0 |
| 1 | 1 | 2 | 7 | 0 | 1 | 0 | 1 | 0 |
| 1 | 1 | 2 | 8-9 | 1 | 1 | 0 | 0 | 0 |
| 1 | 1 | 2 | A-F | A-F | 0 | 1 | 0 | 0 |
| 1 | 1 | 3 | 0-5 | 4-9 | 0 | 0 | 0 | 0 |
| 1 | 1 | 3 | 6 | 0 | 1 | 0 | 1 | 0 |
| 1 | 1 | 3 | 7-9 | 1-3 | 1 | 0 | 0 | 0 |
| 1 | 1 | 3 | A-F | A-F | 0 | 1 | 0 | 0 |
| 1 | 1 | 4 | 0-4 | 5-9 | 0 | 0 | 0 | 0 |
| 1 | 1 | 4 | 5 | 0 | 1 | 0 | 1 | 0 |
| 1 | 1 | 4 | 6-9 | 1-4 | 1 | 0 | 0 | 0 |
| 1 | 1 | 4 | A-F | A-F | 0 | 1 | 0 | 0 |
| 1 | 1 | 5 | 0-3 | 6-9 | 0 | 0 | 0 | 0 |
| 1 | 1 | 5 | 4 | 4 | 1 | 0 | 1 | 0 |
| 1 | 1 | 5 | 5-9 | 1-5 | 1 | 0 | 0 | 0 |
| 1 | 1 | 5 | A-F | A-F | 0 | 1 | 0 | 0 |
| 1 | 1 | 6 | 0-2 | 7-9 | 0 | 0 | 0 | 0 |
| 1 | 1 | 6 | 3 | 0 | 1 | 0 | 1 | 0 |
| 1 | 1 | 6 | 4-9 | 1-6 | 1 | 0 | 0 | 0 |
| 1 | 1 | 6 | A-F | A-F | 0 | 1 | 0 | 0 |
| 1 | 1 | 7 | 0-1 | 8-9 | 0 | 0 | 0 | 0 |
| 1 | 1 | 7 | 2 | 0 | 1 | 0 | 1 | 0 |
| 1 | 1 | 7 | 3-9 | 1-7 | 1 | 0 | 0 | 0 |

TABLE 3-continued

Decimal Add/Subtract PROM Encoding

| 10 ADDRESS BITS | | | | 8 DATA BITS | | | | |
|---|---|---|---|---|---|---|---|---|
| | | | | 3 2 1 0 | 7 | 6 | 5 | 4 |
| 512 | 256 | 128 64 32 16 | 8 4 2 1 | DECIMAL | INDICATORS | | | |
| ADD | CRI | OP2 | OP1 | RESULT | CRO | ILL | E0 | E9 |
| 1 | 1 | 7 | A-F | A-F | 0 | 1 | 0 | 0 |
| 1 | 1 | 8 | 0 | 9 | 0 | 0 | 0 | 0 |
| 1 | 1 | 8 | 1 | 0 | 1 | 0 | 1 | 0 |
| 1 | 1 | 8 | 2-9 | 1-8 | 1 | 0 | 0 | 0 |
| 1 | 1 | 8 | A-F | A-F | 0 | 1 | 0 | 0 |
| 1 | 1 | 9 | 0 | 0 | 1 | 0 | 1 | 0 |
| 1 | 1 | 9 | 1-9 | 1-9 | 1 | 0 | 0 | 0 |
| 1 | 1 | 9 | A-F | A-F | 0 | 1 | 0 | 0 |
| 1 | 1 | A | 0-9 | A | 0 | 1 | 0 | 0 |
| 1 | 1 | A | A | A | 0 | 1 | 1 | 0 |
| 1 | 1 | A | B-F | A | 0 | 1 | 0 | 0 |
| 1 | 1 | B | 0-A | B | 0 | 1 | 0 | 0 |
| 1 | 1 | B | B | B | 0 | 1 | 1 | 0 |
| 1 | 1 | B | C-F | 8 | 0 | 1 | 0 | 0 |
| 1 | 1 | C | 0-B | C | 0 | 1 | 0 | 0 |
| 1 | 1 | C | C | C | 0 | 1 | 1 | 0 |
| 1 | 1 | C | D-F | C | 0 | 1 | 0 | 0 |
| 1 | 1 | D | 0-C | D | 0 | 1 | 0 | 0 |
| 1 | 1 | D | D | D | 0 | 1 | 1 | 0 |
| 1 | 1 | D | E-F | D | 0 | 1 | 0 | 0 |
| 1 | 1 | E | 0-D | E | 0 | 1 | 0 | 0 |
| 1 | 1 | E | E | E | 0 | 1 | 1 | 0 |
| 1 | 1 | E | F | E | 0 | 1 | 0 | 0 |
| 1 | 1 | F | 0-E | F | 0 | 1 | 0 | 0 |
| 1 | 1 | F | F | F | 0 | 1 | 1 | 0 |

The ability to detect whether either of the two operands contains a value greater than 9 is very useful in that it allows the decimal adder/subtractor PROM 84 to detect the case of an illegal operand which has a decimal digit which is represented by four bits and therefore can have values of from A through F hexadecimal which are illegal. The ability for the decimal adder/subtractor PROM 84 to detect illegal decimal operands as part of the addition/subtraction process eliminates the need for a separate precheck of the operands by a prescan of the operands prior to introducing them into the ALU.

Sign detector PROM 78 is similar in operation to decimal adder/subtractor PROM 84. Sign detector PROM 78 uses the nine input bits to address a 4-bit data word which indicates the sign of the operands used in an arithmetic operation. Of the nine bits used to address the 4-bit data words of the sign detector PROM 78, three bits come from data-in register 98, 4 bits from sign multiplexer 77, and two bits (PACKD) and overpunch (OVPUN) from CIL control area 100. The output of sign detector PROM 78 can be gated to monitor logic 22 for inputting into microprocessor 30 via monitor multiplexer 80. The four bits output by sign detector PROM 78 indicate whether the sign is positive or negative, whether it is an illegal sign atom, whether the sign is an overpunch sign, and whether it is an overpunched zero. The resultant sign can be tested by the microprocessor 30 firmware examining the four monitor bits of test flip-flops 40 (see FIG. 3). In the preferred embodiment, the generation of the sign result is complex in that the CPU 20 allows decimal numbers to be represented in either a packed or unpacked format with trailing or leading signs and overpunch signs.

RAM 1 zero multiplexer 82 at the output of RAM 1 81 and RAM 2 zero multiplexer 90 at the output of RAM 2 96 are used to allow the commercial instruction logic firmware to effectively zero out the output of RAM 1 and RAM 2 respectively so that the operand in the other RAM can effectively be added or subtracted from zero.

RAM 2 data register 88 holds the 16-bit output of RAM 2 96. RAM 2 nibble multiplexer 89 is used to select the one of the four 4-bit nibbles held in RAM 2 data register 88 so that the appropriate nibble can be gated into RAM 2 zero multiplexer 90 or into double multiplexer 83 in preparation of adding or subtracting a nibble from RAM 2 96 with a nibble from RAM 1 81 in decimal adder/subtractor PROM 84.

Nibble 0 multiplexer 92, nibble 1 multiplexer 93, nibble 2 multiplexer 94, and nibble 3 multiplexer 95 are used to either allow a 16-bit quantity to be loaded in from data-in register 98 RAM 2 96 or to allow a 4-bit nibble from result/zone multiplexer 91 into the appropriate 4-bit nibble of the 16-bit word stored in RAM 2 96 under firmware control.

Result/zone multiplexer 91 is used to determine whether the 4-bit result from decimal adder/subtractor PROM 84 or the four zone bits are to be written into a nibble within RAM 2 96. In the CPU of the preferred embodiment, when a decimal number is stored in a packed format, each four bits of data in the decimal value represent a decimal digit having the value from zero through nine. When decimal data is stored in an unpacked (string) format, each decimal digit is represented by an eight bits in which the most significant (left) four bits of the 8-bit field represent a zone field having a value of 3 hexadecimal and the least significant (right) four bits represent the decimal values 0 through 9. Thus, in the unpacked format, each decimal digit is represented by an 8-bit field which contains the ASCII code for the decimal digit. Therefore, result/zone multiplexer 91 can select between the 4-bit result from decimal adder/subtractor PROM 84 (which can have a value from 0 through 9) or the four zone bits which are preset to 0011 binary (3 hexadecimal). For example, the decimal value 76 when stored in a packed field is stored in eight bits with the most significant 4-bit nibble containing the value 7 and the least significant 4-bit nibble containing the value 6. When the same value of 76 decimal is stored in an unpacked field, it is stored in two 8-bit bytes with the left most 4-bit nibble of each byte being a 4-bit zone field which contains the hexadecimal value of three and the right 4-bit nibble in each byte containing the decimal value of 7 in the left byte and 6 in the right byte. Therefore, the value of 76 decimal in a packed decimal field is represented by the 8-bit field of 76 hexadecimal and in an unpacked field it is represented by a 16-bit field containing 3736 hexadecimal.

Double multiplexer 83 allows one input of decimal adder/subtractor PROM 84 to be selected between four bits from RAM 1 81 or four bits from RAM 2 96. When double multiplexer 83 selects one ihput of decimal adder/subtractor PROM 84 to be four bits from RAM 2 96, the effect is that the output of decimal adder/subtractor PROM 84 is double the value of the four bits from RAM 2 because in this case both inputs to the decimal adder/subtractor PROM 84 will be from RAM 2. This provides a very convenient method of multiplying by two the operand stored in RAM 2 96.

Although both RAM 1 81 and RAM 2 96 contain 16-bit data words, with RAM 1 containing 16 such 16-bit words and RAM 2 containing 256 16-bit words, there are other distinctions between these two RAMs. RAM 1, as indicated above, normally holds operand 1 and may be written into only on a 16-bit word basis. That is, when information is written into RAM 1 from data-in register 98, all four nibbles of the 16-bit word are written to. The output of RAM 1 is always a single 4-bit nibble which is presented at one of two inputs to RAM 1 zero multiplexer 82. The word which is read from RAM 1 81 is controlled by RAM 1 address counter 75 and the nibble which is enabled into one input of RAM 1 zero multiplexer 82 is controlled by nibble out control 76. RAM 1 address counter 75 also receives inputs from nibble out control 76 such that consecutive decimal digits may be accessed from RAM 1 by either incrementing or decrementing a nibble counter in nibble out control 76 which in turn either increments or decrements the word counter in RAM 1 address counter 75 each time that four nibbles have been accessed.

RAM 2, as indicated above, normally holds operand 2. RAM 2 96 has the ability to be written into as one 16-bit word or the ability to write any one of the four individual nibbles. The 16-bit word to be written into RAM 2 96 comes from data-in register 98 which can be loaded from processor bus 37 or from the output of RAM 2 data register 88. Individual nibbles are written into RAM 2 96 from the output of result/zone multiplexer 91 with the value of the nibble being either the result of the decimal adder/subtractor PROM 84 or a 4-bit zone field containing the hexadecimal value of 3. Nibble write control 86 determines whether a 16 bit word is written into RAM 2 96 or whether one of four individual nibbles is written into RAM 2 96. RAM 2 address counter 87 determines the 8-bit word address that is used to address RAM 2 96 for either a read or write operation. RAM 2 address counter 87 receives an input from nibble write control 86 so that consecutive nibbles may be accessed from RAM 2 96. Each time the four nibbles have been accessed, RAM 2 address counter 87 is either incremented or decremented to get to the next word which contains the next consecutive nibble. A read from RAM 2 96 results in a 16-bit data word being read out and latched into RAM 2 data register 88. The particular nibble to be accessed in the 16-bit data word is controlled by RAM 2 nibble multiplexer 89 which selects one of the four nibbles to be output into RAM 2 zero multiplexer 90 and double multiplexer 83. By contrast, a read in RAM 1 results in only four bits of one nibble being output with the other twelve bits of the three nibbles not being enabled. The enabling of the nibble which is read from RAM 1 81 is controlled by nibble out control 76. The 16-bit word read from RAM 2 96 into RAM 2 data register 88 can be written back into RAM 2 96 via data-in register 98 or it can be written into RAM 1 81 via data-in register 98 under firmware control. The output of nibble write control 86, besides controlling which one of four nibbles is write enabled into RAM 2 when a single nibble is being written into, also controls the selection of which one of four nibbles will be output by RAM 2 nibble multiplexer 89. When a 16-bit word is written into RAM 2 96, all four nibbles are write enabled by nibble write control 86.

The sizes of RAM 1 81 and RAM 2 96 are determined by their use by the firmware. As indicated above, RAM 1 81 is used primarily to hold operand 1 which, in the CPU of the preferred embodiment, may be a decimal number of from 1 through 31 decimal digits including the sign. Therefore, to accommodate a 31 digit decimal number, sixteen words of 16 bits each are required in order to be able to hold the 31 bytes of the maximum decimal number if the number is an unpacked decimal number having zone bits associated with each decimal digit. RAM 2 96, on the other hand, besides normally holding operand 2 is divided into eight segments with each segment being used to either hold an operand or as a working register. For example, in the case of a decimal divide, the segments of RAM 2 96 are used to hold an original copy of operand 1, an original copy of operand 2, a packed copy of operand 2, the quotient and partial products.

COMMERCIAL INSTRUCTION LOGIC MICROOPERATIONS

The microoperations of the microinstruction firmware word which control the operation of commercial instruction logic 28 will now be described with reference to FIG. 4 and FIG. 5 and Table 4 through Table 8. As discussed earlier, the addressing of read-only storage 24 is controlled by microprocessor 30 and more particularly the control area 36 of microprocessor 30. As shown in FIG. 3, the firmware microinstruction accessed in ROS 24 is controlled by the contents of ROS address register 63. Each time a firmware word is read from ROS 24 either 48 bits or 56 bits are retrieved. If the address is within the first 2K of ROS (i.e., addressed 0 through 2047) a 48-bit microinstruction word is retrieved and if the address is from 2048 through 4095 a 56-bit microinstruction word is retrieved. As described earlier, bits 0 through 47 of microinstruction word are always latched into ROS data register 65 for decoding and controlling the operations of microprocessor 30 (see FIG. 3). In addition, the special control field of the microinstruction word, bits 35 through 47, are also latched into ROS SCF register 101 of CIL control area 100 (see FIG. 4). This allows the special control field, bits RDDT35 through RDDT47, to control either operations within microprocessor 30 or within commercial instruction logic 28. As will be seen below in describing the microoperations in Table 4 and Table 5, subfield A of the special control field is used to enable some of the microoperations controlled by subfields B and C. That is, as is shown in Table 4, three of the four microoperations defined by subfield the special control field are enabled only when subfield A contains a binary 110 in RDDT35 through RDDT37. Similarly, the eight microoperations defined in Table 5 the subfield C are enabled only when subfield A contains a binary 110 in RDDT35 through RDDT37. This is shown in FIG. 4 which shows that three of the bits from sutfield B are enabled by feeding the three bits from subfield A into AND gate 107 and that the decoding of subfield C is enabled by feeding the three bits from subfield A into the enable (EN) input of decoder 106. As is shown in Table 6, and in FIG. 4, the three bits from subfield D do not require that subfield A be equal to a binary 110 in bits RDDT35 through RDDT37. The requirement certain of the microoperations specified in subfield B, C and D of the special control field are enabled only if subfield A contains a binary 110 is necessary in order to inhibit commercial instruction logic 28 from performing certain microoperations which would otherwise interfere with the microoperations being performed by microprocessor 30.

Zero multiplexer 102 is used to force binary ZEROs into ROS CIL register 103 when the microprocessor 30 addresses a firmware location in the lower 2K of ROS 24. This forcing of binary ZEROs into ROS CIL register 103 is done by enabling the tri-state outputs of zero register 102 and disabling the tri-state outputs of ROS 24 bits RDDT48 through RDDT55. By forcing ZEROs into ROS CIL register 103 in this manner, decode PROM 104 and decode PROM 105 decode no operation microoperations (see Table 7 and Table 8) thereby inhibiting commercial instruction logic 28 from performing any operation when a firmware word has been retireved from ROS 24 which does not contain bits RDDT48 through RDDT55 (see FIG. 5). Therefore, zero multiplexer 102 is used to force zeros into subfields E and F which are dedicated to commercial instruction logic 28 and which are absent in the first 2K words in ROS 24. The sixteen microoperations encoded within subfield E are shown in Table 7 and the sixteen microoperations specifiable in subfield F are shown in Table 8.

As can be appreciated by examining FIG. 4 and Table 4 through Table 8, many parallel microoperations for control of commercial instruction logic can be programmed into a single microinstruction word. Because subfield B which contains four bits is not encoded, four parallel microoperations can be programmed into subfield B. The subfield B operations can be performed in parallel with any of the seven microoperations that can be programmed into the three bits which are encoded in subfield C (see Table 5) Table 6 shows that three parallel microoperations can programmed into subfield D and these in turn can be performed in parallel with any of the operations of subfields B and C. Table 7 shows that this 4-bit field is encoded to provide one of fifteen microoperations which can be performed in parallel with any of the operations of subfields B, C, D and F. Table 8 illustrates that the four bits encoded to provide one of sixteen microoperations which can be performed in parallel with any of the microoperations specified in subfield B, C, D and E.

It will be understood that the various control signals from CIL control area 100 are applied to the various logic elements of commercial instruction logic 28 during each microinstruction execution cycle. It will also be understood that the clock signals from microprocessor 30 provide appropriate timing signals in a conventional manner to the commercial instruction logic 28 to provide appropriate timing therefor. In order not to confuse the drawings, the particular timing and control signals fed to various elements are not shown in FIGS. 1–4, but are assumed to be provided where appropriate.

The microoperations of Table 4 will now be described with reference to FIG. 4.

TABLE 4

Subfield B Microoperations

| RDDT Bits | | | | | | | |
|---|---|---|---|---|---|---|---|
| 35 | 36 | 37 | 38 | 39 | 40 | 41 | Operation |
| X | X | X | 1 | X | X | X | Double RAM 2 thru Add/Sub PROM (CIPDUB) |
| 1 | 1 | 0 | X | 1 | 0 | X | Write RAM 2 Nibble (CWRESZ) |
| 1 | 1 | 0 | X | X | 1 | X | Write RAM 2 All (CWROP2) |
| 1 | 1 | 0 | X | X | X | 1 | Write RAM 1 All (CWROP1) |

In Table 4, it can be seen that when RDDT38 is a binary ONE, that both inputs to decimal adder/subtractor PROM 84 originate from RAM 2 96 which effectively allows, when an addition is being performed, the doubling of the 4-bit nibble output from RAM 2. Thus, when RDDT38 is a binary ONE, the double multiplexer 83 selects as its output the input it received from RAM 2 nibble multiplexer 89. This also allows, by performing a subtract operation in decimal adder/subtractor PROM 84 and by selecting the zero inputs as the output of RAM 2 zero multiplexer 90, the ability to subtract the nibble output from RAM 2 from zero and thus do a complementing of the nibble from RAM 2. When RDDT39 is a binary ONE, one nibble is written into RAM 2 96. This is accomplished by enabling one of the four 4-bit segments of RAM 2 96 under the control of nibble write control 86 so that only one nibble is written into the word specified by RAM 2 address counter 87.

RDDT40, when a binary ONE, controls multiplexers 92 through 95 such that the output of data-in register 98 is input into RAM 2 96 and all four nibbles in RAM 2 96 are write enabled such that full word addressed by RAM 2 address counter 87 is written into RAM 2. When RDDT41 is a binary ONE, a full 16-bit word is written into RAM 1 81 from data-in register 98 in the word specified by RAM 1 address counter 75. As can be seen in Table 4, in order for the microoperations controlled by RDDT39, RDDT40 and RDDT41, subfield A of the special control field must have the binary value 110 in RDDT35 through RDDT37. This can also be appreciated by examining Table 4, the four microoperations controlled by RDDT38 through RDDT41 can each be selected within a single microinstruction with the exception that in order to write a single nibble into RAM 2, RDDT40 must be a binary ZERO therefore preventing both the writing of a single nibble and the writing of a full word into RAM 2 in a single microoperation.

The microoperations controlled by subfield C of the special control field will now be discussed with reference to Table 5 and FIG. 4.

TABLE 5

Subfield C Microoperations
RDDT Bits When RDDT35-37 Equals 110 Binary

| RDDT Bits | | | |
|---|---|---|---|
| 42 | 43 | 44 | Operation |
| 0 | 0 | 0 | No Operation (NOP) |
| 0 | 0 | 1 | Packed Sign (CPACKD) |
| 0 | 1 | 0 | Overpunched Sign (COVPUN) |
| 0 | 1 | 1 | Subtract (CIPSUB) |
| 1 | 0 | 0 | Reset =0 And =9 Indicators (CRSETX) |
| 1 | 0 | 1 | Increment Address RAM 1 (CIAD01) |
| 1 | 1 | 0 | Decrement Address RAM 1 (CDAD01) |
| 1 | 1 | 1 | Reset All Indicators (CRESET) |

The three bits of subfield C, that is RDDT42 through RDDT44, are decoded by decoder 106 to perform one of eight microoperations. When RDDT42 through RDDT44 are a binary 000, no operation is performed by commercial instruction logic 28. When RDDT42 through RDDT44 are a binary 001, the PACKD signal input into sign detection PROM 78 is made a binary ZERO and is used to address the portion of the sign detector PROM 78 which contains the coding for packed decimal sign types. When RDDT42 through RDDT44 are a binary 010, signal OVPUN becomes a binary ZERO and is used to address the portion of the sign detector PROM 78 which contains the encoding for overpunched signs. When bits RDDT42 through RDDT44 are a binary 011, a subtract operation is performed by decimal adder/subtractor PROM 84 by forcing the signal ADD/SUB which is one of its inputs to be a binary ZERO. When RDDT42 through RDDT44 are a binary 100, the equal zero and equal nine indicators in decimal indicators 85 are reset to zero. When RDDT42 through RDDT44 are a binary 101, the address counter in RAM 1 address counter 75 is incremented by one such that the next word in RAM 1 81 is addressed thereby allowing one of four new nibbles to be input into RAM 1 zero multiplexer 82. The exact nibble which is enabled into RAM 1 zero multiplexer 82 is determined by nibble out control 76. When RDOT42 through RDDT44 are a binary 110, RAM 1 address counter 75 is decremented by one, thereby addressing the next lower word in RAM 1 81 and making available at its output one of four new nibbles with the enabled nibble again being under the control of nibble output control 76. when RDDT42 through RDDT44 are a binary 111 all four indicators in decimal indicators 85 are reset to binary ZERO thereby indicating that there is no carry, that the result is not equal to zero, that the result is not equal to nine, and that the result is not an illegal digit.

The microoperations associated with subfield D of special control field will now be described with reference to Table 6.

TABLE 6

Subfield D Microoperations

| RDDT Bits | | | |
|---|---|---|---|
| 45 | 46 | 47 | Operation |
| 1 | X | X | Sign to Monitor Logic (CIPSGN) |

TABLE 6-continued

Subfield D Microoperations

| RDDT Bits | | | |
|---|---|---|---|
| 45 | 46 | 47 | Operation |
| X | 1 | X | Inhibit RAM 2 to Add/Sub PROM (CINOP2) |
| X | X | 1 | Inhibit RAM 1 to Add/Sub PROM (CINOP1) |

As is shown in Table 6, each of these three bits is independent of the other three bits in subfield D and therefore all three microoperations may be performed in parallel. It should also be noted that the microoperations controlled by subfield D do no require that the subfield A be any particular value whereas when coding the microoperations described above in Table 5, with respect to subfield C, require that subfield A contain a binary value of 110. When RDDT45 is a binary ONE, the output of sign detector PROM 78 is enabled through monitor multiplexer 80 to monitor logic 22. When RDDT45 is a binary ZERO, the output of monitor multiplexer 80 is the decimal indicators 85 which are then transferred to monitor logic 22. When RDDT46 is a binary ONE, the zero input of RAM 2 zero multiplexer 90 is enabled to its output and thus zeros are entered as one of the operands into the decimal adder/subtractor PROM 84. When RDDT47 is a binary ONE, the zero input to RAM 1 zero multiplexer 82 is enabled into double multiplexer 83 thereby inhibiting the output of RAM 1 from entering decimal adder/subtractor PROM 84.

The microoperations controlled by subfield E are illustrated in Table 7. As discussed above, these microoperations, as do those controlled by subfield F shown in Table 8, are encoded in microinstruction bits 48 through 55 which are only present in the upper 2K words of read only storage 24. Therefore, as indicated earlier, if the address used to address ROS 24 is less than 2K, the output of zero register 102 is enabled into ROS CIL register 103 thereby forcing bits RDDT48 through RDDT55 to a binary ZERO which will cause two parallel no operations to be performed by commercial instruction logic 28. When the ROS 24 address is greater than 2K, the output of bits 48 through 55 of ROS 24 is enabled into ROS CIL register 103 and one of the microoperations specified in Table 7 and one of the microoperations specified in Table 8 will be performed.

TABLE 7

Subfield E Microoperations
RDDT Bits When ROS Address Greater Than 2K

| RDDT Bits | | | | |
|---|---|---|---|---|
| 48 | 49 | 50 | 51 | Operation |
| 0 | 0 | 0 | 0 | No Operation (NOP4) |
| 0 | 0 | 0 | 1 | Load Address RAM 1 (CLDAD1) |
| 0 | 0 | 1 | 0 | Load Count RAM 1 (CLDCT1) |
| 0 | 0 | 1 | 1 | Load Address and Count RAM 1 (CLDAC1) = (CLDAD1 & CLDCT1)* |
| 0 | 1 | 0 | 0 | Load Address RAM 2 (CLDAD2) |
| 0 | 1 | 0 | 1 | Load Count RAM 2 (CLDCT2) |
| 0 | 1 | 1 | 0 | Load Address and Count RAM 2 (CLDAC2) = (CLDAD2 & CLDCT2)* |
| 0 | 1 | 1 | 1 | Load Address RAM 1 and RAM 2 (CLDADB) = (CLDAD1 & CLDAD2)* |

TABLE 7-continued

Subfield E Microoperations
RDDT Bits When ROS Address Greater Than 2K

| RDDT Bits | | | | Operation |
|---|---|---|---|---|
| 48 | 49 | 50 | 51 | |
| 1 | 0 | 0 | 0 | Load Count RAM 1 and RAM 2 (CLDCTB) = (CLDCT1 & CLDCT2)* |
| 1 | 0 | 0 | 1 | Load Address and Count RAM 1 and RAM 2 (CLDACB) = (CLDAD1 & CLDCT1 & CLDAD2 & CLDCT2)* |
| 1 | 0 | 1 | 0 | Count Up RAM 1 (CTUCT1) |
| 1 | 0 | 1 | 1 | Count Down RAM 1 (CTDCT1) |
| 1 | 1 | 0 | 0 | Count Up RAM 2 (CTUCT2) |
| 1 | 1 | 0 | 1 | Count Down RAM 2 (CTDCT2) |
| 1 | 1 | 1 | 0 | Count Up RAM 1 and RAM 2 (CTUALL) = (CTUCT1 & CTUCT2)* |
| 1 | 1 | 1 | 1 | Count Down RAM 1 and RAM 2 (CTDALL) = (CTDCT1 & CTDCT2)* |

*Parallel microoperations created by decode PROM coding.

Now referencing Table 7, when RDDT48 through RDDT51 are a binary 0000 a no operation is performed. When RDDT48 through RDDT51 are a binary 0001, an address from data-in register 98 is loaded into RAM 1 address countar 75 thereby permitting control of which word is addressed in RAM 1 81. When RDDT48 through RDDT51 is a binary 0010, a nibble count from data-in register 98 is loaded into nibble output control 76 thereby controlling which one of four nibbles contained in one word of RAM 1 is enabled into one input of RAM 1 zero multiplexer 82. When RDDT48 through RDDT51 is a binary 0011, a word address is loaded into RAM 1 address counter 75 and a nibble count is loaded into nibble output control 76 from data-in register 98 thereby allowing the specifying as to the word and the nibble which will be read from RAM 1 81. When RDDT48 through RDDT51 is a binary 0100 an initial address is loaded into RAM 2 address counter 87 from data-in register 98 thereby controlling which word will be written into or read from RAM 2 96. When RDDT48 through RDDT51 is a binary 0101, an initial nibble count is loaded into nibble write control 86 thereby controlling which nibble will be write enabled into RAM 2 96. The nibble counter within nibble write control 86 also controls which of the four nibbles from RAM 2 data register 88 is enabled onto the outputs of RAM 2 nibble multiplexer 89. Therefore, loading of the RAM 2 nibble count by this microoperation controls both the write enabling into RAM 2 96 and the output enabling of RAM 2 nibble multiplexer 89. When RDDT48 through RDDT51 is a binary 0110, the address counter in RAM 2 address counter 87 and the nibble counter in nibble write control 86 are loaded from data in register 98 thereby controlling the word that is addressed within RAM 2 and the nibble which is write enabled into RAM 2 and the nibble which is selected at the output of RAM 2 nibble multiplexer 89. The loading of the nibble counter by this microoperation only controls which nibble will be write enabled when a write is done and does not actually do a write into RAM 2.

When RDDT48 through RDDT51 are a binary 0111, the word address contained in data-in register 98 is loaded into RAM 1 address counter 75 and RAM 2 address counter 87. When RDDT48 through RDDT51 is a binary 1000, the nibble count in data-in register 98 is loaded into the nibble out control 76 and into nibtle write control 86 thereby allowing the selection of one of four nibbles in RAM 1 and RAM 2. When RDDT48 through RDDT51 is a binary 1001, the word address and the nibble count from data-in register 98 are loaded into RAM 1 address counter 75 and RAM 2 address counter 87 and nibble out control 76 and nibble write control 86 respectively. When RDDT48 through RDDT51 is a binary 1010, the nibble counter in nibble out control 76 is incremented by one and if it changes from a nibble count of three to a nibble count of zero, the word counter in RAM 1 address counter 75 is also incremented by one. This allows nibbles to be consecutively addressed and after the four nibbles have been addressed from one word, the first nibble is addressed in the next word. When RDDT48 through RDDT51 is a binary 1011, the nibble counter in nibble out control 76 is decremented by one and if the count changes from zero to three, the word counter in RAM 1 address counter 75 is decremented by one thereby allowing consecutive nibbles to be addressed from right to left.

When RDDT48 through RDDT51 is a binary 1100, the nibble counter in write control 86 is incremented by one and if the nibble counter goes from three to zero, the word counter in RAM 2 address counter 87 is also incremented by one thereby allowing ccnsecutive nibbles to be addressed from left to right. When RDDT48 through RDDT51 is a binary 1101, the nibble counter in nibble write control 86 is decremented by one and if the count goes from zero to three, the word counter in RAM 2 address counter 87 is also decremented by one to point to the next word in RAM 2 96. This decrementing of the nibble counter associated with RAM 2 by one allows consecutive nibbles in RAM 2 to be addressed from right to left. When RDDT48 through RDDT51 is a binary 1110, the nibble counter in nibble out control 76 is incremented by one as is the nibble counter in nibble write control 86 and when a counter go from three to zero, the corresponding word counter in RAM 1 address counter 75 and RAM 2 address counter 87 is also incremented by one thereby allowing consecutive nibbles to be addressed from left to right in RAM 1 and RAM 2. When RDDT48 through RDDT51 is a binary 1111, the nibble counter in nibble out control 76 is decremented by one, and the nibble counter in nibble write control 86 is decremented by one, and if either counter goes from zero to three, the associated word counter in RAM 1 address counter 75 or RAM 2 address counter 87 is decremented by one thereby allowing consecutive nibbles in RAM 1 and RAM 2 to be addressed from right to left.

The microoperations controlled by subfield F will now be discussed with reference to Table 8 and FIG. 4.

TABLE 8

Subfield F Microoperations
RDDT Bits When ROS Address Greater Than 2K

| RDDT Bits | | | | Operation |
|---|---|---|---|---|
| 52 | 53 | 54 | 55 | |
| 0 | 0 | 0 | 0 | No Operation (NOP) |
| 0 | 0 | 0 | 1 | Transceivers In to CIL (CIPINN) |
| 0 | 0 | 1 | 0 | Transceivers Out to Microprocessor (CIPOUT) |
| 0 | 0 | 1 | 1 | Write Zone Bits to RAM 2 (CWZONE) |
| 0 | 1 | 0 | 0 | Decrement Address RAM 2 (CDAD02) |

TABLE 8-continued
Subfield F Microoperations
RDDT Bits When ROS Address Greater Than 2K

| RDDT Bits | | | | |
|---|---|---|---|---|
| 52 | 53 | 54 | 55 | Operation |
| 0 | 1 | 0 | 1 | Load Indicators (CLDFLP) |
| 0 | 1 | 1 | 0 | Increment Address RAM 2 (CIAD02) = (CIPINN & CIAD02)* |
| 0 | 1 | 1 | 1 | Set Carry Indicator (CSETCA) |
| 1 | 0 | 0 | 0 | Set Test Mode Flop (QLTCTL) |
| 1 | 0 | 0 | 1 | Transceivers In to CIL and Increment Address RAM 2 (CINIA2) |
| 1 | 0 | 1 | 0 | Transceivers In to CIL and Decrement Address RAM 2 (CINDA2) = (CIPINN & CDAD02)* |
| 1 | 0 | 1 | 1 | Transceivers Out to Microprocessor and Increment Address RAM 2 (COAIA2) = (CIPOUT & CIAD02)* |
| 1 | 1 | 0 | 0 | Transceivers Out to Microprocessor and Decrement Address RAM 2 (COTDA2) = (CIPOUT & CDAD02)* |
| 1 | 1 | 0 | 1 | Not Used |
| 1 | 1 | 1 | 0 | Not Used |
| 1 | 1 | 1 | 1 | Not Used |

*Parallel microoperations created by decode PROM coding.

When RDDT52 through RDDT55 is a binary 0000, no operation is performed by commercial instruction logic 28. Again, as discussed above, this no operation is performed whenever the ROS 24 address is less than 2K because zero register 102 is enabled into ROS CIL register 103 as discussed above. When RDDT52 through RDDT55 is a binary 0001, transceivers 97 are enabled such that the data on processor bus 37 is available to data-in register 98 and data-in register 98 is clocked such that the information becomes available to commercial instruction logic 28 at the output of data-in register 98. When RDDT52 through RDDT55 is a binary 0010, the transceivers 97 are enabled to transmit data from commercial instruction logic 28 to microprocessor 30 such that the information in RAM 2 data register 98 is passed to processor thus 37. In addition, this microoperation clocks data-in register 98 such that the data from RAM 2 data register 88 is loaded into data-in register 98. By loading data-in register 98 with the contents of RAM 2 data register 88, information can effectively be transferred from RAM 2 through data-in register 98 and into RAM 1 81 by a parallel microoperation or by a subsequent microoperation. When RDDT52 through RDDT55 is a binary 0011, the zone bits at the input of result/zone multiplexer 91 are enabled onto its outputs thereby allowing the zone nibble of a binary 0011 to be loaded into one of the nibbles of a word within RAM 2 96. This is used when processing string decimal data. When RDDT52 through RDDT55 is a binary 0100, the word address counter in RAM 2 address counter 87 is decremented by one. When RDDT52 through RDDT55 is a binary 0101, the decimal indicator register 85 is loaded with the four indicator bits from decimal adder/subtractor PROM 84. This loading of indicators is normally specified whenever an add or subtract operation is performed so that the status of the indicator bits is latched into decimal indicators 85. When RDDT52 through RDDT55 is a binary 0110, the word address counter in RAM 2 address counter 87 is incremented by one thereby pointing to the next word within RAM 2 96. It should be noted that the incrementing and decrementing of the address counter for RAM 2 is controlled by subfield F and the incrementing and decrementing of the address counter for RAM 1 is controlled by subfield C so that the address counters of RAM 2 and RAM 1 can be incremented and decremented in parallel.

When RDDT52 through RDDT55 is a binary 0111, the carry indicator in decimal indicators 85 is set to a binary ONE. This function is useful to allow a carry-in to be forced into decimal adder/subtractor PROM 84. When RDDT52 through RDDT55 is a binary 1000, a test mode flop is set to indicate that a fault condition has occurred within commercial instruction logic 28. When RDDT52 through RDDT55 is a binary 1001, transceivers 97 are enabled to receive data from processor bus 37 and data-in register 98 is clocked such that the data is latched in it and at the same time the word address counter in RAM 2 address counter 87 is incremented by one. By using a series of these microoperations, consecutive locations in RAM 2 96 can be loaded from the contents of processor bus 37. When RDDT52 through RDDT55 is a binary 1010, transceivers 97 are enabled to receive the data from processor bus 37 and it is latched into data-in register 98. In parallel, the address counter in RAM 2 address counter 87 is decremented by one such that the next lower word in RAM 2 96 is addressed. As in the previous microoperation, it is useful for allowing consecutive words in RAM 2 to be loaded from processor bus 37.

When RDDT52 through RDDT55 is a binary 1011, transceivers 97 are enabled to transmit the data from the output of RAM 2 data register 88 to processor bus 37 and at the same time this data is loaded into data-in register 98. In addition, the address counter in RAM 2 address counter 87 is incremented by one. This microoperation is useful to allow consecutive words in RAM 2 to be transmitted to processor bus 37 and also to allow consecutive words from RAM 2 to be loaded into data-in register 98 from which they can be loaded by a parallel microoperation into RAM 1 81. When RDDT52 through RDDT55 are a binary 1100, transceivers 97 are enabled to processor bus 37 to allow the outputting of data in RAM 2 data register 88 and at the same time the data is loaded into data-in register 98. In addition, the address counter in RAM 2 address counter 87 is decremented by one such that the next lower word in RAM 2 96 is pointed to. This microoperation is also useful to allow consecutive words in RAM 2 96 to be transmitted to processor bus 37 and loaded into data-in register 98. As in the previous microoperation, this microoperation is also useful to transfer consecutive words from RAM 2 into RAM 1. The microoperations specified by binary 1101, 1110 and 1111 are not used.

COMMERCIAL SOFTWARE INSTRUCTION DATA TYPES

The three different data types handled by the commercial instruction logic 28 are: decimal data, alphanumeric data, and binary data. The decimal and binary data types are used to represent fixed point integer numeric values. The alphanumeric data type is used to represent alphabetic, numeric and punctuation of text information. The commercial software instructions of the CPU permit arithmetic operations on the decimal data and editing operations on alphanumeric data. These commercial software instructions are performed by commercial instruction logic 28 in conjunction with microprocessor 30.

The single unit of information of each data type will be referred to as an "atom". Table 9 gives the size of an atom in bits as a function of the data type.

TABLE 9
Size of Data Atoms

| Data Type | Atom Size In Number of Bits |
|---|---|
| String (Unpacked) Decimal | 8 |
| Packed Decimal | 4 |
| Alphanumeric | 8 |
| Binary | 8* |

*This means that: single precision binary numbers consist of two atoms, or 16 bits, while double precision binary numbers consist of four atoms or 32 bits.

Eight-bit atoms are also referred to as "bytes" and 4-bit atoms are also referred to as "nibbles".

Figure 7A:
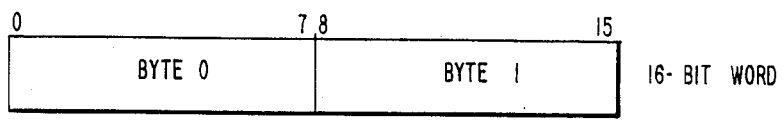
FIGS. 7A and 7B illustrate the position of 8-bit bytes and 4-bit nibbles in a 16-bit word of a data processing system utilizing the invention.
Figure 7B:
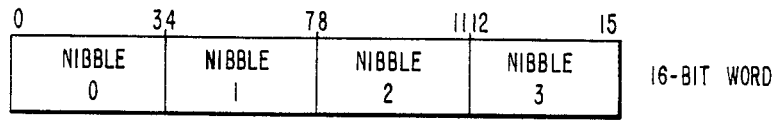

FIG. 7A illustrates the positiion of byte 0 and byte 1 within the 16-bit words of the preferred embodiment. FIG. 7B illustrates the positions of nibble 0 through nibble 3 in a 16-bit word. The bits are numbered 0 through 15 with bit 0 being the most significant bit (MSB) and bit 15 being the least significant bit (LSB) as illustrated in FIGS. 7A and 7B.

Decimal data can be represented in either string (also referred to as unpacked) or packed form. The maximum length of a decimal operand is 31 atoms (i.e., if separate sign, then 30 digits plus sign). Decimal numbers are treated as integers with the decimal point assumed to be to the right of the least significant digit. A decimal operand can be signed or unsigned and when unsigned it is assumed to be positive.

String (unpacked) decimal digits (atoms) occupy one byte position in memory. They can start and/or end on any byte boundaries. The four most significant bits of a decimal string digit are called the zone bits. The four least significant bits of decimal string digit define the value of the digit. Only the codes 0–9 are valid for the low order four bits otherwise an illegal character (IC) trap will result. Zone bits are not checked by the hardware on input but will be set to 3 hexadecimal (0011 binary) on output.

String decimal data can be signed or unsigned. When unsigned the operand is considered to be positive and its length refers only to digits. When signed, the operand can have either: leading separate sign, trailing separate sign, or trailing overpunched sign.

The length of the operand also includes the sign character. Table 10 gives the sign convention for string decimal operands having leading or trailing signs and Table 11 gives the sign convention for string decimal operands having trailing overpunch signs.

Packed decimal digits (atoms) occupy four bits or one-half a byte position in memory (also referred to as nibbles). These digits can start and/or end on any half byte boundaries. The only valid codes for packed decimal digits are 0–9 otherwise an illegal character trap will result.

Packed decimal data can be signed or unsigned. When unsigned, the operand is considered to be positive and its length refers only to digits. When signed, the sign will be the least significant atom of the operand. The length of the operand will include the sign atom. Table 12 gives the sign conventions for packed decimal operands. Sign, when specified, can only be separate trailing; i.e., the rightmost atom of the operand field.

TABLE 10
Sign Convertions for String Decimal Operands Having Leading And Drawing Sig1

| SIGN VALUE | ASCII CHARACTER | HEXADECIMAL CODE |
|---|---|---|
| + | + | 2B |
| − | − | 2D |

Note:
The number of digits equals L-1 and the sign occupies one atom position.

TABLE 11
Sign Convention For String Decimal Operands Having Trailing Overpunch Sign

| SIGN VALUE | DIGIT VALUE | ASCII CHARACTER | HEXADECIMAL CODE RECOGNIZED AND GENERATED | HEXADECIMAL CODE RECOGNIZED ONLY |
|---|---|---|---|---|
| + | 0 | (left brace) | 7B | 30 |
| + | 1 | A | 41 | 31 |
| + | 2 | B | 42 | 32 |
| + | 3 | C | 43 | 33 |
| + | 4 | D | 44 | 34 |
| + | 5 | E | 45 | 35 |
| + | 6 | F | 46 | 36 |
| + | 7 | G | 47 | 37 |
| + | 8 | H | 48 | 38 |
| + | 9 | I | 49 | 39 |
| − | 0 | (right brace) | 7D | |
| − | 1 | J | 4A | |
| − | 2 | K | 4B | |
| − | 3 | L | 4C | |
| − | 4 | M | 4D | None |
| − | 5 | N | 4E | |
| − | 6 | 0 | 4F | |
| − | 7 | P | 50 | |
| − | 8 | Q | 51 | |
| − | 9 | R | 52 | |

Notes:
1. For length of operand equal to L, the number of digits equals L and sign is overpunched on rightmost digit.
2. The hardware uses only the low order 7-bits of the byte to determine its sign value.

TABLE 12

Packed Decimal Sign Conventions

| SIGN DIGIT IN HEXADECIMAL CODE | PACKED DECIMAL RECOGNIZED AND GENERATED BY HARDWARE | ASCII SIGN RECOGNIZED ONLY BY HARDWARE |
| --- | --- | --- |
| A |   | + |
| B | + |   |
| C |   | + |
| D | − |   |
| E |   | + |
| F |   | + |

Alphanumeric operands consist of ASCII 7-bit characters. Their maximum size is 255 characters except as specified otherwise. Each alphanumeric character atom occupies one 8-bit byte. Alphanumeric strings in memory can start and/or end or both on either odd or even byte boundaries.

Binary operands can be either 16 bits long or 32 bits long (i.e., one or two words). They are 2s complement numbers and thus the most significant bit is the sign bit and the binary point is assumed to be to the right of the least significant bit. The range (RG) of the value of a binary operand is:

for a 16-bit long operand: −2 to the 15th less than or equal to RG less than or equal to 2 to the 15th−1 and for a 32-bit long operand: −2 to the 31st less than or equal to RG less than or equal to 2 to the 31st−1.

Note that the binary atom is eight bits and thus the length of the operand should be either two or four atoms, otherwise unspecified results will occur. Binary operands in memory can start and/or end on either odd or even byte boundaries.

BASIC SOFTWARE INSTRUCTIONS

There are seven types of basic software instructions: generic, branch on indicators, branch on registers, shift short and shift long, short value immediate, input/output, single operand, and double operand. The format for single and double operand basic software instructions is shown in FIG. 8A.

Figure 8A:
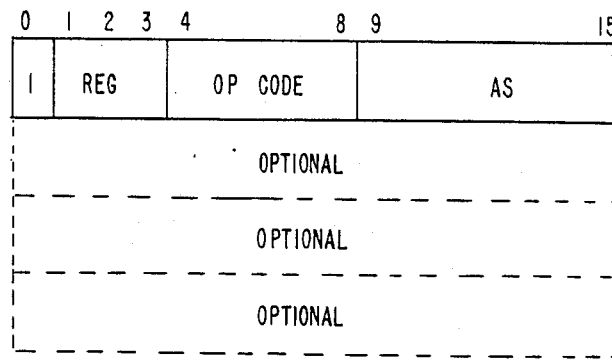
FIG. 8A illustrates the format of a single or double operand basic software instruction processed by the central processing unit of FIG. 1.

The significance of the bits in FIG. 8A is as follows: bit 0 is always a binary ONE; bits 1, 2 and 3 are binary ZERO for single operand instructions and define a register number (1-7) in double operand instructions (the op code defines whether this is one of the 7 general (R) registers or one of the 7 address(B) registers; bits 4 to 8 define the operation code; bits 9-15 are the address syllable (AS) and are used to define either: (1) a location in memory that contains an operand, (2) a register that contains an operand, or (3) an immediate operand, where the operand is contained in the second word of the instruction.

Single and double operand instructions can be either one, two or three words in length depending on the addressing mode utilized. The addressing mode is defined by the address syllable. Instructions that address a register are one word in length. Instructions that utilize an immediate operand are considered to be two words in length, including the operand, since the program counter is incremented by two in order to access the next instruction. And finally, instructions that address operands in memory can be either one, two or three (two, three or four for those requiring a mask) words in length depending on the addressing mode used.

The three address modes are: absolute, base and relative addressing.

Absolute addressing—(also called immediate address mode)—two-word instructions where the second word contains a 16-bit absolute address (short address format), or three word instructions where the second and third words contain a 20-bit absolute address (long address format).

Base addressing—one-word instructions that define one of the seven address registers (B1-B7) as containing the address of the operand.

Relative addressing—two-word instructions where the second word contains an algebraic displacement (±32K) relative to either the program counter (P relative), an address register (base relative), or the interrupt vector for the current central processor level.

COMMERCIAL SOFTWARE INSTRUCTIONS

The commercial software instructions of CPU 20 ara classified as follows: numeric, alphanumeric, edit and branch.

Figure 8B:
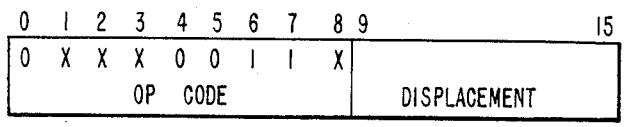
FIG. 8B illustrates the format of a commercial software branch instruction processed by the central processing unit of FIG. 1.

The format of commercial branch instructions is identical to that of the CPU branch instructions as shown in FIG. 8B where:

OP CODE=specifies one of the commercial software branch instructions. Bits 0, 4 and 5 are binary ZEROs, bits 6 and 7 are binary ONEs and bits 1 through 3 specify which commercial indicator is to be tested and bit 8 specifies if a branch is to occur when the indicator is true (i.e., a binary ONE) or false (i.e., a binary ZERO).

DISPLACEMENT=specifies the software instruction by its displacement in number of words forward or backward from the branch instruction to which the branch is to transfer control if the condition is met.

Figures 1, 8C:
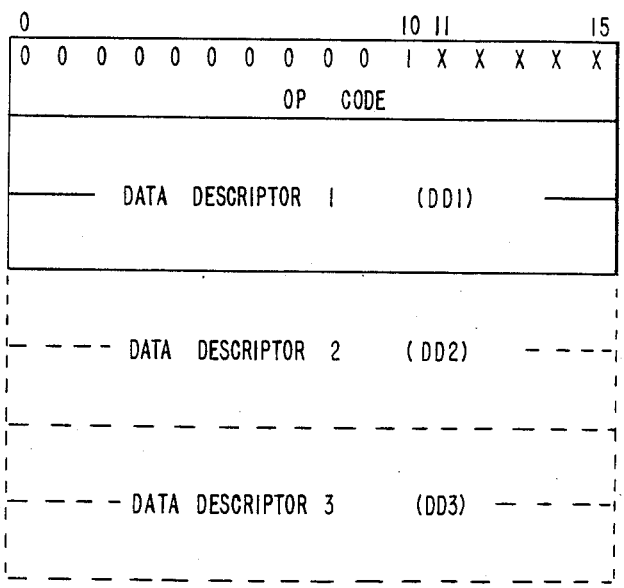

The format for commercial numeric, alphanumeric and edit software instructions is given in FIGS. 8C-1 through 8C-3 where:

OP CODE=specifies one of the commercial software instructions. Bits 0 through 9 of the op code word are binary ZEROs, bit 10 is a binary ONE and bits 11 through 15 specify the particular commercial software operation to be performed.

DDn=Data descriptor specifies the type, size and location of the operand. DD1 refers to the first data descriptor; DD2 refers to the second and DD3 refers to the third.

LABEL n=12 bit displacement capable of addressing any of up to 4K remote data descriptors. Label 1 refers to the first data descriptor; Label 2 refers to the second and Label 3 refers to the third.

FIG. 8C-1 illustrates the format of a commercial software instruction using in-line data descriptors which describe the 1 to 3 operands used by the instruction with the number of operands being a function of the software instruction type. FIG. 8C-2 illustrates the format of a commercial software instruction using remote data descriptors to describe the 1 to 3 operands used by the software instruction and FIG. 8C-3 shows the format of a commercial software instruction using a combination of in-line and remote data descriptors to describe the 1 to 3 operands. The CPU distinguishes between in-line and remote data descriptors by examining bits 12 through 15 of the first word of a data descriptor. In remote data descriptors, bits 12 through 15 are binary ZEROs.

A commercial software instruction can have from 1 to 3 operands which are defined by data descriptors.

Data descriptors (DDs) are used to define the operand type, size and location in memory. Data descriptors can be in-line DDs (IDs) or remote DDs (RDs) but regardless of their location in memory, they have the same format. IDs are part of a commercial software instruction (see FIG. 8C-1). RDs are defined by a label within the commercial software instruction (see FIG. 8C-2). The label is a 12-bit positive integer which is used as an offset from the remote descriptor base address which is contained in the CPU 20-bit remote descriptor base register (RDBR).

As a function of the instruction op code, a data descriptor can be either a: decimal DD, alphanumeric DD, or binary DD.

Decimal DDs are implied by all numeric software instructions and the numeric edit instruction. Decimal DDs can refer to either string decimal or packed decimal data. The format of the DD is as shown in FIG. 9 where:

WORD 1:
  C1, C2, C3=control bits and specify atom offset and sign information.
  L=specifies the length of the operand in number of atoms.
  T=specifies the data type:
    If T=binary ZERO, data is string (unpacked) decimal and
    IF T=binary ONE, data is packed decimal.
  CAS=specifies the commercial address syllable (see CAS description below).

WORD 2:
  The contents of word 2 is either a displacement or an immediate operand (IMO) (i.e., the operand itself instead of a pointer to the operand) as defined by the CAS.

In a string decimal DD the fields, shown in FIG. 9, have the following meaning:
1. C1=byte (atom) offset.
   a. When no indexing is specified, C1 specifies the offset within the addressed word:
      C1=binary ZERO, operand starts in the left most byte of the addressed word.
      C1=binary ONE, operand starts in the right most byte of the addressed word.
   b. When indexing is specified, C1 contains an atom offset value that is added to the index value and the resulting sum is used to compute the effective address of the operand.

C2, C3=sign control as shown in the following tabulation:

| C2 | C3 | SIGN CONVENTION |
|----|----|-----------------|
| 0  | 0  | Unsigned (assumed to be positive) |
| 0  | 1  | Trailing Overpunch |
| 1  | 0  | Leading Separate Sign |
| 1  | 1  | Trailing Separate Sign |

3. L=Specifies the length of the operand either directly or indirectly:
   for L not equal to 0, then 1 less than or equal to L less than or equal to 31
   for L=0, the escape to CPU registers 11-15, where:
     Register 4 for DD1
     Register 5 for DD2
     Register 6 for DD3.
     Register 8-10 should be zero else unspecified results will occur.

Note that for unsigned or sign overpunched operands, the length refers to number of digits. For a leading or trailing separate signed operand, its length refers to L−1 digits and a sign.

Note that an illegal specification trap will result if an operand has either: a length of 0, or a length of 1 and specifies separate sign (i.e., the operand consists only of a sign).

4. T=binary ZERO.
5. CAS=specifies the commercial address syllable.

In a Packed Decimal DD the fields shown in FIG. 9 have the following meaning:
1. C1, C2=Nibble (atom) offset.
   a. When no indexing is specified then C1 and C2 specify the offset within the addressed word:

| C1 | C2 | POSITION OF FIRST DIGIT WITHIN THE ADDRESSED WORD |
|----|----|---------------------------------------------------|
| 0  | 0  | Nibble 0 (bits 0–3) |
| 0  | 1  | Nibble 1 (bits 4–7) |
| 1  | 0  | Nibble 2 (bits 8–11) |
| 1  | 1  | Nibble 3 (bits 12–15) | b. When indexing is specified C1 and C2 contain an atom offset value which is added to the index value and the resulting sum is used to compute the effective address of the operand.

2. C3=Sign control:
   If C3=binary ZERO, the operand is unsigned and
   If C3=binary ONE, the operand is trailing sign.
   When unsigned, the operand is considered to be positive.
   When signed, only trailing sign is allowed.

3. L=specifies the length of the operand directly or indirectly. Those rules under string decimal DD for L also apply here.

4. T=binary ONE.

Alphanumeric DDs are implied by all alphanumeric software instructions and the alphanumeric edit software instruction. The format of the alphanumeric DD is somewhat similar to that shown in FIG. 9 but need not be further described.

Commercial software instructions generate address references through a filed called the commercial address syllable (CAS). The resolution of the CAS field for non branch instructions usually results in the formation of an effective address (EA) which points to an operand but can also directly describe an operand (i.e., an immediate operand).

The CAS is a seven bit field of a data descriptor in which bits 9 through 11 are used as an address modifier, bit 12 is generally used to indicate whether direct or indirect addressing is to be used, and bits 13 through 15 are used to indicate a base register number. The CAS of FIG. 9 should not be confused with the AS used by the basic software CPU instructions of FIG. 8A although they are similar.

The general rules describing the commercial address syllable entries are as follows:
1. An in-line descriptor (ID) is a DD that is part of the instruction.
2. An ID can either point directly to the operand or to a pointer to the operand (i.e., whenever indirection is specified).
3. A remote descriptor (RD) is a DD defined by a label (which is part of the instruction) and the remote descriptor base register.

4. An RD can either point directly to the operand or to a pointer to the operand (i.e., when indirection is specified).
5. During extraction of commercial software instructions, the CPU must determine whether IDs or RDs are used.
6. The contents of the program counter and base registers are considered word addressed.
7. An index register content is considered an atom displacement and has a range of minus 2 to the 15th less than or equal to the index register content which is less than or equal to 2 to the 15th minus 1.
8. The displacement is a word displacement and has a range of minus 2 to the 15th less than or equal to the displacement which is less than or equal to 2 to the 15th minus 1.
9. When program counter plus displacement addressing is specified then the program counter contents means the address of the word containing the displacement.
10. An immediate operand (IMO) always occupies the second word of a DD. Its offset and length are specified in the DD. For offset plus length specifying more atoms than can be contained in a word, then unspecified results will occur. Note that a decimal IMO can specify any sign convention supported for normal operands.

The definition of the commercial software instructions supports post indexing of data at the atom level. The index value is in atoms and it is automatically adjusted to correspond to the data type specified in the DD.

During effective operand address generation, the atom index defined in one of seven index registers (R1, R2, ... R7), may be added to the atom offset in the DD before this is algebraically added as the last step (after any indirection) to the base address.

The following general rules will apply to all numeric commercial software instructions:
1. Effective address (EA) always points to the leftmost atom of the operand.
2. Greater than (G) or less than (L) indicators indicate value of result relative to zero except for convert decimal to binary (CDB), and convert binary to decimal (CBD) instructions.
3. If result is shorter than receiving field, the receiving field will be zero filled to the left.
4. Plus and minus zero are allowed on input but will be assumed to be plus zero during instruction execution. All zeros operands generated by the hardware will be plus zeros.
5. A string decimal zero=30 (hexadecimal); a packed decimal zero=0 (hexadecimal).
6. All signed results will have the hardware generated signs, regardless of the sign convention used by the operands at execution time.
7. Zone bits (leftmost four bits of a string decimal number) are always ignored on input. Nevertheless, all results will have the zone bits set to 3 hexadecimal.
8. Operands must not overlap each other, otherwise unspecified results will occur.
9. Identical overlapping operands are allowed.
10. If a trap condition is disabled the trap will not occur and the receiving field will be altered.
11. Mixing of operands (i.e., string or packed decimal) is allowed.
12. Operands having different signs conventions are allowed.
13. Any operand having a zero length or a length equal to just the sign character, and specifying separate sign, will result in an illegal specification (IS) trap condition.
14. Overflow (OV) indicator is set if the receiving field cannot accept all significant digits of the result.
15. If either operand has an illegal digit or an illegal sign, then an illegal character (IC) trap will result.
16. If a negative operand or a negative result is to be stored in an unsigned receiving field, then the sign fault indicator is set and no trap occurs.
17. If DD2 specifies IMO in any instruction except a decimal compare (DCM) instruction, an IS trap will occur.
18. If DD3 specifies IMO, an IS trap will occur.
19. Whenever a trap occurs, the state of the indicators used by the trapped instruction will be unspecified.
20. The original operands preservation cannot be guaranteed whenever either an unavailable resource trap or a bus or memory error trap occurs. If any other trap occurs, then the operands will remain unchanged.
21. If the receiving field cannot accept all significant digits of the result and commercial instruction mode register (CM) specifies that no trap be generated then the receiving field will contain only low order digits (i.e., the high order digits will be lost).

NUMERIC COMMERCIAL SOFTWARE INSTRUCTIONS

The numeric commercial software instructions of interest are described below.

Decimal add (DAD) adds the contents of DD1 (i.e., the operand pointed to by data descriptor (1) to the contents of DD2 and the result replaces the contents of DD2 (i.e., [DD2]+[DD1] stored in [DD2], augend+addend=sum). The overflow (OV), sign fault (SF), greater than (G) and less than (L) commercial indicators will be set as a function of the result.

Decimal subtract (DSB) subtracts the contents of DD1 from contents of DD2 and the result replaces the contents of DD2 (i.e., [DD2]−[DD1] stored in [DD2], minuend−subtrahend=difference). The OV, SF, G and L commercial indicators are set as a function of the result.

Decimal multiply (DML) multiplies the contents of DD2 by the contents of DD1 and the result replaces the contents of DD2 (i.e., [DD2]*[DD1] stored in [DD2], multiplicand×multiplier=product).

Decimal divide (DDV) divides the contents of DD2 by the contents of DD1 and the resulting quotient is stored in the contents of DD3 and the remainder replaces the contents of DD2 (i.e., [DD2]/[DD1] stored in [DD3] and remainder stored in [DD2], dividend/divisor=quotient and remainder). The OV, SF, G, and L commercial indicators are set as a function of the result. Overflow occurs if quotient is larger than DD3 receiving field length or if a divide by zero is attempted. The sign of the quotient is determined by rules of algebra and sign of remainder is equal to sign of the dividend unless the remainder is zero.

Decimal compare (DCM) makes an algebraic comparison of the contents of DD1 to contents of DD2 and sets commercial indicators to indicate if contents of DD1 are equal, greater, or less than contents of DD2 (i.e., [DD1]::[DD2] results to commercial indicators). The G and L commercial indicators are set as function of comparison.

Convert binary to decimal (CBD) moves and converts the contents of binary DD1 and places the decimal string or packed result in the contents of DD2 (i.e., [DD1] converted and stored in [DD2]). The OV and SF commercial indicators are set as a function of the result.

Convert decimal to binary (CBD) moves and converts the contents of a decimal (string or packed) DD1 and places the binary result in the contents of DD2 (i.e., [DD1] converted and stored in [DD2]). The OV commercial indicator is set as a function of the result.

COMMERCIAL INSTRUCTION LOGIC DETAILS

Figure 10A:
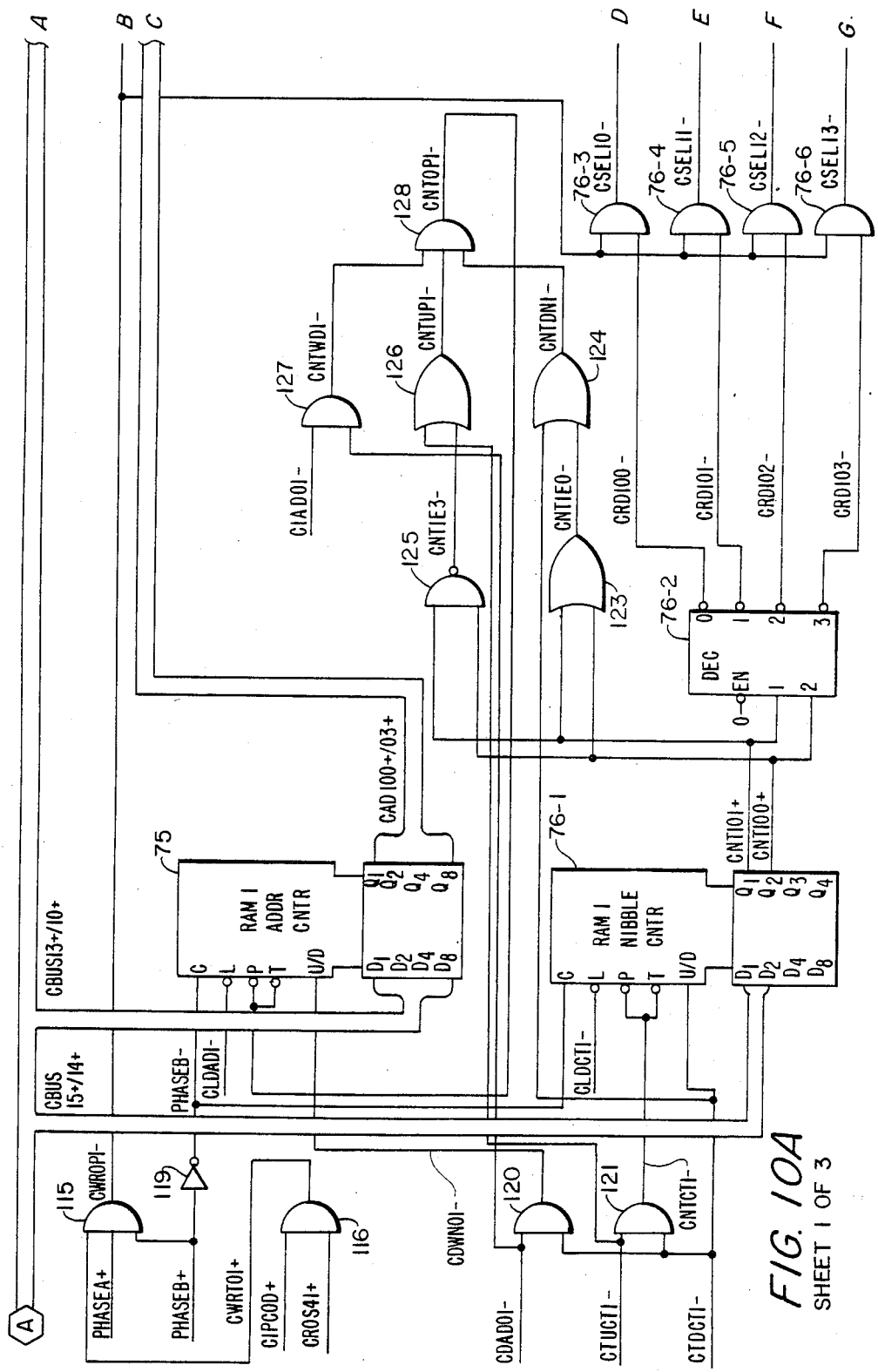
FIGS. 10A through 10D are logic block diagrams of circuitry utilized in the commercial instruction logic of FIG. 4 in accordance with the present invention.
Figure 10A:
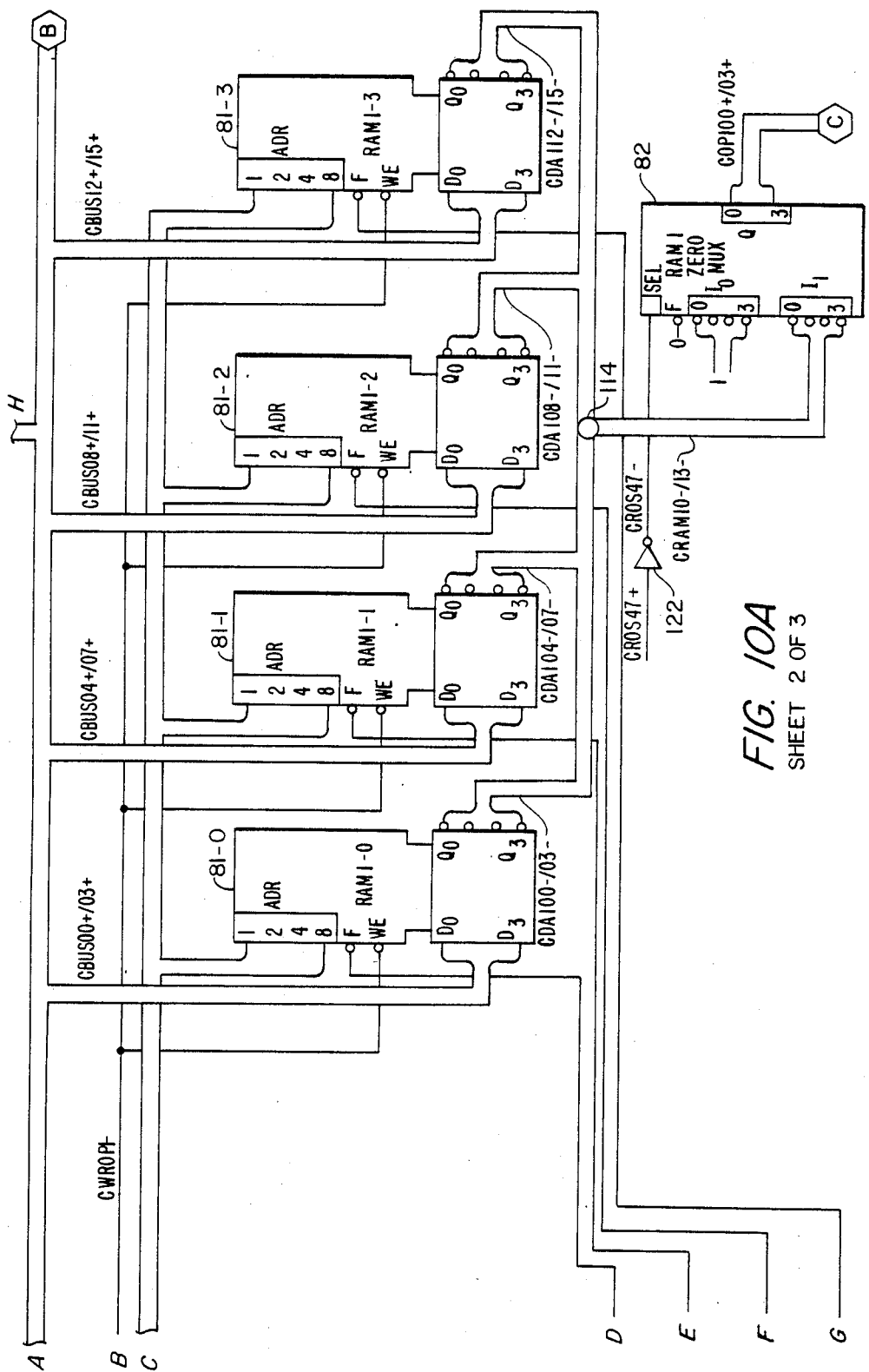
Figure 10A:
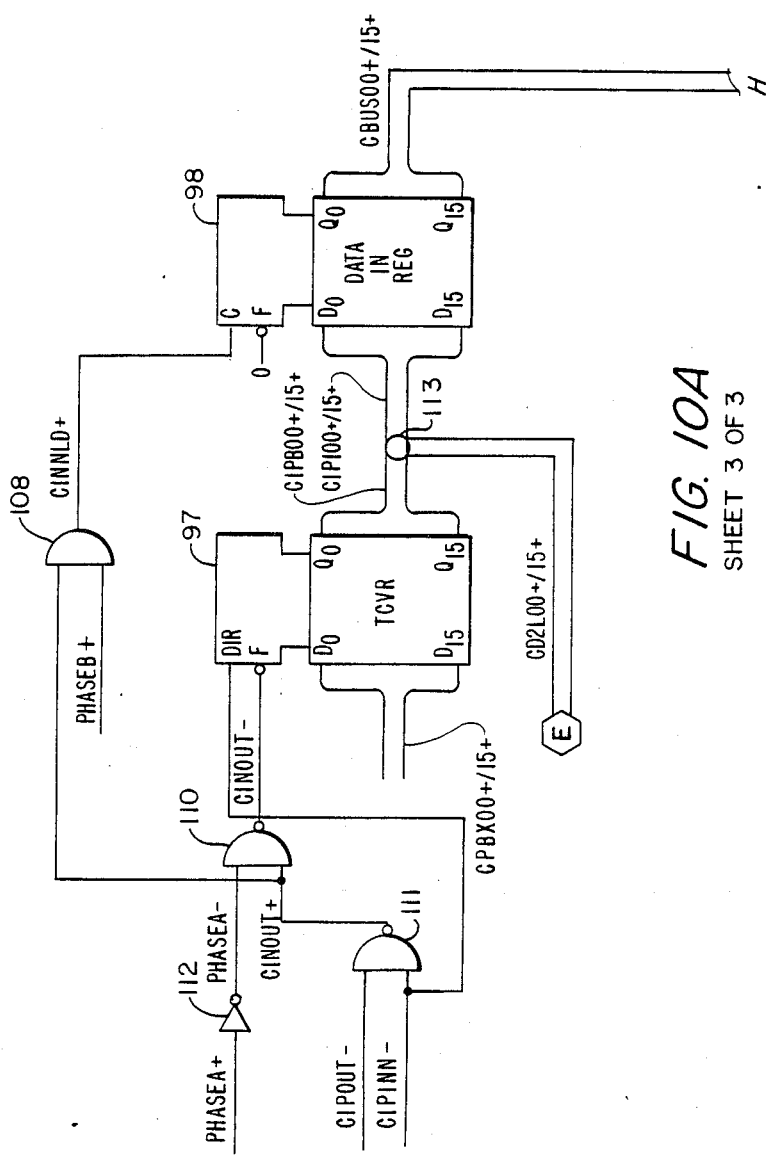

Before describing the manner in which the commercial instruction logic 28 is used to perform the various decimal operations, the structure of commercial instruction logic 28 will be described in greater detail with respect to FIGS. 10A through 10D. FIG. 10A primarily shows the structure of RAM 1 81 and its associated addressing logic, FIG. 10B primarily shows the structure of RAM 2 and its associated addressing logic, FIG. 10C primarily shows the structure of decimal adder/subtractor PROM 84 along with its inputs and outputs and decimal indicators 85, and FIG. 10D primarily shows the structure of CIL control area 100.

In FIGS. 10A through 10D, the same reference numerals used previously are shown in addition to the detailed circuitry required for the operation of the hardware mechanism. In FIGS. 10A through 10D the little circles at some of the inputs and outputs of the various elements are used to represent inverting inputs or outputs respectively.

RAM 1 LOGIC DETAILS

The operation of RAM 1 81 will now be described with reference to FIG. 10A. In the preferred embodiment, transceivers 97 is comprised of two Texas Instruments (TI) type SN74LS245 octal bus transceivers with three-state outputs as described in their publication, *The TTL Data Book for Design Engineers*, Second Edition, copyright 1976 by Texas Instruments, Incorporated of Dallas, Texas, which reference is incorporated herein by reference. Transceivers 97 operates such that when the direction input signal CIPINN-- at its DIR input is a binary ZERO, the data at the D inputs is transmitted to the Q outputs (i.e., the signals on line CPBX00+ through CPBX15+ is transmitted to the lines CIPB00+ through CIPB15+) and when the DIR signal is in the binary ONE state, the data at the Q inputs is transmitted to the D outputs such that the signals on line CIPB00+ through CIPB15+ is transmitted to line CPBX00+ through CPBX15+. Signals CPBX00+ through CPBX15+ come from processor bus 37 in microprocessor 30. The direction signal CIPINN− comes from a decode of microinstruction bits RDDT52 through RDDT55 as performed by decoder 105 (see FIG. 10D). The D and Q inputs and outputs of transceivers 97 are isolated whenever the function (F) input is a binary ONE as determined by signal CINOUT− at the output of NAND gate 110. Signal CINOUT− is produced by NANDing together signal PHASEA− and signal CINOUT+. Signal PHASEA− is produced by inverting clocking signal PHASEA+ from microprocessor 30 via inverter 112. Signal CINOUT+ is produced by combining signal CIPOUT− and CIPINN− from decoder 105 via NAND gate 111.

Signals CIPB00+ through CIPB15+ are wire-ored together at point 113 with signals CD2L00+ through CD2L15+ to produce signals CIPI00+ through CIPI15+. Thus, transceivers 97 can input to data-in register 98 the data from processor bus 37 or can transmit to processor bus 37 the data from RAM 2 data register 88. When data-in register 98 is clocked by clocking signals CINNLD+ at its clock (C) input transitioning from the binary ZERO to the binary ONE state, the data at its D0 through D15 inputs is latched into the register and will appear at the Q0 through Q15 outputs as signals CBUS00+ through CBUS15+. Thus, data-in register 98 can store either the output of transceivers 97 when it is enabled or the output of RAM 2 data register 89 when it is enabled (see FIG. 10B). Load control signal CINNLD+ is produced by AND gate 108 combining signal CINOUT+ from NAND gate 111 and clocking signal PHASEB+ from microprocessor 30.

In the preferred embodiment, RAM 1 81 is comprised of four type AM74S189 manufactured by Advanced Micro Devices, Inc. of Sunnyvale, California, and described in their publication entitled, *Advanced Micro Devices Bipolar/MOS Memories Data Book*, copyrighted 1982, which is incorporated herein by reference, random access memories having 16 words of 4 bits each with three-state outputs. The four address (ADR) inputs are connected to RAM 1 address counter 75 to receive signals CAD100+ through CAD103+ such that the same four-bit word will be accessed in each of the RAMS. The memory data inputs D0 through D3 are connected to receive four bits from data-in register 98 such that RAM 1-0 81-0 receives bits CBUS00+ through CBUS03+, RAM 1-1 81-1 receives bits CBUS04+ through CBUS07+, RAM 1-2 81-2 receives bits CBUS08+ through CBUS11+ and RAM 1-3 81-3 receives bits CBUS12+ through CBUS15+. Each RAM chip is write enabled by signal CWROP1− at its write enable (WE) input. The Q outputs of each RAM 1 chip are individually enabled under the control of the F input such that at any given time only one of the four RAMS will have its four bits output enabled. The output of RAM 1-0 81-0 is controlled by signal CSEL10− from AND gate 76-3, RAM 1-1 81-1 has its outputs controlled by signal CSEL11− from AND gate 76-4, RAM 1-2 81-2 has its outputs controlled by signal CSEL12− from AND gate 76-5 and RAM 1-3 81-3 has its outputs controlled by signal CSEL13− from AND gate 76-6. AND gates 76-3 through 76-6 all have signal CWROP1− at one input. The second input of each of these AND gates comes from decoder 76-2 as signal CRD100− through signal CRD103−. Of these four signals, only one will be in the binary ONE state at any given time such that only one of signals CSEL10− through CSEL13− will be in the binary ZERO state at any given instance thereby allowing the Q outputs of RAM 1-0 through RAM 1-3 to be wire-ored together at point 114.

The four bit word which is enabled at the output of one of RAM 1-0 through RAM 1-3 is determined by nibble out control 76 logic which is comprised of RAM 1 nibble counter 76-1, decoder 76-2 and AND gate 76-3 through 76-6. The 16-bit word which is written in four bits into each of RAM 1-0 through RAM 1-3 is controlled by RAM 1 address counter 75. By controlling RAM 1 in this manner, a 16-bit word can be written into RAM 1 in the word addressed by RAM 1 address counter 75 and a 4-bit nibble can be output as selected by RAM 1 address counter 75 and nibble-out control 76. RAM 1 81 is write enabled by signal CWROP1− from AND gate 115. AND gate 115 combines the clocking signals PHASEA+ and PHASEB+ from microprocessor 30 along with signal CWRT01+ which is output by AND gate 116. AND gate 116 combines signal CIPCOD+ and signal CROS41+. Signal CROS41+ comes from microinstruction bit RDDT41 and signal CIPCOD+ is derived by combining microinstruction bits CROS35+ through CROS37+ in NAND gate 117 the output of which is signal CIPCOD− which is inverted by inverter 118 to produce signal CIPCOD+.

In the preferred embodiment, RAM 1 address counter 75 and RAM 1 nibble counter 86-1 are TI type SN74LS169 synchronous 4-bit up/down counters as described in *The TTL Data Book for Design Engineers*. Both counters are clocked each microinstruction when signal PHASEB− transitions from the binary ZERO to the binary ONE state. Signal PHASEB+ is derived by inverting clocking signal PHASEB+ from microprocessor 30 by use of inverter 119. When both count enable inputs P and T are in the binary ZERO state, the clocking of the counter will result in the counter being incremented by one or decremented by one depending upon the state of the up/down (U/D) input. RAM 1 address counter 75 is count enabled by signal CNTOP1− being in the binary ZERO state and RAM 1 nibble counter 76-1 is count enabled by signal CNTCT1− being in the binary ZERO state. RAM 1 address counter 75 counts up when signal CDWN01− is a binary ONE and counts down when that signal is a binary ZERO. Similarly, this RAM 1 nibble counter 76-1 counts up when signal CTDCT1− is a binary ONE and counts down when that signal is a binary ZERO. Signal CDWN01− is output by AND gate 120 which combines signals CDAD01− from decoder 106 and signal CTDCT1− from decode PROM 104 both of which are derived from decoding various bits of the microinstruction word (see FIG. 10D). RAM 1 address counter 75 is loaded with bits CBUS13+ through CBUS10+ when signal CLDAD1− at the load (L) input is in the binary ZERO state. Signal CLDAD1− is derived by decoding microinstruction bits via decoder PROM 104 (See FIG. 10D). Similarly, RAM 1 nibble counter 76-1 is loaded with bits CBUS15+ and CBUS14+ when under the control of signal CLDCT1− at its load (L) input. Signal CLDCT1− also comes from decode PROM 104 (see FIG. 10D). The enabling of RAM 1 nibble counter 76-1 is controlled by signal CNTCT1− which is the output of AND gate 121. AND gate 121 combines signal CTUCT1− and signal CTDCT1− both of which are derived from the microinstruction bits being decoded by decode PROM 104.

The 2-bit output of RAM 1 nibble counter 76-1 which allows it to count from 0 through 3 are signal CNT101+ and CNT100+. These two signals are decoded by decoder 76-2 such that the one chip of RAM 1-0 through RAM 1-3 will have its outputs enabled which are ORed together by wire-or 114 to produce signal CRAM10− through CRAM13−. These signals are input to RAM 1 zero multiplexer 82 to provide one of two inputs to be selected between. The other inputs to RAM 1 zero multiplexer 82 is a binary ONE which when inverted produces a binary ZERO at its output if that input is selected. RAM 1 zero multiplexer 82 is always enabled by the binary ZERO appearing at its enable (F) input. The selection between the two inputs is done under the control of select (SEL) input CROS47− which is derived by inverting microinstruction bit CROS47+ by inverter 122. The output of RAM 1 zero multiplexer 82, signals COP100+ through COP103+, is input into double multiplexer 83 (see FIG. 10C).

Gates 123 through 128 control the enabling of RAM 1 address counter 75 which can be enabled to either count up or count down each time a microinstruction is executed. Gate 120 controls the direction in which the address counter 75 will be counted, whether it is up or down. The inputs to AND gate 120 are signals CTDCT1− and CDAD01−. Signal CTDCT1− will be a binary ONE if a CTDCT1 microoperation is included within the microinstruction thereby indicating that RAM 1 nibble counter 76-1 is to be decremented (i.e., counted down) and signal CDAD01− will be a binary ZERO if a CDAD01 microoperation is included in a microinstruction thereby indicating that RAM 1 address counter 75 is to be decremented. Thus, the output of AND gate 120, signal CDWN01−, will be a binary ZERO if either RAM 1 nibble counter 76-1 or RAM 1 address counter 75 is to be counted down, thus setting RAM 1 address counter 75 into the decrement mode by providing a binary ZERO signal at its U/D input.

The enabling of RAM 1 address counter 75 is done by control signal CNTOP1− being in the binary ZERO state at the output of AND gate 128. There are three conditions which will cause the output of AND gate 128 to be a binary ZERO and thus enable RAM 1 address counter 75 to be either decremented or incremented depending upon the state of the U/D input. If either a increment address 1 microoperation (CIAD01) or a decrement address 1 microoperation (CDAD01) is encoded in the microinstruction then signal CIAD1− will be a binary ZERO or signal CDAD01− will be a binary ZERO and the output of AND gate 127, signal CNTWD1−, will be a binary ZERO and thereby the cause the output of AND gate 128 to be a binary ZERO and enable the incrementing or decrementing of RAM 1 address counter 75. Thus, if the microinstruction contains either an increment or decrement address 1 microoperation, RAM 1 address counter 75 will be enabled. The other two conditions which enable RAM 1 address counter 75 are if RAM 1 nibble counter 76-1 has been decremented to a count of 0, or has been incremented to a count of 3 thus requiring that the word address be decremented or incremented, respectively, by 1. The output of OR gate 123, signal CNT1E0−, will be a binary ZERO if the output of RAM 1 nibble counter 76-1 is a binary ZERO. The binary ZERO of signal CNT1E0− at one input of OR gate 124 will cause signal CNTDN1− to be a binary ZERO if its other input, signal CTDCT1−, is a biinary ZERO. Signal CTDCT1− from decode PROM 104 (see FIG. 10D) will be a binary ZERO if a count down counter 1 microoperation (CTDCT1) is present in the microinstruction, or if a count down both counter 1 and counter 2 microoperation (CTDALL) is present in the microinstruction. Thus, if when counting down the output of RAM 1 nibble counter 76-1 is a binary 00, signal CNTDN1− will be a binary ZERO and cause the output of AND gate 128 to become a binary ZERO and enable the counting of RAM 1 address counter 75. Similarly, if counting up and the nibble counter reaches a count of 3, the output of NAND gate 125, signal CNT1E3−, will become a binary ZERO and if counting up, as indicated by signal CTUCT1− being a binary ZERO, the output of OR gate 126, signal CNTUP1−, will become a binary ZERO and cause the output of AND gate 128 to become a binary ZERO and enable RAM 1 address counter 75. Signal CTUCT1−, which is input to OR gate 126, comes from decode PROM 104 (see FIG. 10C) and will be a binary ZERO if either a count up counter 1 microoperation (CTUCT1) or a count up both counter 1 and counter 2 microoperation (CTUALL) is present in the microinstruction.

From this discussion it can be appreciated that RAM 1 address counter 75 is enabled if the address counter 75 is to be incremented or decremented by 1 as determined by a microinstruction and thus incremented to address the next word in RAM 1 81 or if counter 1 or counters 1 and 2 are being incremented or decremented and the output of the nibble counter 76-1 is equal to 3 when counting up or equal to 0 when counting down so that the next nibble can be addressed from the next word.

RAM 1 nibble counter 76-1 is enabled to count by signal CNTCT1− at the output of AND gate 121 which will be a binary ZERO if either of its inputs, signal CTUCT1− or CTDCT1−, are a binary ZERO and the state of these inputs is controlled by the count up and count down microoperations as mentioned before. The counting direction of RAM 1 nibble counter 76-1 is controlled by signal CTDCT1− and will be a binary ZERO indicating that the counter is to be decremented if a count down counter 1 microoperation (CTDCT1) or a count down counter 1 and counter 2 operation (CTDALL) is present in the microinstruction.

From the above discussion it can be appreciated that the logic in FIG. 10A permits commercial instruction logic 28 to either receive data from or send data to processor bus 37 via transceivers 97, to latch data into into data-in register 98 from either processor bus 37 or RAM 2 data register 88 and that RAM 1 81 can be addressed under the control of RAM 1 address counter 75 such that a 16-bit word can be written into RAM 1 81 or a 4-bit nibble can be read from RAM 1 81 under the control of RAM 1 address counter 75 and RAM 1 nibble counter 76-1. Further, RAM 1 address counter 75 can be loaded from data-in register 98 as can RAM 1 nibble counter 76-1 and that RAM 1 address counter 75 can be incremented or decremented and that RAM 1 nibble counter 76-1 can be incremented or decremented and that incrementing through a count of 3 will also result in the incrementing of RAM 1 address counter 75 and a decrementing through a count of 0 will result in the decrementing of RAM 1 address counter 75. Further, RAM 1 zero multiplexer 82 allows either the 4-bit nibble from RAM 1 81 to be passed on to an input of double multiplexer 83 or a zero nibble to be passed on to double multiplexer 83.

RAM 2 LOGIC DETAILS

Figure 10B:
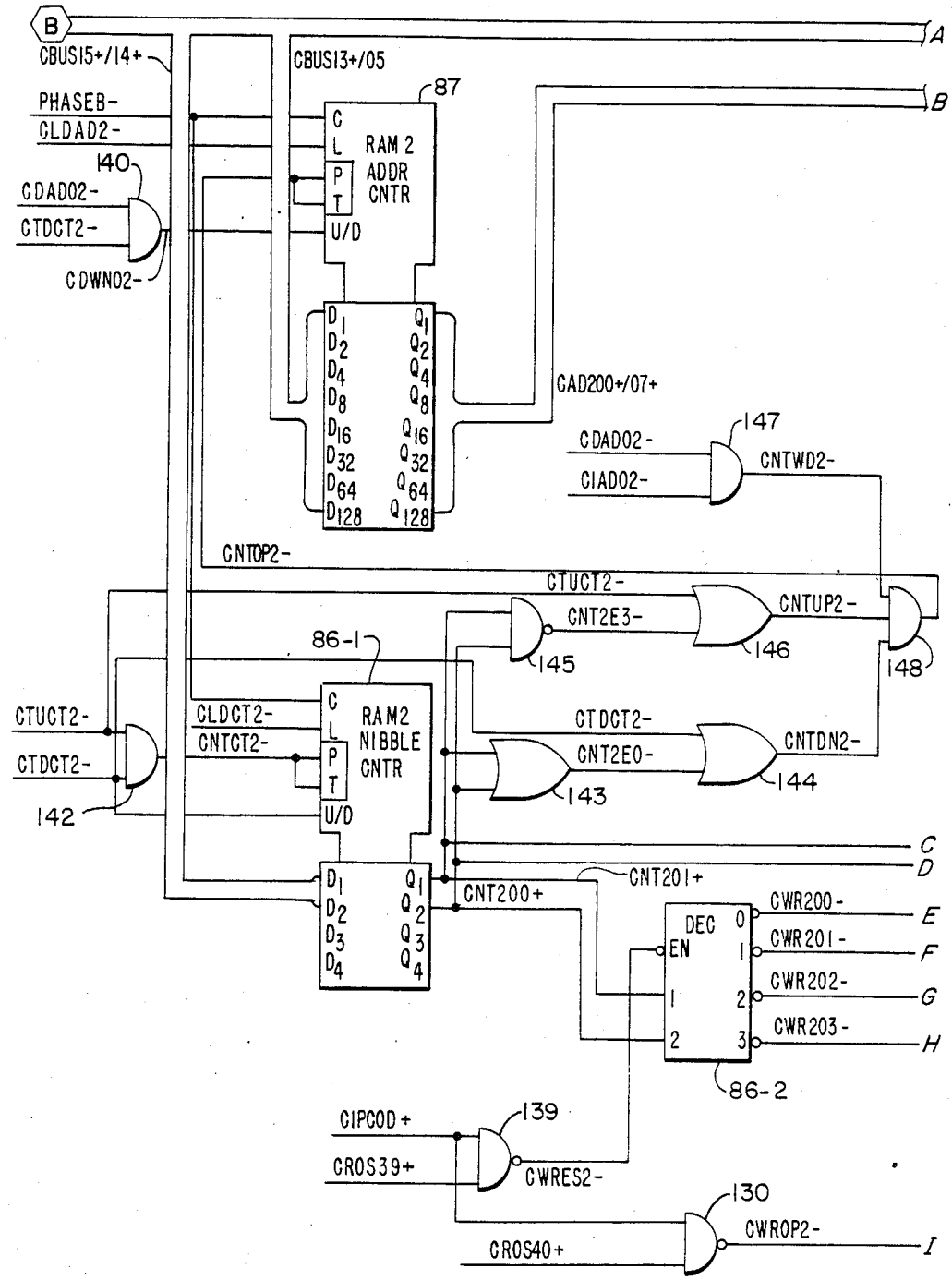
Figure 10B:
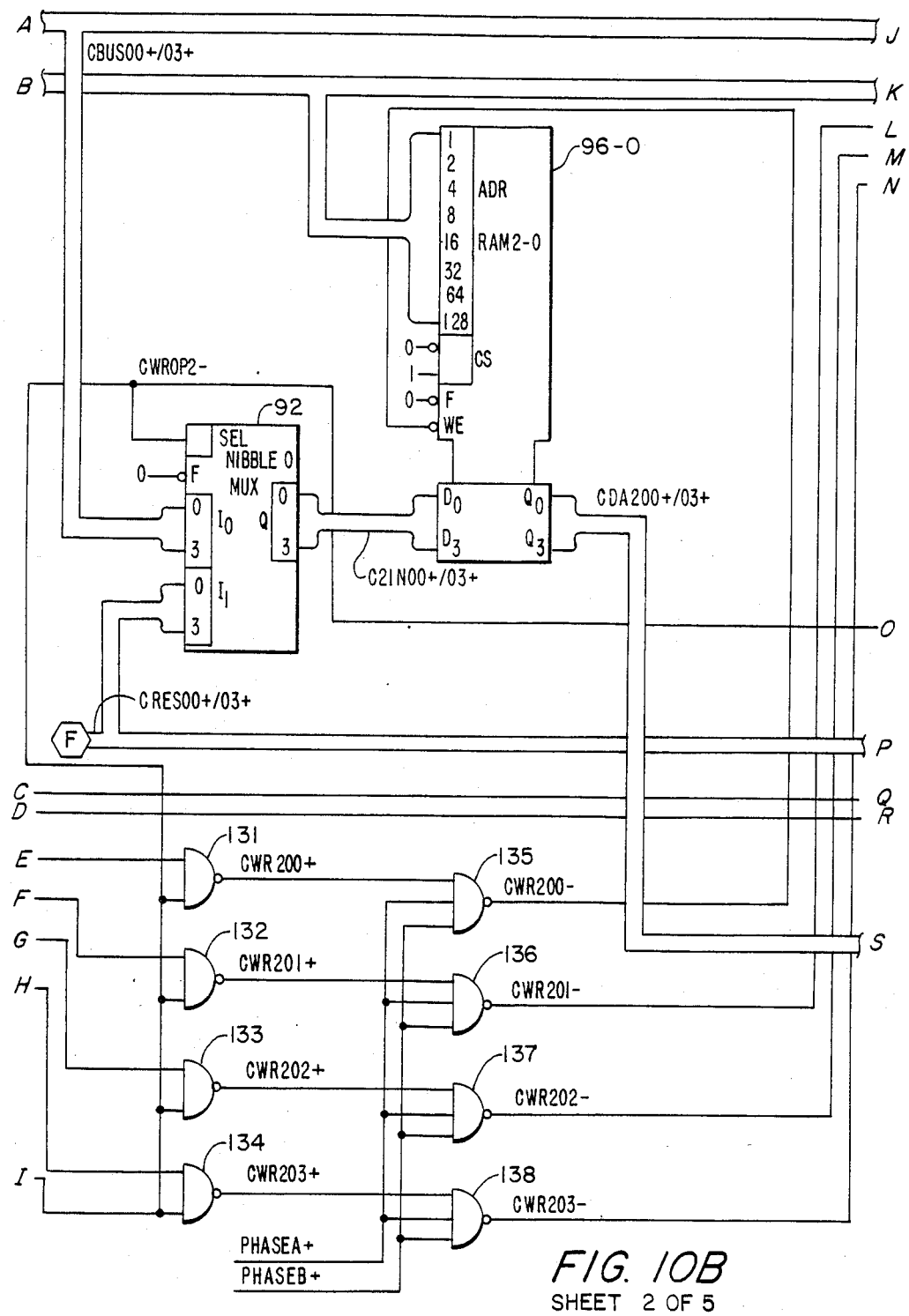
Figure 10B:
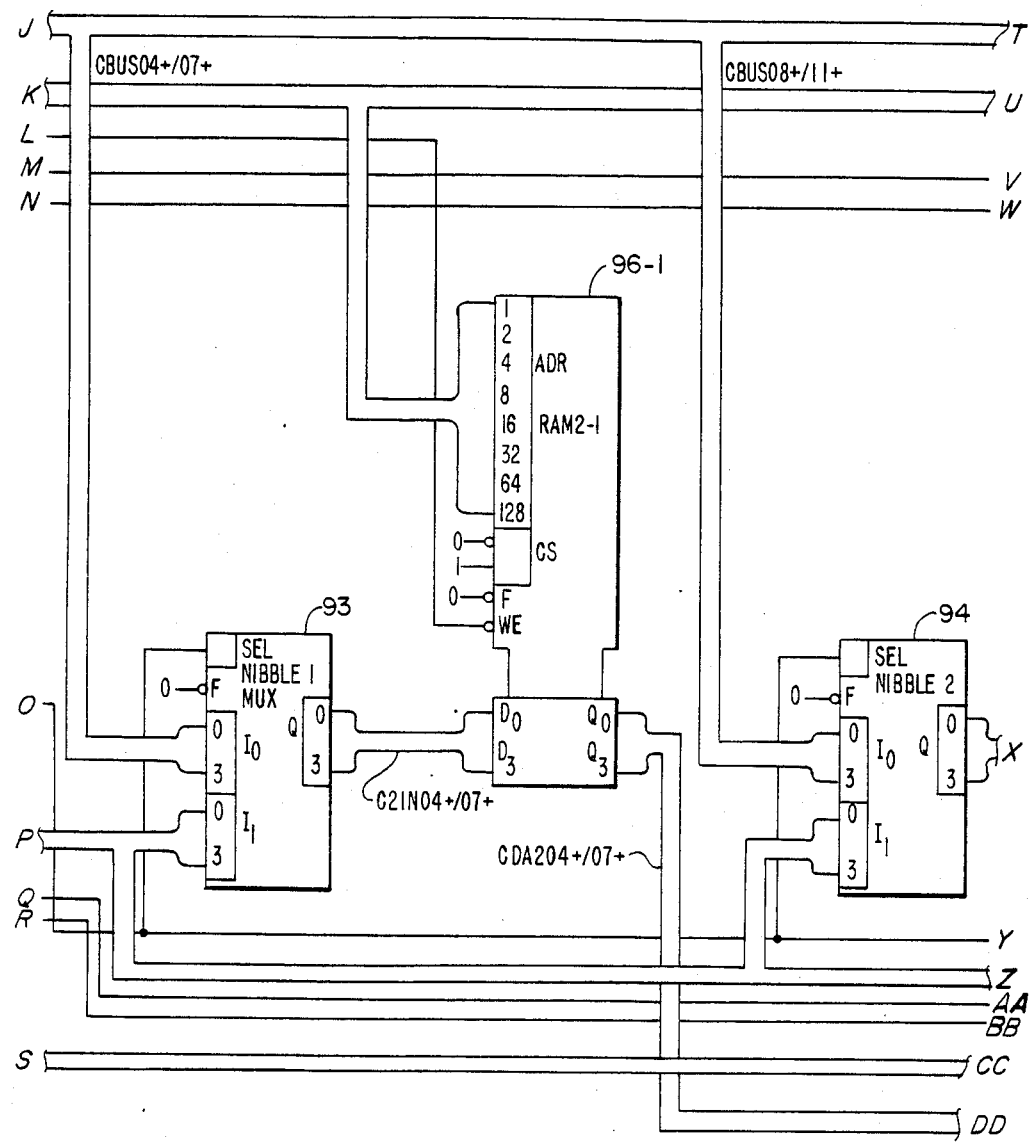
Figure 10B:
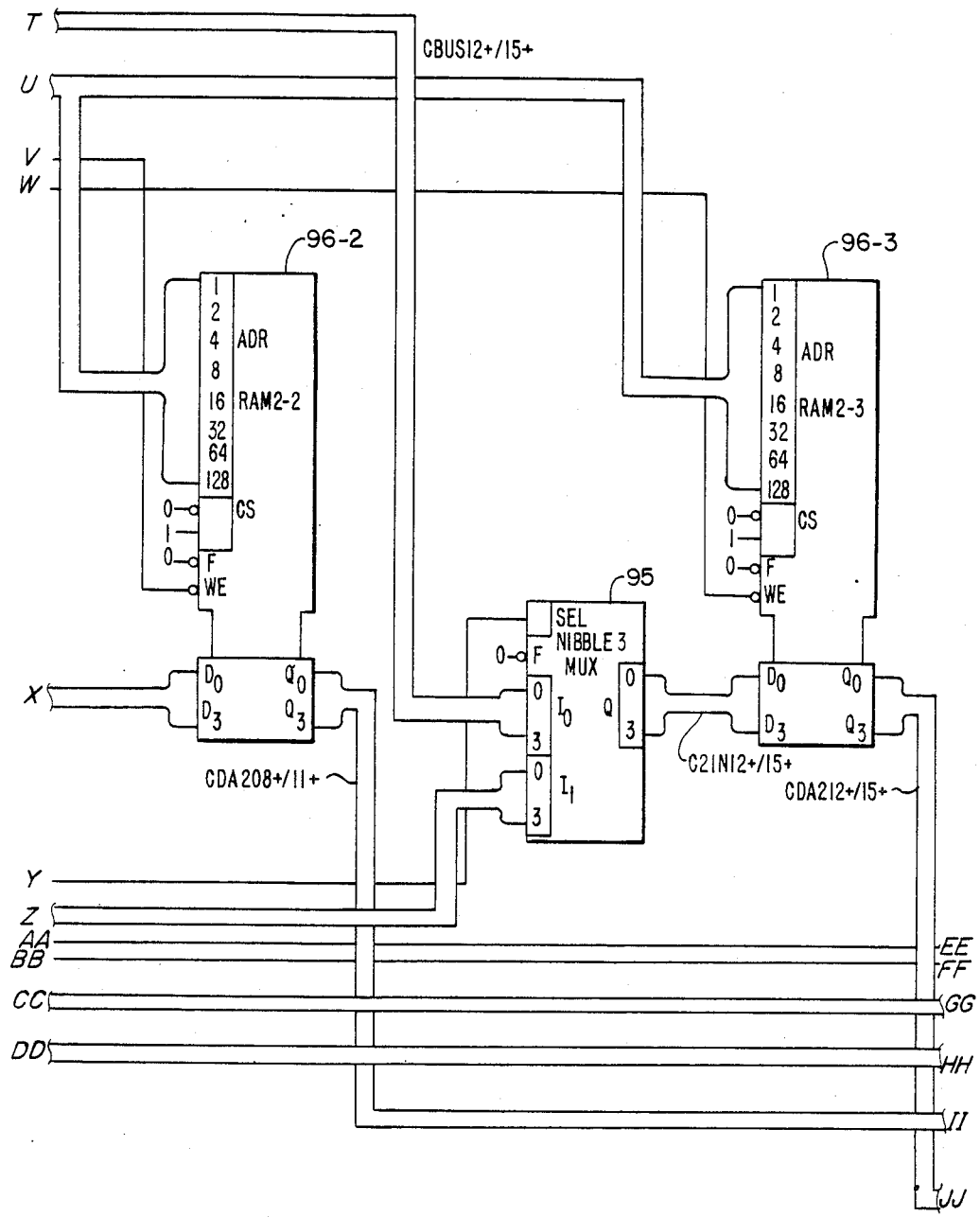
Figure 10B:
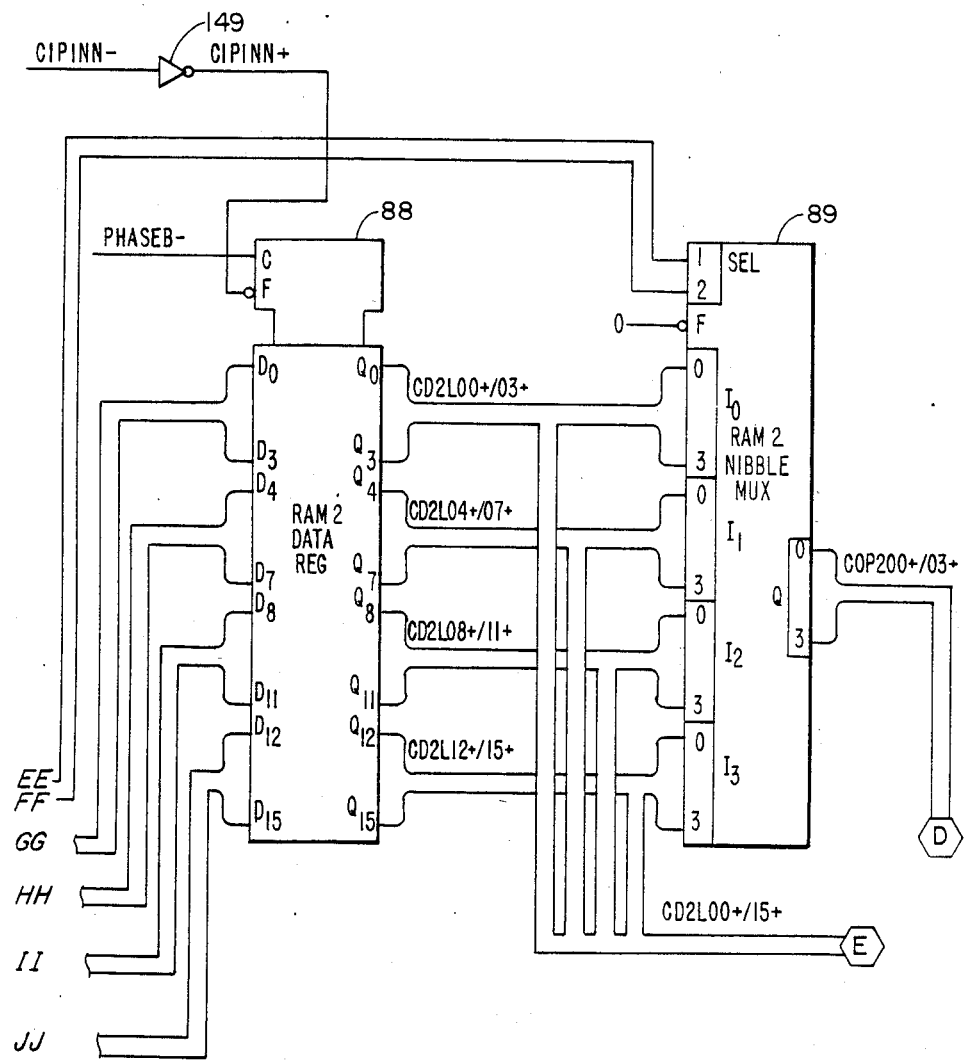

FIG. 10B illustrates the logic associated with RAM 2 96. RAM 2 96 differs from RAM 1 81 in that in addition to being able to write a whole word of 16 bits into RAM 2 with the address specified by RAM 2 address counter 87, a single 4-bit nibble can be written into RAM 2 96 with the address of the word being specified by RAM 2 address counter 87 and the one of four nibbles being selected by nibble write control 86. In addition, unlike RAM 1 81 which outputs only a single nibble at a time, RAM 2 96 always outputs a full 16-bit word into RAM 2 data register 88 and one of four from that word is selected by RAM 2 nibble multiplexer 89.

In the preferred embodiment, RAM 2 96 is comprised of four random access memory chips of the type 93422, manufactured by Fairchild Camera and Instruments Corporation of Mountain View, Calif., and described in their publication, *Bipolar Memory Data Book*, copyrighted 1979, which is incorporated herein by reference. The word within RAM 2 96 which is to be either written or read is controlled by connecting the output of RAM 2 address counter 87, signal CAD200+ through CAD207+, to the address inputs of RAM 2-0 chip 96-0, RAM 2-1 chip 96-1, RAM 2-2 chip 96-2 and RAM 2-3 chip 96-3. The outputs of RAM 2 chips 96-0 through 96-3 are enabled by connecting the function (F) input of each chip to a binary ZERO. The write enable (WE) input of RAM 2 chips 96-0 through 96-3 are controlled by signals CWR200− through CWR203− thus allowing each chip to be individually write enabled or all chips to be write enabled as will be described below. The chip select (CS) inputs of RAM 2 chips 96-0 through 96-3 are enabled by connecting the inverted input to a binary ZERO and the noninverted input to a binary ONE thus enabling the chips at all times.

The four data input bits of the RAM 2 chips are connected to the output of their corresponding nibble multiplexer such that, for example, the four data inputs to RAM 2-0 chip 96-0 are connected to receive signal C2IN00+ through C2IN03+, which are the outputs of nibble 0 multiplexer 92. The outputs of nibble multiplexer 92 through 95 are always enabled by connecting the function (F) input of each multiplexer to a binary ZERO. The zeroth inputs of nibble multiplexers 92 through 95 are connected to receive a different four bits from data-in register 98 such that nibble 0 multiplexer 92 is connected to receive bits CBUS00+ through CBUS03+, nibble 1 multiplexer 93 is connected to receive signals CBUS04+ through CBUS07+ and similarly nibble 2 multiplexer 94 receives signals CBUS08+ through CBUS11+ and nibble 3 multiplexer 95 receives signals CBUS12+ through CBUS15+.

The selection between the zeroth input and first input of nibble multiplexers 92 through 95 is controlled by signal CWROP2− at their select (SEL) input. Signal CWROP2− at the output of NAND gate 130 will be a binary ZERO if a write all of RAM 2 microoperation (CWROP2) is present in the microinstruction thereby causing signal CROS40+ to be a binary ONE and signal CIPCOD+ to also be a binary ONE. Thus, when a write all of RAM 2 microoperation is present, nibble multiplexers 92 through 95 will select as input to RAM 2 chips 96-0 through 96-3 the output of data-in register 98. When signal CWROP2− is a binary ZERO, the output of NAND gates 131 through 134, signals CWR200+ through CXWR203+, will all be binary ONEs and partially enable NAND gates 135 through 138, respectively. The output of NAND gates 135 through 138, signals CWR200− through CWR203−, will become binary ZEROs and write enable RAM 2 chips 96-0 through 96-3 when clocking signals PHASEA+ and PHASEB+ from microprocessor 30 become binary ONEs. Thus, it can be appreciated when a write all of RAM 2 microoperation (CWROP2) is executed, RAM 2 chips 96-0 through 96-3 will all be enabled and a different 4-bit nibble from data-in register 98 will be written into each chip via nibble multiplexers 92 through 95.

Figure 10C:
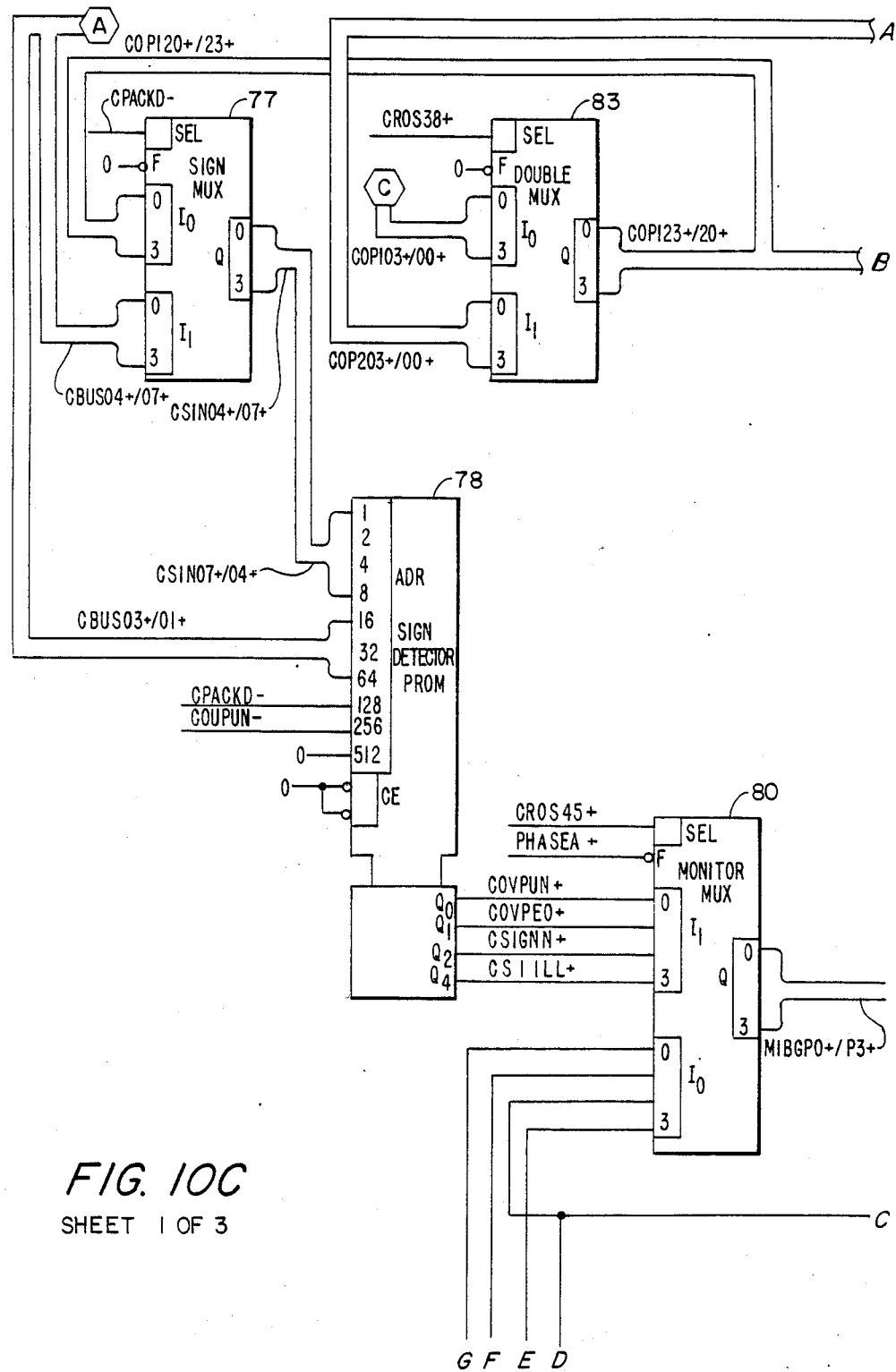
Figure 10C:
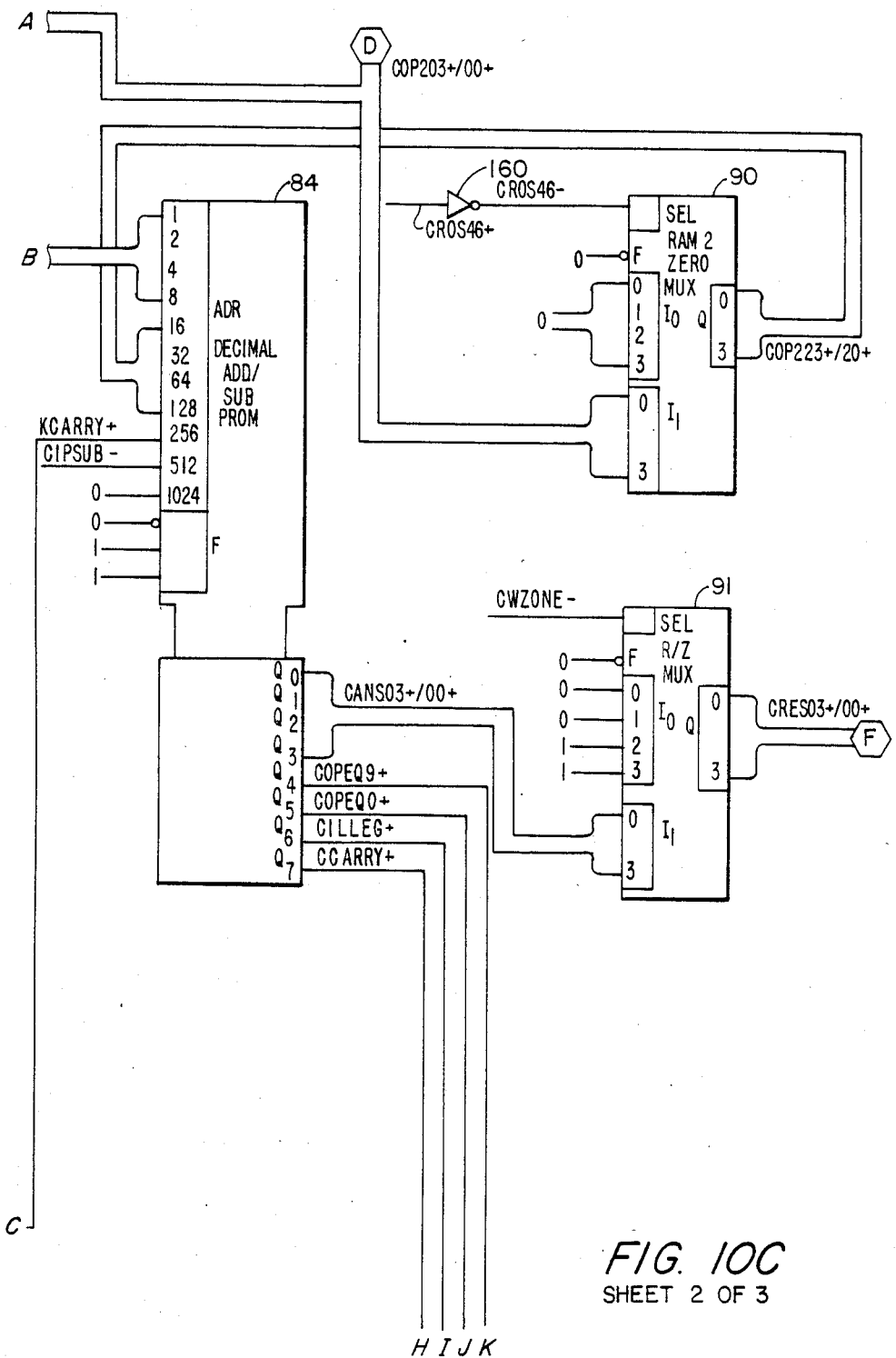
Figure 10C:
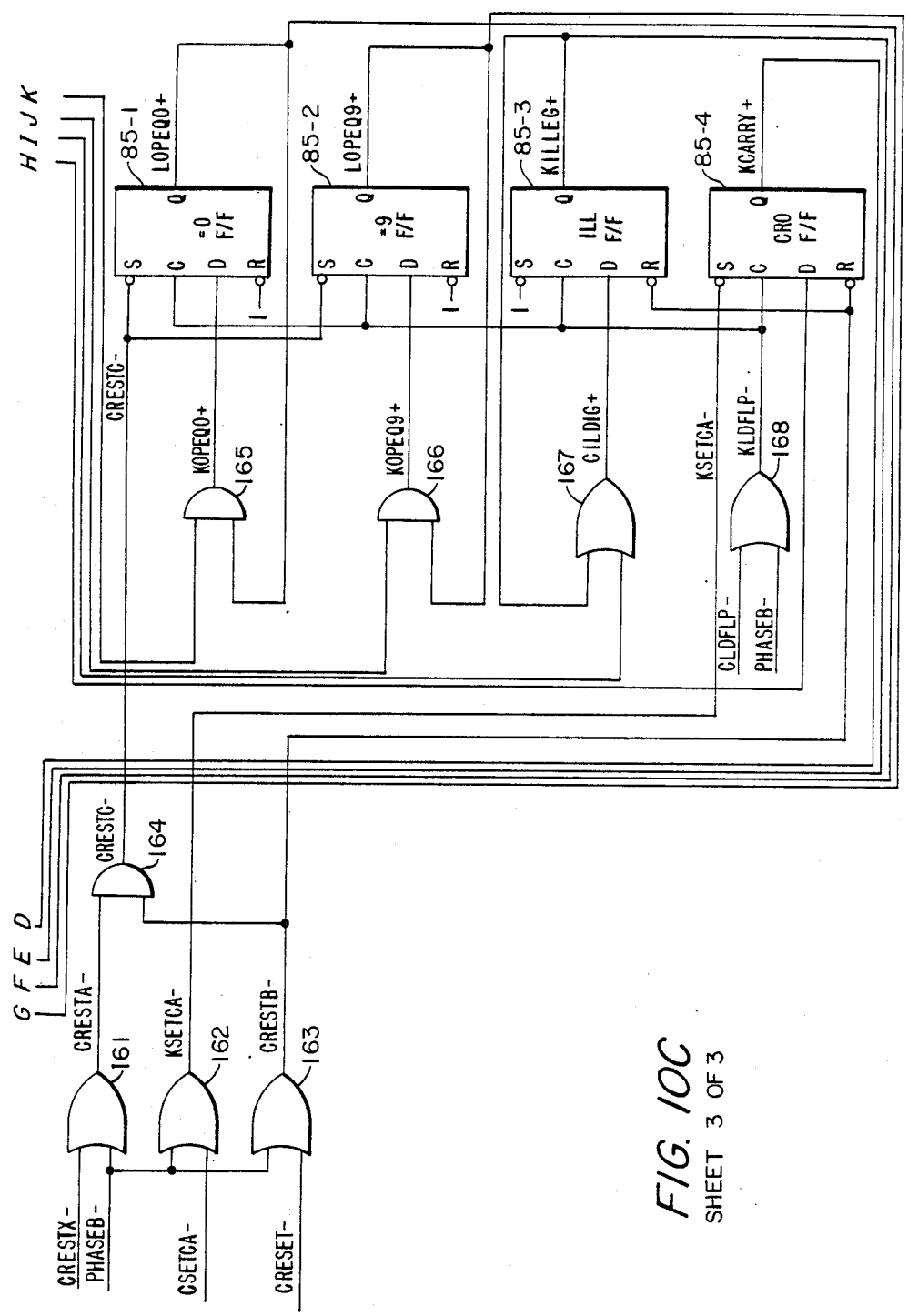

Input 1 of nibble multiplexers 92 through 95 are each connected to receive the four signals CRES00+ through CRES03+ which is output from result/zone multiplexer 91 (see FIG. 10C). The first input of nibble multiplexers 92 through 95 is selected if signal CWROP2− is a binary ONE indicating that a write all of RAM 2 microoperation is not present in the microinstruction. If a write nibble to RAM 2 microoperation (CWRES2) is present in a microinstruction, signal CROS39+ at one input of NAND gate 139 will be a binary ONE as will signal CIPCOD+ at the other input of NAND gate 139 thus causing its output, signal CWRES2−, to become a binary ZERO and enable decoder 86-2. Decoder 86-2 decodes the nibble count from RAM 2 nibble counter 86-1 thus enabling one of its four outputs, signal CWR200− through CWR203− to become a binary ZERO with the other three outputs remaining in the binary ONE state. Whichever signal of CWR200− through CWR203− becomes a binary ZERO, it will disable one of NAND gates 131 through 134 and thereby cause the output of one of the NAND gates to become a binary ONE which will enable one of NAND gate 135 through 138 and cause one of their outputs, signal CWR200− through CWR203−, to become a binary ZERO when clocking signals PHASEA+ and PHASEB+ from microprocessor 30 become binary ONEs. With one of NAND gates 135 through 138 fully enabled and the other three NAND gates disabled. One of signals CWR200− through CWR203− will become a binary ZERO and write enable its corresponding RAM 2 chip 96-0 through 96-3 and thereby allow one nibble to be written into the word addressed by RAM 2 address counter 87 and the nibble addressed by RAM 2 nibble counter 86-1. As indicated before, the source of the single nibble to be written into RAM 2 96 comes from the output of result/zone multiplexer 91 as signals CRES00+ through CRES03+.

The word to be written into or read from RAM 2 96 is determined by the output of RAM 2 address counter 87 bit CDA200+ through CDA207+. RAM 2 address counter 87 and RAM 2 nibble counter 86-1 are TI type SN74 LS169 4-bit up/down synchronous counters. RAM 2 nibble counter 86-1 is connected to RAM 2 address counter 87 such that when the counter is counting up a count of 3 in the RAM 2 nibble counter 86-1 will result in an incrementing of RAM 2 address counter 87 and when counting down a count of 0 in RAM 2 nibble counter 86-1 will result in the decrementing of RAM 2 address counter 87 in a manner similar to that described for RAM 1 nibble counter 76-1 and RAM 1 address counter 75.

The clocking of RAM 2 address counter 87 and RAM 2 nibble counter 86-1 is in response to signal PHASEB− at their clock (C) input transitioning from the binary ZERO to the binary ONE state. RAM 2 address counter 87 can be loaded with signals CBUS13+ through CBUS05+ from data-in register 98 when signal CLDAD2− at the load (L) input is in a binary ZERO state. Signal CLDAD2− which comes from decode PROM 104 will be in the binary zero state if the microinstruction contains a load address 2 microoperation (CLDAD2). Similarly, RAM 2 nibble counter 86-1 will be loaded with the signals CBS15+ and CBUS14+ if signal CLDCT2− is a binary ZERO at its load (L) input. Signal CLDCT2− from decode PROM 104 will be in the binary ZERO state if a load counter 2 microoperation (CLDCT2) is specified in the microinstruction.

The enabling of the counting of RAM 2 address counter is controlled by signal CNTOP2− at the P and T count enable inputs. Signal CNTOP2− will be a binary ZERO state if any one of the three inputs to AND gate 148 is a binary ZERO. Signal CNTWD2− which is one input to AND gate 148 will be in the binary ZERO state if either input to AND gate 147 is in the binary ZERO state. One input to AND gate 147 is signal CDAD02− which will be a binary ZERO if a decrement address 2 microoperation (CDAD02) is specified in the microinstruction. Similarly, the output of AND gate 147 will be in the binary ZERO state if an increment address to microoperation (CIAD02) is specified in the microinstruction which will cause signal CIAD02− to be in the binary ZERO state at the output of decode PROM 104 (see FIG. 10D) which is input to AND gate 147.

The other two conditions that can cause the enabling of RAM 2 address counter to count up or down is if the output of OR gate 146, signal CNTUP2−, or the output of OR gate 144, signal CNTDN2−, is a binary ZERO. The output of OR gate 146 will be a binary ZERO if the output of RAM 2 nibble counter 86-1 is a 3 and a count up counter 2 microoperation (CTUCT2) is specified which will cause signal CTUCT2− to be in the binary ZERO state. Similarly, the output of OR gate 144 will be in the binary ZERO state if the output of RAM 2 nibble counter 86-1 is a 0 which will cause the output of OR gate 143, signal CNT2E0−, to be a binary ZERO and if signal CTDCT2− is a binary ZERO indicating that a count down counter 2 microoperation (CTDCT2) has been specified in the microinstruction.

RAM 2 nibble counter 86-1 is enabled to count if either a count up counter 2 microoperation (CTUCT2) or a count down counter 2 microoperation (CTDCT2) has been specified such that signal CTUCT2− will be a binary ZERO or signal CTDCT2− at the input of AND gate 142 will be a ZERO which in turn will cause the output thereof, signal CNTCT2−, to be a binary ZERO. The direction of counting of RAM 2 address counter 87 is controlled by the output of AND gate 140, signal CDWN02−, which will be a binary ZERO either a count down address 2 or a count down counter 2 microoperation has been specified (CDAD02 or CTDCT2) such that either signal CDAD02− or signal CTDCT2− is a binary ZERO. The up/down direction of counting of RAM 2 nibble counter 86-1 is controlled by signal CTDCT2− which will be in the binary ZERO state and cause the counter 2 count down if a count down counter 2 microoperation (CTDCT2) has been specified in the microinstruction.

If a write of a single nibble is microoperation (CWRES2) is specified in the microinstruction, signal CROS39+ will be a binary ONE and signal CIPCOD+ will be a binary ONE at the inputs of NAND gate 139 causing the output thereof, signal CWRES2−, to be a binary ZERO and enable decoder 86-2 such that one output will be in the binary ZERO state and the other three outputs will be in the binary ONE state and thereby enable three of NAND gate 131 through 134 and disable the remaining NAND gate such that only one of the output signals of NAND gates 135 through 138 will be a binary ZERO to write enable one of RAM 2 chips 96-0 through 96-3 as described above.

The data read from RAM 2 96 will be enabled on to the Q outputs of RAM 2 data register 88 whenever clocking signal PHASEB− is a binary ONE at the C input and the output control signal CIPINN+ is a binary ZERO at the F input. RAM 2 data register 88 is a transparent latch which means that the outputs will follow the inputs as long as the C input remains in the binary ONE state and the outputs will be latched at the level of the inputs whenever the C input becomes a binary ZERO. When the F input signal becomes a binary ONE, the state of the C input is ignored and the Q outputs assume a high impedance state. This permits the F input to control the latching of the data into RAM 2 data register 88 such that whenever a microoperation is specified which indicates that the data is to be taken from processor bus 37 into transceivers 97, for example, when a CIPINN or a CINDA2 microoperation is specified, signal CIPINN− from decode PROM 105 will be in the binary ZERO state and cause the output of inverter 149, signal CIPINN+, to be in the binary ONE state at the F input of RAM 2 data register 88.

Each 4-bit nibble grouping of output signals from RAM 2 data register 88 is one of the four data inputs to RAM 2 nibble multiplexer 89 such that the four bits output from RAM 2-0 chip 96-0 are input into the zero input and the four bits output by RAM 2-1 chip 96-1 are input into the first input, etc. RAM 2 multiplexer 89 receives selection signals CNT200+ and CNT201+ at the select (SEL) inputs from the output of RAM 2 nibble counter 86-1 such that one of four 4-bit input groups will be enabled on to the Q output to produce signal COP200+ through COP203+. The nibble output by RAM 2 nibble multiplexer 89 goes to RAM 2 zero multiplexer 90 and double multiplexer 83 (see FIG. 10C). The output of RAM 2 nibble multiplexer 89 is always enabled because of the binary ZERO at the function (F) input. The 16 bits output by RAM 2 data register 88, signals CD2L00+ through CD2L15+, besides going to RAM 2 nibble multiplexer 89 also go to transceivers 97 and data-in register 98 as described above.

DECIMAL ARITHMETIC LOGIC UNIT DETAILS

FIG. 10C illustrates the decimal add/subtract PROM 84, decimal indicators 85, sign generator PROM 78 and associated multiplexers. In the preferred embodiment, decimal add/subtract PROM 84 is a type 82S191 PROM manufactured by Signetics Corporation of Sunnyvale, Calif. PROM containing 2048 8-bit words and described in their publication, *Signetics Bipolar Memory Data Manual* 1982, copyright 1982, which is incorporated herein by reference. Also in the preferred embodiment, sign detector PROM 78 is a type 82S137 PROM, also manufactured by Signetics Corporation, having 1024 4-bit words and is described in their above named publication.

Decimal add/subtract PROM 84 (also referred to as the decimal ALU) is encoded as shown in Table 3 such that the first four address bits (bits having a binary weight of 1, 2, 4 and 8) normally receive operand 1 which comes from the output of double multiplexer 83 as signals COP123+ through COP120+. These four address bits are also referred to as the A port of decimal ALU 84 because they receive the first of two decimal numeric inputs upon which the decimal arithmetic operation is performed. The next four address bits, bits having a binary weight of 16 through 128, come from the output of RAM 2 zero multiplexer 90 as signals COP223+ through COP220+ which normally will be operand 2 from RAM 2. These four bits are also referred to as the B port of decimal ALU 84 because they receive the second of two decimal numeric inputs upon which the decimal arithmetic operation is performed. The bit having a binary wait of 256 receives the carry-in signal KCARRY+ and the address bit having a binary weight of 512 receives signal CIPSUB− from decoder 106 which when a binary ZERO indicates that a subtract operation is to be performed and when a binary ONE indicates that an addition operation is to be performed. The eleventh address bit of PROM 84 having a binary weight of 1024 is connected to a binary ZERO and therefore results in only the first 1024 words of PROM 84 being addressed. The inverted function (F) input receives a binary ZERO and the two noninverted inputs receive a binary ONE thereby providing that the 8-bit word outputs Q0 through Q7 are continually enabled. The 8-bit word read from decimal add/subtract PROM 84 as shown in Table 3 contains the 4-bit result of adding (or subtracting) the 4-bit operand 1 to the 4-bit operand 2 in bits 0 through 3 as signal CANS03+ through CANS00+ and contain the four indicator bits as signal COPEQ9+ for controlling the equal nine indicator, signal COPEQ0+ for controlling the equal zero indicator, signal CILLEG+ for controlling the illegal nibble indicator and signal CCARRY+ for controlling the carry out indicator.

As discussed above, double multiplexer 83 is used to select the operand 1 input to PROM 84 from either RAM 1 in which case signals COP103+ through COP100+ are selected, or from the output of RAM 2 multiplexer 89 which receives a nibble from RAM 2. If the nibble from RAM 2 multiplexer 89 is to be selected as operand 1, then signals COP203+ through COP200+ are selected to be gated on to the Q outputs as signals COP123+ through COP120+. Double multiplexer 83 is continually enabled by the binary ZERO at its function (F) input and the selection between the zeroth input and the first input is done under the control of signal CROS38+ at the select (SEL) input. Signal CROS38+ comes from bit RDDT38 and is a binary ONE if a double output microoperation (CIPDUB) is encoded in the microinstruction word.

The operand 2 input of decimal add/subtract PROM 84 comes from the output of RAM 2 zero multiplexer 90. RAM 2 zero multiplexer selects between the binary ZEROs at the zeroth input or the output of RAM 2 nibble multiplexer 89 which is signal COP203+ through COP200+. The outputs of RAM 2 zero multiplexer 90 are always enabled by the binary ZERO at the function (F) input. The selection between the binary ZERO and the output of RAM 2 nibble multiplexer to be enabled on to the Q outputs is done by signal CROS46+ which is inverted by inverter 160 to produce signal CROS46− at the select (SEL) input of RAM 2 zero multiplexer 90. Signal CROS46+ is derived from bit RDDT46 of the microinstruction word which is a binary ONE if the inhibit RAM 2 microoperation (CINOP2) is encoded in the microinstruction word.

Result/zone multiplexer 91 is used to select between a zone nibble containing a hexadecimal 3 as the zeroth input or the 4-bit decimal result coming from decimal add/subtract PROM 84 as signals CANS03+ through CANS00+ at the first input. Result/zone multiplexer 91 is always enabled by the binary ZERO at its function (F) input. Selection between the zone nibble and the decimal result nibble is done under the control of signal CWZONE− which at the select (SEL) input which will be a binary ZERO is output by decode PROM 105 when a write zone to RAM 2 microoperation (CWZONE) is encoded in the microinstruction word. The output of result/zone multiplexer 91, signal CRES03+ through CRES00+, are fed back as input to nibble multiplexers 92 through 95 thus allowing either a zone nibble or the decimal result nibble to be written into RAM 2 96.

Indicator flip-flops 85-1 through 85-4 are D-type flip-flops and are all clocked by clocking signal KLDFLP− which is connected to their clock (C) input transitioning from the binary ZERO to the binary ONE state. This transition of signals KLDFLP− will occur at the end of each microinstruction to load in the status of the indicators as output by decimal add/subtract PROM 84 when signal PHASEB− at one input of OR gate 168 becomes a binary ONE if signal CLDFLP− is a binary ZERO at the other input of OR gate 168. Signal CLDFLP− comes from decode PROM 105 and will be a binary ZERO enabling the clocking of indicator flip-flops 85-1 through 85-4 if a load indicator's microoperation (CLDFLP) is present in the microinstruction. If the load indicator's microoperation is not encoded within the microinstruction, signal CLDFLP− will be a binary ONE and maintain signal KLDFLP− in the binary ONE state thus inhioiting its transition from the binary ZERO to the binary 3NE state which is necessary in order to clock the indicator flip-flops 85-1 through 85-4.

Both the equal zero indicator flip-flop 85-1 and the equal nine indicator flip-flop 85-2 are arranged in a similar manner such that during certain arithmetic operations both flip-flops can be preset so that their Q output signal will be in the binary ONE state and will be reset if their corresponding output signal from decimal add/subtract PROM 84 becomes a binary ZERO thereafter. For example, equal zero indicator flip-flop 85-1 is initially set by signal CRESTC− at its set (S) input becoming a binary ZERO whizh will result in its Q output signal LOPEQ0+ becoming a binary ONE at one input to AND gate 165. Thereafter, if the loading of flip-flops is permitted by a load indicator's microoperation (CLDFLP), equal zero indicator flip-flop 85-1 will be clocked at the end of the microinstruction and the output of AND gate 165 will be determined by te COPEQ0+ signal from decimal add/subtract PROM 84 which is the other input to AND gate 165. If the 8-bit word retrieved from decimal add/subtract PROM 84 contains a binary ONE in the equal zero bit position, when equal zero indicator flip-flop 85-1 is clocked the binary ONE at the data (D) input will be clocked into the flip-ilop and the flip-flop will not change state. However, if the signal COPEQ0+ is a binary ZERO, the output of ANO gate 165, signal KOPEQ0+, will be a binary ZERO and when clocked into flip-flop 85-1 will result in its output beirg reset and its output signal LOPEQ0+ becoming a binary ZERO. Thereafter, because one input of AND gate 165 is now a binary ZERO, the flip-flop will remain in the reset state independent of the binary state of the equal zero bit from decimal add/subtract PROM 84. In this manner, the equal zero indicator flip-flop 85-1 and the equal nine flip-flop 85-2 are known as integrating indicator flip-flops in that the indicator is initially placed in a first state and once it is changed to a second state will remain in the second state independent of the fact that the data input may return to the first state.

Equal nine indicator flip-flop 85-2 is similarly constructed in that it outputs signal LOPEQ9+ is fed into one input of AND gate 166 which receives its other input from decimal add/subtract PROM 84 as signal COPEQ9+. Both indicator flip-flops 85-1 and 85-2 are initially set by signal CRESTC− becoming a binary ZERO at their set inputs. both flip-flop 85-1 and 85-2 have their reset (R) inputs fixed to receive a binary CNE signal.

The illegal digit (nibble) indicator flip-flop 85-3 is constructed in a manner similar to equal zero and equal nine indicator flip-flops 85-1 and 85-2 except that illegal digit indicator flip-flop 85-3 is initially preset to the binary ZERO state causing its Q output, signal KILLEG+, to become binary ZERO which is fed back into OR gate 167. Thereafter, if the illegal digit indicator bit from decimal add/subtract PROM 84, signal CILLEG+, becomes a binary ONE indicating that the result of the addition or subtraction has produced an illegal digit because one of the two operands contains an illegal digit (see Table 3), then illegal digit indicator flip-flop 85-3 will become set causing its Q output, signal KILLEG+, to assume the binary ONE state and thereafter insure that the output of OR gate 167, signal CILDIG+, will remain in the binary ONE state until such time as the indicator flip-flop is reset. Illegal digit indicator flip-flop 85-3 has its set (S) input fixed to receive a binary ONE and its reset (R) input receives signal CRLSTB− from OR gate 162 which allows the illegal indicator flip-flop 85-3 to be initially preset to the binary ZERO state.

The carry output indi:ator flip-flop 85-4 is not an integrating type flip-flop such that its state will change each time it is clocked independent of its previous state. Therefore, the data input of carry-out indicator flip-flop 85-4 receives its input directly from the carry bit as output by decimal add/subtract PROM 84 as signal CARRY+. As will be seen below, it is sometimes desirable to be able to preset the carry-out indicator flip-flop 85-4 to the set state thereby causi:g its Q output, signal KCARRY+ to be a binary ONE or to be able to preset it to the binary ZERO state and thus presetting its cutput to the signal KCARRY+ to the binary ZERO state. Carry out indicator flip-flop 85-4 is preset to the binary ONE state if signal KSETCA− becomes a binary ZERO and is preset to the binary ZERO state if signal CRESTB− at its reset (R) becomes a binary ZERO.

Gates 161 through 164 are used to control the presetting of indicator flip-flops 85-1 through 85-4. OR gates 161 through 163 each receive as one input a signal PHASEB− which is a clocking signal from microprocessor 30. This timing signal when it transitions from the binary ONE to the binary ZERO state is used to set or reset the indicator flip-flops 85-1 through 85-4 depending upon whether the other input of the OR gate is a binary ZERO which is controlled by a microoperation. For example, OR gate 161 receives signal CRESTX− which will be in a binary ZERO state if a reset equal zero and equal nine indicators microoperation (CRESTX) is present in a microinstruction. If this microoperation is present, the output of OR gate 161, signal CRESTA−, will become a binary ZERO when the clocking signal PHASEB− becomes a binary ZERO and thereby force the output of AND gate 164, signal CRESTC−, to the binary ZERO state and result in the presetting of the equal zero indicator flip-flop 85-1 and the equal nine indicator flip-flop 85-2 to the binary ONE state. Signal CRESTX− is produced by decoder 106 as is signal CRESET− at one input of OR gate 163.

Signal CRESET− will be in the binary ZERO state if there is a reset all indicators microoperation (CRESET) in the microinstruction. If signal CRESET− is a binary ZERO at OR gate 163, its output, signal CRESTB−, will become a binary ZERO and result in the presetting to the ZERO state of the illegal digit indicator flip-flop 85-3 and the carry out indicator flip-flop 85-4. Because this signal is also the other input to AND gate 164, it will result in signal CRESTC− becoming a binary ZERO and result in the presetting to the binary ONE state of the equal zero indicator flip-flop 85-1 and the equal nine indicator flip-flop 85-2. Thus, it can be seen that a resetting of all indicators results in the setting of flip-flop 85-1 and 85-2 and the resetting of flip-flops 85-3 and 85-4.

OR gate 162 produces signal KSETCA− which is connected to the set (S) input of carry out indicator flip-flop 85-4. When this signal becomes a binary ZERO it results in the presetting to the binary ONE state of the carry out flip-flop thus allowing under microinstruction control the setting of the carry out indicator to indicate that a carry out has in fact occurred. This presetting of the carry out indicator is done by use of the set carry indicator microoperation (CSETCA) which results in signal CSETCA− from decode PROM 105 becoming a binary ZERO.

Sign multiplexer 77 allows the 4 least significant bits of the address into sign generator PROM 78 to be selected from either the output of double multiplexer 83 which in turn can have its output selected from either a nibble from RAM 1 or a nibble from RAM 2, or alternatively, the 4 bits out of sign multiplexer 78 can come from 4 bits within data-in register 88. Thus, under the selection of the signal CAPACKD− at the select (SEL) input of sign multiplexer 78, either signals COP120+ through COP123+ or signals CBUS04+ through CBUS07+ will be gated on to the Q output as signals CSIN04+ through CSIN07+. Signal CAPCKD− will be a binary ZERO at the select (SEL) input of sign multiplexer 77 and at the address bit having a binary weight of 128 of sign generator PROM 78 if a packed microoperation (CPACKD) is in the microinstruction as determined by decoder 106.

In addition to receiving 4 address bits from sign multiplexer 77, sign generator 78 receives 3 address bits as signals CPBUS03+ through CBUS01+ from the output of data-in register 98. The last address bit of sign generator PROM 78 is signal COVPUN− which will be a binary ZERO if there is an overpunch microoperation (COVPUN) in the microinstruction as detected by decoder 106. The output of sign generator PROM 78 is enabled by the output enable (CE) inputs being fixed to a binary ZERO signal. The 4-bit word read from sign generator PROM 78 results in signals COVPUN+, COVPEO+, CSIGNN+ and CSIILL+ which are used to indicate whether the sign is an overpunch sign, is an overpunch sign equal to 0, whether it is a negative sign and whether it is an illegal sign. These four bits are input into the first input of monitor multiplexer 80. The other input of monitor multiplexer 80 receives the output of the decimal indicators 85 such that the output of monitor multiplexer 80 signals MIBGP0− through MIBGP3+ will be enabled when the clocking signal PHASEA+ at the function (F) input becomes a binary ZERO. The selection between the output of sign generator PROM 78 and the output of decimal indicators 85 is done by signal CROS45+ at the select (SEL) input. The first input from sign generator PROM 78 will be selected if there is a sign to microprocessor microoperation (CIPSGN) in the microinstruction which will cause the signal CROS45+ to be a binary ONE. The output of monitor multiplexer 80 is fed to monitor logic 32 which in turn can be used to control branching within the microprocessor 30 thus allowing the branching between microinstructions by microprocessor 30 depending upon the status of decimal indicators 85 or the output of sign generator PROM 78. Sign generator PROM 78 is encoded with the necessary data words such that its 4-bit output can be used to control branching in the microinstruction routine which executes the decimal arithmetic operations. This branching is done early in the execution of a decimal operation to test the signs of operand 1 and operand 2 before a decimal operation is performed.

MICROOPERATION DECODING LOGIC DETAILS

Figure 10D:
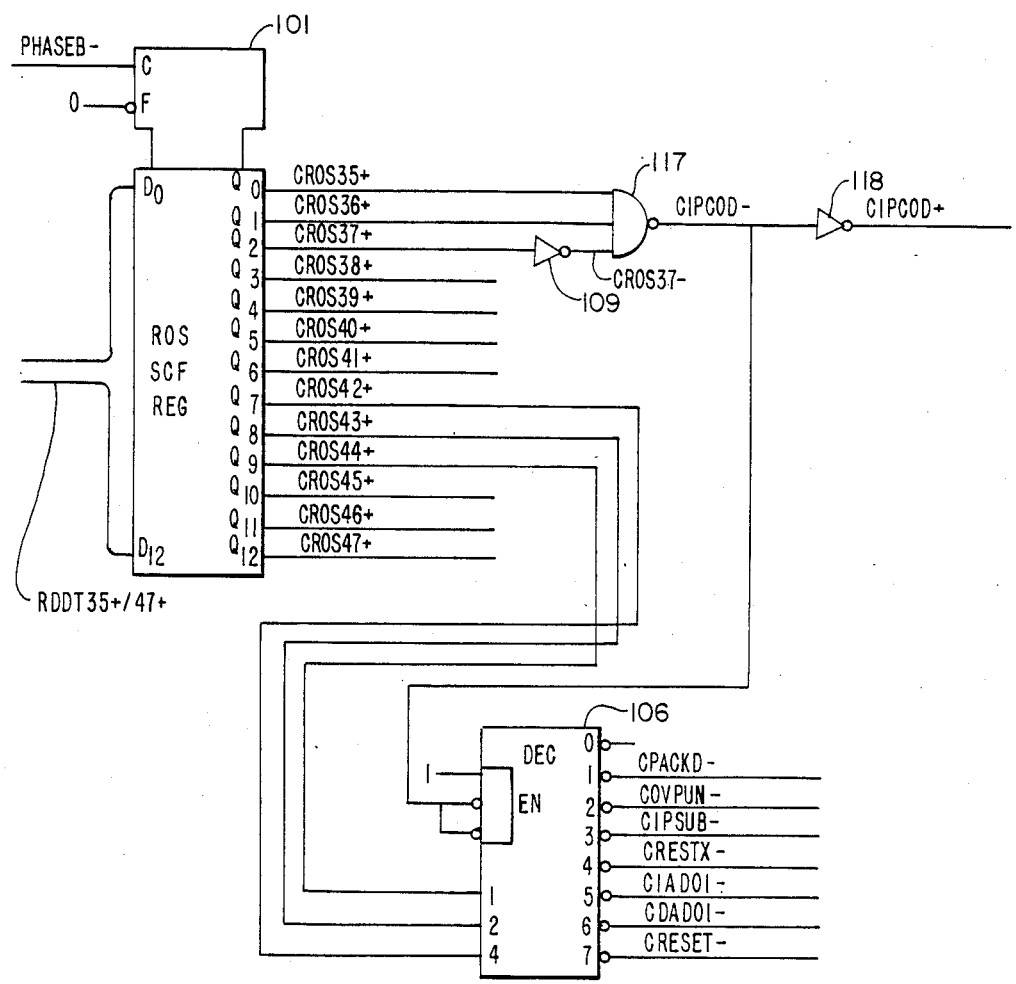
Figure 10D:
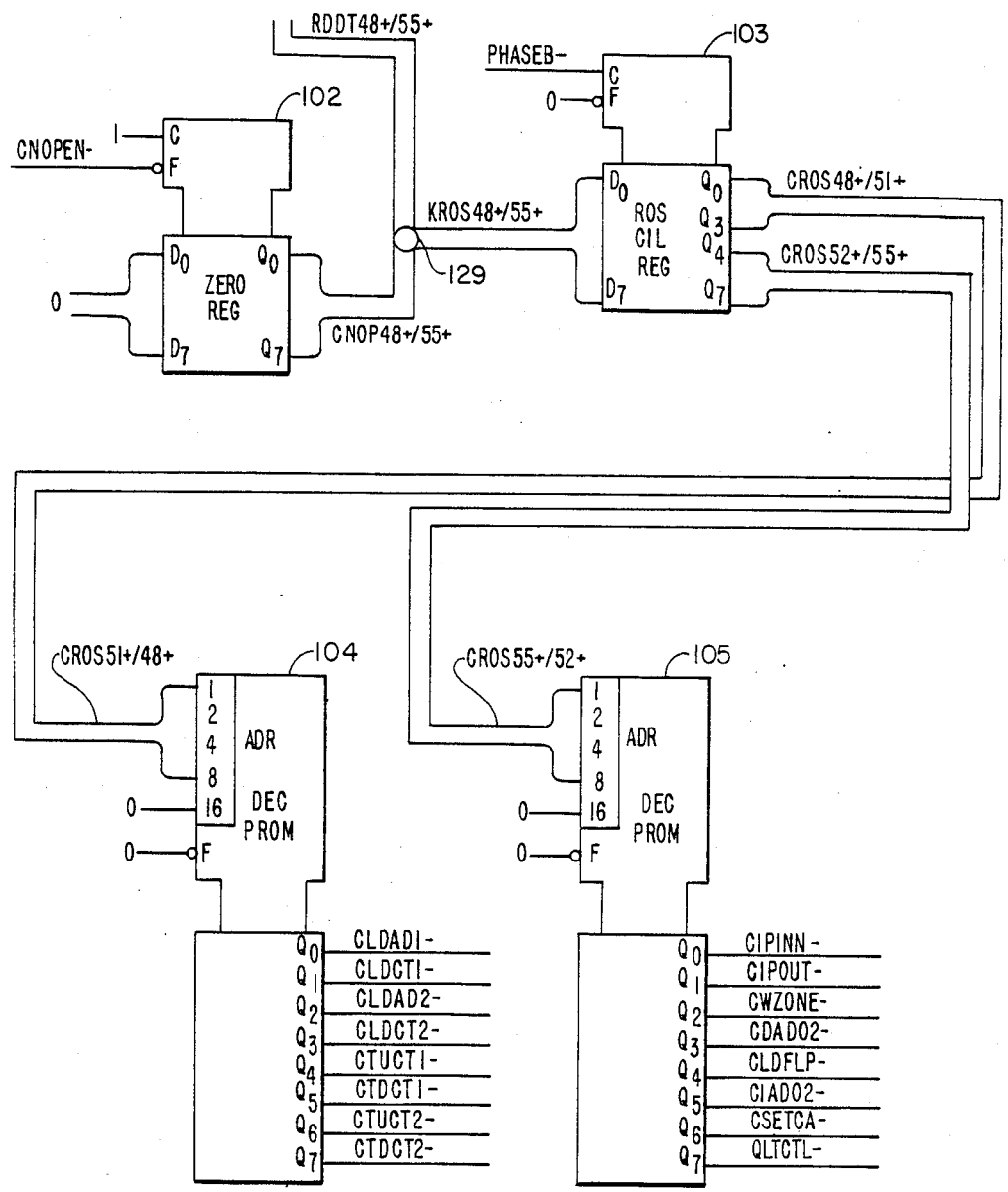

FIG. 10D illustrates CIL control area 100 in detail. ROS special control field register 101 latches in the special control field bits RDDT35 through RDDT47 from the microinstruction word when clocking signal PHASEBtransitions from the binary ZERO to the binary ONE state. The outputs of ROS special control field register 101 are enabled by the binary ZERO at the function (F) input thereof. Signals CROS35+, CROS36+ and CROS37− are input to NAND gate 117 to produce signal CIPCOD− at the output thereof as an indicator as to whether or not subfield A is a binary 110. Signal CROS37− is produced by inverting signal CROS37+ by inverter 109. If subfield A is a binary 110 indicating that special control field subfields B, C and D are to be interpreted as commercial instruction microoperations, signal CIPCOD− will be a binary ZERO and signal CIPCOD+ at the output of inverter 118 will be a binary one. Special control field subfield B bits which correspond to signal CROS38+ through CROS41+ are used as described above to enable various gates and to control the selection of various multiplexers. The special control field subfield C bits which correspond to signal CROS42+ through CROS44+ are input to decoder 106 to produce signal CPACKD− through CRESET− which are used as described above. The output of decoder 106 is controlled by signal CIPCOD− which will cause all the output signals to assume the binary ONE state if special control field subfield A is not a binary 110.

Zero register 102 is connected to receive 8 binary ZEROs as input which are enabled onto its outputs as signals CNOP48+ through CNOP55+ if signal CNOPEN− is a binary ZERO at the function (F) input. The clock input of zero register 102 is fixed to a binary ONE. Signal CNOPEN− will enable the output if the address presented to ROS 24 is less than 2K. The output of zero register 102, signals CNOP48+ through DNOP55+, are wire-ored together with the output of ROS 24, signals RDDT48+ through RDDT55+ at wire-or 129 to produce signals KROS48+ through KROS55+. Signals RDDT48+ through RDDT55+ are enabled into wire-or 129 only if the address into ROS 24 is greater than 2K.

The data at the input of ROS CIL register 103 is clocked by clocking signal PHASEB− from microprocessor 30. Signals CROS48+ through CROS51+ which correspond to subfield E of the microinstruction word are decoded by use of decode PROM 104 by using the four signals as addressing bits. Signals CROS52+ through CROS55+, which correspond to subfield F of the microinstruction word, are decoded by use of decode PROM 105 by using the four signals as addressing bits. The fifth address bit of decode PROM 104 and decode PROM 105 is tied to a binary ZERO so that the upper 16 words in each decode PROM is not used. The output of both decode PROM 104 and decode PROM 105 are enabled by the binary ZEROs at their function (F) input. Decode PROM 104 produces signal CLDAD1− through CTDCT2− and decode PROM 105 produces signals CIPINN− through QLTCTL−, the use of which has been discussed above with reference to FIGS. 10A, 10B and 10C. For the most part, the coding of decode PROM 104 and decode PROM 105 is such that only a single output signal will be in the binary ZERO state and all other outputs will be in the binary ONE state except for the few cases in which parallelism is provided by coding the PROM such that more than one bit within the 8-bit word is a binary ZERO. These cases are indicated in Tables 7 and 8 above.

DECIMAL SUBTRACT COMMERCIAL SOFTWARE INSTRUCTIONS

In the preferred embodiment, the decimal arithmetic operations that are performed by CPU 20 are microprogrammed to take advantage of commercial instruction logic 28 to reduce the execution time of the decimal commercial software instructions. For example, the decimal multiply and divide commercial software instructions are sped up by detecting leading (non-significant) zeros in the dividend and divisor and the multiplicand and multiplier, thereby reducing the field lengths which must be used when performing the operations. This leading zero detection is done by using the ability of RAM 1 81 and RAM 2 96 to be addressed from left to right (i.e. most significant to least significant digit) and by use of the decimal equal zero indicator. The decimal add and subtract commercial software instructions are sped up by use of the decimal equal nine indicator to detect cases of oversubtract (i.e., when the sign of the difference changes) and the ability to feed the decimal adder/subtractor inputs (decimal arithmetic logic unit (ALU) 84 ports A and B) from either RAM 1 81 or RAM 2 96 or zeros are used in performing a ten's complement. The convert decimal to binary commercial software instruction is sped up by using the ability to address RAM 1 81 for left to right to strip leading zeros. The convert binary to decimal commercial software instruction is sped up by using the ability of the decimal adder/subtractor (decimal ALU 84) to have the same data fed to both inputs and by presetting the converted value receiving field to a zero digit and increasing the receiving field length as necessary (when a carry occurs) as the conversion progresses.

When CPU 20 executes a commercial software instruction, microprocessor 30 and commercial instruction logic 28 operate in parallel to perform the necessary microoperations under the control of microinstructions stored in ROS 24. Microinstruction bits 0 through 47 are used to control the operation of microprocessor 30 and microinstruction bits 35 through 55 be used to control the operation of commercial instruction logic 28. The use of microinstruction bits 35 through 47 to control microprocessor 30 or commercial instruction logic 29 depend on the value of special control field subfield A. In performing commercial software instructions, microprocessor 30 is used to: read the software instructions from main memory 10, to decode the software instructions, to read the operands from main memory 10, to perform arithmetic, shifting and logical operations on binary data, and write the results of the operation back into main memory 10. During execution of commercial software instructions, commercial instruction logic 28 is used to perform logic and shifting operations on decimal and alphanumeric data.

DECIMAL ADDITION AND SUBTRACTION COMMERCIAL SOFTWARE INSTRUCTIONS

The use of commercial instruction logic 28 will now be discussed with reference to the performance of the decimal addition commercial software instruction (DAD) and the decimal subtraction software instruction (DSB). Both the DAD and DSB software instructions are advantageously performed in the preferred embodiment by use of the decimal equal nine indicator and the ability to feed either port of the decimal ALU 84 from either RAM 1 81, RAM 2 96 or zeros.

During a DAD or DSB instruction which results in operand 1 (OP 1) being added or subtracted from operand 2 (OP 2) with results being stored in the operand 2. The DAD software instruction uses the absolute value subtract routine if the signs of the number to be added are different and the DSB software instruction uses the absolute value subtract microroutine if the signs of the numbers to be subtracted are the same. The equal nine indicator is needed in the absolute subtract routine to handle the case where the OP 2 field length is less than the OP 1 field length and an oversubtract occurs (i.e., the sign of the difference changes). This is because the result is calculated in the OP 2 field in RAM 2 and OP 2 is moved from main memory 10 to RAM 2 96 on a word basis and the result which is stored in RAM 2 96 is moved back to main memory on a word basis. Because OP 2 can start and end on any 4-bit nibble boundary within the 16-bit words of main memory, it is important that neighboring nibbles (known as "neighbors") that are not part of OP 2 but which are present in the word containing the most significant digit or leading sign of OP 2 and the word containing the least significant digit or trailing sign of OP 2 be preserved during the addition or subtraction so that when the result is written from RAM 2 96 back to main memory 10, the neighbors have not been changed. By preserving the neighbors, the result can be written back on a word basis without having to read the words containing the first and last digits, maske in the result and then write back the words to main memory.

In the following discussion, the term "written field" will be used to indicate the field of the result which is as long as the field length of OP 2 which is used to store the result. The term "unwritten field" will be used to indicate the left most significant digits in the result having a length equal to the number of digits by which the field length of OP 1 exceeds the field length of OP 2. For example, if a DAD is performed with OP 1=−00142 and OP 2=+68 the result will be −74. In this example the written field is 2 digits long (the length of OP 2 without the sign) and the unwritten field is 3 digits long (the length of OP 1 minus the length of OP 2, both without signs). This DAD software instruction is performed in CPU 20 by placing OP 1 in RAM 1 81 and OP 2 in RAM 2 96 and developing the result in RAM 2 96 from which it is written back into the memory locations previously occupied by OP 2.

Example:  (+68) +   (−00142) =  (−74)
          + 68              OP 2 in RAM 2
          −00142            OP 1 in RAM 1
          UUUWW      result where:
                     WW  = written field developed
                           in RAM 2
                     UUU = unwritten field in order
                           to preserve neighbors
                           in RAM 2

In addition to using the equal nine indicator to determine the contents of the unwritten field, a DAD or DSB software instruction is microprogrammed to use the ability to feed the A port of the decimal adder/subtractor 84 from either RAM 1 or RAM 2 and the ability to feed zero's digits into the B port. This is used to perform a ten's complement on the written field in those cases where there is an oversubtract.

The following example will describe a DAD software instruction using the example of OP 1 = −00142 and OP 2 = +68 which results in a sum of −74. The same example would result from a DSB with OP 1 = +00142 and OP 2 = +68 which results in a difference of −74.

For this example, assume the DAD software instruction is at main memory location 1000 as follows:

| Example DAD Software Instruction | | |
|---|---|---|
| Memory Location (Hexadecimal) | Memory Contents (Hexadecimal) | Meaning |
| 1000 | 002C | DAD OP code |
| 1001 | E687 | data descriptor 1 (DD1) word 1 |
| 1002 | 1102 | data descriptor 1 (DD1) word 2 |
| 1003 | E207 | data descriptor 2 (DD2) word 1 |
| 1004 | 1204 | data descriptor 2 (DD2) word 2 |

Data descriptors DD1 and DD2 are decoded as follows (see FIG. 9):

DD1:  T=1:        Packed decimal.
      C1,C2=11:   OP 1 starts in nibble 3 position.
      C3=1:       Trailing sign
      L=6:        5 digits and sign.
      CAS:        OP 1 starts in word addressed by contents
                  of base register 7 plus displacement of 1102.
                  If B7 contains the value 1000 hexadecimal,
                  OP 1 is located at address 2102
                  hexadecimal
DD2:  T=0:        String (unpacked) decimal.
      C1=1:       OP 2 starts in right byte.
      CR,C3=11:   Trailing sign.
      L=3:        2 digits and sign.
      CAS:        OP 2 starts in word addressed by contents
                  of base register 7 plus the displacement of
                  1204.
                  Since B7 contains 1000 hexadecimal, OP 2 is
                  located at address 2204 hexadecimal.

OP 1, which is a −00142 with a trailing minus sign, appears in main memory as follows:

| Memory Location Address (Hexadecimal) | Memory Contents (Hexadecimal) |
|---|---|
| 2102 | NNN0 |
| 2103 | 0142 |
| 2104 | DNNN |

| Memory Location Address (Hexadecimal) | Memory Contents (Hexadecimal) |
|---|---|
| where: | N are neighbor nibbles. 00142 are packed decimal digits. D is a trailing minus sign. |

OP 2, which is +68 with a trailing plus sign, appears in main memory as follows:

| Memory Location Address (Hexadecimal) | Memory Contents (Hexadecimal) |
|---|---|
| 2204 | NN36 |
| 2205 | 382B |
| where: | N are neighbor nibbles. 36 is an unpacked decimal 6 with zone nibble of 3. 38 is an unpacked decimal 8 with zone nibble of 3. 2B is an unpacked trailing plus sign. |

Figure 11:
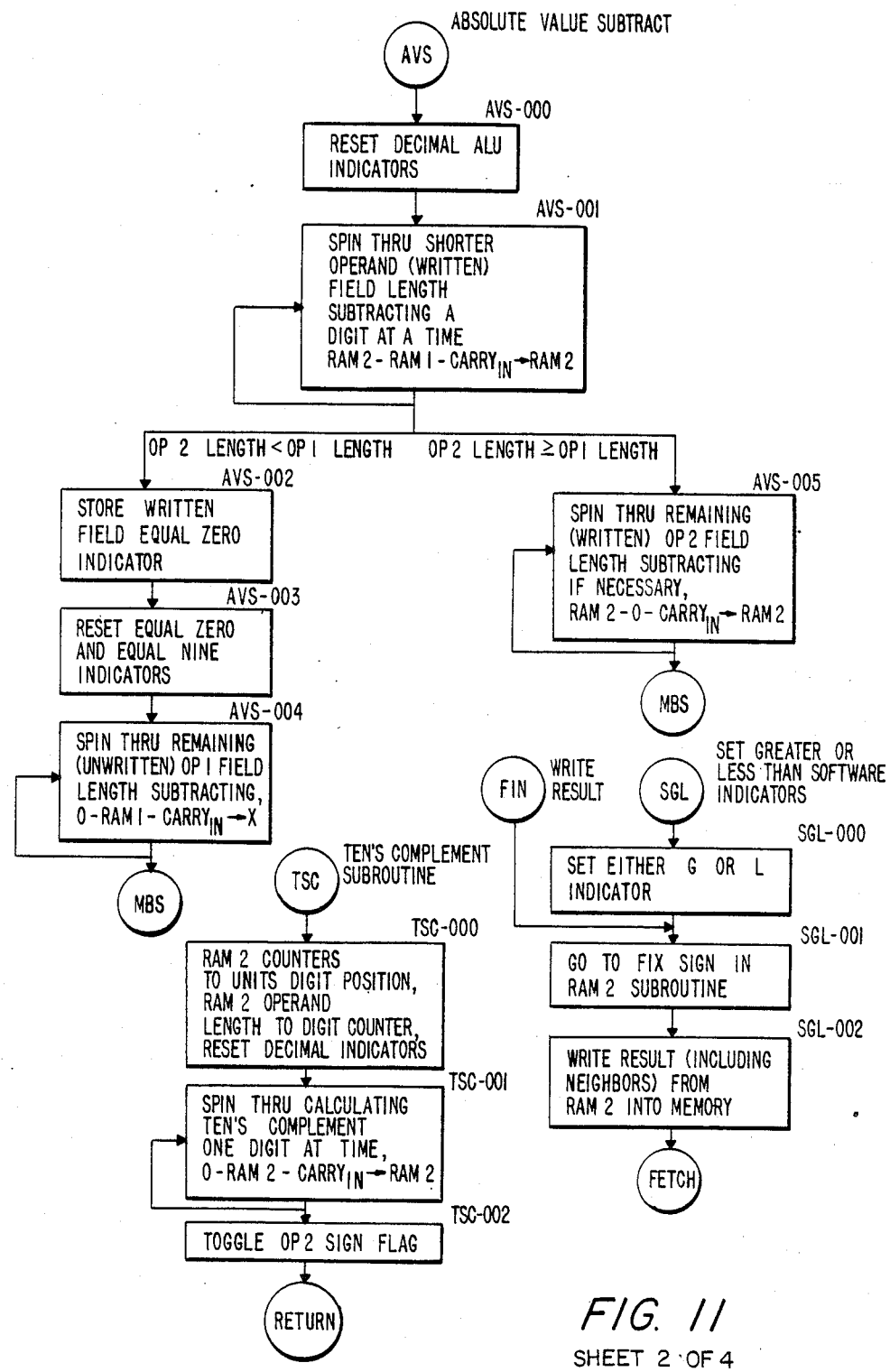
FIG. 11 is a flow chart of the method used by the central processing unit of FIG. 1 to perform decimal addition and subtraction commercial software instructions.
Figure 11:
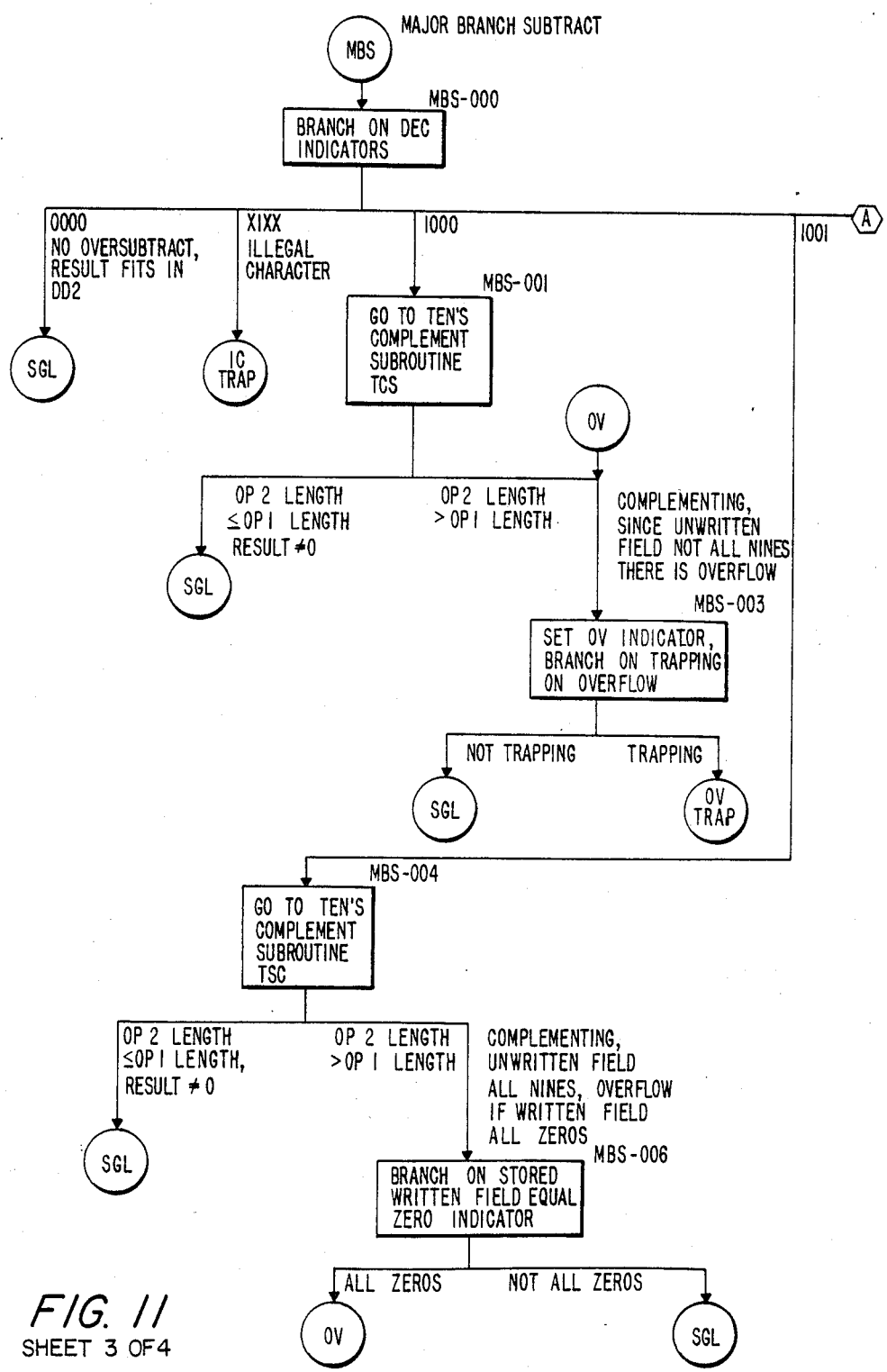
Figure 11:
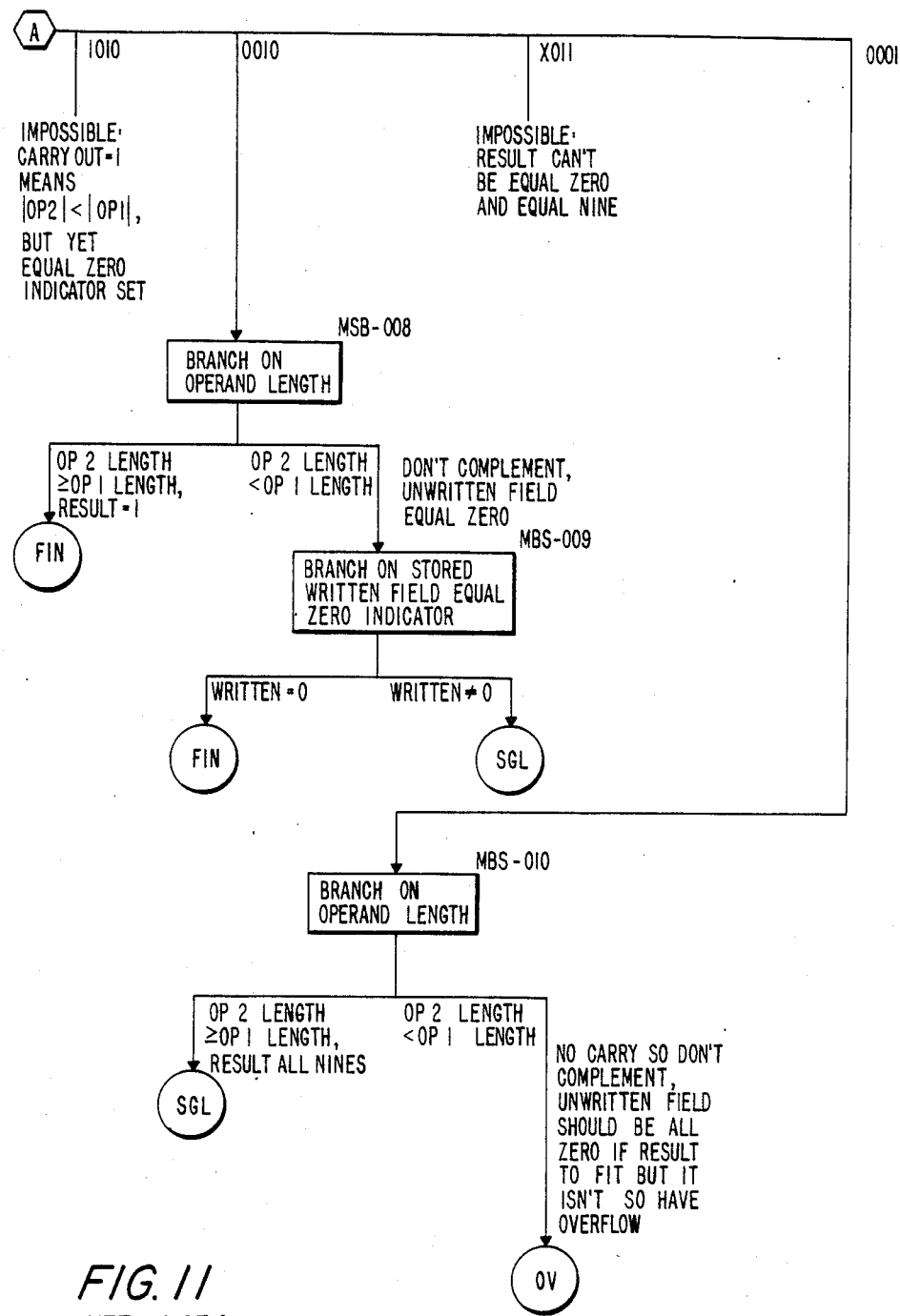

The execution of the above example DAD commercial software instruction will now be described with reference to FIG. 11. FIG. 11 is a flow chart of the firmware microroutines used by CPU 20 to execute the DAD and DSB software instruction. The blocks in FIG. 11 which are referred to by the names next to them, such as DAD-001, show at a gross level the functions performed by microprocessor 30 and commercial instruction logic 38 to perform the software instruction. Some of these blocks may represent the execution of more than one 48 or 56-bit microinstruction, the form of which is shown in FIG. 5.

Before entering the microroutines shown in FIG. 11, which are more or less peculiar to the DAD and DSB commercial software instructions, the CPU 20 examines the first word of the software instruction which is being executed to determine the type of operation to be performed. Once it is determined that it is a decimal arithmetic operation as determined by looking at the operation code in the first word of the instruction, the CPU 20 then proceeds to decode the address syllable associated with data descriptor 1 to determine the main memory word address and the position within the word in which operand 1 begins. This front end processing of the software instruction then continues with the microprocessor branching to the DAD routine to block DAD-000.

When the decimal add routine is entered at block DAD-000, it tests whether this is the first pass in which operand 1 is to be brought into the CPU or the second pass in which operand 2 is to be brought into the CPU. If it is the first pass, the firmware then branches to instruction DAD-001 which fetches operand 1 into RAM 1 81 one word at a time by bringing it from main memory 10 into the microprocessor 30 and then from the microprocessor processor bus 37 into transceivers 97, data-in register 98 and then into RAM 1 81. This process is performed by first loading RAM 1 address counter 78 with the address of the first word which is to be used in RAM 1 and the loading of the nibble counter in nibble-out control 76. It should be noted that the words of OP 1 are loaded into RAM 1 by using the low four order bits of the main memory address as the four-bit address which is loaded into RAM 1 address counter 75 such that after block DAD-001 is executed, OP 1 is in RAM 1 in the following locations with the address counter pointing to word 3 in RAM 1 which contains the unit's digit and the nibble counter pointing to nibble 3 which is the position of the unit's digit. At the end of block DAD-001, the contents of RAM 1 are as follows:

| RAM 1 Location | RAM 1 Contents (Hexadecimal) |
|---|---|
| 2 | NNN0 |
| 3 | 0142 |
| 4 | DNNN |
| RAM 1 Address Counter (WP1) = 3 | |
| RAM 1 Nibble Counter (NP1) = 3 | |

Block DAD-001, after setting an indicator to indicate the sign of operand 1, then exits to the instruction front end processing routine which proceeds to crack data descriptor 2 to determine the address of where OP 2 begins in main memory. After cracking DD2, the front end routine then branches on the software instruction operating code to an instruction in block DAD-000 which in turn determines whether this is the pass 1 of pass 2. In this case it is pass 2 so that block DAD-002 is executed.

In block DAD-002 operand 2 is fetched into RAM 2 a word at a time from main memory, the sign of OP 2 is determined, and the address counter of RAM 2 address counter 87 and the nibble counter of nibble write control 86 are left to point to the unit's position of OP 2 such that at the end of block DAD-002, the contents of RAM 2 are as follows:

| RAM 2 Location | RAM 2 Contents (Hexadecimal) |
|---|---|
| 0 | NN36 |
| 1 | 382B |
| RAM 2 address oounter (WP2) = 1 | |
| RAM 2 nibble counter (NP2) = 1 | |

It should be noted that in contrast to RAM 1 where the operand is loaded into the location which corresponds to the low four order bits of the memory address, the first word of OP 2 is loaded into word 0 of RAM 2 and consecutive words are loaded into locations with increasing addresses.

Block DAD-002 exits to block DAD-003 which determines which operand has the shorter field length. This is done by comparing the length of OP 1 with OP 2 and determining which is shorter. This determination is necessary so that the length of the written field can be determined as well as the length of the unwritten field so that the neighbors within RAM 2 will not be destroyed if OP 2 is shorter than OP 1. In the present example, the length of OP 1 is 5 and the length of OP 2 is 2 (excluding the signs) such that the shorter field has a length of 2 digits and this length is the length of Operand 2. Therefore, the written field length will have a length of 2 digits and the unwritten field will have a length of 3 digits. Block DAD-003 then exits to block DAD-004 which compares the sign of OP 1 with the sign of OP 2. Block DAD-004 determines that OP 1 sign is a minus and that OP 2 is a plus and therefore exits to block DAD-006 because the signs are different and does not exit to block DAD-005 is taken if the signs were the same. Because the signs are different, an absolute value subtract must be performed and so a call is made to the absolute value subtract routine which is entered at block AVS-000.

The absolute value subtract routine performs a subtraction by taking the contents of RAM 1 from the contents of RAM 2 and placing the result into RAM 2 a digit at a time starting with the units (the least significant) digit and working from right to left to the most significant digit. This subtraction is done in two steps in that first the written field is done in which the result is actually written back into RAM 2 a digit at a time. Then the unwritten field is done and the result of each digit position is not written into RAM 2 in order to preserve the neighboring nibbles within RAM 2.

The absolute value subtract routine begins in block AVS-000 by presetting the decimal indicators 85 to an initial value such that the carry-out (CRO) indicator is set to a binary ZERO, the illegal digit (ILL) indicator is set to a binary ZERO, the equal zero (E0) is set to a binary ONE and the equal nine (E9) is set to a binary ONE. In block AVS-001 a one digit from RAM 1

In block AVS-001 one decimal digit from RAM 1 is subtracted from one decimal digit from RAM 2 by decimal ALU 84 with the carry-in coming from the carry-out indicator and the resulting digit is stored back into RAM 2 and the indicators are stored into decimal indicators 85. Block AVS-001 is repeated until the length of the shorter operand is exhausted. In this case, because in the example, operand 2 is in string (unpacked) decimal data the zone nibbles within RAM 2 are written back into RAM 2 by use of the result/zone multiplexer 91 as every other nibble is written into RAM 2 as each decimal digit is processed. In the instant example, the shorter operand is operand 2, which contains only two unpacked digits. Block AVS-001 is executed two times with the contents of RAM 2 96 and decimal indicators 85 at the end of the spin through the shorter field length (the length of the written field) being as follows:

| RAM 2 Location (Hexadecimal) | RAM 2 Contents (Hexadecimal) | Indicators | | | |
|---|---|---|---|---|---|
| | | CRO | ILL | E0 | E9 |
| 0 | NN32 | 0 | 0 | 0 | 0 |
| 1 | 362B | | | | |

This spinning through the shorter field length of two times by subtracting first the unit's digit position of RAM 1 from the unit's digit position of RAM 2 and storing the result in the unit's digit position of RAM 2 and then subtracting the 10's position of RAM 1 from the 10's position of RAM 2 and storing the result in RAM 2 and the writing of the zone nibbles into RAM 2 is shown in Table 13 below.

TABLE 13

Spin Through Shorter Field Length Performing Subtract

| | RAM 1 | | | | RAM 2 | | | DEC ALU IN | | DEC ALU OUT | | DEC IND |
|---|---|---|---|---|---|---|---|---|---|---|---|---|
| STP | LC | CONT | W1 | N1 | LC | CONT | W2 | N2 | A | B | R | CIZN | CIZN |
| 1B | 2 | NNN0 | 3 | 3 | 0 | NN36 | 1 | 1 | 2 | 8 | X | XXXX | 0011 |
|  | 3 | 014(2) |  |  | 1 | 3(8)2B |  |  |  |  |  |  |  |
|  | 4 | DNNN |  |  |  |  |  |  |  |  |  |  |  |
| 1A | 2 | NNN0 | 3 | 2 | 0 | NN36 | 1 | 0 | X | X | 6 | 0000 | 0000 |
|  | 3 | 01(4)2 |  |  | 1 | (3)62B |  |  |  |  |  |  |  |
|  | 4 | DNNN |  |  |  |  |  |  |  |  |  |  |  |
| 2B | 2 | NNN0 | 3 | 2 | 0 | NN36 | 1 | 0 | X | X | X | XXXX | 0000 |
|  | 3 | 01(4)2 |  |  | 1 | (3)62B |  |  |  |  |  |  |  |
|  | 4 | DNNN |  |  |  |  |  |  |  |  |  |  |  |
| 2A | 2 | NNN0 | 3 | 2 | 0 | NN3(6) | 0 | 3 | X | X | X | XXXX | 0000 |
|  | 3 | 01(4)2 |  |  | 1 | 362B |  |  |  |  |  |  |  |
|  | 4 | DNNN |  |  |  |  |  |  |  |  |  |  |  |
| 3B | 2 | NNN0 | 3 | 2 | 0 | NN3(6) | 0 | 3 | 4 | 6 | X | XXXX | 0000 |
|  | 3 | 01(4)2 |  |  | 1 | 362B |  |  |  |  |  |  |  |
|  | 4 | DNNN |  |  |  |  |  |  |  |  |  |  |  |
| 3A | 2 | NNN0 | 3 | 1 | 0 | NN(3)2 | 0 | 2 | X | X | 2 | 0000 | 0000 |
|  | 3 | 0(1)42 |  |  | 1 | 362B |  |  |  |  |  |  |  |
|  | 4 | DNNN |  |  |  |  |  |  |  |  |  |  |  |
| 4B | 2 | NNN0 | 3 | 1 | 0 | NN(3)2 | 0 | 2 | X | X | X | XXXX | 0000 |
|  | 3 | 0(1)42 |  |  | 1 | 362B |  |  |  |  |  |  |  |
|  | 4 | DNNN |  |  |  |  |  |  |  |  |  |  |  |
| 4A | 2 | NNN0 | 3 | 1 | 0 | N(N)32 | 0 | 1 | X | X | X | XXXX | 0000 |
|  | 3 | 0(1)42 |  |  | 1 | 362B |  |  |  |  |  |  |  |
|  | 4 | DNNN |  |  |  |  |  |  |  |  |  |  |  |

Table 13 illustrates the before and after states of RAM 1 81, RAM 2 96, the output of decimal adder{/fsuracOtor PROM 84 and the status of the decimal indicators 85 before and after each microinstruction is executed. The column labeled "STP" contains the step number with the rows labeled with a step number with a "B" suffix containing the status of the system before the microinstruction is executed and the rows with a step number with an "A" suffix containing the status after the microinstruction is executed. The columns under the "RAM 1" label contain the location, contents, word pointer and nibble pointer associated with RAM 1 and the column under the "RAM 2" label containing the location, contents, word pointer and nibble pointer associated with RAM 2. For example, the "LC" column under the "RAM 1" label contains the numbers 2, 3 and 4 indicating that the corresponding "CONT" column contains the contents of RAM 1 words addressed by addresses 2, 3 and 4 respectively. The "W1" column under the "RAM 1" label contains the contents of "RAM 1" address counter 75 and the column labeled "N1" contains the contents of the nibble counter in nibble out control 76. The corresponding "LC", "CONT", "W2" and "N2" columns under the "RAM 2" label contain the corresponding data for RAM 2 with the "W2" word pointer being the address stored in RAM 2 address counter 87 and the "N2" nibble pointer being nibble counter contained in nibble write control 86. The columns labeled under the "DEC ALU" column, contain the inputs and outputs of decimal ALU 84. The "A" and "B" columns under the "IN" label contain the decimal digits input into the A and B ports of decimal ALU 84 respectively. Under the "OUT" label, the "R" column contains the resultant digit output from decimal adder/subtractor PROM 84 which is one input to result/zone multiplexer 91 and the columns labeled "CIZN" contains the four indicator bits output by decimal adder/subtractor PROM 84 which are input into decimal indicators 85. The "C" column corresponding to the carry-out, elsewhere referred to as a "CRO", the "I" column corresponding to the illegal digit signal which is else sometimes labeled as "ILL", the "Z" column corresponding to the equal zero signal which is elsewhere referred to as "E0" and the "N" column containing the signal indicating the status of the equal nine which is elsewhere referred to as "EN". The column labeled "DEC IND" contains the contents of decimal indicators 85 with each individual indicator under the corresponding "CIZN" column.

Step 1B shows the contents of RAM 1 before the microinstruction are executed contain the operand 1 with the word and nibble counters pointing to the unit's digit of the number which in the example is the digit decimal 2. This is indicated in Table 13 by parentheses around the nibble which is point to by the word and nibble counters. Row 1B also shows the contents of RAM 2 which indicates that the unit's digit is pointed to by the word and nibble counters such that the decimal 8 is within the parentheses. The status of the resultant digit and the indicator bits output by decimal adder/subtractor PROM 84 before the microoperation is executed are don't care conditions and indicated by X's in Table 13. The decimal indicators have been preset prior to the adding the unit's position to the binary value 0011 as shown.

In step 1, when the unit's digit of operand 1 is added to the unit's digit of operand 2, the result is shown in the row labeled step 1a. Step 1A shows, in the RAM 1 column, that after the addition the address counter and nibble counter have been incremented by one such that the nibble counter now points to the nibble 2 position and the word counter has remained at word 3 such that the 10's position of the operand 2 is now pointed to with the parentheses now being around the digit 4. Similarly, after executing the first microinstruction, the word address and nibble counter of RAM 2 have been incremented to point to the next nibble, which in this case is field of the unit's position, such that nibble zero of location 1 is now pointed to which contains tbe zone nibble of a binary 0011 (hexadecimal 3), as shown in parentheses. The output of the decimal subtract (an absolute value subtract is done because the sign of the two numbers to be added together were different) is a decimal 6 as indicated in the "R" column which is the result of subtracting 2 from 8. The output of the decimal adder/subtractor PROM 84 indicators is a binary 0000 which indicates that there has been no carry, the digit is a legal digit, the digit is not equal to zero and it is not equal to nine. This results in the updating of the decimal indicators as shown which results in the decimal indicators 85 now being equal to the binary value 0000. Returning now to the RAM 2 content column as step 1A, it is seen that the resulting digit output from decimal adder/subtractor PROM 84 has been stored back into the nibble position which was pointed to at the beginning of the microinstruction such that the decimal 6 has been stored in the unit's position of operand 2. This storing of the decimal result occurs prior to the updating of the address and nibble counters such that although at the end of the microinstruction, after its execution, the RAM 2 counter point to word 1 nibble 0 the word 1, nibble 1 counter values were used to store the result before the counters were updated.

The operation shown as step 1 is performed by microinstruction which contains a CIPSUB, a CWRES2, a CLDFLP and a CTDALL microoperation within the microinstruction. These microinstructions are found in Tables 4 through 8 as described above and the operation of which was described with respect to the logic shown in FIGS. 10A through 10D. As a brief review here, the CIPSUB instruction causes the adder/subtractor PROM 84 to perform a subtract operation on the two inputs presented to it from RAM 2 zero multiplexer 90 and double multiplexer 83. In this case, RAM 2 zero multiplexer 90 is feeding the output of RAM 2 96 and double multiplexer 83 is feeding the output of RAM 1 81. The CWRES2 microoperation causes the decimal digit output from the decimal adder/subtractor PROM 84 to be written into the nibble pointed to by nibble write control 86 and RAM 2 address counter 87. The CLDFLP microoperation causes the indicators output by decimal adder/subtractor PROM 85 to be clocked into decimal indicators 85. The CTDALL microoperation causes the RAM 1 and RAM 2 nibble and word counters to be decremented after the decimal arithmetic operation has been performed. The microinstruction associated with step 1 also performs other parallel microoperations which have not been discussed but, for example, include decrementing a counter contained within microprocessor 30 to decrement the length count of the shorter operand field such that the number of times through the shorter operand field, where the arithmetic operation is performed on each digit position so that the spinning through the shorter (written) field can be terminated when it is finished.

In step 2 of Table 13, which performs the writing in of the zone nibble into the unit's position of operand 2. It being remembered that operand 2 in the example case is string (unpacked) data which always has a binary THREE in the zone nibble position of each byte associated with each decimal digit. The row associated with step 2B shows the contents of RAM 1 and its associated pointers and the contents of RAM 2 and its associated pointers. In the writing of the zone nibble of the unit's position, the contents of RAM 1 are ignored and only the contents of RAM 2 are used. Before the second microoperation is executed, the word address pointer and nibble pointer of RAM 1 under the W2 and N2 columns point to location 1 and nibble 0 respectively such that the zone field containing a hexadecimal 3 is pointed to as indicated by the 3 being within parentheses in Table 13. The second microinstruction which forces the zone field into operand 2 contains a CWZONE and a CTDCT2 microoperation as describe in Tables 4 through 8 and the operation of which when the hardware is described in reference to FIGS. 10A through 10D above perform the following. The CWZONE microoperation causes result/zone multiplexer 91 to select the zone bits of binary 0011 as the output and result in that zone being written into RAM 2 96 in the nibble position pointed to by RAM 2 address counter 87 and nibble write control 86. The CTDCT2 microoperation causes the RAM 2 nibble and word counters to be decremented by one after the zone nibble is written into RAM 2 96 such that in step 2A it can be seen that the address counter now points to word 0 and the nibble counter now points to nibble 3 which contains the 10's position of operand 2 which is a decimal 6 as indicated by the digit 6 in the contents column of RAM 2 being within the parentheses. In this second microoperation as indicated by rows 2B and 2A, the output of the decimal adder/subtractor PROM 84 is a don't care condition and both the resultant digit and the indicators columns of before and after and the decimal indicators 85 are not changed as a result of the operation. Steps 3B and 3A show the before and after condition of the execution of the third microinstruction which subtracts the 10's position of operand 1 in RAM 1 from the 10th position of operand 2 in RAM 2 which results in subtracting 4 decimal from 6 decimal producing a decimal result of 2 which is stored in word 0 nibble 3 of RAM 2. The indicators as output from decimal adder/subtractor PROM 84 are again used to update decimal indicators 85. Thus, step 3 is a repeat of step 1 except that the 10's position is being manipulated instead of the unit's position. In step 4, which is a repeat of step 2, the zone nibble within the 10's digit position of operand 2 is written into RAM 2. Thus, at the end of the fourth microinstruction, the pointers and indicators are as shown in row 4A.

Returning now to the description of the absolute value add and subtract routine illustrated in FIG. 11. In block AVS-001 which spins through the shorter length operand field performing the subtraction when it has been determined that all digits contained in the shorter field have been subtracted. Block AVS-001 exits to either block AVS-002 or AVS-004 depending upon whether or not the operand 2 field length is shorter than operand 1 or if operand 2 is longer or the same length as operand 1. In the example case being discussed, operand 2 field length is shorter than operand 1 field length so that block AVS-001 exits to block AVS-002. This branching to block AVS-002 is controlled by a flag which was previously set in data manipulation area 32 when in block DAD-001 which determines the shorter operand field length. In block AVS-002, the microinstruction routine restores to indicator to indicate whether or not the written field contains all zeros. This is done by setting a flag depending upon the status of the equal zero indicator of decimal indicators 85. This is done by entering decimal indicators 85 via monitor mutiplexer 80 into monitor logic 22 which is then input into microprocessor 30 such that the status of the equal zero indicator can be examined and a flag is set within data manipulation area 32 within microprocessor 30 to remember to status of the zero indicator at the end of the operation on the written field. Block AVS-002 then exits to block AVS-003 which presets the equal nine and equal zero indicators in decimal indicators 85 in preparation for spinning through the remainder of the longer operand to produce the unwritten field. This presetting of the equal nine and equal zero indicators is done by a microinstruction containing a CRESTX microoperation.

Block AVS-004 is then entered to spin through the remaining (unwritten) field of operand 1 one digit at a time. Since no more digits exist within operand 2 to correspond to the hundreds, thousands, etc. positions of operand 1, zero digits are provided by RAM 2 zero multiplexer 90. The results of the subtraction cannot be written into RAM 2 because this would result in the destruction of the neighboring nibbles to the left of the most significant digit of operand 2 which are contained in RAM 2. Therefore, the arithmetic result is not written but the status of the decimal indicators is continued to be accumulated to be determined whether the unwritten field is equal to all zeros or all nines, contains an illegal digit or results in a carry-out of the most significant digit. This spinning through of the unwritten field of operand 1 is shown in Table 14 which has columns which correspond to those of Table 13 as described above.

and nine result in the decimal indicator carry bit being set to a binary ONE and the equal nine bit being set to a binary ONE and the equal zero bit being set to the binary ZERO state. This microinstruction also provides that a subtract operation is done (as opposed to an addition) by the decimal ALU 84 as specified by the CIPSUB microoperation. The address and nibble counters associated with RAM 1 81 are decremented after the operation so that after step 1 the word address counter points to word 3 and the nibble counter points to nibble 0. The indicators output by the decimal ALU 84 are stored in decimal indicators 85 as directly by the CLDFLP microoperation.

Steps 2 and 3 are then repeated for the thousandths and ten-thousandths positions of operand 1 with corresponding zeros for operand 2 being supplied by RAM 2 zero multipliexer 90. Upon the completion of the step 3, it can be seen that the word and nibble counters of RAM 1 point to the first neighboring nibble beyond the most significant digit of operand 1 and the decimal indicators contain a binary 1001 which indicate that there was a carry-out from the last arithmetic operation, that there is no illegal digit within the unwritten field, that the unwritten field is not equal to all zeros and that

TABLE 14

Spin Through Unwritten Field Length Performing Subtract

| STP | RAM 1 | | | | RAM 2 | | | | DEC ALU | | | | DEC IND |
|---|---|---|---|---|---|---|---|---|---|---|---|---|---|
| | LC | CONT | W1 | N1 | LC | CONT | W2 | N2 | IN A | B | R | OUT CIZN | CIZN |
| 1B | 2 | NNN0 | 3 | 1 | 0 | N(N)32 | 0 | 1 | 1 | 0 | X | XXXX | 0011 |
| | 3 | 0(1)42 | | | 1 | 362B | | | | | | | |
| | 4 | DNNN | | | | | | | | | | | |
| 1A | 2 | NNN0 | 3 | 0 | 0 | N(N)32 | 0 | 1 | X | X | 9 | 1001 | 1001 |
| | 3 | (0)142 | | | 1 | 362B | | | | | | | |
| | 4 | DNNN | | | | | | | | | | | |
| 2B | 2 | NNN0 | 3 | 0 | 0 | N(N)32 | 0 | 1 | 0 | 0 | X | XXXX | 1001 |
| | 3 | (0)142 | | | 1 | 362B | | | | | | | |
| | 4 | DNNN | | | | | | | | | | | |
| 2A | 2 | NNN(0) | 2 | 3 | 0 | N(N)32 | 0 | 1 | X | X | 9 | 1001 | 1001 |
| | 3 | 0142 | | | 1 | 362B | | | | | | | |
| | 4 | DNNN | | | | | | | | | | | |
| 3B | 2 | NNN(0) | 2 | 3 | 0 | N(N)32 | 0 | 1 | 0 | 0 | X | XXXX | 1001 |
| | 3 | 0142 | | | 1 | 362B | | | | | | | |
| | 4 | DNNN | | | | | | | | | | | |
| 3A | 2 | NN(N)0 | 2 | 2 | 0 | N(N)32 | 0 | 1 | X | X | 9 | 1001 | 1001 |
| | 3 | 0142 | | | 1 | 362B | | | | | | | |
| | 4 | DNNN | | | | | | | | | | | |

In Table 14, step 1B shows the decimal indicators 85 have been initialized such that the equal zero and equal nine indicators have been preset to the binary ONE state and the carry-out and illegal digit indicator have been left in the state they were in at the end of the written field subtraction. The microinstruction which corresponds to step 1 contains a CINOP2, a CIPSUB, a CTDCT1, and a CLDFLP microoperation. This microinstruction is repeated for steps 2 and 3 also. This microinstruction results in the B port of the decimal ALU 84 being fed a decimal zero by selecting the zero input to RAM 2 zero multiplexer 90. This is done because there is no corresponding digit within operand 2 which is stored in RAM 2. The A port of decimal ALU 84 is fed the digit pointed to by the word and nibble counters of RAM 1 which in step 1 is the hundredths position which contains a decimal 1.

As in the previous steps, the carry input into decimal ALU 84 is fed from the carry-out indicator of decimal indicators 85. The result of subtracting a 1 from 0 is a decimal 9 as shown in step 1A with a resultant carry-out as indicated in the C column and a resultant equal nine indicator as indicated in the N column. This carry-out the unwritten field is equal to all nines as indicated by the 3 nines which appear in the result ("R") column of the rows associated with steps 1A, 2A and 3A.

Block AVS-004 spins through the unwritten operand 1 field until the counter within microprocessor 30 reaches 0 indicating that the unwritten field has been completely processed. Block AVS-004 then exits to the major branch subtract microoperation which performs a major branch within the subtract routine which results in the next microinstruction being fetched from ROS 24 as a function of which of 16 conditions exist in the four decimal indicators 85 as entered into microprocessor 30 via monitor multiplexer 80 and monitor logic 22.

Before leaving the absolute value subtract routine, a brief description of block AVS-005 is in order. Block AVS-005 would be entered if the field length of operand 2 is longer than or the same length as operand 1. If the operand 1 and operand 2 field lengths are the same length, nothing remains to be done and block AVS-005 exits to the major branch subtract microinstruction which performs the 16-way branch depending upon the results of the subtraction as indicated by the decimal indicators 85. If, however, the field length of operand 2 is greater than the field length of operand 1, the subtraction must be continued and the results written into RAM 2. In this case, however, because operand 1 is shorter than operand 2, zeros are supplied for the non-existent leading digits of operand 1 by RAM 1 zero multiplexer 82 selecting the zero input such that the A port of decimal ALU 84 would be a decimal 0 and the B port is continued to be fed from RAM 2. It is necessary to continue to process the operand 2 digits beyond the length of the operand because there could be a carry-out from the last digit position of the subtraction performed by using the most significant digit of operand 1.

Both blocks AVS-004 and AVS-005 exit by going to the major branch subtract routine which does a 16-way branch depending upon the 4 decimal indicators from decimal indicators 65. At this point, these decimal indicators contain four binary bits of information which correspond to the carry-out, illegal digit, the equal zero, and the equal nine indicators all which reflect the result of the last field processed which will, in the case of exiting from block AVS-004, be the result of the unwritten field, and in the case of exiting from block AVS-005, will be the result of the written field because there is no unwritten field in the case of where the operand 2 field length is greater than the operand 1 field length. In any case, the major branch subtract routine does a 16-way branch depending upon the indicators after the most significant digit has been processed.

The major branch subtract routine is entered at block MBS-000 which performs the 16-way major branch after entering decimal indicators 85 via monitor multiplexer 80 and monitor logic 22 into microprocessor 30. Block MBS-000 performs a 16-way branch as shown in FIG. 11 which can exit to one of 16 places. The conditions required to enter any one of the 16 branch routines are shown by the 4-bit binary number shown at the various possible exits. This 4-bit binary number corresponds to the carry-out, illegal digit, equal zero and equal nine indicators of decimal indicators 85. For example, the binary 1000 branch is taken, if the carry indicator is a binary ONE indicating there was a carry-out of the most significant digit, the illegal indicator is a binary ZERO indicating that there was no illegal digit encountered, the zero indicator equals a binary ZERO indicating that the field is not all zeros and the equal nine indicator is a binary ZERO indicating that the field is not all nines.

If the binary 1000 branch is taken, block MBS-001 is entered and jump is performed to a 10's complement routine. This is one of two cases of interest to us to show the use of the equal nine and equal zero indicators. When the binary 1000 branch is taken, block MBS-001 jumps to the 10's complement subroutine to perform a 10's complement on the written field because a carry-out from the most significant digit during a subtract indicates that an oversubtract has been performed and the result must be 10's complemented. Upon exiting, block MBS-001 performs a 2-way branch depending upon whether or not the operand 2 field length was greater than or the same as the operand 1 field length or if the operand 2 field length was less than the operand 1 field length. If operand 2 was longer or the same length as operand 1, the algebraic result is not equal to zero and block MBS-002 is entered to set the greater (G) and the less (L) than commercial instruction indicators which are visible to software instructions. If operand 2 is shorter than operand 1, there is an unwritten field which is not equal to all nines because the all nines indicator is not a binary ONE, and therefore, an overflow (OV) commercial instruction condition has occurred. Therefore, when block MBS-003 is entered, the overflow (OV) commercial instruction indicator is set and upon exiting that block a check is made to see whether the computer is to trap on overflow and, if so, the trap branch exit is taken to routine OV and, if not, the non-trap branch is taken to routine SGL.

Block MBS-003 checks whether a trap is to occur if overflow occurs and, if so, traps to the OV routine which initiates a software trap routine which will handle the overflow condition. Exiting to the overflow trap software routine results in the result of the decimal arithmetic operation not being stored in memory. If the trap on overflow has been masked out such that trapping does not occur on overflow, SGL block MBS-003 takes the no-trap exit and goes to the routine which sets the greater (G) than and less (L) than software visible commercial instruction indicators. When this routine is processed as will be seen below, it results in truncation that saves the least significant digits of the result by storing the written field in RAM 2 into the memory location designated by data descriptor 2.

Before describing the other case of oversubtract in which the indicators are equal to a binary 1001 and which begins with the execution of block MBS-004, the other possible exits from the major branch subtract routine will be briefly described. If the decimal indicators are equal to a binary 0000, it indicates that no oversubtract has occurred and therefore the result in RAM 2 is the final result and the routine exits to the SGL routine which sets the greater than and less than software indicators, fixes the sign of the result and writes the result from RAM 2 into main memory as will be seen below. If the indicators contain the binary value X1XX, it indicates that the illegal character indicator has been set indicating that at some point during the arithmetic operation, the decimal ALU 84 encountered an illegal digit on input such that the 4-bit nibble contained a value that was greater than decimal 9 (i.e., a value of from A through F hexadecimal). In the case where an illegal digit was encountered, a trap occurs to a trap handling routine which allows the software programmer to write a software routine to handle the illegal operand. In this case, the subtract routine does no clean up and stores nothing into main memory before exiting to the software routine which is programmed to handle the case of an illegal digit within one of the operands.

If the decimal indicators 85 are a binary 0010, the major branch subroutine exits to block MBS-008 which does a branch depending upon the relative length of operand 1 and operand 2. If the length of operand 2 was greater than or equal to the length of operand 1, the result is equal to all zeros and therefore is not necessary to set either the greater than or less than indicator so block MBS-008 exits to the FIN routine which completes the processing of the arithmetic operation by setting the sign in RAM 2 and then writing the result, including the sign, from RAM 2 into the main memory location specified by data descriptor 2. FIN is a second entry into the SGL routine. If block MBS-008 takes the branch which indicates that the length of operand 2 is less than the length of operand 1, this indicates that the unwritten field is all zeros and a test must be made to see whether the written field is all zeros, therefore block MBS-009 is entered which examines the status of the equal zero indicator which was saved at the end of the operation on the written field. If the equal zero indicator was a binary ONE at the end of the operation on the written field, block MBS-009 exits to the FIN routine which means that the result is all zeros and therefore neither the greater or less than commercial software instruction indicators must be set. If the written field equal zero indicator was not set at completion of the operation on the written field, block MBS-009 exits to the SGL routine because the result is non-zero and either the G or L commercial software instruction indicators must be set prior to completing the execution of the commercial software instruction.

The major branch subract routine can never take the branch exist which corresponds to decimal indicators of a binary 1010 because this is an arithmetically impossible case. This case would indicate that there was a carry-out of the last (most) significant digit meaning that the absolute value of operand 2 is less than the absolute value of operand 1 but yet the result has the equal zero indicator set to a binary ONE indicating that the result is 0 and this is a mathematical impossibility.

If the major branch subtract routine takes the branch corresponding to indicators of a binary 0001, block MBS-010 is entered. This block is entered if the equal nine decimal indicator that is set to the binary ONE state indicating that the result of the last field processed is equal to all nines. Block MBS-010 branches on the relative length of operand 1 and operand 2 based on the previous compare of operand lengths which was made in block DAD-003. If the length of operard 2 is greater than or equal to the length of operand 1 then block MBS-010 branches to the SGL routine. In this case, the result happens to be equal to all nines. The SGL routine sets the greater and less than indicators before setting the sign and then storing the result in main memory. If the length of operand 2 is less than the length of operand 1, block MBS-010 branches to the OV routine because an overflow has occurred. The OV routine enters block MBS-003 as discussed above which sets the overflow indicator and possibly traps on the overflow condition. This overflow has occurred because there has been no carry-out of the most significant digit indicating that there has been no oversubtract so that a 10's complement will not be performed. Because the unwritten field is not all zeros the result will not fit into the field length of operand 2 and therefore an overflow has occurred.

The major branch subtract routine cannot branch to either branch associated with binary indicators equals to X011 which would mean that the all zeros and all nines indicator are both simultaneously set. This is an impossible condition to have a field containing both all zeros and all nines and therefore these branch paths are never taken.

Returning now to the other case of interest in which an oversubtract has occurred as indicated by the carry-out of the most significant digit meaning that the sign of the result must be changed and that a 10's complement must be performed on the written field. The case where the indicators are equal to a binary 1001 will be described. In this case, the major branch subtract routine block MBS-000 exits to block MBS-004. This block performs a jump to a 10's complement subroutine which performs a 10's complement operation on the written field contained in RAM 2. The 10's complement routine TSC is entered and block TSC-000 is executed.

Block TSC-000 resets the RAM 2 address counter and the nibble write control nibble counter to point to the unit's position of the result in RAM 2. A counter in microprocessor 30 is also initialized to the length of operand 2 so that it will contain the number of decimal digits (excluding the sign) that are in operand 2 as determined by data descriptor 2. Block TSC-001 is then entered which spins through the written field contained in RAM 2 one digit at a time from the unit's position to the most significant digit position until all digits have been complemented as determined by the length of operand 2 counter being decremented until it reaches 0. This spinning through of the written field to perform the 10's complement is shown in Table 15.

Block TSC-000 before exiting resets the decimal indicators such that the carry-out and illegal digit indicators are set to binary ZERO and the equal zero and equal nine indicators are set to the binary ONE state. Block TSC-001 spins through the written field contained in RAM 2 beginning in the unit's position and working to the most significant digit performing a 10's complement on each digit. This is done by subtracting each digit of the result in RAM 2 from zero and storing the result back into RAM 2. This is done by a microinstruction in block TSC-001 which contains a CIPSUB, a CIPDUB, a CINOP2, a CWRES2, a CLDFLP, and a CTDCT2 microoperation. These microoperations tell the decimal ALU 84 to perform a subtract operation, that the A input of the ALU should come from RAM 2 instead of RAM 1 which is done by selecting the output of RAM 2 nibble multiplexer 89 to be output by double multiplexer 83, and to provide that the B port of the ALU 84 receives a zero digit from RAM 2 zero multiplexer 90. In addition, these microoperations provide that the resultant digit out of decimal ALU 84 should be written back into RAM 2 in the nibble pointed to by RAM 2 address counter 87 and the nibble counter in nibble write control 86. In addition, the decimal indicators 85 are to be updated with the results of the indicators from decimal ALU 84 and after the operation is performed, the address and nibble counters in RAM 2 are to be decremented by one to point to the next more significant digit.

TABLE 15

| | | | | | | | | | | | DEC ALU | | DEC |
| | | RAM 1 | | | | RAM 2 | | | IN | | OUT | IND |
| STP | LC | CONT | W1 | N1 | LC | CONT | W2 | N2 | A | B | R | CIZN | CIZN |
| 1B | 2 | NN(N)0 | 2 | 2 | 0 | NN32 | 1 | 1 | 6 | 0 | X | XXXX | 0011 |
| | 3 | 0142 | | | 1 | 3(6)2B | | | | | | | |
| | 4 | DNNN | | | | | | | | | | | |
| 1A | 2 | NN(N)0 | 2 | 2 | 0 | NN32 | 1 | 0 | X | X | 4 | 1000 | 1000 |
| | 3 | 0142 | | | 1 | (3)42B | | | | | | | |
| | 4 | DNNN | | | | | | | | | | | |

TABLE 15-continued

Spin Through Written Field Performing Ten's Complement

| STP | RAM 1 LC | RAM 1 CONT | W1 | N1 | RAM 2 LC | RAM 2 CONT | W2 | N2 | DEC ALU IN A | DEC ALU IN B | DEC ALU OUT R | DEC ALU OUT CIZN | DEC IND CIZN |
|---|---|---|---|---|---|---|---|---|---|---|---|---|---|
| 2B | 2 | NN(N)0 | 2 | 2 | 0 | NN32 | 1 | 0 | X | X | X | XXXX | 1000 |
|    | 3 | 0142   |   |   | 1 | (3)42B |   |   |   |   |   |      |      |
|    | 4 | DNNN   |   |   |   |        |   |   |   |   |   |      |      |
| 2A | 2 | NN(N)0 | 2 | 2 | 0 | NN3(2) | 0 | 3 | X | X | X | XXXX | 1000 |
|    | 3 | 0142   |   |   | 1 | 342B   |   |   |   |   |   |      |      |
|    | 4 | DNNN   |   |   |   |        |   |   |   |   |   |      |      |
| 3B | 2 | NN(N)0 | 2 | 2 | 0 | NN3(2) | 0 | 3 | 2 | 0 | X | XXXX | 1000 |
|    | 3 | 0142   |   |   | 1 | 342B   |   |   |   |   |   |      |      |
|    | 4 | DNNN   |   |   |   |        |   |   |   |   |   |      |      |
| 3A | 2 | NN(N)0 | 2 | 2 | 0 | NN(3)7 | 0 | 2 | X | X | 7 | 1000 | 1000 |
|    | 3 | 0142   |   |   | 1 | 342B   |   |   |   |   |   |      |      |
|    | 4 | DNNN   |   |   |   |        |   |   |   |   |   |      |      |
| 4B | 2 | NN(N)0 | 2 | 2 | 0 | NN(3)7 | 0 | 2 | X | X | X | XXXX | 1000 |
|    | 3 | 0142   |   |   | 1 | 342B   |   |   |   |   |   |      |      |
|    | 4 | DNNN   |   |   |   |        |   |   |   |   |   |      |      |
| 4A | 2 | NN(N)0 | 2 | 2 | 0 | N(N)37 | 0 | 1 | X | X | X | XXXX | 1000 |
|    | 3 | 0142   |   |   | 1 | 342B   |   |   |   |   |   |      |      |
|    | 4 | DNNN   |   |   |   |        |   |   |   |   |   |      |      |

Table 15 illustrates the processing of each of the nibbles in the written field contained in RAM 2. Step B again shows the contents of RAM 1 and RAM 2 prior to the first operation which performs a subtracting of the specified digit in RAM 2 from 0 as indicated by the A port being provided the decimal 6 from RAM 2 and the B port being provided a 0 from RAM 2 zero multiplexer 90. After the first step is completed as shown in step 1A, the result of subtracting 6 from 0 is a decimal 4 as shown in the "R" column which is written into the unit's position in RAM 2 word 1 nibble 1 and the indicators have been set to indicate that there has been a carry-out which is really a borrow in this case. The indicators from decimal ALU 84 are used to update decimal indicators 85 such that the carry indicator is set to a binary ONE and equal zero and equal nine indicators have been reset to the binary ZERO state. Step 2 provides for the writing of the zone field into the string decimal result by use of a microinstruction containing a CWZONE and a CTDCT2 microoperation. This microoperation results in result/zone multiplexer 91 selecting the zone bits of a binary 0011 to be written into the nibble pointed to by the RAM 2 address counter and the nibble write control nibble counter as shown in step 2A which indicates that the 3 has been written into RAM 2 word 1 nibble 0 (no change in this case because the zone nibble was already present) and the counters have been updated to point to the 10's position in RAM 2.

Step 3 is then performed which performs the 10's complement operation on the 10's position of the result field by subtracting decimal 2 from a decimal 0 which results in a result of decimal 7 being written into the 10's position in RAM 2 as shown in step 3A. The output of the decimal ALU indicators is also used to update the decimal indicators 85 which in this case results in no change. Step 4 is then performed in which the zone nibble is written such that it will contain a hexadecimal 3 and no updating is done of the decimal indicators 85. After spinning through the written field in RAM 2, block TSC-001 exits to block TSC-002.

Block TSC-002 inverts a flag contained in microprocessor 30 which is used to indicate whether operand 2 had a plus or minus sign initially. This flag is toggled so that the sign of the result will be inverted by the SGL routine before the result is written back into main memory. Block TSC-002 then returns to the microinstruction following the microinstruction from which it was called. In this case, the return is to block MBS-004 from which the 10's complement subroutine was called.

Block MBS-004 then exits by branching upon whether operand 2 was longer or the safe length as operand 1 in which case the result is not equal to zero and it branches to the set greater than or less than indicators routine SGL. If, however, the operand 2 was shorter than operand 1, block MBS-004 exits to block MBS-006. Block MBS-006 then does a branch depending upon whether or not the written field after complementing contains all zeros as indicated by the current status of the equal zero indicator of decimal indicators 85. Because the unwritten field contained all nines, the overflow condition will only occur if the written field is equal to all zeros. Therefore, if the written field contains all zeros, block MBS-006 branches to the OV routine which, as discussed earlier, results in the setting of the overflow commercial software instruction indicator and then by performing block MBS-003 and then testing for if a trap is to be performed on overflow or not. In the particular case of the example being discussed, the written field is not the equal to all zeros and block MBS-006 takes the non-zero branch and exits to the SGL routine which sets the greater than or less than commercial software instruction indicators and writes the result into main memory.

When the SGL routine is entered, block SGL-000 sets either the G or L commercial software instruction indicators depending upon the result of the arithmetic operation. If the result is greater than zero, the G indicator is set to a binary ONE and the L indicator remains reset to a binary ZERO. If the result is less than zero, the L indicator is set to a binary ONE and the G indicator remains in the binary ZERO state. If the result is zero, neither the G nor L indicators are set to a binary ONE (i.e., the L indicator is set to a binary ONE if the sign of the result is negative and the G indicator is set to a binary ONE if the sign of the result is positive and the equal zero indicator of decimal indicators 85 is not a binary ONE). Block SGL-000 then exits to block SGL-001 which jumps to a subroutine to set the sign within the result.

In the case of the example being described, the sign of the result should be a minus sign because the answer is a −74 decimal and therefore the sign in RAM 2 must be changed from a plus sign, which is a hexadecimal 2B, to a minus sign, which is a hexadecimal 2D in string decimal format. Therefore the trailing sign within the resultant field in RAM 1 is changed from a hexadecimal 2B to a hexadecimal 2D such that the contents of RAM 2 after the sign position has been set in block SGL-001 are as follows.

| RAM 2 Location | RAM 2 Contents (Hexadecimal) |
| --- | --- |
| 0 | NN37 |
| 1 | 342D |

Block SGL-002 then writes the final result contained in RAM 2 back into main memory by transferring one word at a time under the control of RAM address counter 87 via RAM 2 data register 88 and transceivers 97 a word of the result back to microprocessor 30 which then writes the word into the main memory locations pointed to by data descriptor 2. The contents of memory after block SGL-002 are as follows:

| Memory Location (Hexadecimal) | Memory Contents (Hexadecimal) |
| --- | --- |
| 2204 | NN37 |
| 2205 | 342D |

Thus, at the completion of the decimal addition the contents of memory in the locations previously occupied by operand 2 will contain a string decimal 74 with a trailing minus sign which is the result of adding an operand 1 of −00142 to an operand 2 of +68. After the complete result is written into main memory, block SGL-002 exits to the FETCH routine which FETCHes the next software instruction from main memory, decodes the operation codes and begins the processing thereof. The exit to the FETCH routine completes the processing of the decimal add commercial software instruction.

Before leaving the decimal add commercial software instruction discussion, it should be noted that FIG. 11 also contains a flow chart for the decimal subtract commercial software instruction DSB beginning at block DSB-000. An examination of this flow chart shows that it is the same as the decimal add instruction except that blocks DSB-005 and DSB-006 are the reverse of blocks DAD-005 and DAD-006 because when a subtract is being performed, if the signs of the operands are different an absolute value addition must be performed, and if the operands are the same, an absolute value subtract must be performed. In order to complete the discussion of the decimal add and subtract instructions, it should be noted that the absolute value add routine is not shown in FIG. 11 but is similar to the absolute value subtract routine SUB except that the blocks corresponding to blocks AVS-001, AVS-004 and AVS-005 perform additions instead of subtractions in the decimal ALU 84. In addition, the blocks corresponding to blocks AVS-004 and AVS-005 in the absolute value add routine exit to a major branch addition routine instead of the major branch on subtraction routine. The major branch addition routine, which is not shown in FIG. 11, is similar to the major branch subtraction routine shown in FIG. 11 with the exception that in the major branch addition routine, it is not necessary to do any 10's complementing because there is no case in which an oversubtract can occur since the addition of two numbers having the same sign never results in a change of sign.

From the above discussion it can be appreciated that the equal nine indicator and equal zero indicator, which are integrating indicators, are of use in discerning whether the result of an oversubtract in an absolute value subtract routine is within range when the receiving field length of the result is less than the source operand's field length. In the preferred embodiment, where the result is stored into the field previously occupied by operand 2, this means that if the field length of operand 2 is less than the field length of operand 1, the equal nine and equal zero flip-flops can be advantageously employed to determine whether the result will fit within the field previously occupied by operand 2. The four cases below will summarize how the equal nine indicator is used.

These cases illustrate than when an absolute subtract is performed, the indicators are initially preset such that the equal nine and equal zero indicators are binary ONEs and the subtraction is performed starting with the unit's digits and working towards the most significant digit. The subtraction continues until the written field having a length equal to the length of the shorter operand has been processed. After processing the written field, the status of the equal zero indicator is remembered for later use. The processing of the rest of the operand then continues with the processing of the unwritten field after resetting the equal nine and equal zero indicators before starting processing at the least significant digit of the unwritten field. The unwritten field is processed by zero digits being supplied for the missing digits within the shorter operand and the result of the subtracting each digit is not written into a field. Instead, the equal zero and equal nine indicators are integrated over the unwritten field and together with the carry-out from the most significant digit of the longest operand are used to indicate whether the unwritten field is equal to all zeros after any necessary ten's complementing is performed. In performing the ten's complement of the result when an oversubtract occurs (i.e., when the sign of the result must be changed) the ability to to feed either port of the decimal ALU 84 from RAM 2 is used along with the ability to feed a zero into the other port. The case of oversubtract is indicated by a carry out of the most significant digit position. If to carry out occurs, then the unwritten field must be equal to zero, otherwise the result will not fit within the receiving field. If a carry out occurs, meaning that an oversubtract has resulted, it means that the written field must be ten's complemented. In this case, when an oversubtract has occurred and the written field must be ten's complemented, an unwritten field of all nines and a written field ofd all zeros means that the result will not fit within the receiving field because performing a ten's complement will result in a 1 in the first digit of the unwritten field and all zeros in the written field (i.e., this is an overflow condition). If an oversubtract has occurred as indicated by a carry out of the most significant digit, and a ten's complement must be performed on the written field, if the unwritten field is equal to all nines and the written field is not equal to all zeros, the result will fit with no overflow. If an oversubtract has occurred, as indicated by a carry out of the most significant digit, and the unwritten field is not equal to all nines, it means that there is an overflow because performing a ten's complement on the result would not yield an answer which would fit in the written field. These conditions are illustrated in the below cases. Cases illustrating use of equal nine indicator:

| Case 1: DAD (+68) + (−00142) = (−74) | |
|---|---|
| 1 1 1 0 0 | Carries out. |
| 0 0 0 | Leading zeros from RAM 2 zero multiplexer 90. |
| 6 8 | OP 2 in RAM 2. |
| −0 0 1 4 2 | OP 1 in RAM 1. |
| 2 6 | Written field in RAM 2. |
| 9 9 9 | Unwritten field. |

Carry out of 1 from most significant digit means ten's complement necessary on result.
Algebraically:
100000
−99926
−00074
Note:
Unwritten field of all nines turned into innocuous leading zeros in ten's complemented result.

| Case 2: DSB (+68) − (+01142) = (−74) with overflow after truncation | |
|---|---|
| 1 1 1 0 0 | Carries out. |
| 0 0 0 | Leading zeros from RAM 2 zero multiplexer 90. |
| 6 8 | OP 2 in RAM 2. |
| −0 1 1 4 2 | OP 1 in RAM 1. |
| 2 6 | Written field in RAM 2. |
| 9 8 9 | Unwritten field. |

Carry out of 1 from most significant digit means ten's complement necessary on result.
Algebraically:
100000
−98926
−01074
Note:
Result of −1074 is longer than the 2 digit receiving field. An unwritten field that is not all nines will not turn into all zeros when ten's complemented and therefore results in an overflow condition.

| Case 3: DSB (+68) − (+00042) = (+26) | |
|---|---|
| 0 0 0 0 0 | Carries out |
| 0 0 0 | Leading zeros from RAM 2 zero multiplexer 90 |
| 6 8 | OP 2 in RAM 2 |
| −0 0 0 4 2 | OP 1 in RAM 1 |
| 2 6 | Written field in RAM 2 |
| 0 0 0 | Unwritten field |

Carry out from most significant digit equal to 0 means no need to ten's complement the result. Equal zero indicator is used to indicate that unwritten field is all zeros and therefore result fits (no overflow) in receiving field.

| Case 4: DAD (+68) + (−00168) = (−00) with overflow | |
|---|---|
| 1 1 1 0 0 | Carries out. |
| 0 0 0 | Leading zeros from RAM 2 zero multiplexer 90. |
| 6 8 | OP 2 in RAM 2. |
| −0 0 1 6 8 | OP 1 in RAM 1. |
| 0 0 | Written field in RAM 2. |
| 9 9 9 | Unwritten field. |

Carry out of 1 from most significant digit means ten's complement necessary on result.
Algebraically:
100000
−99900
−00100
Note:
Result of −100 is longer than the 2 digit receiving field. The unwritten field of all nines did not turn into innocuous leading zeros. Although the equal nine indicator was set to 1 at the end of unwritten field, the written field equal zero indicator of binary ONE was saved at the end of written field processing and this condition can be detected as an overflow condition.

DECIMAL MULTIPLY COMMERCIAL SOFTWARE INSTRUCTION

The use of commercial instruction logic 28 will now be discussed with reference to the performance of the decimal multiplication software instruction (DML). The DML software instruction is advantageously performed in the preferred embodiment by use of the equal zero indicator of decimal indicators 85 and the ability to access digits from left to right in RAMs 1 and 2 and also from right to left thus providing the decimal multiply routine the ability to access the operands from the most significant to the least significant digit, and from the least significant to the most significant digit. Before examining a specific example of the use of the decimal multiply (DML) software instruction, the overall method used in performing a decimal multiply will be examined with reference to FIG. 12A which shows a prior art method and FIG. 12B which shows the improved method employed in the preferred embodiment.

Figure 12A:
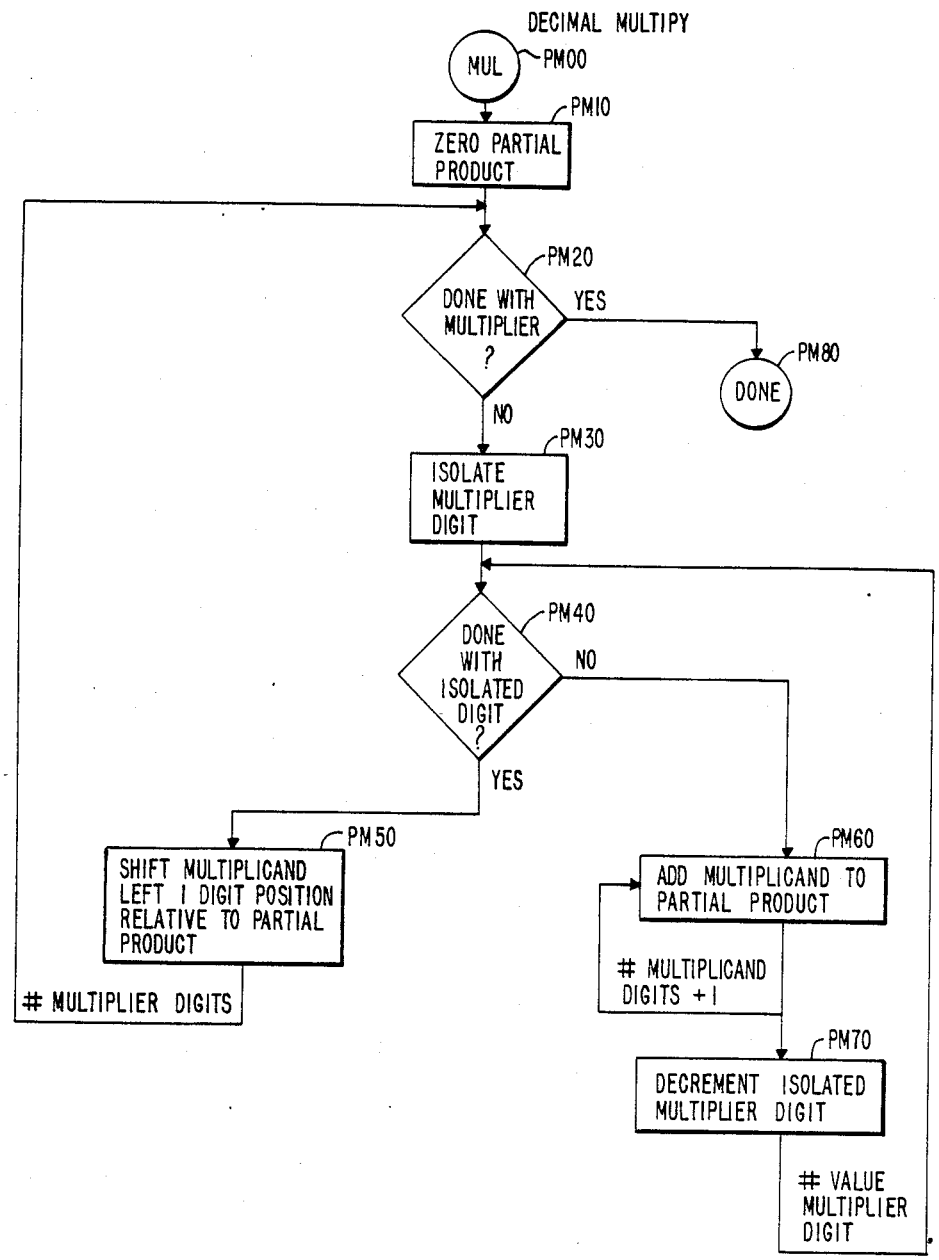
FIG. 12A is a flow chart of a prior art method of performing a decimal multiply.

In FIG. 12A, the flow chart shows that a multiplication is basically done by setting a partial product to zero initially and then working through the multiplier one digit at a time starting with the least significant digit (i.e., the unit's position and then working toward the most significant digits) adding the multiplicand to the partial product the number of times that correspond to the value of an isolated multiplier digit. Once the addition of the multiplicand to the partial product has been completed for a given digit, the multiplicand is shifted left one position, which amounts to multiplying it by a decimal 10, and the shifted multiplicand is then added to the partial product the number of times corresponding to the value of the next most significant in the multiplier. This process is continued until all of the digits in the multiplier have been used to add the multiplicand to the partial product.

In the flow chart in FIG. 12A which shows the prior art, the multiplication is begun in the block entitled MUL which is labeled PM00. Block PM00 exits to block PM10 which zeros out the partial product. Block PM10 exits to block PM20 which tests to see whether all digits within the multiplier have been processed and if so exit to block PM80 which indicates that the multiplication is done. If all digits within the multiplier have not been processed, block PM30 is entered and the least significant non-processed digit within the multiplier is isolated. Block PM30 exits to block PM40 which tests whether the isolated digit of the multiplier has been fully processed and if not exits to block PM60 which adds the multiplicand to the partial product. As indicated in the flow chart, this addition of the multiplicand to the partial product, is accomplished by adding each digit of the multiplicand to the partial product one digit at a time by performing decimal additions, this requires the processing that a loop to be performed a number of times there are digits in the multiplicand plus one.

After the multiplicand is added to the partial product, block PM70 is entered and the isolated multiplier digit is decremented. Block PM70 then returns to block PM40 which determines whether the decremented value of the isolated multiplier digit is now equal to zero. If the decremented value of the isolated digit is not equal to zero, block PM40 exits to block PM60 which does another addition of the multiplicand to the partial product which in turn enters block PM70 to decrement the isolated multiplier digit again and this loop from PM70 back to PM40 has indicated the performed number of times that the equal to the value of the multiplier digit.

When block PM40 finally determines that the isolated digit has been decremented to zero, block PM50 is entered and the multiplicand is shifted one digit position to the left relative to the partial product which amounts to multiplying the multiplicand by 10 such that when the next more significant digit of the multiplier is processed, the multiplicand when it is added to the partial product, will now have a value of ten times what it had when the previous multiplier digit was being processed. Block PM20 is then entered and a test is made to determine whether all digits within the multiplier have been processed. If not, the next more significant digit within the multiplier is isolated in block PM30 and PM30 then exits to block PM40.

Block PM40 determines whether the multiplicand has been added to the partial product the number of times corresponding to the value of the isolated multiplier digit and if not exits to block PM60 to add the multiplicand to the partial product and the isolated multiplier digit is decremented in block PM70. When block PM40 determines that the isolated digit has been processed a sufficient number of times such that the multiplicand has been added to the partial product the required number of times, block PM40 exits to block PM50 which again shifts a multiplicand one digit position to the left relative to the partial product which results in again multiplying the multiplicand by 10.

This process of isolating digits within the multiplier and adding the multlplicand to the partial product the number of times equal to value of the isolated digit continues such that the loop between block PM50 back to block PM20 is performed the number times there are digits within the multiplier. This process is completed when by block PM20 determines that all multiplier digits have been processed so that the multiplication is done and the process is completed in block PM80.

Figure 12B:
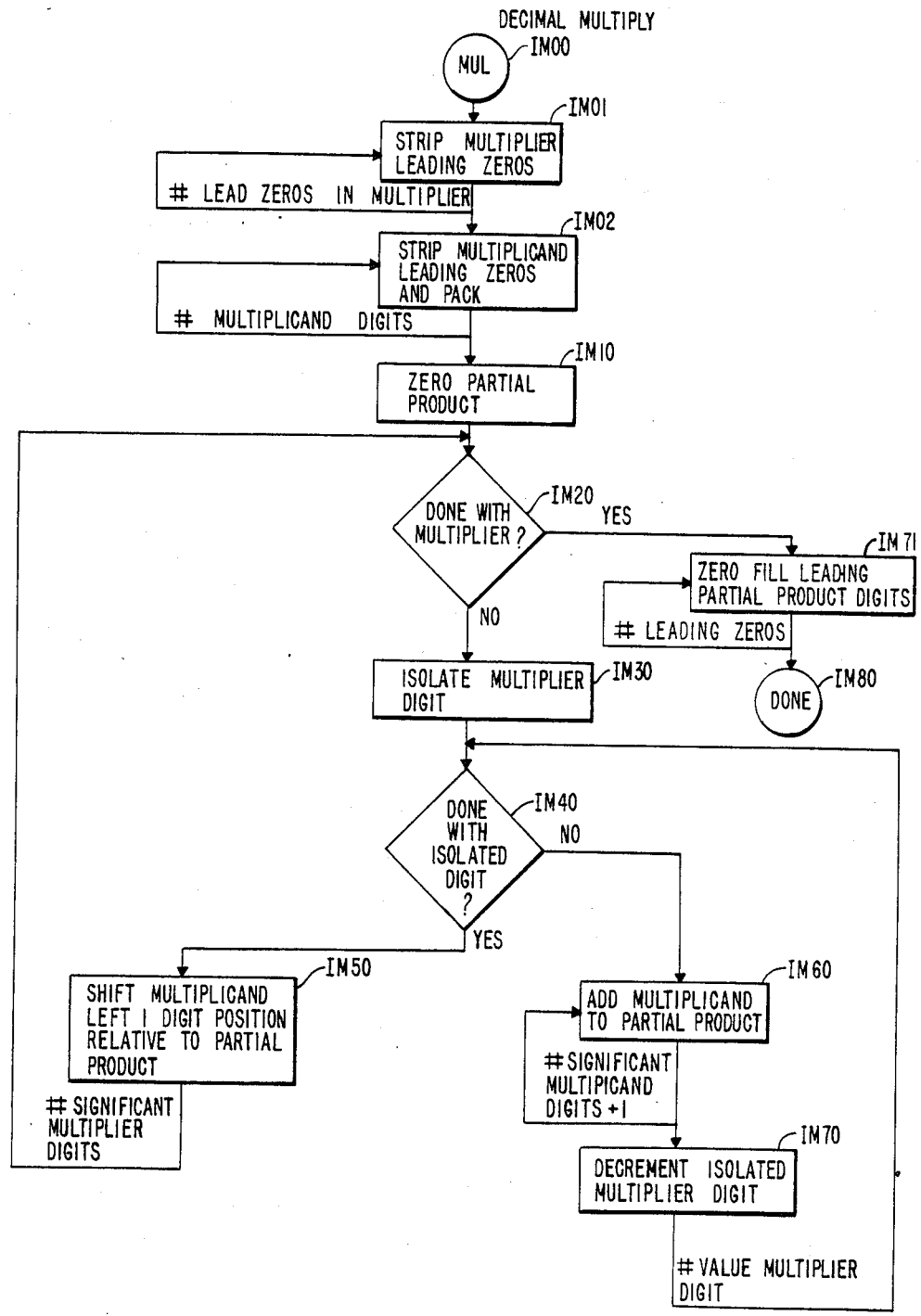
FIG. 12B is a flow chart of the method used by the central processing unit of FIG. 1 to perform a decimal multiply.

The improved multiplication method employed in the preferred embodiment is illustrated in FIG. 12B. In FIG. 12B, the use of the prior art partial product method described above with reference to FIG. 12A is basically employed with time improving enhancements performed prior to the beginning of the process and the clean up enhancements done at the end of the process which results in significant time savings for multiplications performed on operands having leading zeros in the multiplier or the multiplicand.

In FIG. 12B, the multiplication begins in the block entitled MUL and labeled IM00. Block IM00 exits to block IM01 which strips the leading zeros from the multiplier thereby reducing the effective length of the multiplier. Block IM01 then exits to block IM02 which strips the leading zeros from the multiplicand and packs the multiplicand such that if it was unpacked or string data in which each digit occupies a full byte, it is packed such that each digit only occupies a single nibble and the zone nibbles are removed from the multiplicand. In block IM01, the stripping of the leading zeros from the multiplier requires that the loop be performed the number of times that there are leading zeros in the multiplier. Block IM02 is performed the number of times there are digits within the multiplicand.

This stripping of the leading zeros from the multiplier and the multiplicand has the effect of reducing the effective length of both the mutliplier and the multiplicand. This is done in order to reduce the number of times that loops within the multiply routine are performed. This stripping saves time because when the operands are presented to the multiply routine, their length is specified as the length of the entire field in whioh the operand resides suoh that a number having a value of 100 occupying a field which is 7 digits in length will have 4 leading zeros followed by 100. The prior art method will process this number by processing each digit within the operand including the four leading zeros.

After block IM02 has stripped the leading zeros and packed the multiplicand, it exits to block IM10 which begins the multiplication itself. Blocks IM10, 20, 30, 40, 50, 60, 70 and 80 correspond to blocks PM10, 20, 30, 40, 50, 60, 70 and 80 of the prior art method and work in a similar manner. There is a difference, though, in that by stripping the leading zeros from the multiplier and multiplicand the number of times that loops are performed in the improved method can be significantly reduced depending upon the number of leading zeros. For example, the number of times that IM50 branches back to IM20 is equal to the number of significant digits in the multiplier as opposed to the number of digits in the multiplier which included leading zeros in the prior art method. Similarly, the number of times that the loop within block IM60 is performed is equal to the number of significant multiplicand digits plus 1 as opposed to the prior art method in which the loop was performed the number of multiplicand digits plus 1. Because block IM60 contains a loop which is within the bigger loop of blocks IM20 through 50, this reduction in the number of digits which have to be processed within the multiplicand can be quite significant.

The stripping of the leading zeros from the multiplier and the multiplicand, thereby effectively reducing the length of the fields which must be processed, is done prior to the beginning of the multiplication itself because if one attempts to determine whether a digit is equal to zero within a multiplier or multiplicand when working from the least significant digit to the most significant digit, it is impossible to determine whether there is still a non-zero digit to the left (in a more significant position) of an embedded zero. For example, if the number 1001 is being processed, when the ten's position is processed, and the zero is discovered, one cannot simply stop processing at that point because there is a non-zero digit to the left in the one-thousandths position. This non-zero more significant digit is not easily detected in an efficient manner when working from left to right.

The improved method in FIG. 12B has one other block which is different from that in the method of FIG. 12A in that block IM20 exits to block IM71 which must then provide leading zeros within the final partial product such that the field which receives the results will have the sufficient number of digits. This is done by block IM71 looping from the most significant digit within the partial product until the end of the resultant field length is reached in the most significant digit position. This loop is performed the number of times there are leading zeros. Block IM71 then exits to block IM80 which is taken when the multiplication is complete.

From this discussion of the prior art and the improved method, it should be appreciated that the improved method has a little overhead at the beginning of the multiplication to strip of the leading zeros and a little overhead at the end of the multiplication operation to provide leading zeros in the final product but that this additional overhead is more than compensated for by the great reduction in the number of times nested loops within the multiplier routine must be performed.

The stripping of leading zeros in the multiplier multiplicand can become significant when the number of significant digits within the operand field is relatively small as can be the case quite often in software programs. This is the case because when a software program is written, the operand field lengths are specified such that it is sufficiently long to accommodate the maximum length operand such that a field may be required to hold. For example, an operand field may be specified as containing 16 digits when, in fact, for a large portion of the time the number may never exceed 1000 such that the operands will usually have 13 or more leading zeros within them. This happens because it is easier for the software to use fixed length fields for the operands rather than to continually adjust the operand field lengths as a function of the value of the variable stored in that field at any given moment. For example, if an operand value may go to 99,999,999, rather than to attempt to continually adjust the field length of the operand which may range from a value of 0 up to the maximum number and usually has a value of less than 999, the operand is specified to have 8 decimal digits.

Figure 13:
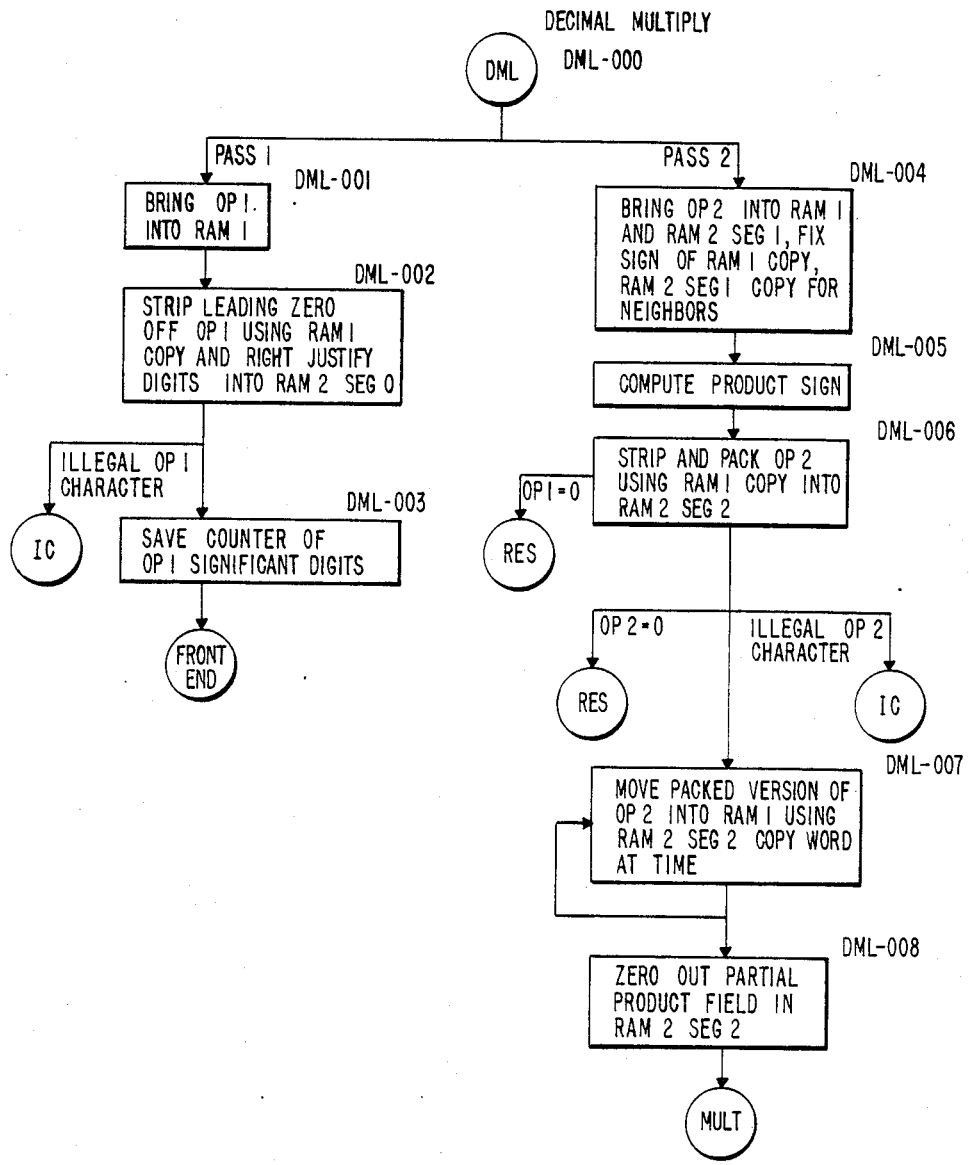
FIG. 13 is a more detailed flow chart of the method shown in FIG. 12B which is used by the central processing unit of FIG. 1 to perform a decimal multiply commercial software instruction.
Figure 13:
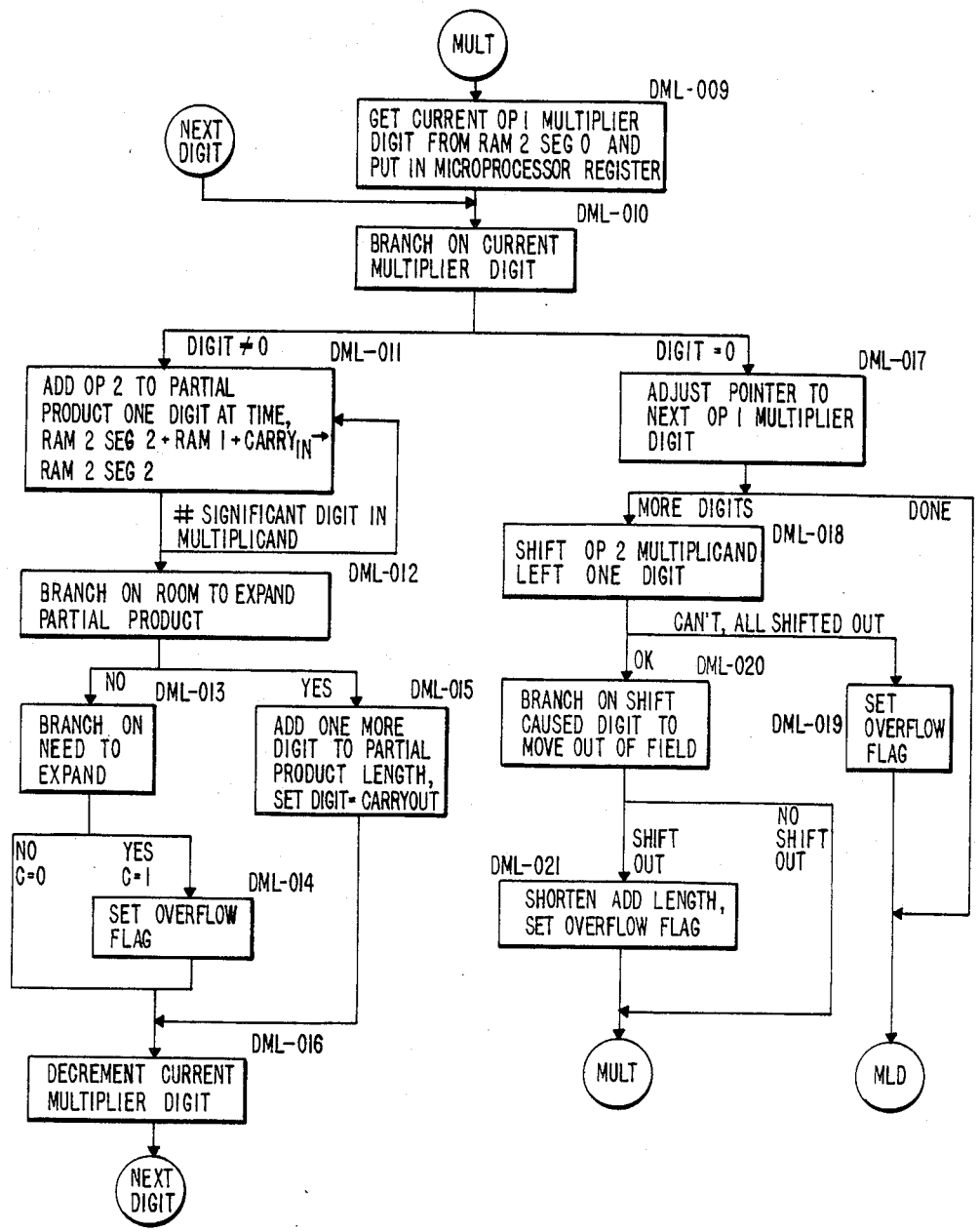
Figure 13:
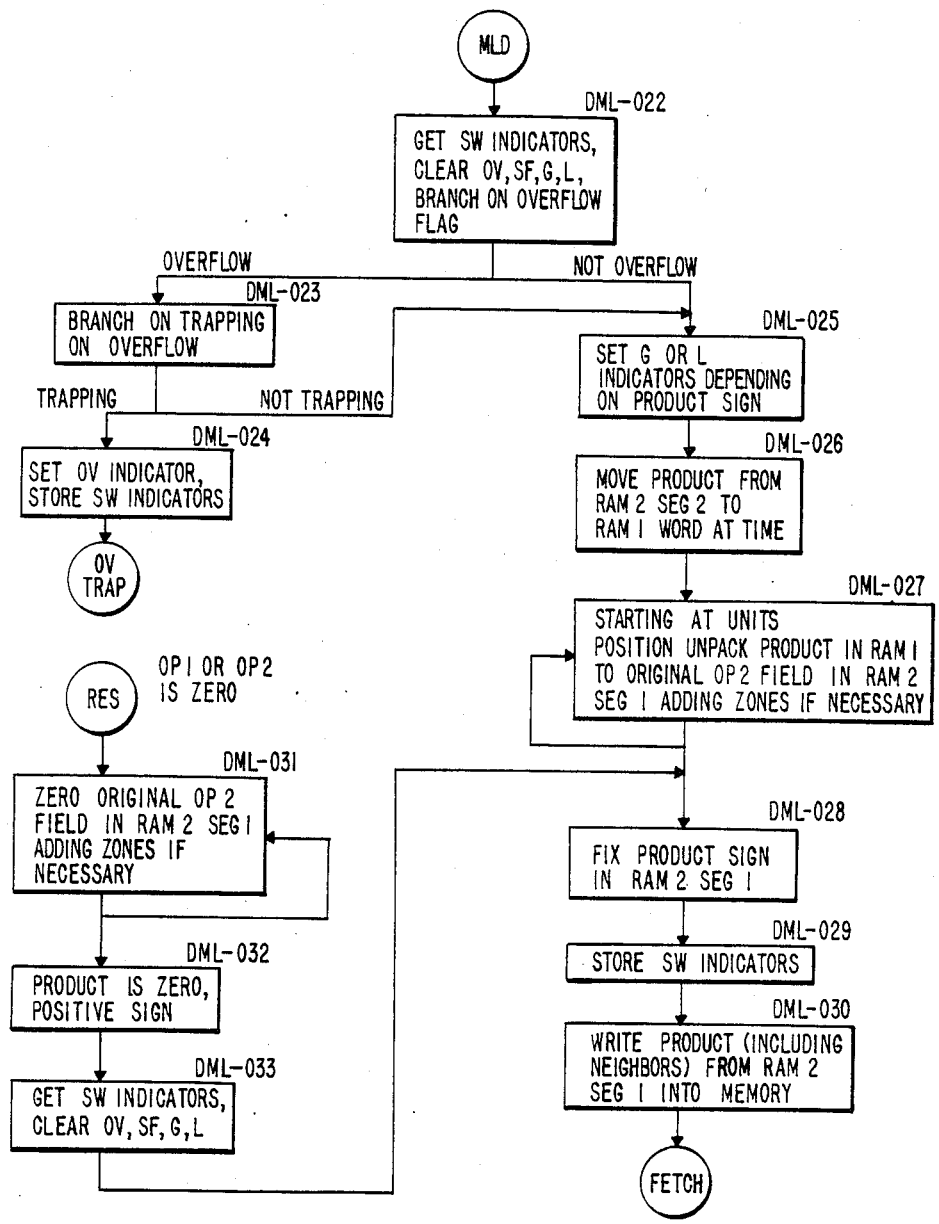

The implementation of the DML software instruction will now be discussed with reference to the detailed flow charts of FIG. 13 which show its implementation in a preferred embodiment. In the DML software instruction, operand 1 is the multiplier which is used to multiply operand 2 which is the multiplicand and the product is stored in the field previously occupied by operand 1.

The DML software instruction will now be explored taking as a specific example as follows:

EXAMPLE $(-000,000,002,403) * (+000,305) = (-000,000,732,915)$

In this example, a multiplicand of −2403 which is operand 2 or OP 2 is multiplied by a multiplier of which is operand 1 or OP 1 to yield a product of −732915 which is stored in the field previously occupied by OP 2. In this example, the multiplicand has 8 leading zeros and the multiplier has 6 leading zeros which will be stripped away before the actual multiplication is performed. Once the final product is calculated, leading zeros will be added to the product before it is stored into main memory.

This stripping of the leading zeros from the multiplicand and the multiplier before calculating the product and the addition of leading zeros to the product at the end greatly reduces the number of steps required as was discussed above. In addition, the preferred embodiment also packs unpacked decimal data such that if string data is presented, in which case each digit of an operand requires a single byte in which the left nibble contains a zone field of binary 0011 and the right nibble contains a decimal value, it is packed to eliminate zone nibbles so that the decimal digits may be consecutively addressed in the working area of the commercial instruction logic. This packing of the operand saves having to skip the zone nibbles and results in some operations being performed in a single microinstruction as opposed to requiring two microinstructions which would be necessary in order to skip the zone nibbles. The above example values will now be discussed in more detail with reference to the detail flow charts of the decimal multiply method.

For this example, assume the DML softward instruction is at main memory location 1000 as follows:

| | Example DML Software Instruction | |
|---|---|---|
| Memory Location (Hexadecimal) | Memory Contents (Hexadecimal) | Meaning |
| 1000 | 0029 | DML op code |
| 1001 | E707 | data descriptor 1 (DD1) word 1 |
| 1002 | 1102 | data descriptor 1 (DD1) word 2 |
| 1003 | 6B07 | data descriptor 2 (DD2) word 1 |
| 1004 | 1204 | data descriptor 2 (DD2) word 2 |

Data descriptors DD1 and DD2 are decoded as follows (see FIG. 9):

| DD1: | T = 0: | String (unpacked) decimal. |
|---|---|---|
| | C1 = 1: | OP 1 starts in right byte. |
| | C2,C3 = 11: | Trailing sign |
| | L = 8: | 7 digits and sign. |
| | CAS: | OP 1 starts in word addressed by contents of base register 7 plus displacement of 1102. If B7 contains the value 1000 hexadecimal, OP 1 is located at address 2102 hexadecimal. |
| DD2: | T = 0: | String (unpacked) decimal. |
| | C1 = O: | OP 2 starts in left byte. |
| | C2,C3 = 11: | Trailing sign. |
| | L = 3: | 2 digits and sign. |
| | CAS: | OP 2 starts in word addressed by contents of base register 7 plus the displacement of 1204. Since B7 contains 1000 hexadecimal, OP 2 is located at address 2204 hexadecimal. |

OP 1, which is a +000305 with a trailing plus sign, appears in main memory as follows:

| Memory Location (Hexadecimal) | Memory Contents (Hexadecimal) |
|---|---|
| 2102 | NN30 |
| 2103 | 3030 |
| 2104 | 3330 |
| 2105 | 352B | where: N are neighbor nibbles. 30, 33 and with 35 are unpacked decimal digits and with zone fields and corresponding to 0, 3 and 5 decimal. 2B is an unpacked trailing plus sign.

OP 2, which is −2403 with a trailing minus sign, appears in main memory as follows:

| Memory Location Address (Hexadecimal) | Memory Contents (Hexadecimal) |
|---|---|
| 2204 | 3030 |
| 2205 | 3030 |
| 2206 | 3030 |
| 2207 | 3030 |
| 2208 | 3234 |
| 2209 | 3033 |
| 220A | 2DNN |
| where: | N are neighbor nibbles which must be preserved when product is stored. 30, 32, 34 and 33 are unpacked decimal digits with zone fields corresponding to 0, 2, 4 and 3 decimal. 2D is an unpacked trailing minus sign. |

The execution of the above example DML commercial software instruction will now be described with reference to FIG. 13. FIG. 13 is a flow chart of the firmware microroutines used by CPU 20 to execute a DML software instruction. The blocks in FIG. 13 which are referred to by the names next to them, such as DML-001, show at a gross level the functions performed by microprocessor 30 and commercial instruction logic 28 to perform the software instruction. Some of these blocks may represent the execution of more than one 48 or 56-bit microinstruction, the form of which is shown in FIG. 5. Before entering the microroutines shown in FIG. 13, which are peculiar to the DML commercial software instructions, the CPU 20 examines the first word of the software instruction which is being executed to determine the type of operation to be performed. Once it is determined that it is a decimal arithmetic operation as determined by looking at the operation code in the first word of the instruction, the CPU 20 then proceeds to decode the address syllable associated with data descriptor 1 to determine the main memory word address and the position within the word in which operand 1 begins. This front end processing of the software instruction then continues with the microprocessor branching to the DML routine at block DML-000.

When the decimal multiply routine is entered at DML-000, it determines whether this is a first pass in which operand 1 is to be brought into the CPU or the second pass in which operand 2 is to be brought into the CPU. If it is the first pass, block DML-000 branches to block DML-001 which fetches operand 1 into RAM 1 one word at a time by bringing it from main memory into the microprocessor, from the microprocessor processor bus 37 into transceivers 97, data-in register 98 and then into RAM 1 81. This process is performed by first loading RAM 1 address counter 75 with the address of the first word which is to be used in RAM 1 and then the loading of the nibble counter in nibble-out control 76. It should be noted that the words of OP 1 are loaded into RAM 1 by using the low four-bit order bits of the main memory address as the four-bit address which is loaded into RAM 1 address counter 75 such that at the end of block DML-001, the contents of RAM 1 are as follows:

| RAM 1 Location | RAM 1 Contents (Hexadecimal) |
|---|---|
| 2 | NN30 |
| 3 | 3030 |
| 4 | 3330 |
| 5 | 352B |

Block DML-001 then exits to block DML-002 which then strips off leading zeros of OP 1 as it moves a copy of OP 1 into segment 0 of RAM 2. During a multiply operation, RAM 2 is broken in eight 32-word segments such that segment 0 occupies address 0-1F (hexadecimal), segment 1 occupies addressed 20-3F (hexadecimal) and segment 2 occupies address 40-5F (hexadecimal), etc. This move and strip of leading zero operation is performed by a subroutine that takes advantage of the ability of the RAM 1 and RAM 2 to be addressed from left to right (i.e., from the most significant digit to the least significant digit).

The move and strip subroutine is entered with the address and nibble counter of RAM 1 pointing to the most significant digit (nibble) of OP 1 in RAM 1 and with the word counter of RAM 2 pointing to word 0 in segment 0 (i.e., location 0) and the nibble counter pointing to nibble 3. The routine is also entered with a a word of all binary zeros loaded into data-in register 98 and the decimal indicators 85 preset such that the equal zero indicator is a binary ONE. The routine then writes one word of all zeros from data in register 98 into the word pointed to by the address counter of RAM 2 by a CWROP2 microoperation. The routine takes the nibble pointed to in RAM 1 and runs it through decimal ALU 84 and writes it into the right (3rd) nibble of the word pointed to in RAM 2 by use of a microinstruction containing a CWRES2, a CLDFLP, a CRUCT1 and a CINOP2 microoperation. This microinstruction also loads the decimal indicators to indicate if the digit just moved to RAM 2 was a nibble containing a decimal 0 digit and it also increments the nibble center of RAM 1 to point to the next nibble which results in the word counter of RAM 1 being incremented if the nibble counter increments through 3. The routine then checks if OP1 is string data and if so it increments the nibble counter of RAM 1 one more time to skip over the zone nibble of the next least significant digit in RAM 1. The routine then tests to see if the equal zero decimal indicator is still a binary ZERO which means that the digit moved from RAM 1 to RAM 2 was a leading zero digit. If the moved digit was a non-zero digit, the routine increments the address counter of RAM 2 so that it will point to the next word by use of a CIAD01 microoperation and then checks to see if all of OP 1 has been moved to RAM 2. If some of OP 1 remains to be moved, the routine returns to the beginning and writes a word of zeros into RAM 2 and then moves the next digit of OP 1 from RAM 1 into RAM 2. If the moved digit of OP 1 was a zero digit such that the equal zero indicator is still a binary ONE, the routine test if all of OP 1 has been moved and if not it goes back and moves the next digit of OP 1 from RAM 1 to RAM 2 without having to zero out the word pointed to by the RAM 2 address counter because the counter is still pointing to the word which has been previously zeroed out since a non-zero digit has not yet been encountered. The strip and move routine makes use of the integrating nature of the equal zero decimal indicator in that once a non-zero digit is encountered, the address counter is incremented by one as each digit is moved even if it happens to be an embedded zero as is found in the number 1203.

When the move and strip routine finishes the move, it returns to block DML-002 which tests the status of the illegal digit indicator to determine if an illegal digit is present in OP 1. The illegal digit indicator was preset to a binary ZERO prior to calling the move routine and since it is also an integrating irdicator, it states at the end of the move will indicate if any illegal (non 0-9 digit) was encountered during the move. If an illegal digit was encountered block DML-002 exits to routine IC otherwise it exits to block DML-003.

At the completion of block DML-002 the contents of segment 0 of RAM 2 will have the significant digit of OP 1 in it as follows:

| RAM 2 Location | RAM 2 Contents (Hexadecimal) |
| --- | --- |
| 0 | 0003 |
| 1 | 0000 |
| 2 | 0005 |

This format, in which RAM 2 contains only one digit of OP 1 (the multiplier) per 16-bit word right justified, makes the digits easily accessible for entry and use in microprocessor 30 as counters in the multiplier loops later on. Block DML-003 then computes the number of significant digits in the OP 1 which is equal to the number of words occupied in RAM 2 segment 0 by the multiplier after the leading zeros have been stripped. This number of significant digits in the multiplier is used as a counter in the multiplication loop.

Block DMA-003 then exits to the instruction front end processing routine which proceeds to crack data descriptor 2 to determine the main memory address of where OP 2 begins in main memory. After cracking DD2, the front end routine then branches on the software instruction operation code in block DML-000 which in turn determines whether this is the pass 1 of pass 2. In this case it is pass 2 so that the microinstructions associated with block DML-004 are executed.

In block DML-004 operand 2 is brought into both RAM 1 and segment 1 cf RAM 2 a word at a time from main memory and the sign of OP 2 is determined. The copy of OP 2 in segment 1 of RAM 2 is used primarily to preserve the neighbor nibbles so that when tbe product is written back into main memory in the field previously occupied by OP 2 the neighbors are not destroyed. At the end of block DML-004, the contents of RAM 1 and segment 1 of RAM 2 are as follows:

| RAM 1 Location (Hexadecimal) | RAM 1 Contents (Hexadecimal) | |
| --- | --- | --- |
| 4 | 3030 | |
| 5 | 3030 | |
| 6 | 3030 | |
| 7 | 3030 | |
| 8 | 3234 | |
| 9 | 3033 | |
| A | 2DNN | |
| RAM 2 Location (Hexadecimal) | RAM 2 Contents (Hexadecimal) | |
| 10 | 3030 | Segment 1 |
| 11 | 3030 | |
| 12 | 3030 | |
| 13 | 3030 | |
| 14 | 3234 | |
| 15 | 3033 | |
| 16 | 2CNN | |

It should be noted that in contrast to RAM 1 where the operand is loaded into the location which corresponds to the low four order bits of the memory address, the first word of OP 2 is loaded into word 0 of segment 1 of RAM 2 and consecutive words are loaded into locations with increasing addresses.

In block DML-005 the sign of the result is calculated by comparing the sign of operand 1 with the sign of operand 2. The resultant sign is positive if the signs of the two operands are the same, negative if the signs of the operands are not the same.

In block DML-006, operand 2 is packed into segment 2 of RAM 2. This packing is done by calling in a subroutine which takes the copy of operand 2, which is in RAM 1, and packs it into RAM 2 segment 2. This packing operation also strips off leading zeros. Before performing the packed routine, a test is made in block DML-006 to determine whether operand 1 is equal to 0 and, if so, a branch is taken to the result routine (RES). The strip and pack routine used in block DML-006 is initially called with the address counter and nibble counter of RAM 1 set to point to the most significant digit of the operand 2 which is stored in RAM 1 and with the address counter and nibble counter of RAM 2 to point to word 0 of segment 2 and nibble zero within word 0. The routine then performs a microinstruction which contains a CWRES2, a CLDFLP, a CTUCT1, and a CINOP2 microoperation which results in the nibble within RAM 1 going through decimal ALU 84 through result/zone multiplexer 91 and into the nibble pointed to by the RAM 2 address and nibble counters. The RAM 1 pointers are then updated to point to the next nibble within RAM 2 to the right of the nibble which was just moved and the RAM 2 counters are left unchanged. A test is then made to determine whether or not operand 2 is in the string decimal format (i.e., if it contains zone nibbles) and if so the RAM 1 nibble counter is incremented by one to skip over the zone field and the RAM 1 address counter is incremented by one if the RAM 1 nibble counter increments through 3. A test is then made on the equal zero indicator to see whether all of the digits that have been moved through decimal ALU 84 have been equal to zero digits. If a non-zero digit has been moved through the decimal ALU 84, the nibble pointer in RAM 1 is incremented by one to point to the next nibble to the right. Again, if the nibble counter increments through 3, the corresponding address counter is incremented by one. Here again, use is being made of the integrating nature of the equal zero indicator such that leading zeros will be stripped from the operand when the operand is being packed but, once a non-zero digit is encountered, from then on all digits are moved such that even embedded zeros will be moved. This incrementing of the RAM 2 pointers when a non-zero digit is moved is done by a microinstruction containing a CTUCT2 microoperation. This process is then repeated until the complete field length of operand 2 has been processed.

Upon completion of the move of operand 2 from RAM 1 and the stripping of the leading zeros and packing it in RAM 2 a test is then made to determine whether operand 2 is equal to zero by testing the equal zero indicator. If the equal zero indicator is still set indicating that all digits were zero, a branch is taken to the result routine (RES) because the answer is now known because one of the operands is equal to zero. A further test is made to determine whether operand 2 contained an illegal character for a digit and, if so, a branch is taken to illegal character (Iroutine IC). Upon the completion of block DML-006, the contents of segment 2 of RAM 0 are as follows:

| RAM 2 Location (Hexadecimal) | RAM 2 Contents (Hexadecimal) | |
|---|---|---|
| 20 | 2403 | Segment 2 OP 2 stripped and packed. |

Block DML-006 also calculates the number of significant digits in operand 2 which is equal to the number of digits of operand 2 stored in RAM 2 segment 2.

Block DML-007 is then entered to move the packed copy of operand 2 from RAM 2 to RAM 1. This moved is performed a word at a time by reading a word from RAM 2 into RAM 2 data-in register 88 and back into data-in register 98 and from there into RAM 1. This move is performed by a microinstruction containing a CWROP1, a CIAD01, and a CIAD02 microoperation which results in the writing of RAM 1 and the incrementing of the address counters of RAM 1 and RAM 2 after the read and write have been performed. Before the move loop is initiated, both the RAM 1 address counter and the RAM 2 address counter were loaded with addresses to point to the first word of RAM 1 (word 0) and RAM 2 address counter was loaded to point to the first word of segment 2 (word 20). After the packed version of operand 2 in RAM 2 segment 2 has been moved to RAM 1, the contents of RAM 1 are as follows:

| RAM 1 Location (Hexadecimal) | RAM 1 Contents (Hexadecimal) | |
|---|---|---|
| 0 | 2403 | OP 2 stripped and packed. |

Block DML-008 is then entered which zeroes out the partial product field prior to initializing the multiplication loops. The partial product is stored in RAM 2 segment 2. This zeroing out of segment 2 of RAM 2 is performed by initializing the RAM 2 address counter to point to the first word of segment 2 (i.e., word 20) and then loading a word of all zeros into data-in register 98 and performing a microinstruction containing a CWROP2 and a CIAD02 microoperation which results in the writing of a word into RAM 2 after which the RAM 2 address counter is incremented by one. This loop is continued until 8 words of segment 2 in RAM 2 have been written into. At the end of block DML-008 the contents of RAM 1 and RAM 2 are as follows:

| RAM 1 Location (Hexadecimal) | RAM 1 Contents (Hexadecimal) | |
|---|---|---|
| 0 | 2403 | Packed version of |
| 1 | XXXX | OP 2 multiplicand |
| RAM 2 | RAM 2 | |

| Location (Hexadecimal) | Contents (Hexadecimal) | |
|---|---|---|
| 0 | 0003 | Segment 0 |
| 1 | 0000 | Significant digits |
| 2 | 0005 | OP 1 multiplier |
| 3 | XXXX | 1 digit/word. |
| 10 | 3030 | Segment 1 |
| 11 | 3030 | Main memory image |
| 12 | 3030 | of OP 2 multiplicand. |
| 13 | 3030 | Preserved or neighbor |
| 14 | 3234 | nibbles. Product will |
| 15 | 3033 | be unpacked into this |
| 16 | 2CNN | area and filled with |
| 17 | XXXX | leading zeros. |
| 20 | 0000 | Segment 2 |
| 21 | 0000 | Partial product |
| ... | ... | of 32 packed zeros |
| 28 | 0000 | ready for multiplica- |
| 29 | XXXX | tion. |

As can be seen above, the partial product area of segment 2 has been packed with 32 zeros which only requires the use of 8 words. The 32 zeros are used because this is the maximum length of any decimal number in the preferred embodiment.

The multiply loop itself begins at the entry point labeled MULT at block DML-009. Block DML-009 gets the current multiplier digit from RAM 2 segment 0 and stores it into a register in microprocessor 30 where it can be decremented down each time the multiplicand is added to the partial product. Initially, because the multiplication is performed by using the multiplier digits from right to left, that is, the multiplication begins using the least significant (the unit's position) digit, the first time through block DML-009 loads word 2 from word 2 RAM 2 segment 2 into microprocessor 30.

Block DML-009 then exits to block DML-010 which branches depending upon the value of the current multiplier digit which is being worked on. This current multiplier digit value is decremented down by one each time the multiplicand is added to the partial product. As long as the decremented value of the multiplier digit is not equal to zero, block DML-010 exits to block DML-011 and begins the addition of the multiplicand to the partial product. When the decremented value of the current multiplier digit is equal to zero, block DML-010 exits to block DML-017. Initially, because the unit's position of the multiplier in the example contains a multiplier digit of 5, it is not equal to zero and block DML-010 branches to block DML-011.

In block DML-011 the multiplicand is added to the partial product. To do this, the multiplicand which is stored as the packed version of operand 2 in RAM 1 is added to the partial product which is stored in segment 2 of RAM 2. This addition is done by adding each digit of the multiplicand in RAM 1 to its corresponding digit within the partial product in RAM 2 with the addition being performed by adding the unit's position of the multiplicand to the adjusted unit's position in the partial product and then adding the ten's digit in the multiplicand to the adjusted ten's position in the partial product. This addition loop adding digit by digit of multiplicand to partial product is done the number of times that there are significant digits in the multiplicand and therefore the stripping of leading zeros done initially from the multiplicand reduces the number of times that this loop must be done. The initial unit's position within the partial product of RAM 2 segment 2 which is initialized to all zeros is initially set at the nibble which corresponds to the Lth nibble in segment 2 of RAM 2 where L is equal to the number of digits not including the sign in operand 2 because the operand 2 field will be used to hold the final product. In the example, there are 12 digits in operand 2 and therefore the 12th nibble in RAM 2 segment 2 is the unit's position in the partial product such that the unit's position is contained in word 22 nibble 3. Thus, before the first addition is done within block DML-011, the pointers in RAM 1 and RAM 2 are as shown below in which the address counter of RAM 1 points to word 0 and the nibble counter of RAM 1 points to nibble 3 such that the unit's digit of 3 will be processed and the pointers to the partial duct in RAM 2 are set to point to the unit's position in RAM 2 segment 2 such that the word counter 2 points to word 22 and the nibble counter points to nibble 3.

| RAM 1 Location (Hexadecimal) | RAM 1 Contents (Hexadecimal) | |
|---|---|---|
| 0 | 2403 | |
| | | WP1 = 0 |
| | | NP1 = 3 |

| RAM 2 Location (Hexadecimal) | RAM 2 Contents (Hexadecimal) | |
|---|---|---|
| 20 | 0000 | |
| 21 | 0000 | |
| 22 | 0000 | |
| | | WP2 = 22 |
| | | NP2 = 3 |

This addition is accomplished by block DML-011 executing a microinstruction containing a CWRES2, a CTDCT1, a CTDCT2, and a CDLFLP microoperation such that one nibble from RAM 1 is added to one nibble from RAM 2 and written back into RAM 2 with the decimal indicators set to indicate the result of the addition. At the end of the addition microinstruction, the counters in RAM 1 are decremented as are the counters in RAM 2 to point to the next most significant digit within the multiplicand and partial product respectively. This loop is then done the number of times corresponding to the number of significant digits in the multiplicand so that each digit within the multiplicand is added to the partial product. In the example, this results in the four digits of the multiplicand being added to the partial product such that at the end of the loop, the partial product will contain the following:

| RAM 2 Location (Hexadecimal) | RAM 2 Contents (Hexadecimal) | |
|---|---|---|
| 20 | 0000 | Segment 2 |
| 21 | 0000 | |
| 22 | 2403 | |
| | | WP2 = 2 |
| | | NP2 = 3 |

Block DML-011 then exits to block DML-012 which determines whether there is sufficient room to expand the partial product value. This test determines whether the adjusted unit's position in the partial product is equal to the adjusted number of significant digits being used in the multiplicand. If the adjusted unit's position is equal to the adjusted number of significant digits in the multiplicand, then there is no room to expand the partial product to accommodate any possible carry-out of the addition of the most significant in the multiplicand to the most significant digit in the partial product. If there is no room to expand the partial product, then DML-012 exits to block DML-013 which determines whether there is a need to expand the partial product. This is done by determining whether there is a carry-out of the addition of the last digit of the multiplicand with the last digit of the partial product (i.e., the most significant digit of each). If there is no carry-out (the carry-out indicator of decimal indicators 85 is equal to 0) there is no overflow and block DML-016 is entered. If there was a carry-out of the most significant digit, then an overflow condition exists and block DML-014 sets an overflow flag before exiting to block DML-016. If block DML-012 determines that there is room to expand the partial product, then the one more digit addition is performed by using a microinstruction containing a CINOP1 and a CWRES2 microoperation which results in the next digit within the partial product being added to a zero from RAM 1 zero multiplexer 82 with the carry-out from the previous digit being added as the carry-in in this addition. Block DML-015 then exits to block DML-016 which decrements the current multiplier digit before returning to block DML-010 for the next multiplier digit.

Block DML-010 then tests the decremented value of the current multiplier and depending upon whether it is equal to zero or non-zero exits to block DML-011 or DML-017. Because the unit's position of the multiplier contains a decimal 5, the branch to block DML-011 would be taken 5 times adding the multiplicand into the partial product 5 times at the end of which the partial product in RAM 2 segment 2 will be as follows:

| RAM 2 Location (Hexadecimal) | RAM 2 Contents (Hexadecimal) | |
|---|---|---|
| 20 | 0000 | Segment 2 |
| 21 | 0001 | |
| 22 | 2015 | |

This is the equivalent of 5 times the multiplicand. When the current multiplier digit is exhausted in block DML-010, it exits to block DML-017. The pointer to the current multiplier digit is decremented to point to the next more significant digit in the multiplier which, the first time this block is entered, results in the pointer being changed from the unit's position to the ten's position. Block DML-017 then exits by testing to see whether there are more multiplier digits to be processed and, if not, exits to block DML-022.

If there are more digits to be processed in the multiplier, block DML-017 exits to block DML-018 which shifts the multiplicand left one digit (i.e., equivalent to multiplying it by 10) relative to the partial product. This shifting of the multiplicand relative to the partial product is actually done by shifting the pointer to the unit's position in the partial product to point to the next digit to the left such that the unit's position in the multiplicand will now be added to the adjusted unit's position in the partial product. The first time block DML-018 is executed, this amounts to changing the pointers to the partial product in RAM 2 segment 2 such that the unit's position is no longer considered to be in word 22 nibble 3, but is now considered to be in word 22 nibble 2, such that the unit's position of the multiplicand will now be added to the ten's position and the partial product.

Block DML-018 then exits to block DML-020 if this shifting of the starting position in the partial product does not result in the starting position being shifted out of the most significant digit of the partial product (i.e., out of word 20 nibble 0). If the shift results in the starting position in the partial product being shifted out of the most significant digit of the partial product, block DML-019 is entered and then overflow condition is flagged. However, if the starting position in the partial product has not been shifted out of the most significant digit of the partial product, a test is then made in block DML-020 to see whether there are sufficient number of remaining digits between the most significart digit and the starting position in the partial product to accommodate the adjusted length of the multiplicand. If, for example, three are only three digits between the most significant digit and the starting digit in the partial product and the multiplicand is 4 digits long, then there are not sufficient digits in the partial product to accommodate the addition of the full multiplicand and block DML-020 then adjusts the length of the multiplicand so that only the number of digits of the multiplicand will be added to the partial product. By doing this, truncation takes place as the multiply is done. This shortening of the multiplicand which amounts to adjusting its length is done in block DML-021 if necessary. After the multiplicand is shifted relative to the partial product, the exit is taken to point MULT in which the multiplicand is then added to the partial product the number of times corresponding to the value of the current multiplier digit beginning with block DML-009.

In the current example in which the ten's position of the multiplier is a zero, the branch performed in block DML-010 will immediatelY result in the exit being taken to block DML-017 and the hundredths position of the multiplier will then be processed. This will result in block DML-018 being entered which will again shift the multiplicand to the left relative to the partial product and the hundredths digit of the multiplier will be processed by eventually returning via point MULT to block DML-009. At this point, when the hundredths position of the multiplier is processed, the pointers in the partial product starting position will point to the hundredths position in the partial product such that the unit's position in the multiplicand will be added to the hundredths position in the partial product. The pointers to the partial product in RAM 2 segment 2 will be as follows:

| RAM 2 Location (Hexadecimal) | RAM 2 Contents (Hexadecimal) | |
|---|---|---|
| 20 | 0000 | |
| 21 | 0001 | |
| 22 | 2015 | |
| | | WP2=22 |
| | | NP2=1 |

After the hundredth's digit of the multiplier has been processed by performing the loop of block DML-010 through block DML-016 three times, the current multiplier digit will have been decremented to zero and block DML-017 will be entered with the partial product then being as follows:

| RAM 2 Location (Hexadecimal) | RAM 2 Contents (Hexadecimal) | |
|---|---|---|
| 20 | 0000 | Segment 2 |
| 21 | 0073 | |
| 22 | 2915 | |

Block DML-017 then tests to see whether all multiplier digits have been processed. In this case, because there is only three multiplier digits to be processed, it exits to block DML-022. It should be noted at this point that by only processing the significant digits in the multiplier, only three digits must be processed and the leading zeros need not be processed. In this case, the three leading zeros in the multiplier need not be processed and this saves considerable time by not having to perform blocks DML-009 through DML-021 for these leading zeros.

Block DML-022 is entered after the multiplication process has been completed and the partial product fully developed in segment 2 of RAM 2. Block DML-022 then gets the decimal indicators 85 into microprocessor 30 via monitor multiplexer 80 and monitor logic 22. It also clears the commercial software instruction overflow (OV), sign fault (SF), greater than (G), and less than (L) indicators. Block DML-022 then branches to block DML-023 if an overflow was detected during the multiplication process or branches to block DML-025 if no overflow occurred during the multiplicatlon. If an overflow was detected, block DML-023 is entered and a branch is taken depending upon whether the overflow trapping is enabled or not. If overflow trapping is enabled, block DML-024 is entered and the commercial software indicators are stored with overflow indicator set. Block DML-024 then branches to the overflow trap routine which processes the overflow trap. If the trapping is not enabled on overflow block DML-023 branches to block DML-025.

Block DML-025 sets the G and L indicators depending upon the sign of the product. Block DML-026 is then entered and the partial product in RAM 2 segment 2 is transferred to RAM 1 one word at a time. Block DML-027 is then entered and the product in RAM 1 is then unpacked into the original operand 2 field adding the necessary zone field nibbles if the operand 2 is string decimal type. This unpacking of the product from RAM 1 into segment 1 in RAM 2 is done to both add the necessary zone nibbles, if it is string decimal data, and to keep intact the original neighboring nibbles that may occupy words with the most significant and least significant digits of operand 2. At the end of block DML-027, RAM 1 which contains the packed product and RAM 2 segment 1 which contains the final product in the decimal format of the original operand 2 are as follows for the example:

| RAM 1 Location (Hexadecimal) | RAM 1 Contents (Hexadecimal) | |
|---|---|---|
| 0 | 0000 | Product in packed format |
| 1 | 0073 | |
| 2 | 2915 | |

| RAM 2 Location (Hexadecimal) | RAM 2 Contents (Hexadecimal) |
|---|---|

-continued

| 10 | 3030 | Segment 1 |
| --- | --- | --- |
| 11 | 3030 | |
| 12 | 3030 | Unpacked product |
| 13 | 3030 | in string decimal |
| 14 | 3733 | format (i.e., with |
| 15 | 3239 | zone nibbles). |
| 16 | 3135 | |
| 17 | 2DNN | |

After moving the product to segment 1, block DML-027 exits to block DML-028 which fixes the sign of the product in RAM 2 segment 1 depending upon whether the sign is negative or positive, which is a function of whether the signs of operand 1 and operand 2 are like or unlike. Block DML-029 is entered and the commercial software instruction indicators are then set. Block DML-030 is then entered which moves the result from RAM 2 segment 1 back via transceivers 97 79 into microprocessor 30 and from there into main memory as specified by data descriptor 2. Block DML-030 then exits to the FETCH routine which fetches the next software instruction and begins its processing.

From the above discussion of the multiplication routine, it can be appreciated that the stripping of the leading zeros from the multiplier and the multiplicand saves significant time within the multiplication routine and that by packing the multiplicand, time is also saved in that zone field nibbles do not have to be skipped during the computation of the partial product.

DECIMAL DIVIDE COMMERCIAL SOFTWARE INSTRUCTION

The decimal divide operation performed by the CPU of the preferred embodiment will now be described. One method of performing a decimal divide which is well known in the art is to initialize a quotient to zero and then continually subtract the denominator from the numerator using decimal subtract operations until the difference goes negative and to increment the quotient by one each time the denominator is successfully subtracted from the numerator before the difference goes negative. When this method is used, the unit's position of the denominator is lined up with the numerator and the subtractions are performed with as many digits being processed in each subtraction as there are digits in the longer of the operands, be it the numerator or the denominator. This process, although it works, can be very slow if the denominator goes into the numerator many times.

Figure 14A:
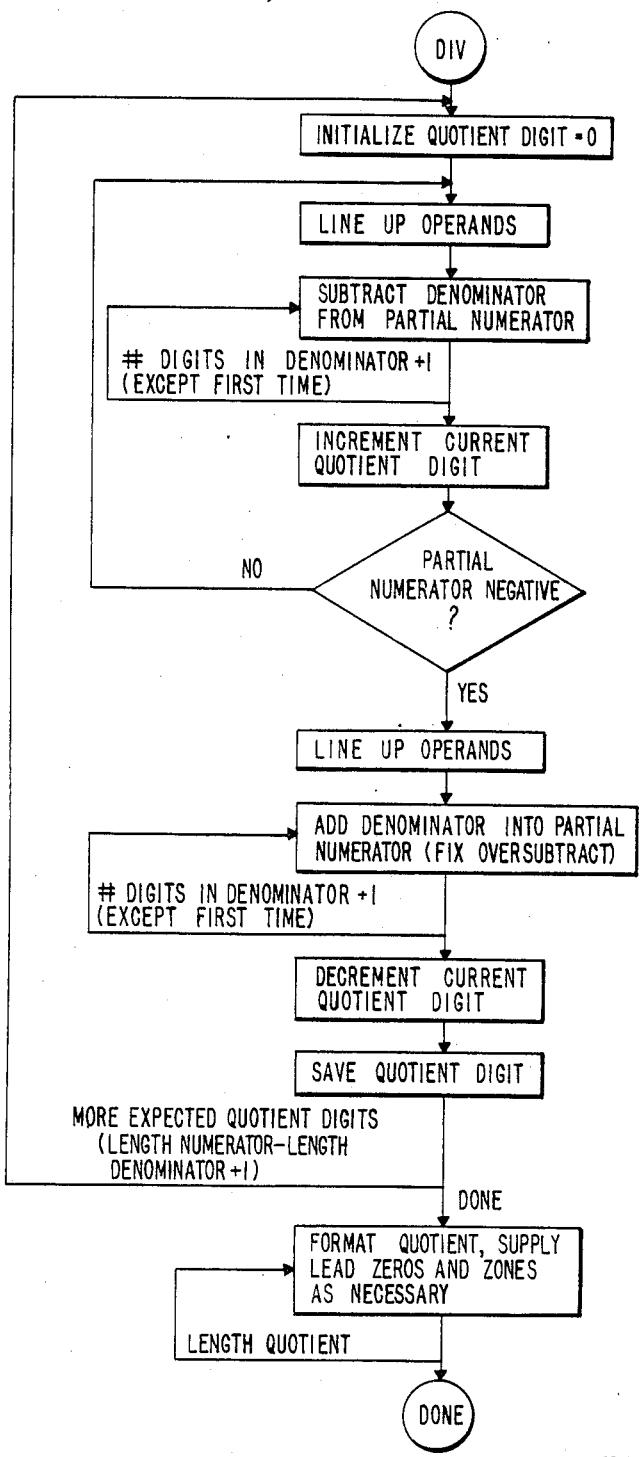
FIG. 14A is a flow chart of a prior art method of performing a decimal divide.

A better method of performing a decimal divide is shown in the flow chart of FIG. 14A which is a diagram of an improved prior art method. In this method, the quotient is developed by first developing the most significant digit of the quotient and then developing lesser significant digits. This is done by lining up the most significant digit in the denominator with the most significant digit in the numerator and doing a decimal subtract. If the result of the subtract is not negative, the present quotient digit is incremented by one and the subtract is performed until such time as the difference between the aligned denominator and the (convert partial numerator) numerator becomes negative at which time the denominator is added back into the difference (partial numerator) and the quotient digit is stored away. Then, the denominator is shifted one decimal digit position to the right and the shifted denominator is then subtracted from the partial numerator until such time as the difference (new current partial numerator) becomes negative at which time the new quotient digit is stored away and the partial numerator is again made positive by adding back in the denominator before the denominator is again shifted one position to the right and a new quotient digit is developed by subtracting the shifted denominator from the partial numerator until such time as the partial numerator becomes negative.

This process is continued until the unit's position of the partial numerator is aligned with the unit's position of the denominator at which time all quotient digits have been developed and the remainder is the final difference.

This process greatly speeds up the division over the non-aligned method previously discussed in which the denominator is simply subtracted from the numerator until the difference becomes negative. An example of this prior art method is shown in Table 16 in which a denominator of 0043 is divided into a numerator of 00006402. As can be seen, the quotient digits are developed from the most significant digit (Q1) to the least significant digit (Q5). This division results in a quotient of 000148 and a remainder of 38.

TABLE 16

| Prior Art Divide of 00006402 by 0043 | |
| --- | --- |
| 00006402 | Q1=0 |
| −0043 | |
| −9997 | Q1=1 |
| +0043 | |
| 00006 | Q1=0, Q2=0 |
| −00043 | |
| −99963 | Q2=1 |
| +00043 | |
| 000064 | Q2=0, Q3=0 |
| −000043 | |
| 000021 | Q3=1 |
| −000043 | |
| −999978 | Q3=2 |
| +000043 | |
| 0000210 | Q3=1, Q4=0 |
| −0000043 | |
| 0000167 | Q4=1 |
| −0000043 | |
| 0000124 | Q4=2 |
| . | |
| . | |
| . | |
| 00000382 | Q4=4, Q5=0 |
| −00000043 | |
| 00000339 | Q5=1 |
| . | |
| . | |
| . | |
| −99999995 | |
| +00000043 | |
| 38 | Q5=8 |

Quotient = 00148
Remainder = 38

Figure 14B:
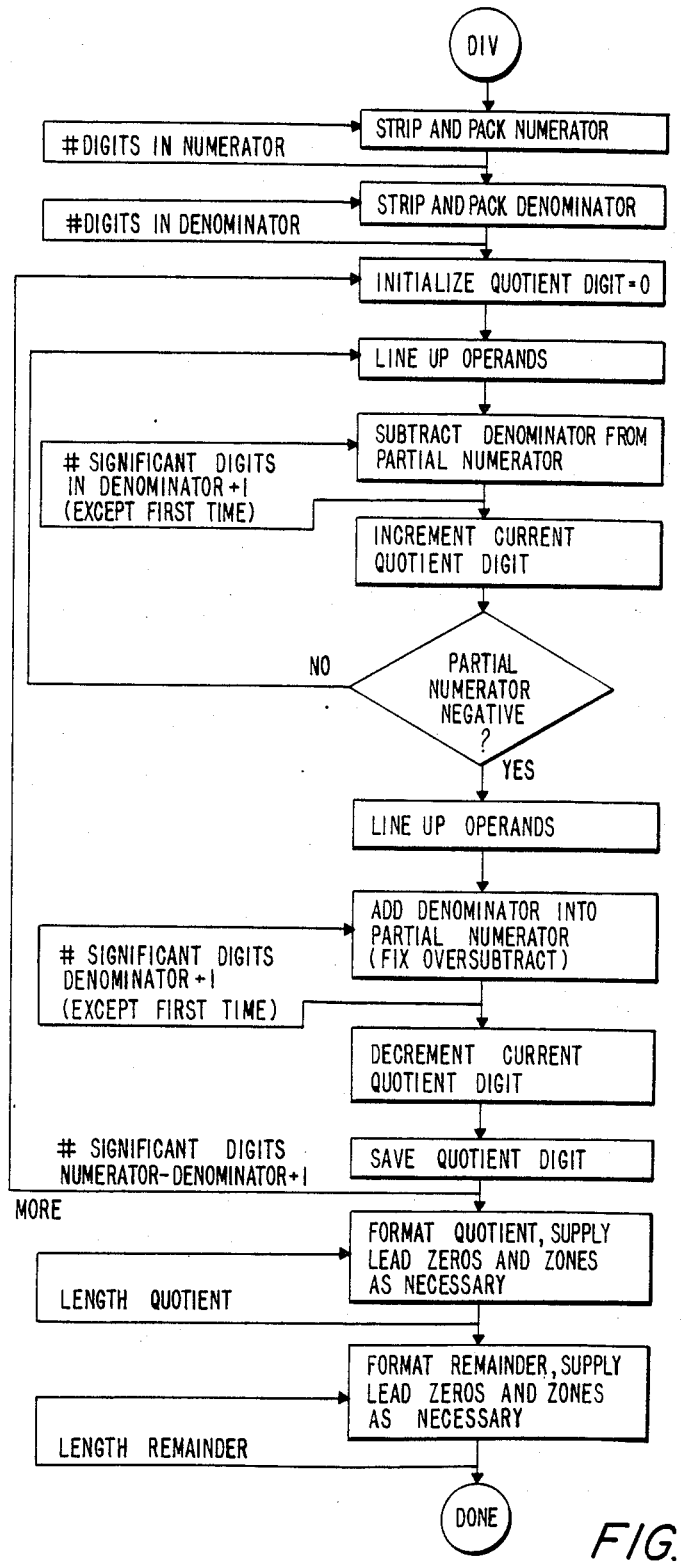
FIG. 14B is a flow chart of the method used by the central processing unit of FIG. 1 to perform a decimal divide.

An improvement on this method is shown in the flow chart of FIG. 14B which is very similar to the flow chart of 14A except that the leading zeros of the numerator and the denominator are stripped away so that the alignment of the numerator and the denominator is done on the most significant non-zero digit as opposed to the most significant digit in the numerator's and denominator's fields as was done in the method of FIG. 14A. The results of stripping away the leading zeros in the numerator and denominator is to further increase the speed by which the division can be done because the leading zero digits need not be processed when performing the subtraction operations. An example of this method is shown in Table 17 using the same denominators and numerators as used above in Table 16.

TABLE 17
Improved Divide

| | |
|---|---|
| 6402 | Q1=0 |
| −43 | |
| 21 | Q1=1 |
| −43 | |
| −78 | Q1=2 |
| +43 | |
| 210 | Q1=1, Q2=0 |
| −043 | |
| 167 | Q2=1 |
| −043 | |
| 124 | Q2=2 |
| . | |
| . | |
| . | |
| 382 | Q2=4, Q3=0 |
| −043 | |
| 339 | Q3=1 |
| . | |
| . | |
| . | |
| −995 | Q3=9 |
| +043 | |
| 038 | Q3=8 |

Quotient = 148
Remainder = 38

The improved method of FIG. 14B also improves the speed by packing the numerator and denominator so that zone field nibbles are eliminated so that at the completion of developing the quotient and remainder the quotient and remainder must have leading zeros supplied as necessary as well as necessary zone field nibbles if the quotient or remainder are in the string decimal format.

Figure 15:
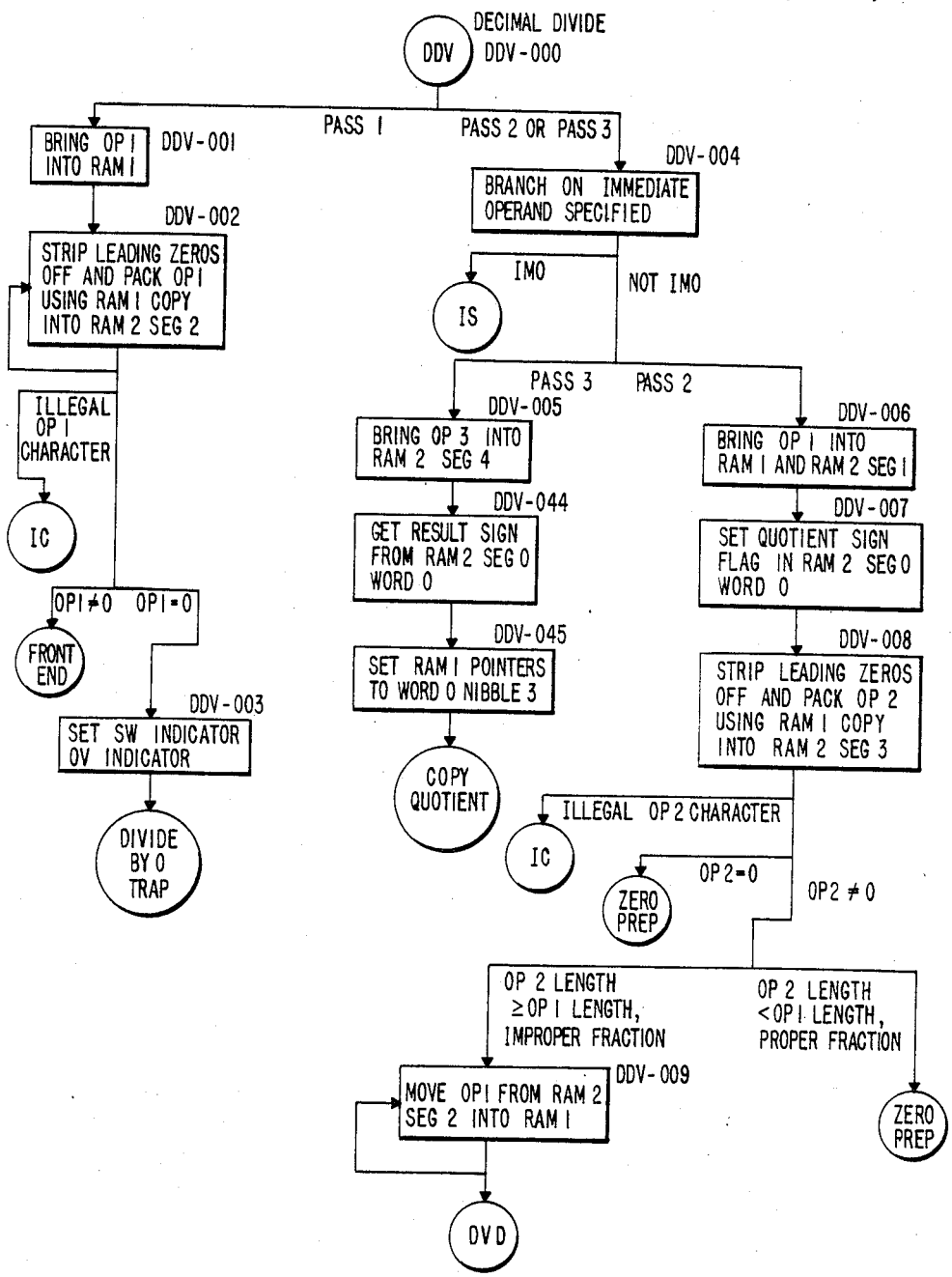
FIG. 15 is a more detailed flow chart of the method shown in FIG. 14B, which is used by the central processing unit of FIG. 1 to perform a decimal divide commercial software instruction.
Figure 15:
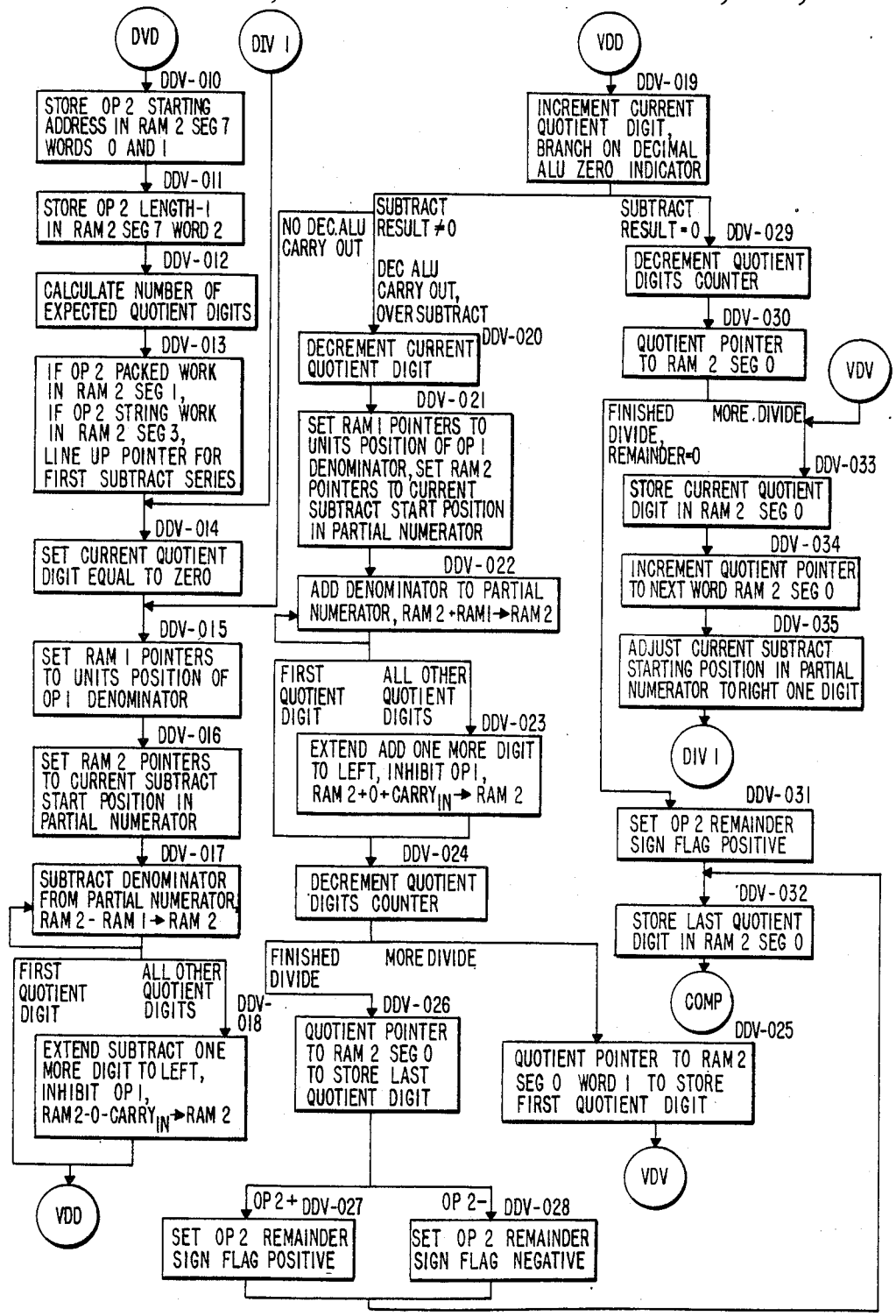
Figure 15:
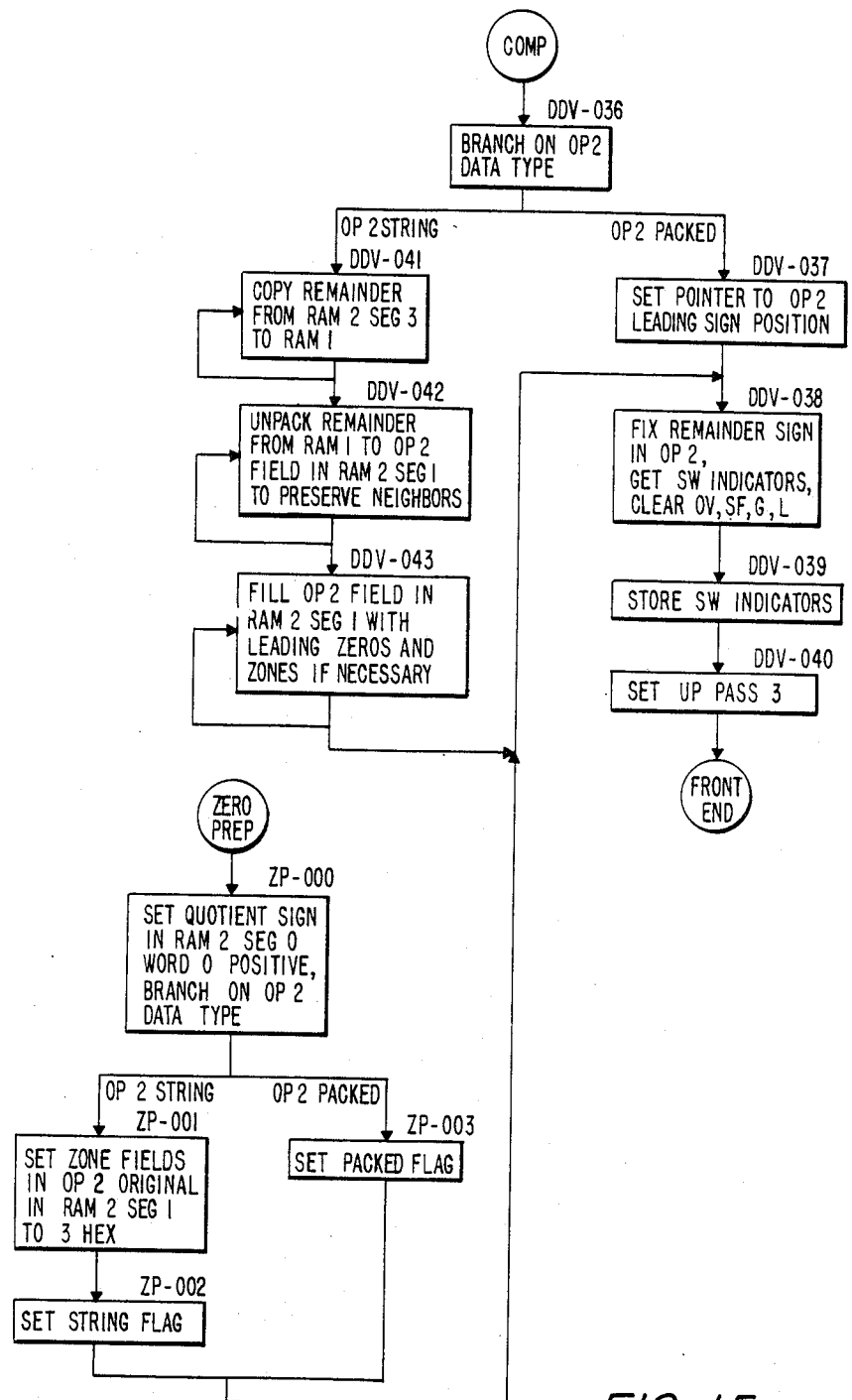
Figure 15:
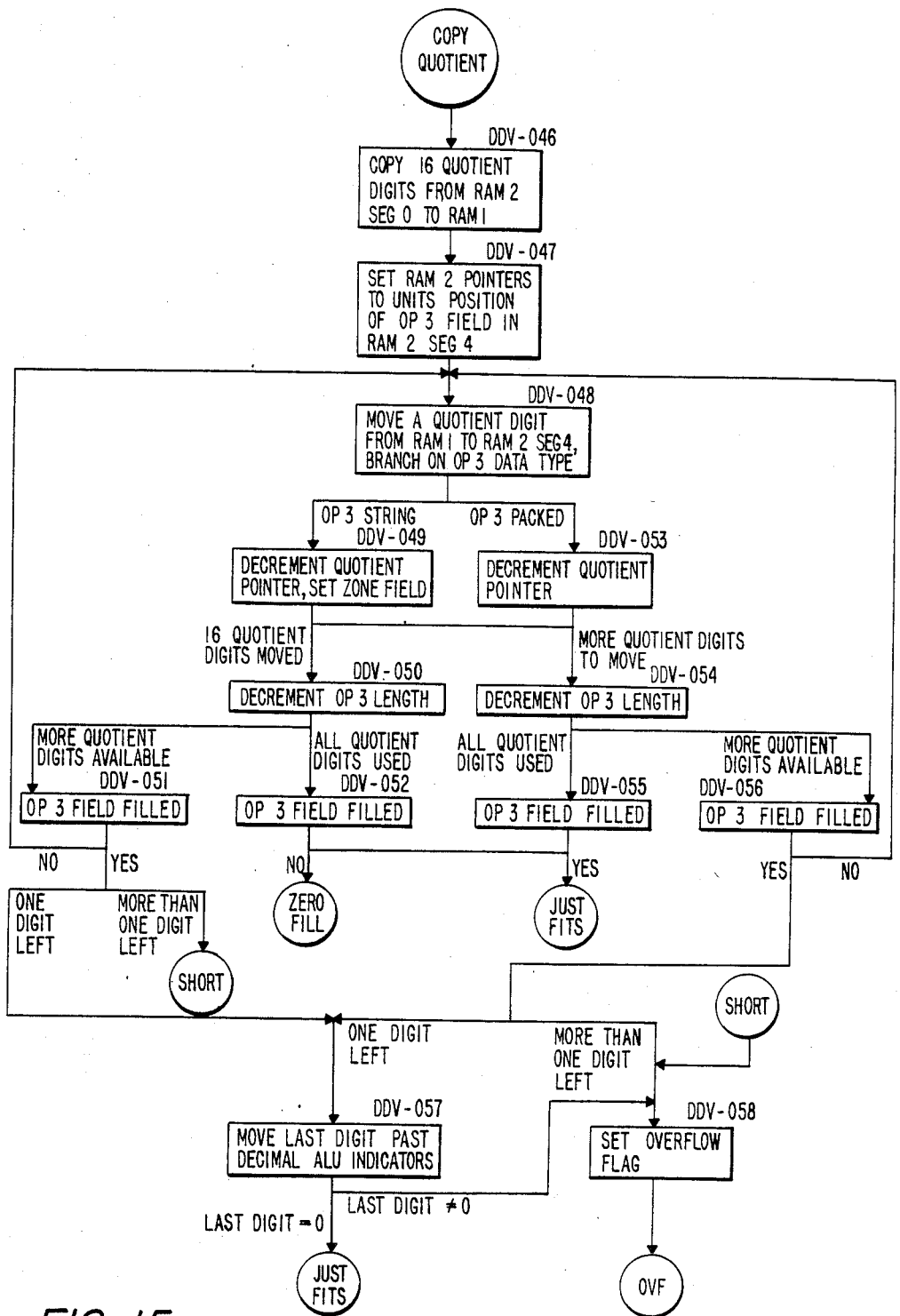
Figure 15:
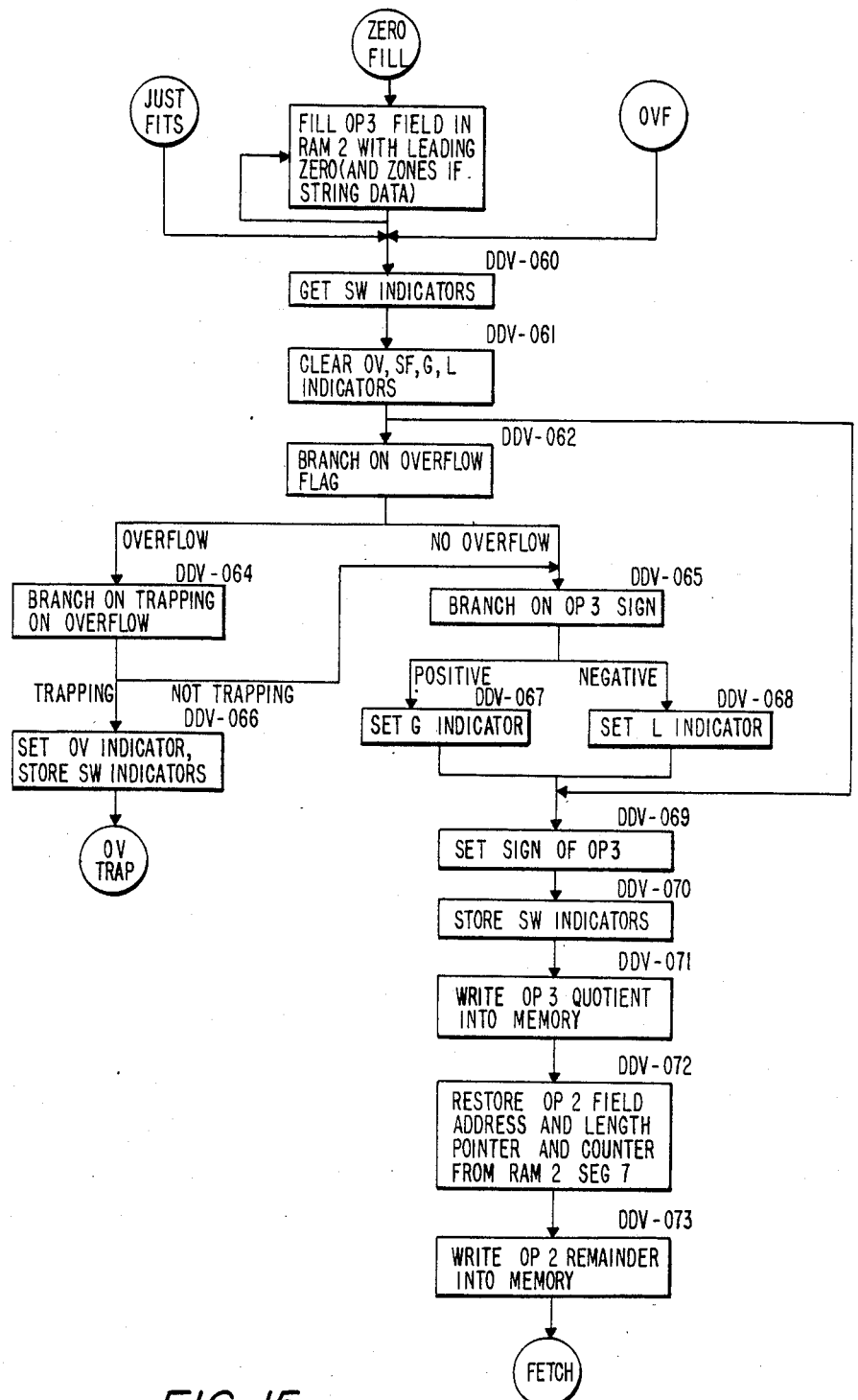

A specific example will now be discussed with the detailed flow charts of the method in FIG. 15. In the preferred embodiment, the decimal divide commercial software instruction takes operand 1 as the denominator and divides it into operand 2, the numerator, and stores the quotient in a field pointed to by data descriptor 3 and stores and remainder back into the field previously occupied by operand 2 which is pointed to by data descriptor 2. In the following example, a numerator of −0006402 will be divided by a denominator of −0043 to produce a quotient in a field designated as containing 6 digits plus a sign such that it will produce a quotient of +000148 and the remainder will go back into the field previously occupied by operand 2 such that the remainder will equal −00000038.

For this example, assume the DDV software instruction is at main memory location 1000 as follows:
Example DDV Software Instruction:

| Memory Location Addressing (Hexadecimal) | Memory Contents (Hexadecimal) | Meaning |
|---|---|---|
| 1000 | 002B | DDV op code |
| 1001 | E507 | data descriptor 1 (DD1) word 1 |
| 1002 | 1102 | data descriptor 1 (DD1) word 2 |
| 1003 | 6907 | data descriptor 2 (DD2) word 1 |
| 1004 | 1204 | data descriptor 2 (DD2) word 2 |
| 1005 | 6707 | data descriptor 3 (DD3) word 1 |
| 1006 | 1306 | data descriptor 3 (DD3) word 2 |

Data descriptors DD1, DD2, DD2 are decoded as follows (see FIG. 9):

| DD1: | T=0: | String (unpacked) decimal. |
|---|---|---|
| | C1=1: | OP 1 starts in right byte. |
| | C2,C3=11: | Trailing sign |
| | L=5: | 4 digits and sign. |
| | CAS: | OP 1 starts in word addressed by contents of base register 7 plus displacement of 1102. If B7 contains the value 1000 hexadecimal, OP 1 is located at address 2102 hexadecimal. |
| DD2: | T=0: | String (unpacked) decimal. |
| | C1=0: | OP 2 starts in left byte. |
| | C2,C3=11: | Trailing sign. |
| | L=9: | 8 digits and a sign. |
| | CAS: | OP 2 starts in word addressed by contents of base register 7 plus the displacement of 1204. Since B7 contains 1000 hexadecimal, OP 2 is located at address 2204 hexadecimal. |
| DD3: | T=0: | String (unpacked) decimal. |
| | C1=0: | OP 3 starts in left byte. |
| | C2,C3=11: | Trailing sign. |
| | L=7: | 6 digits and a sign. |
| | CAS: | OP 3 starts in word addressed by contents of base register 7 plus the displacement of 1306. Since B7 contains 1000 hexadecimal, OP 3 is located at address 2306 hexadecimal. |

OP 1, which is a −0043 with a trailing minus sign, appears in main memory as follows:

| Memory Location (Hexadecimal) | Memory Contents (Hexadecimal) |
|---|---|
| 2102 | NN30 |
| 2103 | 3034 |
| 2104 | 332D | where:
N are neighbor nibbles.
30, 30, 34 and 33 are unpacked decimal digits of 0, 0, 4 and 3 respectively.
2D is a trailing minus sign.

OP 2, which is −00006402 with a trailing minus sign, appears in main memory as follows:

| Memory Location (Hexadecimal) | Memory Contents (Hexadecimal) |
|---|---|
| 2204 | NN30 |
| 2205 | 3030 |
| 2206 | 3036 |
| 2207 | 3430 |
| 2208 | 322D | where:
N are neighbor nibbles which must be preserved when the remainder is stored.
30, 30, 30, 30, 36, 34, 30 and 32 are unpacked decimal digit of 0, 0, 0, 0, 6, 4, 0 and 2 respectively.
2D is an unpacked trailing minus sign.

OP 3, which is to receive the quotient, appears in main memory as follows:

| Memory Location Address (Hexadecimal) | Memory Contents (Hexadecimal) |
|---|---|
| 2306 | XXXX |
| 2307 | XXXX |
| 2308 | XXXX |
| 2309 | SSNN | where:
X are don't care nibbles to be overlayed by quotient digits.
S are don't care nibbles to be overlayed by quotient sign.
N are neighbor nibbles which must be preserved.

The execution of the above example, DDV commercial software instruction, will now be described with reference to FIG. 15. FIG. 15 is a flow chart of the firmware microroutines used by CPU 20 to execute a DDV software instruction. The blocks in FIG. 15 which are referred to by the names next to them, such as DDV-001, show at a gross level the functions performed by microprocessor 30 and commercial instruction logic 28 to perform the software instruction. Some of these blocks may represent the execution of more than one 48 or 56-bit microinstruction, the form of which is shown in FIG. 5. Before entering the microroutines shown in FIG. 15, which are peculiar to the DDV commercial software instructions, the CPU 20 examines the first word of the software instruction which is being executed to determine the type of operation to be performed. Once it is determined that it is a decimal arithmetic operation as determined by looking at the operation code in the first word of the instruction, the CPU 20 then proceeds to decode the address syllable associated with data descriptor 1 to determine the main memory word address and the position within the word in which operand 1 begins. This front end processing of the software instruction then continues with the microprocessor branching to the DDV routine at block DDV-000.

When the decimal divide routine is entered at DDV-000, it determines whether this is a first pass in which operand 1 is to be brought into the CPU or the second pass in which operand 2 is to be brought into the CPU. If it is the first pass, the firmware then branches to block DDV-001 which fetches operand 1 (the denominator) into RAM 1 as previously described for the decimal add instruction. At the end of block DDV-001, the contents of RAM 1 are as follows:

| RAM 1<br>Location | RAM 1<br>Contents<br>(Hexadecimal) |
| --- | --- |
| 2 | NN30 |
| 3 | 3034 |
| 4 | 332D |

Block DDV-001 then exits to block DDV-002 which then strips off leading zeros of OP 1 as it moves a copy of OP 1 into segment 2 of RAM 2. This move and strip of leading zero operation is performed by the subroutine described earlier in the DML instruction.

At the completion of the DDV-002 block, the contents of RAM 2 segment 2 will have OP 1 packed with leading zero stripped and zone field nibble eliminated as follows:

| RAM 2<br>Location<br>(Hexadecimal) | RAM 2<br>Contents<br>(Hexadecimal) | |
| --- | --- | --- |
| 40 | 43XX | OP 1 packed |

After packing the denominator into RAM 2 segment 2 from the copy in RAM 1, block DDV-002 then exits to routine IC if an illegal character was discovered during the move operation or exits to the instruction front end if operand 1 is not equal to zero to prepare to bring in operand 2 or it exits to block DDV-003 if operand 1 is equal to zero indicating that a divide by zero would be attempted. Block DDV-003 sets the commercial instruction overflow indicator and exits to the divide by zero trap routine which causes a trap. If an illegal character was not discovered in operand 1 and if the operand is not equal to zero, the instruction front end routine eventually returns to block DDV-000 to perform the second pass in which case block DDV-004 is entered.

Block DDV-004 tests whether an immediate operand has been specified within the divided software instruction for the operand which is to be processed next. If an immediate operand has been specified for either operand 2 or operand 3, a branch is taken to a routine IS which is an illegal specification routine which will cause a software trap because it is illegal to specify an immediate operand for an operand in which data is to be stored. Operand 2 will have the remainder stored in it and operand 3 will have the quotient stored in it. Therefore, neither operand 2 nor operand 3 may be immediate operations. If the next operand has not been specified to be an immediate operand, block DDV-004 branches to block DDV-006 to get the numerator if it is the second pass or it branches to block DDV-005 to bring in operand 3 if it is the third pass so that the neighbors may be saved when the quotient is stored into that field.

During the second pass, block DDV-006 is entered and operand 2 which is the numerator is brought into RAM 1 and also into segment 1 of RAM 2 such that at the end of block DDV-006, RAM 1 and RAM 2 segment 1 contain the numerator as follows:

| RAM 1<br>Location<br>(Hexadecimal) | RAM 1<br>Contents<br>(Hexadecimal) | |
| --- | --- | --- |
| 4 | NN30 | OP 2 - numerator |
| 5 | 3030 | |
| 6 | 3036 | |
| 7 | 3430 | |
| 8 | 322D | |

| RAM 2<br>Location<br>(Hexadecimal) | RAM 2<br>Contents<br>(Hexadecimal) | |
| --- | --- | --- |
| 20 | NN30 | Segment 1 |
| 21 | 3030 | OP 2 - numerator |
| 22 | 3036 | |
| 23 | 3430 | |
| 24 | 322D | |

Block DDV-007 is then entered and a test of the sign of operand 1 and operand 2 is made to calculate the resultant quotient sign which will be positive if the signs are equal, and will be negative if the signs are not equal, and the resultant quotient sign flag is put into segment 0 word 0 of RAM 2 as follows:

| RAM 2<br>Location<br>(Hexadecimal) | RAM 2<br>Contents<br>(Hexadecimal) | |
| --- | --- | --- |
| 0 | 0000 | Segment 0 word 0<br>Sign flag of quotient:<br>0 = positive<br>FFFF = negative |

Block DDV-008 is then entered and the operand 2 is then moved to RAM 2 segment 3 stripping the leading zeros and removing the zone field nibbles if it is a string operand by copying the copy of operand 2 in RAM 1 into RAM 2 such that at the end of block DDV-008 the contents of RAM 2 segment 3 are as follows:

| RAM 2 Location (Hexadecimal) | RAM 2 Contents (Hexadecimal) | |
|---|---|---|
| 60 | 6402 | Segment 3 OP 2 numerator packed with leading zeros stripped. |

Block DDV-008 exits to routine IC if an illegal character was discovered while moving operand 2 and exits to a ZERO PREP routine if operand 2 is equal to zero. A zero numerator yields a zero quotient and a zero remainder such that the length of the quotient that will be stored in the field specified by data descriptor 3 is set equal to zero and the length of the remainder which will be stored in the field specified by data descriptor 2 is set equal to zero. If operand 2 is not equal to zero as is determined by the zero indicator from decimal indicators 85 not being in the equal zero state, then a test is made to compare the length of the significant digits in operand 2 which is the numerator to the number of significant digits in operand 1 which is the denominator to determine whether just on the basis of the number of non-zero digits in the operands whether the quotient will be greater than zero. If the number of non-zero digits in operand 2 is greater than the number of non-zero digits in operand 1, then an improper fraction will result such that there will be a non-zero quotient and block DDV-009 is entered. If the length of the non-zero field of the operand 2 numerator, is less than the length of the non-zero field in the operand 1 denominator, then a proper fraction will result and it is known that the quotient will be a zero such that the length of the quotient is set to zero and the length of the remainder is set to the length of the data descriptor 2 because operand 2 will be the remainder. In this case of a proper fraction, the routine then branches to the ZERO PREP routine.

If an improper fraction will result and block DDV-009 is entered, it then transfers operand 1 from RAM 2 segment to RAM 1 such that RAM 1 now contains the stripped and packed version of the denominator as follows:

| RAM 1 Location (Hexadecimal) | RAM 1 Contents (Hexadecimal) | |
|---|---|---|
| 0 | 43XX | OP 1 denominator packed and stripped. |

Block DDV-009 then transfers to block DDV-010. Block DDV-010 and block DDV-011 free up some of the registers within microprocessor 30 by storing information that is needed later in the divide operation into unused areas of RAM 2. Block DDV-012 then determines the number of expected digits in the quotient. This is done by taking the number of significant digits of the operand 2 which is the numerator and subtracting from it the number of significant digits of operand 1 which is the denominator and then adding one to the difference. In this case, the expected number of quotient digits is equal to four (which is the length of the non-zero field of operand 2) minus 2 (which is the length of the non-zero field of operand 1) plus 1 which is equal to 3.

Block DDV-013 then sets up the pointers to the version of operand 2 which is to be used during the divide. If operand 2 is string data, the packed version found in RAM 2 segment 3 is used and if operand 2 was packed data then the original version found in RAM 2 segment 1 is used. After setting up the pointers to operand 2, block DDV-014 is entered which sets the current quotient digit equal to 0. In this case, the first time this block is entered, the most significant digit of the quotient is being set equal to zero. This quotient digit is kept in a register within microprocessor 30 which is incremented each time the subtraction loop that follows is done.

Block DDV-015 is then entered which initializes the address counter and nibble counter of RAM 1 to point to the unit's position of the operand 1 denominator which is stored in RAM 1 such that the address counter will point to word 0 and the nibble pointer will point to nibble 1 which contains the decimal 3 digit which is the unit's position of the denominator. Block DDV-016 is then entered and the address counter and nibble counter of RAM 2 are set up to point to the current subtract starting position of operand 2 in RAM 2 which is used as the current partial numerator. In the example case this amounts to pointing to word 0 of segment 3 which is word 60 in RAM 2 and to pointing to the digit 4 which is in nibble 1 of word 60.

Block DDV-017 is then entered and subtracts the denominator in RAM 1 from the current partial numerator in RAM 2 one digit at a time with the number of digits being subtracted equal to the non-zero field length of the denominator. The first time through block DDV-017, this amounts to subtracting the unit's digit of the denominator which contains a decimal 3 from the hundredths position in the numerator which contains a decimal 4 to produce a decimal 1 which replaces the hundredths digit in the partial numerator in RAM 2. The second time through the loop, the ten's position of the denominator which contains a decimal 4 is subtracted from the thousandths position in the numerator which contains a decimal 6 to produce a decimal 2 and no carry-out. Decimal 2 is stored into the one-thousandth's position in the partial numerator replacing the decimal 6. This subtraction of two digits then completes the subtraction of the denominator on a digit by digit basis from the partial numerator and block DDV-017 then exits to block DDV-019 because the first quotient digit is being worked on (i.e., the most significant digit of the quotient). For the second and subsequent quotient digits, block DDV-017 exits to block DDV-018 which subtracts a zero from the next digit to the left in the numerator using the carry-out from the previous subtraction to accommodate a possible carry-out from subtracting the most significant digit of the denominator. This subtraction of individual denominator digits from numerator digits is performed by a microinstruction containing a CIPSUB, a CWRES2, a CLDFLP, a CTDCT1 and a CTDCT2 microoperation such that a digit from RAM 1 is subtracted from a digit from RAM 2 and the result in written back into RAM 2 and the counters to the denominator in RAM 1 are decremented to point to the next more significant digit in the denominator and the counters in RAM 2 are decremented to point to the next more significant digit in the partial numerator. This subtraction of a zero from the next more significant digit within the partial numerator is accomplished by a microinstruction having a CIPSUB, a CWRES2, a CINOP1 and a CLDFLP microoperaiton which results in inhibiting the output of RAM 1 and selecting a zero from RAM 1 zero multiplexer 82 with this zero being subtracted from the digit from RAM 2 using the carry from the previous digit and writing the result back into RAM 2 while updating the decimal indicators 85.

Block DDV-019 is then entered and the current quotient digit is incremented by one. The current quotient digit is kept in a a register in microprocessor 30 and incremented by one and is only transferred back to the commercial instruction logic after the value of the current quotient digit has been finally determined. Block DDV-019 then exits to block DDV-029 if the result of the subtracting the denominator from the partial numerator is equal to zero as determined by the equal zero indicator of decimal indicators 85. Block DDV-019 exits to block DDV-020 if the equal zero indicator does not indicate that the result is equal to zero and there was a carry-out of the most significant digit as indicated by the carry-out decimal indicator 85. If the result is not equal to zero and there was no carry-out then block DDV-019 goes to block DDV-015.

Block DDV-015 is then entered to set the address counter and nibble counter of RAM 1 to point back to the unit's position of the denominator which is stored in RAM 1. Block DDV-016 is then entered and the address counter and nibble counter of RAM 2 are then adjusted back to the current subtract starting position so that they point to the least significant digit in the field within the partial numerator which is currently being worked on. Thus, at the end of block DDV-016 the pointers in the numerator and the denominator have been reset so that another subtract loop can be performed because the previous subtract loop did not yield a zero result and the result did not go negative. Block DDV-016 then returns to block DDV-017 which will subtract the denominator from the current subtract field within the current partial numerator. At the beginning of the second time through this subtract loop, the contents of RAM 1 and RAM 2 are as follows:

| RAM 1 Location (Hexadecimal) | RAM 1 Contents (Hexadecimal) | |
|---|---|---|
| 0 | 43XX | OP 2 - Denominator WP1 = 0 NP1 = 1 |
| RAM 2 Location (Hexadecimal) | RAM 2 Contents (Hexadecimal) | |
| 60 | 2102 | Segment 3 OP 1=Partial numerator WP2 = 60 NP2 = 1 |

Before the subtract begins, the current subtract field being worked on within the partial numerator contains the result of the previous subtraction of the denominator from the partial numerator. After performing the subtract on the entire length of the denominator, block DDV-019 is entered and the current quotient digit of 1 is incremented 2 which is equal to the number of times that the denominator has been subtracted. Block DDV-019 then exits to block DDV-020 because the result is not equal to zero and there was a carry-out indicating that the denominator has been subtracted from the·partial numerator one more time than the denominator will go into the partial numerator. Block DDV-020 then decrements the current quotient digit which makes it go from the value of 2 to the value of 1 to adjust it for this oversubtraction. Block DDV-021 is then entered and the RAM 1 pointers are adjusted to point to the unit's position of the denominator and the RAM 2 pointers are adjusted to point to the current subtract starting position of the partial numerator. Block DDV-022 is then entered to add back the denominator to the partial numerator to compensate for the oversubtraction. Block DDV-022 accomplishes this add by performing a microinstruction containing a CWRES2, a CLDFLD, a CDCT1 and a CDCT2 microoperation in a loop which results in adding each digit of the denominator to its corresponding digit in the partial numerator and placing the resultant digit back into the partial numerator stored in RAM 2. After adding the entire length of the denominator to the partial numerator, block DDV-022 then exits to block DDV-023 if it is not the first quotient digit which is being worked. Block DDV-023 adds one more digit by adding a zero with carry from the previous digit to the next more significant digit in the partial numerator field to handle the case of a carry-out from the previous digit. If it is not the first quotient digit, block DDV-022 exits to block DDV-024 which decrements the current quotient digit by one to adjust for the oversubtraction. Thus, the current quotient digit is adjusted from 2 to 1 the first time through this block.

After adjusting the current quotient digit, block DDV-024 exits to block DDV-025 if there are more quotient digits to be determined or block DDV-026 if this was the last quotient digit to be determined (i.e., the least significant digit of the quotient). In the example case, at this point block DDV-024 would exit to block DDV-025 which sets up point of the address counter of RAM 2 to point to the position in segment 0 where the quotient digits are to be stored. Block DDV-025 then exits to block DDV-033 which store the current quotient digit into segment 0. In the example, this results in storing the first quotient digit in word 1 of segment 0 of RAM 2. This quotient digit has a value of decimal 1 such that at this point segment 0 word 0 contains the sign of the result indicator as stored earlier and the first quotient digit which is equal to a decimal 1 as follows:

| RAM 2 Location (Hexadecimal) | RAM 2 Contents (Hexadecimal) | |
|---|---|---|
| | | Segment 0 |
| 0 | 0000 | OP 3-quotient sign flag |
| 1 | 0001 | 1st quotient digit |

Block DDV-034 then increments the quotient pointer to point to the next word in segment 0 for storing the next quotient digit when it is determined. Block DDV-035 then adjusts the subtract starting position within the partial numerator to the right by one decimal digit. Block DDV-035 then exits to block DDV-014 which sets the current quotient digit, which is a counter within microprocessor 30, equal to 0. Block DDV-015 and DDV-016 then set up their pointers to the unit's position in the denominator and the current subtract starting position in the partial numerator in preparation for starting a new loop which subtracts the denominator from the partial numerator as many times as it can before the result goes negative. When block DDV-016 is exited, the contents of RAM 1 and RAM 2 in their pointers are as follows:

| RAM 1 | RAM 1 | |
|---|---|---|

| Location (Hexadecimal) | Contents (Hexadecimal) | |
|---|---|---|
| 0 | 43XX | OP 1=Denominator WP1=0 NP1=1 |

| RAM 2 Location (Hexadecimal) | RAM 2 Contents (Hexadecimal) | |
|---|---|---|
| 60 | 2102 | OP 1=Partial numerator WP2=60 NP2=2 |

The subtract loop is then performed starting a block DDV-017 and the quotient digit is determined by subtracting decimal 43 from decimal 210 as many times as it will go such that eventually block DDV-033 is entered to store the second quotient digit into the second word of segment 0 RAM 2 so that the contents of segment 0 would then be as follows:

| RAM 2 Location (Hexadecimal) | RAM 2 Contents (Hexadecimal) | |
|---|---|---|
| | | Segment 2 |
| 0 | 0000 | OP3-quotient sign flag |
| 1 | 0001 | 1st quotient digit |
| 2 | 0004 | 2nd quotient digit |

After the pointers are adjusted to the next quotient digit and to the starting position for the next subtract, the subtract routine is again entered at block DDV-017 and the denominator is again subtracted from the partial numerator. Eventually this will result in block DDV-024 being entered to decrement the current quotient counter and taking the branch that goes to block DDV-026 when the last quotient digit is being processed. Block DDV-026 then loads the address counter of RAM 2 with the address of the word in segment 0 where the last quotient digit is to be stored. This last quotient digit is the least significant digit of the quotient. Block DDV-026 then tests to determine whether the sign of operand 2 is a plus sign or a minus sign, and if it is a plus sign, exits to block DDV-027 to set a flag indicating that the remainder which will be stored in field previously occupied by operand 2 should have a plus sign and if operand 2 was negative, then block DDV-026 exits to block DDV-028 to store a flag indicating that the remainder is to have a negative sign. Block DDV-027 and block DDV-028 after setting the remainder sign flag to the proper state then exit to block DDV-032 which stores the last quotient digit. At this point, the contents of RAM 2 segment 0 which contains the quotient digits and the quotient sign flag and segment 3, which contains the remainder of the operand 2 numerator are as follows:

| RAM 2 Location (Hexadecimal) | RAM 2 Contents (Hexadecimal) | |
|---|---|---|
| | | Segment 0 |
| 0 | 0000 | OP3=quotient sign flag |
| 1 | 0001 | 1st quotient digit |
| 2 | 0004 | 2nd quotient digit |
| 3 | 0008 | 3rd quotient digit |
| | | Segment 3 |
| 60 | 0038 | OP2=numerator/ |

| RAM 2 Location (Hexadecimal) | RAM 2 Contents (Hexadecimal) | |
|---|---|---|
| | | remainder |

Before leaving the discussion of the method by which the quotient digits are computed, the case in which block DDV-019 takes the branch that indicates the result of subtracting the denominator from the partial numerator is zero and the branch is taken to block DDV-029 will be discussed. In block DDV-029, the number of remaining quotient digits to be calculated is decremented by one and block DDV-030 is entered which sets up the address counter of RAM 2 to point to the word in segment 0 where the current quotient digit is to be stored. When this path is taken from block DDV-019, it is not necessary to decrement the current quotient digit because there has been no oversubtraction and it is further not necessary to add back the denominator into the numerator to compensate for the oversubtraction. Block DDV-030 then exits and tests whether the divide is finished or not depending upon the number of remaining quotient digits to be calculated as indicated by the quotient digit counter. If there are more quotient digits to be calculated, block DDV-030 exits to block DDV-033 and proceeds as described above. If the divide is finished as indicated by the number of remaining quotient digits being equal to zero, block DDV-030 exits to block DDV-031. Block DDV-031 is taken when the remainder is equal to zero because the result of the subtraction above was zero and the last quotient digit has been processed. Therefore, block DDV-031 sets the sign flag of the remainder to indicate that the remainder has a positive sign. Block DDV-032 is then entered and the last quotient digit is stored in a word in segment 0 of RAM 2. Block DDV-032 then exits to block DDV-036 which tests whether operand 2 is packed decimal data or string decimal data and if it is packed decimal data goes to block DDV-037 and if it is string decimal data goes to block DDV-041.

In the example division, operand 2 is string decimal data so block DDV-036 exits to block DDV-041 which copies the remainder which is what is left of the partial numerator in RAM 2 segment 3 to RAM 1 such that RAM 1 at the end of block DDV-041 is as follows:

| RAM 1 Location (Hexadecimal) | RAM 1 Contents (Hexadecimal) | |
|---|---|---|
| 0 | 0038 | Packed remainder |

After copying the remainder into RAM 1, block DDV-042 then copies and unpacks the remainder from RAM 1 into RAM 2 segment 1 which contains the main memory image of operand 2 which was preserved in order to save the neighboring nibbles. After block DDV-042 unpacks the remainder, RAM 2 segment 1 is as follows:

| RAM 2 Location (Hexadecimal) | RAM 2 Contents (Hexadecimal) | |
|---|---|---|
| | | Segment 1 |
| 20 | NN30 | Unpacked remainder |
| 21 | 3030 | |

-continued

| RAM 2 Location (Hexadecimal) | RAM 2 Contents (Hexadecimal) |
|---|---|
| 22 | 3030 |
| 23 | 3033 |
| 24 | 382D |

In this example, since the packed remainder only contained 4 digits, only the first four least significant digits of the remainder are unpacked into segment 1 of RAM 2 by block DDV-042 and the leading four digits within segment 1 of RAM 2 are those which are left over from the main memory image of the original operand 2. Block DDV-043 is then entered to add the zone field nibbles with leading zeros as is necessary to completely fill out the remainder in RAM 2 segment 1. In this case the execution of block DDV-043 does not result in any change to the contents of segment 1 because the 4 leading digit positions within the operand 2 were initially zeros. These were written over with leading zeros by block DDV-043 also such that at the end of block DDV-043 the contents of segment 1 of RAM 2, which is the main memory image of the remainder, are as above. Block DDV-043 then exits to block DDV-038.

If the operand 2 was not a string decimal data type field, block DDV-036 would have exited to block DDV-037 to adjust the pointers to point to the leading sign position of operand 2 as stored in segment 1 of RAM 2 such that when block DDV-038 is entered from either block DDV-037 or block DDV-043 the address counter and nibble pointers of RAM 2 will point to the first nibble within the operand 2 field. Block DDV-038 is then executed to fix the sign of the remainder in the OP 2 field. Block DDV-038 also gets the commercial software instruction indicators and clears the overflow (OV), specification fault (SF), greater than (G) and less than (L) indicators. Block DDV-039 then stores the commercial software indicators. Block DDV-040 is then entered to set up for pass 3 of the instruction which brings in operand 3 and sets it up in preparation for storing the quotient into the operand 3 field. Block DDV-040 then exits to the instruction front end processing routine which does some preliminary processing upon data descriptor 3 and eventually returns to block DDV-003 which will, on the third pass, result in block DDV-005 being entered.

In block DDV-005, operand 3 field is brought into RAM 2 segment 4 to save the neighboring nibbles before the quotient is written into the field and the field written back into main memory. Block DDV-004 gets the quotient sign flag from RAM 2 segment 0 word 0. Block DDV-045 sets the RAM 1 address counter to point to word 0 and the nibble counter to point to nibble 3. Block DDV-046 is then entered to take the quotient stored in RAM 2 segment 0 one digit at a time starting with the least significant digit and transferring it into RAM 2 segment 4 which contains the operand 3 field, and to supply the necessary zone bits and leading zeros as is necessary. If the operand 3 field length is greater than the number of quotient digits stored in RAM 2 segment 0. This copying of the quotient from segment 0 of RAM 1 to segment 4 of RAM 2 is done in blocks DDV-046 through DDV-059 and at the end of which RAM 2 segment 4, which contains the quotient with the proper sign, appears as follows:

| RAM 2 Location (Hexadecimal) | RAM 2 Contents (Hexadecimal) | |
|---|---|---|
| | | Segment 4 |
| 80 | 3030 | Unpacked quotient of |
| 81 | 3031 | +000148 where "SS" |
| 82 | 3438 | will be occupied later |
| 83 | SSNN | by plus sign. |

After DDV-059 completes the supplying of leading zeros and zone field nibbles as is necessary if there are leading zeros or if the operand 3 field is an unpacked decimal field, block DDV-060 is entered to get commercial software instruction indicators. Block DDV-061 then clears all indicators but the truncation (TR) indicator bit. Block DDV-061 then exits to block DDV-062 if the quotient is not equal to zero or to block DDV-069 if the quotient is equal to zero. If block DDV-062 is entered, a test is made to determine whether an overflow occurred during the divide operation. If an overflow occurred, block DDV-062 exits to block DDV-064 which tests whether traps are enabled and if traps are enabled, block DDV-066 is entered which sets the commercial instruction overflow indicator bit and then exits to the routine to handle the overflow trap. If traps are not enabled, block DDV-064 exits to block DDV-065. Block DDV-065 then tests the sign flag of the quotient which was previously stored.

If the quotient is positive, block DDV-067 is entered and the greater than (G) indicator bit is set. If the of the quotient is negative, block DDV-068 is entered and the less than (L) indicator bit is set. Block DDV-069 is the entered to fix the sign of the quotient in RAM 2 segment 4. Block DDV-070 is then entered which stores the commercial instruction indicators. Block DDV-071 then proceeds to transfer the quotient from RAM 2 segment 4 into main memory by reading a word at a time from RAM 2 into microprocessor 30 and from there having it stored in a word of main memory. In block DDV-072 the starting address and the length of the remainder are restored to pointers and counters from where they were saved in RAM 2 segment 7 words 0-2. In block DDV-073 the remainder is transferred from RAM 2 segment 1 into main memory by taking a word at a time from RAM 2 into microprocessor 30 and writing it into main memory. Block DDV-073 completes the processing of the decimal divide instruction and exits to the routine which fetches the next software instruction from main memory in preparation for its execution.

As can be appreciated from the above discussion of the decimal divide instruction, the ability to address the numerator and the denominator from the most significant digit to the least significant digit is made use of to strip loading zeros from both which results in greatly reducing the number of cycles which must be executed when performing a divide operation.

CONVERT BINARY TO DECIMAL COMMERCIAL SOFTWARE INSTRUCTION

The binary to decimal conversion operation performed by the CPU of the preferred embodiment will now be described. One method of converting a number in a binary format to a number in a decimal format which is well known in the art is to set an initial decimal partial sum to zero and to place the binary number in a register which can be shifted such that each bit within the binary number can be examined. The binary number is then examined beginning at the most significant bit position and the partial sum is then doubled by performing a decimal add of the partial sum to itself and adding in the bit being examined as a carry input into the least significant decimal digit of the partial sum. This process is then repeated scanning from the more significant to the least significant bits within the binary number until each bit has been examined. The decimal partial sum is added to itself each time a bit within the binary number is examined with the carry into the least significant digit of the decimal partial sum being set equal to the bit of the binary number that is being examined. Although this process works, it can be time consuming because the decimal add of the partial sum must be performed for each digit within the binary number being converted such that if a binary number is a 32-bit binary number, 32 decimal adds of the partial sum must be performed. These additions can be quite long if the addition is performed on a partial sum that has as many decimal digits in it as required to hold the largest possible number represented by the length of the binary number (i.e., 2 to the 31 power plus a sign bit).

In the CPU of the preferred embodiment, an improved method is used which first strips off the leading zeros within the binary number such that if a binary number is represented in 16 bits and the most significant 8 bits are all zeros, the 8 first bits are stripped off thereby reducing the total number of decimal additions which need to take place on the partial sum. Secondly, the length of the partial sum is initially set equal to one decimal digit and the length is adjusted only as the number of digits within the partial sum increases so that each addition of the partial sum only is required to do a decimal add on as many digits as required to hold the partial sum at any given instance.

Figure 16:
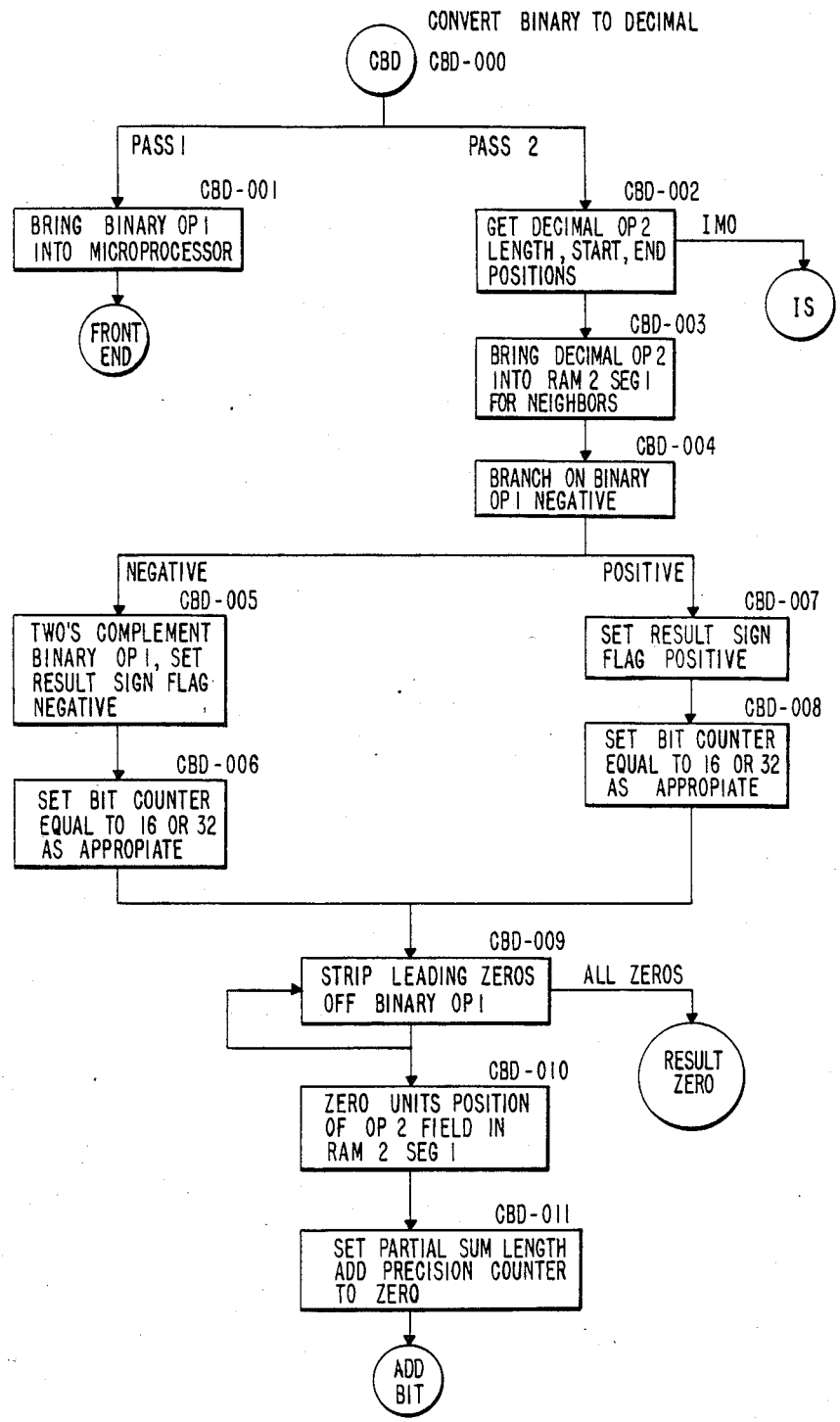
FIG. 16 is a flow chart of the method used by the central processing unit of FIG. 1 to perform a commercial software instruction which converts a number in a binary format to a decimal format.
Figure 16:
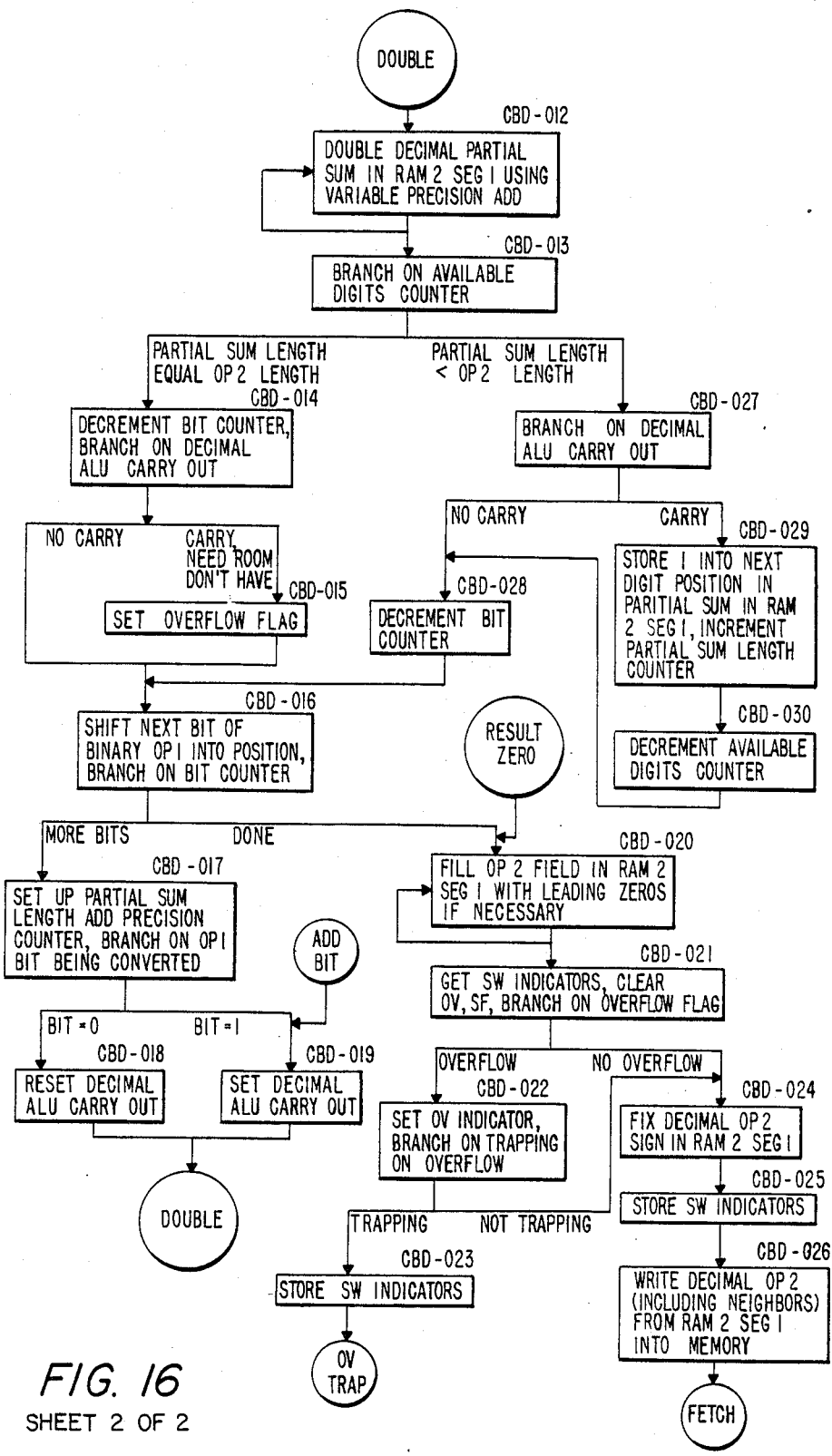

A specific example of a binary to decimal conversion operation will now be discussed with respect to the detailed flow charts of the method as shown in FIG. 16. In the preferred embodiment, the binary to decimal conversion commercial software instruction takes the binary number given to it as operand 1 and it converts it to a decimal number and stores the result in the field specified for operand 2. In the following example, a binary number or −37 will be converted to a decimal number which is to be placed in a packed decimal field with a trailing sign. In the preferred embodiment, negative binary numbers are represented in a two's complement form.

For the example binary to decimal conversion shown below, assume the CBD software instruction is at main memory location 1000 as follows:

| Memory Location Addressing (Hexadecimal) | Memory Contents (Hexadecimal) | Meaning |
|---|---|---|
| | Example CBD Software Instruction: | |
| 1000 | 0027 | CBD op code |
| 1001 | 0207 | data descriptor 1 (DD1) word 1 |
| 1002 | 1102 | data descriptor 1 (DD1) word 2 |
| 1003 | 6487 | data descriptor 2 (DD2) word 1 |
| 1004 | 1204 | data descriptor 2 (DD2) word 2 |

Data descriptors DD1 and DD2 are decoded as follows (see FIG. 9):

| DD1: | T=0: | String (binary DD is a string DD). |
|---|---|---|
| | C1=0: | OP 1 starts in left byte. |
| | L=2: | 16-bit binary operand. |
| | CAS: | OP 1 starts in word addressed by contents of base register 7 plus displacement of 1102. If B7 contains the value 1000 hexadecimal, OP 1 is located at address 2102 hexadecimal. |
| DD2: | T=1: | Packed decimal. |
| | C1,C2=01: | OP 2 starts in nibble 1. |
| | C3=1: | Trailing sign. |
| | L=4: | 3 digits and a sign. |
| | CAS: | OP 2 starts in word addressed by contents of base register 7 plus the displacement of 1204. Since B7 contains 1000 hexadecimal, OP 2 is located at address 2204 hexadecimal. |

OP 1, which is a −37 in two's complement form, appears in main memory as follows:

| Memory Location Address (Hexadecimal) | Memory Contents (Hexadecimal) |
|---|---|
| 2102 | FFDB |

OP 2, which is where the converted number is to be stored, appears in main memory as follows:

| Memory Location Address (Hexadecimal) | Memory Contents (Hexadecimal) |
|---|---|
| 2204 | NXXX |
| 2205 | SNNN | where:
N are neighbor nibbles which must be preserved when the converted number is stored.
X are where the decimal digits of the converted number are to be stored.
S is where the sign of the converted number is to be stored.

The execution of the above example CBD commercial software instruction will now be described with reference to FIG. 16. FIG. 16 is a flow chart of the firmware microroutines used by CPU 20 to execute a CBD software instruction. The blocks in FIG. 16 which are referred to by the names next to them, such as CBD-001, show at a gross level the functions performed by microprocessor 30 and commercial instruction logic 28 to perform the software instruction. Some of these blocks may represent the execution of more than one 48 or 56-bit microinstruction, the form of which is shown in FIG. 5. Before entering the microroutines shown in FIG. 16, which are peculiar to the CBD commercial software instructions, the CPU 20 examines the first word of the software instruction which is being executed to determine the type of operation to be performed. Once it is determined that it is a decimal arithmetic operation as determined by looking at the operation code in the first word of the instruction, the CPU 20 then proceeds to decode the address syllable associated with data descriptor 1 to determine the main memory word address and the position within the word in which operand 1 begins. This front end processing of the software instruction then continues with the microprocessor branching to the CBD routine at block CBD-000.

When the binary to decimal conversion routine is entered at CBD-000, it determines whether this is a first pass in which operand 1 is to be brought into the CPU or the second pass in which operand 2 is to be brought into the CPU. If it is the first pass, the firmware then branches to block CBD-001 which fetches operand 1 (the binary number to be converted into microprocessor 30 During the second pass, block CBD-003 is entered and the operand 2 is brought into the CPU so that it can be shifted and examined one bit at a time starting with the most significant bit. Block CBD-001 then exists to the instruction front end routine which eventually returns to block CBD-000 to perform the second pass in which case block CBD-002 is entered. Block CBD-002 analyzes the data descriptor 2 to determine the starting and end positions of the operand 2 field which is to hold the converted number and the length of the field. 8lock CBD-003 then brings in operand 2 so that the neighbors may be saved when the converted number is stored into that field in main memory. Operand 2, which is the field in which the converted number is to be stored, is brought into segment 1 of RAM 2 such that at the end of block CBD-003, RAM 2 segment 1 contains the converted number field as follows:

| RAM 2 Location (Hexadecimal) | RAM 2 Contents (Hexadecimal) | |
|---|---|---|
| 20 | NXXX | Segment 1 |
| 21 | SNNN | OP 2 - field to receive converted number. |

Block CBD-004 is then entered and a test of the sign of operand 1 binary is made. If the sign of the binary number to be converted is negative, block CBD-004 branches to block CBD-005 to perform a two's complement on the binary operand and to note that the sign of the result should be negative. Block CBD-005 then exits to block CBD-006 which sets up the appropriate bit counter to equal either 16-bits, if a single precision binary number containing 16 bits is to be converted, or equal to 32, if a double precision number containing 32 bits is to be converted. Block CBD-006 then exits to block CBD-009. If block CBD-004 determines that the binary number to be converted is a positive number, block CBD-007 is entered and a flag is set to indicate that the result is positive. Block CBD-007 then exits to block CBD-008 which sets up a bit counter equal to 16, if it is a single precision binary number to be converted, to 32, if a double position binary number is to be converted.

Block CBD-009 is then entered and the binary number within microprocessor 30 is then shifted to the left until the first non-zero binary bit is encountered and the length of the binary field which has to be converted, either 16 or 32, is adjusted to reflect the number of non-zero remaining in the binary number. If block CBD-009 determines that all bits within the binary number to be converted are zeros, block CBD-009 exits to the zero result routine, which is routine CBD-020. If the binary number to be converted is not zero, block CBD-009 after stripping off all leading zero bits then exits to block CBD-010 which puts a binary ZERO into the unit's position of the operand 2 field which will contain the converted binary number in a decimal format. At the end of block CBD-010, the operand 2 field in RAM 2 segment 1 is as follows:

| RAM 2 Location (Hexadecimal) | RAM 2 Contents (Hexadecimal) | |
|---|---|---|
| 20 | NXX0 | Segment 1 |
| 21 | SNNN | OP 2, 1 digit partial sum of 0. |

Block CBD-011 then exits to ADD BIT, which is block CBD-019. Block CBD-019 then sets the carry-out indicator within decimal indicators 85 such that when the addition of the partial sum to itself is performed, the carry-out indicator will have a binary ONE in it which will be used as the carry-in when the unit's digit of the partial sum is added to itself during the decimal partial sum doubling operation. During the first time through, the carry-out indicator can be unconditionally set to indicate a carry-out because the binary number to be converted in block CBD-009 such that it is known that the bit currently being worked on at the left end of the binary number is a binary ONE. After setting the carry-out indicator within decimal indicators 85, block CBD-019 then exits to the DOUBLE routine at block CBD-012.

In block CBD-012 the current decimal partial sum is doubled by adding it to itself. The carry-in bit, of the unit's position of the partial sum is set equal to the bit within the binary number which is currently being converted. In block CBD-012 this doubling of the decimal partial sum is done by initializing the address counter and nibble counter to point to the word and nibble containing the unit's digit within the partial sum. In the example case, the word address counter is set equal to 20 which is word 0 of segment 1 and the nibble counter is set equal to 3 so that it points to the third nibble which is the unit's position in the partial sum. Also, the decimal indicators 85 are initialized such that the illegal indicator is set equal to zero and the equal nine and equal zero indicators are set equal to binary ONEs. This is done by performing a CRESET microoperation. The carry-out indicator of decimal indicators 85 is set equal to the binary state of the bit which is being examined in the binary number and will be set equal to a binary ONE if the bit is a binary ONE and will be set equal to a binary ZERO if the bit is a binary ZERO.

A microinstruction is then executed which contains a CIPDUB, a CWRES2, a CLDFLD, and a CTDCT2 microoperation. These microoperations have the effect of bringing the nibble pointed to by the address and nibble counters of RAM 2 out of RAM 2 nibble multiplexer 89 and through double multiplexer 83 into the A port of decimal ALU 84 and the same nibble from RAM 2 out of RAM 2 zero multiplexer 90 and into the B port of decimal ALU 84 and from there the decimal digit 4-bit result is written back into the same nibble within RAM 2 and the indicator bits from decimal ALU 84 are stored in decimal indicators 85. Then the nibble counter within nibble write control 86 is then decremented by one to point to the next more significant digit within RAM 2 which contains the decimal partial sum and the address counter is decremented by one if the nibble counter decrements through 0. This microinstruction is repeated depending upon the number of active digits there are in the partial sum. The first time through block CBD-012 there will only be one digit active within the partial sum so that this microinstruction is only executed one time. The ability of the preferred embodiment to feed both the A and the B ports of decimal ALU 84 from the outtput of RAM 2 provides a very efficient method of doubling the partial sum contained in RAM 2. At the end of the first time that block CBD-012 is executed, the partial sum stored in RAM 2 segment 1 is as follows:

| RAM 2 Location (Hexadecimal) | RAM 2 Contents (Hexadecimal) | |
|---|---|---|
| 20 | NXX1 | Segment 1 |
| 21 | SNNN | OP 2, 1 digit partial sum of 1. |

It should be noted that the doubling of the partial sum done in block CBD-012 also includes a microinstruction to write and skip the zone nibbles if the operand 2 is of the string decimal type such that they have zone nibbles equal to a binary 0011.

After adding all digits in the decimal partial sum, block CBD-012 exits to block CBD-013 which branches depending upon whether there is any digits left within operand 2 field length which are not currently being used in the partial sum. This branch is done by examining a counter which contains a value equal to the length of operand 2 minus the current length of the partial sum. If the length of the partial sum is less than the length of the operand 2 block CBD-013 branches to block CBD-027 which tests whether there was a carry-out of the most significant digit when the decimal partial sum was added to itself. If there was no carry-out, then block CBD-027 branches to block CBD-028. If there was a carry-out of the most significant decimal digit of the partial sum, block CBD-027 branches to block CBD-029. In block CBD-029 a decimal one is written into the next more significant digit in the decimal partial sum by feeding decimal ALU 84 with a decimal zero from RAM 1 zero multiplexer 82 into the A port and by feeding the B port with a decimal zero from RAM 2 zero multiplexer 90 while adding in the binary ONE as a carry-in. This writing of a decimal 1 in the next more significant digit of the decimal partial sum is performed by a microinstruction containing CINOP1, CINOP2, CWRES2, CLDLFP and CTDCT2 microoperations which write the output of decimal ALU 84 into RAM 2. Block CBD-029 then increments the length of the decimal partial sum so that the increased length will be used the next time the decimal partial sum is added to itself.

Block CBD-030 then decrements the count of available digits by 1 so that a comparison can be made in block CBD-013 to determine if there is any room left in operand 2 to expand the decimal partial sum by 1 digit. Block CBD-030 then exits to block CBD-028 which then decrements the count of bits in the binary number that remains to be converted. Block CBD-016 is then entered and shifts the binary number one position to the left to move the next lesser significant bit into position to be converted. Upon exiting, block CBD-016 branches to block CBD-017, if the bit counter indicates that there are more bits to convert, or to block CBD-020, if all bits have been converted. If there are more bits to convert, block CBD-017 sets up the counter that indicates the number of decimal digits in the partial sum so that counter can be used when doubling the decimal partial sum. Block CBD-017 then branches to block CBD-018, if the current bit to be converted in the binary number is a binary ZERO, or to block CBD-019 if the current bit to be converted is a binary ONE.

Block CBD-018 resets the carry-out indicator of decimal ALU 84 to a binary ZERO because the current bit to be converted is a binary ZERO. Block CBD-019 sets the carry-out indicator of decimal ALU 84 to a binary ONE because the current bit to be converted is a binary ONE. Blocks CBD-018 and CBD-019 both exit to block CBD-012 which doubles the decimal partial sum as discussed above and adds in the carry-out indicator into the unit's position.

After doubling the partial sum, block CBD-012 then exits to block CBD-013 to again test if there are any unused digits left within the operand 2 field length. This test branches as indicated before the process is continued until all bits within the binary number have been converted. If, during this conversion process, the length of the partial sum reaches the length of the operand 2 as indicated by the available digit counter being ZERO, block CBD-013 will branch to block CBD-014. In block CBD-014 the bit counter which indicates the counter of binary bits yet to be converted is decremented by one and then a test is made to see whether there was a carry-out of the most significant bit of the partial sum. If there was no carry-out, then block CBD-014 exits to block CBD-016. If, however, there was a carry-out of the most significant digit of the decimal partial sum, an overflow condition exists because one or more digits is needed in the decimal partial sum to hold the carry-out of the most significant digit in the partial sum and block CBD-015 sets an overflow indicator which is checked later. Block CBD-016 is then entered and the next bit within the binary number being converted is shifted into position and the process continued. When block CBD-016 determines that all bits have been converted, it branches to block CBD-020.

Block CBD-020 then fills the rest of the operand 2 field from the most significant digit in the partial sum through the most significant digit of operand 2 with leading zeros (and zone nibbles as necessary if the operand 2 is the string decimal type). Block CBD-020 is also entered if it was earlier determined that the binary number being converted contained all binary zeros such that the converted number will contain all decimal zeros. Upon leaving block CBD-020, the converted number as stored in RAM 2 segment 1 is as follows:

| RAM 2 Location (Hexadecimal) | RAM 2 Contents (Hexadecimal) | |
|---|---|---|
| 20 | N037 | Segment 1 |
| 21 | SNNN | OP 2 - final partial sum with sign yet to be put in place. |

Block CBD-021 is then entered and the commercial instruction indicators are gotten and the overflow (OV) and sign fault (SF) indicator bits are cleared. A branch is then made to determine whether an overflow condition was encountered during the binary conversion process such that the result in RAM 2 only contains the truncated value with the most significant digits being truncated. If the overflow indicator is set, block CBD-021 branches to block CBD-022 which sets the overflow indicator in the commercial instruction indicators and does a branch depending upon whether traps are enabled or not enabled, block CBD-023 is entered and the commercial instruction indicators are stored with the overflow indicators set.

If traps are not enabled or if there was no overflow during the binary conversion process, block CBD-024 is entered and the sign of the converted decimal number is set into the sign nibble within the operand 2 field in segment 1 of RAM 2. At the end of CBD-024, the contents of RAM 2 segment 1, which is the final converted decimal number are as follows:

| RAM 2 Location (Hexadecimal) | RAM 2 Contents (Hexadecimal) | |
|---|---|---|
| 20 | N037 | Segment 1 |
| 21 | DNNN | OP 2-final converted number with trailing minus sign (−037). |

Block CBD-025 is then entered and the commercial instruction indicators are stored in their hardware register.

Block CBD-026 is then entered and the converted binary number that has been converted to the decimal format and stored in segment 1 of RAM 2 with its neighbor nibbles is now transferred into main memory into the operand 2 field as described by data descriptor 2. This transfer is done one word at a time by moving a word from RAM 2 into main memory with the main memory address being supplied by microprocessor 30.

From the above description of the convert binary to decimal software instruction, it can be appreciated that the stripping of leading zero bits in the binary number before beginning the conversion process can greatly reduce the number of times in which the decimal partial sum must be added to itself. Further, by using a decimal partial sum which has a length only sufficiently long to hold the current decimal partial sum, the number of decimal digits which must be added when doubling the partial sum is greatly reduced. The length of the partial sum is increased by one digit each time there is a carry out of the most significant digit of the decimal partial sum. The preferred embodiment takes further advantage of the commercial instruction logic 28 by using the ability to feed both the A and B ports of the decimal ALU 84 with the same operand thereby eliminated the necessity of copying the partial sum from the place where the sum is stored to the other memory so that both the memory holding the sum and the other memory can be fed into the B and A ports respectively.

CONVERT DECIMAL TO BINARY COMMERCIAL SOFTWARE INSTRUCTION

The decimal to binary conversion operation performed by the CPU of the preferred embodiment will now be described. The method used in the CPU of the preferred embodiment is basically to bring in the number to be converted which is in a decimal format into the commercial instruction logic 28 and to examine each decimal digit one digit at a time starting with the most significant digit. Before starting to examine the most significant decimal digit, a binary partial sum is set equal to zero. This binary partial sum is kept in microprocessor 30 which has an arithmetic logic unit which performs binary arithmetic. Then as each decimal digit in the number to be converted is examined, beginning with the most significant digit, the digit is added into the current binary partial sum after the binary partial sum is multiplied by ten. This process continues until all decimal digits have been examined and the complete binary partial sum has been calculated.

A specific example of a decimal to binary conversion operation will now be discussed with respect to the detailed flow charts of the method as shown in FIG. 17. In the preferred embodiment, the decimal to binary conversion commercial software instruction takes the decimal number given to it as operand 1 and it converts it to a binary number and stores the result in the field specified for operand 2. In the following example, a decimal number of −000123 with a trailing sign will be converted to a binary number which is to be placed in a double precision (32 bits) binary field. In the preferred embodiment, negative decimal numbers are represented in a two's complement form.

For the example decimal to binary conversion shown below, assume the CDB software instruction is at main memory location 1000 as follows:

| Example CDB Software Instruction: | | |
|---|---|---|
| Memory Location Addressing (Hexadecimal) | Memory Contents (Hexadecimal) | Meaning |
| 1000 | 002A | CDB op code |
| 1001 | E707 | data descriptor 1 (DD1) word 1 |
| 1002 | 1102 | data descriptor 1 (DD1) word 2 |
| 1003 | 8407 | data descriptor 2 (DD2) word 1 |
| 1004 | 1204 | data descriptor 2 (DD2) word 2 |

Data descriptors DD1 and DD2 are decoded as follows (see FIG. 9):

| DD1: | T=0: | String (unpacked) decimal. |
|---|---|---|
| | C1=1: | OP 1 starts in right byte. |
| | C2,C3=11: | Trailing sign. |
| | L=7: | 6 digits and a sign. |
| | CAS: | OP 1 starts in word addressed by contents of base register 7 plus displacement of 1102. If B7 contains the value 1000 hexadecimal, OP 1 is located at address 2102 hexadecimal. |
| DD2: | T=0: | String (binary DD is a string DD). |
| | C1=1: | OP 2 starts in left byte. |
| | L=4: | 32-bit binary operand. |
| | CAS: | OP 2 starts in word addressed by contents of base register 7 plus the displacement of 1204. Since B7 contains 1000 hexadecimal, OP 2 is located at address 2204 hexadecimal. |

OP 1, which is a −000123 in string decimal format, appears in main memory as follows:

| Memory Location Address (Hexadecimal) | Memory Contents (Hexadecimal) |
|---|---|
| 2102 | NN30 |
| 2103 | 3030 |
| 2104 | 3132 |
| 2105 | 332D | where:
N are neighbor nibbles which must be preserved when the converted number is stored.
30, 31, 32, 33 are string decimal digits 0, 1, 2, 3 respectively.
2D is a trailing minus sign.

OP 2, which is where the converted number is to be stored, in a binary format appears in main memory as follows:

| Memory Location Address (Hexadecimal) | Memory Contents (Hexadecimal) |
|---|---|
| 2204 | MSWD |
| 2205 | LSWD | where:
MSWD is 16-bit word which will contain the 16 most significant bits of the converted 32-bit binary number.
LSWD is 16-bit word will contain the 16 least significant bits of the converted 32-bit binary number.

The execution of the above example CDB commercial software instruction will now be described with reference to FIG. 17. FIG. 17 is a flow chart of the firmware microroutines used by CPU 20 to execute a CDB software instruction. The blocks in FIG. 17 which are referred to by the names next to them, such as CDB-001, show at a gross level the functions performed by microprocessor 30 and commercial instruction logic 28 to perform the software instruction. Some of these blocks may represent the execution of more than one 48 or 56-bit microinstruction, the form of which is shown in FIG. 5. Before entering the microroutines shown in FIG. 17, which are peculiar to the CDB commercial software instructions, the CPU 20 examines the first word of the software instruction which is being executed to determine the type of operation to be performed. Once it is determined that it is a convert decimal to binary operation as determined by looking at the operation code in the first word of the instruction, the CPU 20 then proceeds to decode the address syllable associated with data descriptor 1 to determine the main memory word address and the position within the word in which operand 1 begins.

The front end processing of the software instruction then continues with the microprocessor branching to the CDB routine at block CDB-000. When the convert decimal to binary routine is entered at CDB, it is determined whether this is a first pass in which operand 1 is to be brought into the CPU or the second pass in which the converted number in binary format is to be stored into the operand 2 field. If it is the first pass, the firmware then branches to block CDB-001 which fetches operand 1 so that it can be examined one decimal digit at a time starting with the most significant decimal digit.

After block CDB-001 has brought the decimal number to be converted into RAM 1, the contents of RAM 1 are as follows:

| RAM 1 Location (Hexadecimal) | RAM 1 Contents (Hexadecimal) | |
|---|---|---|
| 2 | NN30 | OP 1, the string |
| 3 | 3030 | decimal number to |
| 4 | 3132 | be converted |
| 5 | 332D | |

Block CDB-002 is then entered which sets up the RAM 1 address counter and nibble counter to the most significant digit of the decimal number to be converted in RAM 1. The pointers are set to point to the nibble containing the decimal value and not to the nibble containing the zone bits of binary 0011. In the example, the address counter is set up to point to word 2 and the nibble counter is set to point to nibble 3 which contains the most significant digit which is a decimal 0. Block CDB-002 then exits to block CDB-003 where a counter is set equal to the length of the number of digits in the decimal number to be converted. Block CDB-003 also zeros out the word zero within RAM 2 so that when the decimal digit to be converted is written into nibble 3 of RAM 2 from RAM 1 the 12 leading bits will be binary ZEROs.

Block CD8-004 is then entered to bring the current digit pointed to by the address and nibble counters of RAM 1 into microprocessor 30 through RAM 2. This is done by reading the current nibble out of RAM 1 through RAM 0 multiplexer 82 and double multiplexer 83 into the A port of decimal ALU 84 while feeding the B port of the decimal ALU 84 with a zero from RAM 2 zero multiplexer 90. The output of decimal ALU 84 is taken from the result/zone multiplexer 91 and into nibble 3 multiplexer 95 where it is written into word 0 nibble 3 in RAM 2. The word 0 of RAM 2 is then read into RAM 2 data register 88 and from there it is taken by transceivers 97 into microprocessor 30. The decimal digit transferred form RAM 1 into microprocessor 30 is then stored in the least significant word of a 32-bit binary partial sum with the most significant word of the 32 bit binary partial sum set equal to zero. After reading the current decimal digit from RAM 1 into RAM 2, a test is made within block CDB-004 to determine if a string decimal number is being converted and, if so, the nibble counter for RAM 1 is incremented by one by use of a microinstruction containing a CTUCT1 microoperation which increments the nibble counter and, if the nibble counter increments through 3, also increments the address counter of RAM 1.

After the decimal digit has been transferred to microprocessor 30, block CDB-005 is entered and a test is made on the status of the equal zero indicator of decimal indicators 85. If the equal zero indicator indicates that a decimal zero digit was read from RAM 1, block CDB-005 transfers back to block CDB-004 to get the next digit, if all digits have not already been transferred. If block CDB-005 determines that all the digits are zero and that no more digits are left, because a decimal operand length counter has been decremented to zero, block CDB-005 exits to block CDB-006 which sets the converted binary result equal to zero because all of the digits within RAM 1 have been scanned and they were all zeros. When block CDB-005 determines that a non-zero decimal digit has been read from RAM 1 into microprocessor 30, block CDB-007 is entered. Block CDB-007 tests whether there are any digits left within RAM 1 which have not yet been converted by examining the status of the decimal operand length counter to determined whether it has been decremented to zero. If there are still digits left to be converted, the binary partial sum within microprocessor 30 is multiplied by 10 with care being taken to note if there is any overflows out of the most significant bit in the 32-bit binary number. This multiplication by ten is done by shifting the binary partial sum one bit position to the left to multiply the binary partial sum by two. The by-two result is saved and then shifted two more places to the left to effectively multiply by the binary partial sum by eight and then add the by-two partial sum is added to it to produce a binary partial sum which has been multiplied by ten.

Block CDB-010 is then entered to get the next digit from RAM 1 into microprocessor 30 via RAM 2 as done before and the values in the nibble and address counter of RAM 1 are incremented to point to the next less significant digit in the decimal number being converted. Block CDB-011 is then entered and the current decimal digit entered into microprocessor 30 is then added to the binary partial sum with care again being taken to note any overflow out of the most significant bit of the 32-bit binary partial sum which is being accumulated. Block CDB-011 then returns to block BDC-007 which tests the counter indicating the number of decimal digits remaining to be converted. If the count is not zero, block CDB-011 exits to block CDB-009 which multiplies the binary partial sum by 10 as before. This process is continued from block CDB-007 through CDB-011 until all digits within the decimal number to be converted have been processed. When the counter remaining digits is equal to zero, block CDB-007 exits to block CDB-008. In block CDB-008 a test is made on decimal illegal decimal indicator of decimal indicators 85 (which is an integrating indicator as mentioned previously) to determine whether any of the digits read from RAM 1 into the microprocessor via RAM 2 contained a non-decimal digit. If so, block CDB-008 exits to the illegal character (IC) routine which handles the case of an illegal digit.

If no illegal digits were found during the conversion process, block CDB-008 exits to the software instruction front end routine which does the preprocessing on data descriptor 2 and returns to the convert decimal to binary routine at block CDB-000 which tests whether this is pass 1 or pass 2, if pass 2 goes to block CDB-012. Block CDB-012 examines the data descriptor 2 and determines the length of operand 2. If data descriptor 2 is an immediate operand type, instead of a pointer to operand 2, a block CDB-012 branches to routine IS which handles illegal software instructions because immediate operands are not allowed to be used for operand which have results stored in them. If it is not an immediate operand, block CDB-012 exits to block CBD-013-CDB-013 which checks to see if the results can be stored within the one or two words specified for operand 2 taking into account that the binary result may have to have a two's complement performed on it if the result is negative. If the result will not fit within the one or two words specified for operand 2, an overflow indicator is set. In block CDB-014, the commercial instruction indicators are read and updated to set overflow if necessary. If overflow has occurred, and traps are enabled, block CDB-014 branches to the trap overflow routine (OV). If there is not an overflow or if trapping on overflow has not been enabled, block CDB-014 exits to block CDB-015 which performs a two's complement on the binary result if the result is negative as determined by the sign on the original decimal number which was converted. Block CDB-016 is then entered and the binary result consisting of either two bytes, if it is a 16-bit binary number, or 4 bytes, if it is a 32-bit binary number, as specified by data descriptor 2 are then stored from the registers in microprocessor 30 one byte at a time into main memory in order that the neighboring bytes in main memory will be preserved if the binary operand does not begin in the right byte of a word. After CDB-016 stores the results into main memory, the main memory area occupied by the converted binary number for the example contains the binary result of −123 in two's complement form as follows:

| Memory Location (Hexadecimal) | Memory Contents (Hexadecimal) | |
|---|---|---|
| 2204 | FFFF | −123 in binary |
| 2205 | FF85 | two's complement format. |

Block CBD-016 then goes to the FETCH routine which brings in the next software instruction for processing.

This conversion process of converting a decimal number to a binary number can be appreciated by looking at Table 18 which shows selected steps in the decimal to binary conversion process. In Table 18, the column labeled "step", contains the last three digits of the flow chart block numbers of FIG. 17. Under the columns labeled "RAM 1" counters, the "WP1" column indicates where address counter of RAM 1 is pointing at the beginning of the step, and the column labeled "NP1" indicates where the nibble counter of RAM 1 is pointing to at the beginning of the step. The columns labeled "Decimal Digit from RAM 1", contain the decimal digit which is being examined in RAM 1 in both a hexadecimal and binary format. The columns labeled "Partial Sum" indicate the least significant portion of the binary partial sum which is being accumulated in microprocessor 30. The partial sum column in the binary format contains the 8 low order bits of the 32-bit partial sum and the column labeled "Decimal" contains the decimal equivalent.

TABLE 18

Example Decimal to Binary Conversion

| Step (CDB-) | RAM 1 Counters | | Decimal Digit from RAM 1 | | Partial Sum | |
|---|---|---|---|---|---|---|
| | WP1 | NP1 | Hexa- decimal | Bi- nary | (Bi- nary) | (Deci- mal) |
| 004 | 2 | 3 | 0 | 0000 | XXXXXXXX | X |
| 004 | 3 | 1 | 0 | 0000 | XXXXXXXX | X |
| 004 | 3 | 3 | 0 | 0000 | XXXXXXXX | X |
| 004 | 4 | 1 | 1 | 0001 | 00000001 | 1 |
| 009 | 4 | 3 | | | 00001010 | 10 |
| 010 | 4 | 3 | 2 | 0010 | 00001010 | 10 |
| 011 | 5 | 1 | | | 00001100 | 12 |
| 009 | 5 | 1 | | | 01111000 | 120 |
| 010 | 5 | 1 | 3 | 0011 | 01111000 | 120 |
| 011 | 5 | 3 | | | 01111011 | 123 |
| 015 | | | | | 10000101 | 123 |

From the above discussion of the decimal to binary conversion software instruction, it can be appreciated that in a preferred embodiment use is made of the ability of RAM 1 to address from left to right such that the decimal number being converted can be examined starting at the most significant digit and the work to the least significant digit. This ability is used to first strip all leading zeros from the decimal number and then to convert from the first most significant non-zero digit to the least significant digit within the decimal number. It can also be appreciated that the integrating nature of the equal zero and illegal character indicators within decimal indicators 85 is advantageously employed.

While a preferred embodiment has been described, other modifications will be readily suggested by those of ordinary skill in the art. For example, the commercial instruction logic can be adapted to work on words that have fewer or more than 16 bits and decimal data formats using different representations with different nibbles and atom sizes. Also, although the preferred embodiment has been described in terms of a particular microprocessor, the commercial instruction logic can be used with the CPU having different microprocessors or combinatorial logic. In addition, the control of the commercial instruction logic can be done using different microoperations or combinatorial logic. Similarly, the methods used perform the various arithmetic operations can be adapted to use different hardware.

While the invention has been shown and described with reference to the preferred embodiment thereof, it will be understood by those skilled in the art that the above and other changes in form and detail may be made therein without departing from the spirit and scope of the invention.

What is claimed is:

1. A converter apparatus used with a two input arithmetic logic unit (ALU) in a computer system for converting a number in a binary format to a decimal format for use in decimal arithmetic operations in the computer system comprising:
   A. first memory means for storing a binary number to be converted to a decimal number;
   B. second memory means for storing a decimal partial sum and a carry;
   C. a decimal partial sum length counter which is initially set to zero;
   D. multiplexer means for feeding both inputs of said ALU from the same digit position of said partial sum stored in said second memory means,
   E. first means for applying said binary number stored in said first memory means to said ALU, said ALU removing the zeroes preceding the highest order non-zero bit of said binary number, said ALU storing said highest order non-zero bit in said second memory as an initial partial sum, and then setting said counter to a count equal to one less than the digit length of said preceding zero stripped binary number;
   F. second means for applying said initial partial sum and any carry stored in said second memory to said multiplexer means for application to said ALU to be added together and to have the next highest order non-zero digit of said binary number added thereto to derive a next partial sum, said next highest order non-zero digit being applied to said ALU via said first applying means; and
   G. means for storing said next partial sum and a carry resulting therefrom back in the same position in said second memory means that said initial partial sum was read from, and said ALU decrementing said counter means by one,
said first and second applying means, said multiplexing means, said storing means and said ALU then repeating adding of a partial sum to itself, to a carry and to subsequent lower order bits of said leading zero stripped binary number until said counter contents equal zero, said ALU adding zeroes in front of a final partial sum in said second memory when said counter is zero to account for the leading zeroes initially stripped from said binary number, the final partial sum with restored leading zeores stored in said second memory when said counter equals zero being the decimal equivalent of the binary number stored in said first memory.

2. The method in accordance with claim 1 further comprising the steps of:
   F. setting a decimal partial sum length counter to zero before starting said adding step; and
   G. incrementing said decimal partial sum length counter by one if a carry-out occurs from said addition step, the count in said counter after step C. has been performed for all digits of said binary number being the number of digits of said decimal format of said binary number.

3. The apparatus as in claim 1 further comprising:
   A. means for setting a nibble digit counter equal to the number of decimal digits in a receiving field which is to hold said converted decimal number;
   B. means for decrementing said available digit counter each time said partial sum length counter is incremented by one;
   C. means for inhibiting adding more significant digits to said decimal partial sum if said available digit counter equal zero; and
   D. means for indicating an overflow if said available digit counter equals zero and there was a carry-out of the most significant digit of said decimal partial sum when said decimal partial sum was added to itself.

4. The method for converting a number in a binary format to a decimal format in a binary decimal converter used with a decimal arithmetic logic unit (ALU) in a computer system, said ALU having a first input connected to a first storage in which is stored said binary number, a second input connected to a second storage, and a carry output, and comprising the steps of:
   A. initially setting a decimal partial sum stored in said second storage to the value of the highest order non-zero digit of said binary number;
   B. stripping leading zeroes before the highest order non-zero bit of said binary number after reading it out of said first storage;
   C. adding said initial decimal partial sum to itself and to a carry digit which is the next highest order digit of said binary number read out of said first storage to yield a new partial sum and a carry output, said decimal partial sum being added to itself by feeding said first and said second inputs of said decimal arithmetic logic unit with said decimal partial sum read out of said second storage, and storing the result of said addition into the same partial sum position in said second storage;
   D. storing a decimal one in the next more significant digit in said decimal partial sum if a carry-out of said decimal partial sum occurs; and
   E. repeating steps C. and D. for each digit of said binary number starting from its next most significant bit and progressing to its least significant bit, with each such binary number digit being the carry digit in said adding step, and after all binary number digits have been utilized said decimal partial sum in said second storage is the decimal format value of said binary number in said first storage.

* * * * *